(12) United States Patent
Tetteh

(10) Patent No.: US 12,553,030 B2
(45) Date of Patent: Feb. 17, 2026

(54) GENETICALLY ENGINEERED T CELLS WITH PTPN2 KNOCKOUT HAVE IMPROVED FUNCTIONALITY AND ANTI-TUMOR ACTIVITY

(71) Applicant: CRISPR Therapeutics AG, Zug (CH)

(72) Inventor: Paul Tetteh, Cambridge, MA (US)

(73) Assignee: CRISPR Therapeutics AG, Zug (CH)

( * ) Notice: Subject to any disclaimer, the term of this patent is extended or adjusted under 35 U.S.C. 154(b) by 625 days.

(21) Appl. No.: 17/689,071

(22) Filed: Mar. 8, 2022

(65) Prior Publication Data

US 2022/0288122 A1    Sep. 15, 2022

Related U.S. Application Data

(60) Provisional application No. 63/158,636, filed on Mar. 9, 2021.

(51) Int. Cl.
| | | |
|---|---|---|
| *C12N 5/0783* | (2010.01) | |
| *A61K 40/11* | (2025.01) | |
| *A61K 40/15* | (2025.01) | |
| *A61K 40/31* | (2025.01) | |
| *A61K 40/42* | (2025.01) | |
| *A61K 40/50* | (2025.01) | |
| *C07K 14/705* | (2006.01) | |
| *C12N 9/22* | (2006.01) | |

(52) U.S. Cl.
CPC ............ *C12N 5/0638* (2013.01); *A61K 40/11* (2025.01); *A61K 40/15* (2025.01); *A61K 40/31* (2025.01); *A61K 40/4211* (2025.01); *A61K 40/4215* (2025.01); *A61K 40/4232* (2025.01); *C07K 14/70521* (2013.01); *C07K 14/70578* (2013.01); *C12N 9/22* (2013.01); *A61K 40/50* (2025.01); *A61K 2239/31* (2023.05); *A61K 2239/38* (2023.05); *A61K 2239/56* (2023.05); *C07K 2317/622* (2013.01); *C07K 2319/02* (2013.01); *C07K 2319/03* (2013.01); *C07K 2319/33* (2013.01); *C12N 2310/20* (2017.05); *C12N 2510/00* (2013.01); *C12N 2750/14143* (2013.01)

(58) Field of Classification Search
CPC .................................................... C12N 5/0638
See application file for complete search history.

(56) References Cited

U.S. PATENT DOCUMENTS

| | | | |
|---|---|---|---|
| 10,736,919 B2* | 8/2020 | Terrett | ............ C07K 14/70578 |
| 2022/0081691 A1* | 3/2022 | Haining | ................. C07K 16/40 |
| 2022/0118019 A1* | 4/2022 | Benton | ............... A61K 2239/38 |
| 2022/0387572 A1* | 12/2022 | Terrett | ............... A61K 2239/31 |

FOREIGN PATENT DOCUMENTS

| | | |
|---|---|---|
| WO | WO 2020/163365 A2 | 8/2020 |
| WO | WO 2020/219682 A2 | 10/2020 |

OTHER PUBLICATIONS

Liu et al., CRISPR-Cas9-mediated multiplex gene editing in CAR-T cells. Cell Res 27, 154-157 (2017) (Year: 2017).*
Anderson et al., Efficient CRISPR/Cas9 Disruption of Autoimmune-Associated Genes Reveals Key Signaling Programs in Primary Human T Cells. J Immunol. Dec. 15, 2019;203(12):3166-3178. Epub Nov. 13, 2019.
Veenstra et al., The effects of PTPN2 loss on cell signalling and clinical outcome in relation to breast cancer subtype. J Cancer Res Clin Oncol. Jul. 2019;145(7):1845-1856. Epub Apr. 25, 2019.

* cited by examiner

*Primary Examiner* — Allison M Fox
*Assistant Examiner* — Hanan Isam Abuzeineh
(74) *Attorney, Agent, or Firm* — Casimir Jones, S.C.; J. Mitchell Jones

(57) ABSTRACT

A population of genetically engineered T cells, comprising a disrupted protein tyrosine phosphatase non-receptor type 2 (PTPN2) gene and optionally a disrupted TRAC gene, a disrupted β2M gene, and/or a disrupted CD70 gene. Also provided herein are methods for making such genetically engineered T cells and therapeutic uses thereof.

31 Claims, 20 Drawing Sheets

Specification includes a Sequence Listing.

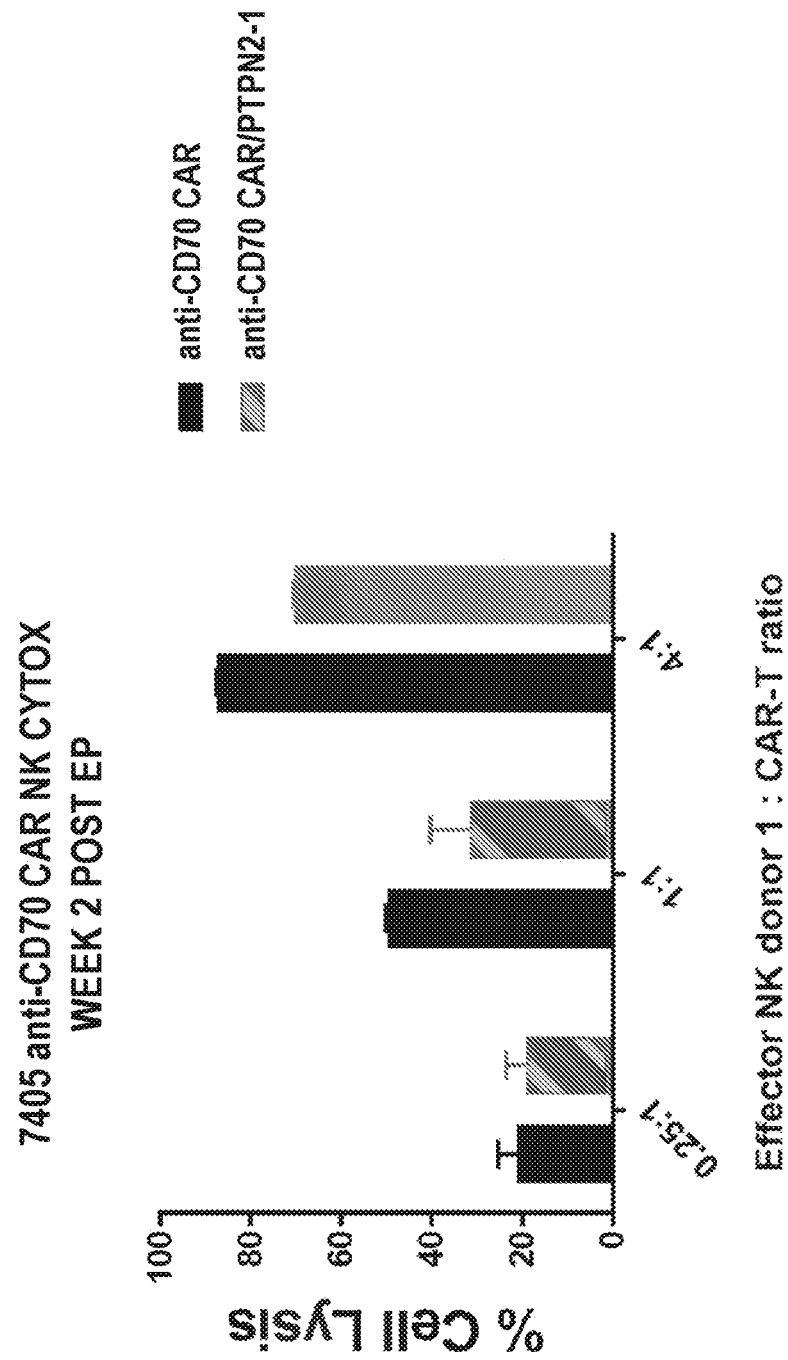

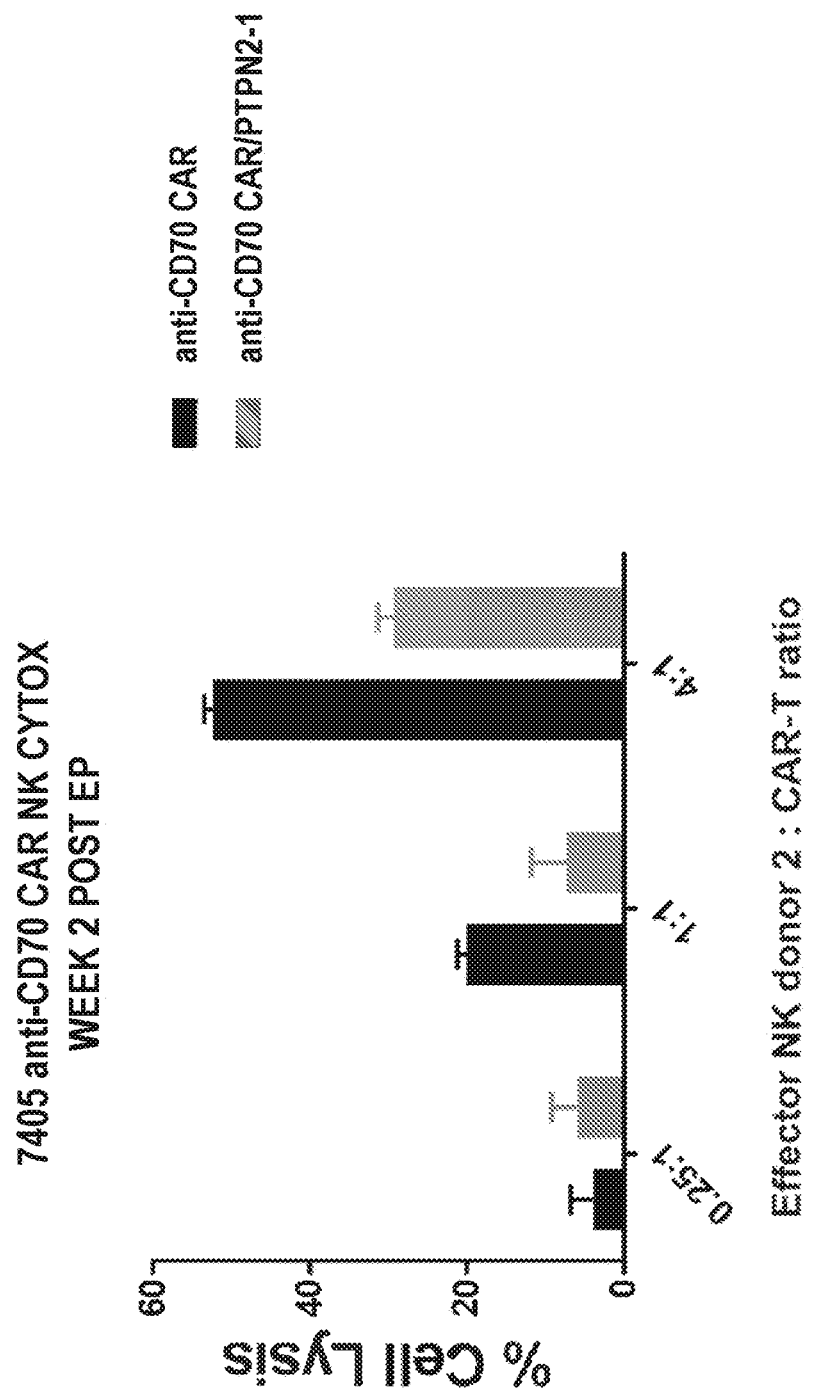

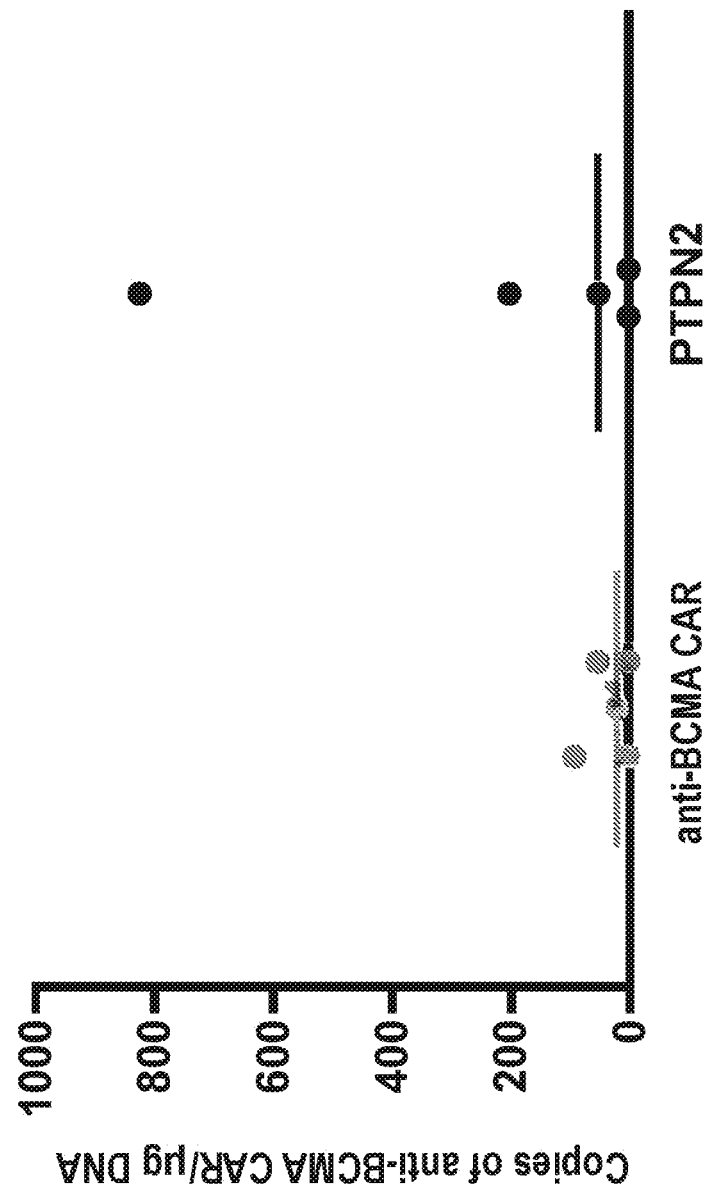

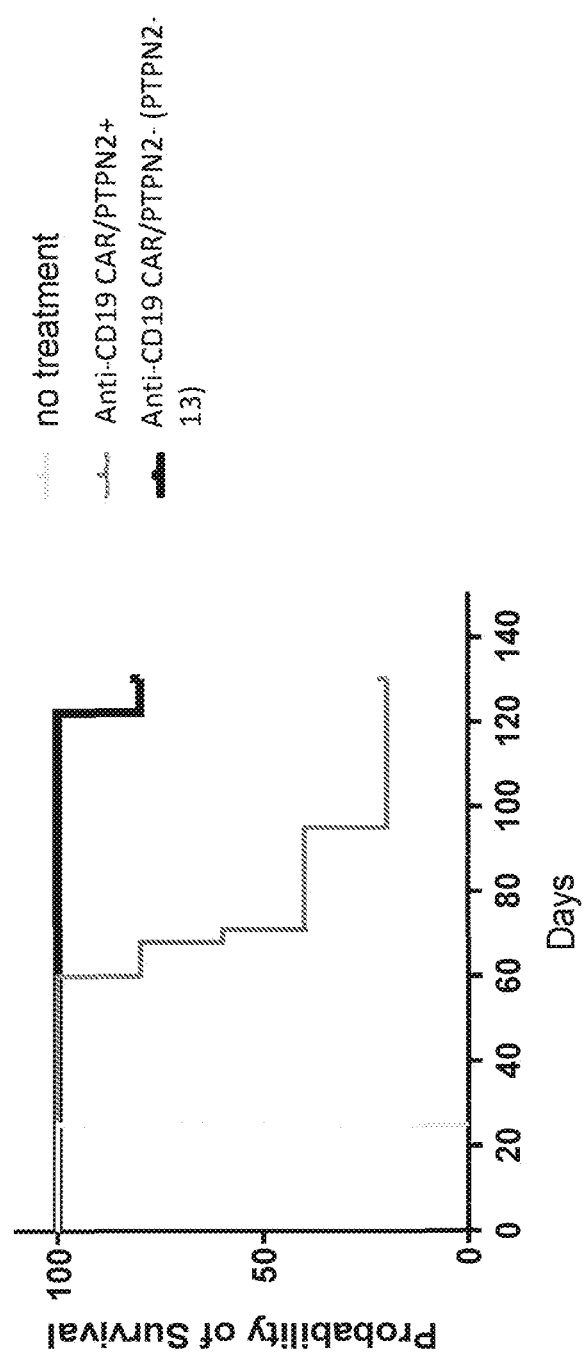

SEQUENCE LISTING

```
<160> NUMBER OF SEQ ID NOS: 193

<210> SEQ ID NO 1
<211> LENGTH: 1368
<212> TYPE: PRT
<213> ORGANISM: Artificial Sequence
<220> FEATURE:
<223> OTHER INFORMATION: Synthetic

<400> SEQUENCE: 1

Met Asp Lys Lys Tyr Ser Ile Gly Leu Asp Ile Gly Thr Asn Ser Val
1               5                   10                  15

Gly Trp Ala Val Ile Thr Asp Glu Tyr Lys Val Pro Ser Lys Lys Phe
            20                  25                  30

Lys Val Leu Gly Asn Thr Asp Arg His Ser Ile Lys Lys Asn Leu Ile
        35                  40                  45

Gly Ala Leu Leu Phe Asp Ser Gly Glu Thr Ala Glu Ala Thr Arg Leu
    50                  55                  60

Lys Arg Thr Ala Arg Arg Arg Tyr Thr Arg Arg Lys Asn Arg Ile Cys
65                  70                  75                  80

Tyr Leu Gln Glu Ile Phe Ser Asn Glu Met Ala Lys Val Asp Asp Ser
                85                  90                  95

Phe Phe His Arg Leu Glu Glu Ser Phe Leu Val Glu Glu Asp Lys Lys
            100                 105                 110

His Glu Arg His Pro Ile Phe Gly Asn Ile Val Asp Glu Val Ala Tyr
        115                 120                 125

His Glu Lys Tyr Pro Thr Ile Tyr His Leu Arg Lys Lys Leu Val Asp
    130                 135                 140

Ser Thr Asp Lys Ala Asp Leu Arg Leu Ile Tyr Leu Ala Leu Ala His
145                 150                 155                 160

Met Ile Lys Phe Arg Gly His Phe Leu Ile Glu Gly Asp Leu Asn Pro
                165                 170                 175

Asp Asn Ser Asp Val Asp Lys Leu Phe Ile Gln Leu Val Gln Thr Tyr
            180                 185                 190

Asn Gln Leu Phe Glu Glu Asn Pro Ile Asn Ala Ser Gly Val Asp Ala
        195                 200                 205

Lys Ala Ile Leu Ser Ala Arg Leu Ser Lys Ser Arg Arg Leu Glu Asn
    210                 215                 220
```

```
Leu Ile Ala Gln Leu Pro Gly Glu Lys Lys Asn Gly Leu Phe Gly Asn
225                 230                 235                 240

Leu Ile Ala Leu Ser Leu Gly Leu Thr Pro Asn Phe Lys Ser Asn Phe
            245                 250                 255

Asp Leu Ala Glu Asp Ala Lys Leu Gln Leu Ser Lys Asp Thr Tyr Asp
                260                 265                 270

Asp Asp Leu Asp Asn Leu Leu Ala Gln Ile Gly Asp Gln Tyr Ala Asp
            275                 280                 285

Leu Phe Leu Ala Ala Lys Asn Leu Ser Asp Ala Ile Leu Leu Ser Asp
        290                 295                 300

Ile Leu Arg Val Asn Thr Glu Ile Thr Lys Ala Pro Leu Ser Ala Ser
305                 310                 315                 320

Met Ile Lys Arg Tyr Asp Glu His His Gln Asp Leu Thr Leu Leu Lys
                325                 330                 335

Ala Leu Val Arg Gln Gln Leu Pro Glu Lys Tyr Lys Glu Ile Phe Phe
            340                 345                 350

Asp Gln Ser Lys Asn Gly Tyr Ala Gly Tyr Ile Asp Gly Gly Ala Ser
        355                 360                 365

Gln Glu Glu Phe Tyr Lys Phe Ile Lys Pro Ile Leu Glu Lys Met Asp
370                 375                 380

Gly Thr Glu Glu Leu Leu Val Lys Leu Asn Arg Glu Asp Leu Leu Arg
385                 390                 395                 400

Lys Gln Arg Thr Phe Asp Asn Gly Ser Ile Pro His Gln Ile His Leu
                405                 410                 415

Gly Glu Leu His Ala Ile Leu Arg Arg Gln Glu Asp Phe Tyr Pro Phe
            420                 425                 430

Leu Lys Asp Asn Arg Glu Lys Ile Glu Lys Ile Leu Thr Phe Arg Ile
        435                 440                 445

Pro Tyr Tyr Val Gly Pro Leu Ala Arg Gly Asn Ser Arg Phe Ala Trp
        450                 455                 460

Met Thr Arg Lys Ser Glu Glu Thr Ile Thr Pro Trp Asn Phe Glu Glu
465                 470                 475                 480

Val Val Asp Lys Gly Ala Ser Ala Gln Ser Phe Ile Glu Arg Met Thr
                485                 490                 495

Asn Phe Asp Lys Asn Leu Pro Asn Glu Lys Val Leu Pro Lys His Ser
            500                 505                 510

Leu Leu Tyr Glu Tyr Phe Thr Val Tyr Asn Glu Leu Thr Lys Val Lys
        515                 520                 525

Tyr Val Thr Glu Gly Met Arg Lys Pro Ala Phe Leu Ser Gly Glu Gln
        530                 535                 540

Lys Lys Ala Ile Val Asp Leu Leu Phe Lys Thr Asn Arg Lys Val Thr
545                 550                 555                 560

Val Lys Gln Leu Lys Glu Asp Tyr Phe Lys Lys Ile Glu Cys Phe Asp
                565                 570                 575

Ser Val Glu Ile Ser Gly Val Glu Asp Arg Phe Asn Ala Ser Leu Gly
            580                 585                 590

Thr Tyr His Asp Leu Leu Lys Ile Ile Lys Asp Lys Asp Phe Leu Asp
        595                 600                 605

Asn Glu Glu Asn Glu Asp Ile Leu Glu Asp Ile Val Leu Thr Leu Thr
        610                 615                 620

Leu Phe Glu Asp Arg Glu Met Ile Glu Glu Arg Leu Lys Thr Tyr Ala
625                 630                 635                 640
```

-continued

His Leu Phe Asp Asp Lys Val Met Lys Gln Leu Lys Arg Arg Tyr
                645                 650                 655

Thr Gly Trp Gly Arg Leu Ser Arg Lys Leu Ile Asn Gly Ile Arg Asp
            660                 665                 670

Lys Gln Ser Gly Lys Thr Ile Leu Asp Phe Leu Lys Ser Asp Gly Phe
        675                 680                 685

Ala Asn Arg Asn Phe Met Gln Leu Ile His Asp Asp Ser Leu Thr Phe
690                 695                 700

Lys Glu Asp Ile Gln Lys Ala Gln Val Ser Gly Gln Gly Asp Ser Leu
705                 710                 715                 720

His Glu His Ile Ala Asn Leu Ala Gly Ser Pro Ala Ile Lys Lys Gly
                725                 730                 735

Ile Leu Gln Thr Val Lys Val Val Asp Glu Leu Val Lys Val Met Gly
            740                 745                 750

Arg His Lys Pro Glu Asn Ile Val Ile Glu Met Ala Arg Glu Asn Gln
        755                 760                 765

Thr Thr Gln Lys Gly Gln Lys Asn Ser Arg Glu Arg Met Lys Arg Ile
770                 775                 780

Glu Glu Gly Ile Lys Glu Leu Gly Ser Gln Ile Leu Lys Glu His Pro
785                 790                 795                 800

Val Glu Asn Thr Gln Leu Gln Asn Glu Lys Leu Tyr Leu Tyr Tyr Leu
                805                 810                 815

Gln Asn Gly Arg Asp Met Tyr Val Asp Gln Glu Leu Asp Ile Asn Arg
            820                 825                 830

Leu Ser Asp Tyr Asp Val Asp His Ile Val Pro Gln Ser Phe Leu Lys
        835                 840                 845

Asp Asp Ser Ile Asp Asn Lys Val Leu Thr Arg Ser Asp Lys Asn Arg
850                 855                 860

Gly Lys Ser Asp Asn Val Pro Ser Glu Glu Val Val Lys Lys Met Lys
865                 870                 875                 880

Asn Tyr Trp Arg Gln Leu Leu Asn Ala Lys Leu Ile Thr Gln Arg Lys
                885                 890                 895

Phe Asp Asn Leu Thr Lys Ala Glu Arg Gly Gly Leu Ser Glu Leu Asp
            900                 905                 910

Lys Ala Gly Phe Ile Lys Arg Gln Leu Val Glu Thr Arg Gln Ile Thr
        915                 920                 925

Lys His Val Ala Gln Ile Leu Asp Ser Arg Met Asn Thr Lys Tyr Asp
930                 935                 940

Glu Asn Asp Lys Leu Ile Arg Glu Val Lys Val Ile Thr Leu Lys Ser
945                 950                 955                 960

Lys Leu Val Ser Asp Phe Arg Lys Asp Phe Gln Phe Tyr Lys Val Arg
                965                 970                 975

Glu Ile Asn Asn Tyr His His Ala His Asp Ala Tyr Leu Asn Ala Val
            980                 985                 990

Val Gly Thr Ala Leu Ile Lys Lys Tyr Pro Lys Leu Glu Ser Glu Phe
        995                 1000                1005

Val Tyr Gly Asp Tyr Lys Val Tyr Asp Val Arg Lys Met Ile Ala
        1010                1015                1020

Lys Ser Glu Gln Glu Ile Gly Lys Ala Thr Ala Lys Tyr Phe Phe
        1025                1030                1035

Tyr Ser Asn Ile Met Asn Phe Phe Lys Thr Glu Ile Thr Leu Ala
        1040                1045                1050

```
Asn Gly Glu Ile Arg Lys Arg Pro Leu Ile Glu Thr Asn Gly Glu
    1055                1060                1065

Thr Gly Glu Ile Val Trp Asp Lys Gly Arg Asp Phe Ala Thr Val
    1070                1075                1080

Arg Lys Val Leu Ser Met Pro Gln Val Asn Ile Val Lys Lys Thr
    1085                1090                1095

Glu Val Gln Thr Gly Gly Phe Ser Lys Glu Ser Ile Leu Pro Lys
    1100                1105                1110

Arg Asn Ser Asp Lys Leu Ile Ala Arg Lys Lys Asp Trp Asp Pro
    1115                1120                1125

Lys Lys Tyr Gly Gly Phe Asp Ser Pro Thr Val Ala Tyr Ser Val
    1130                1135                1140

Leu Val Val Ala Lys Val Glu Lys Gly Lys Ser Lys Lys Leu Lys
    1145                1150                1155

Ser Val Lys Glu Leu Leu Gly Ile Thr Ile Met Glu Arg Ser Ser
    1160                1165                1170

Phe Glu Lys Asn Pro Ile Asp Phe Leu Glu Ala Lys Gly Tyr Lys
    1175                1180                1185

Glu Val Lys Lys Asp Leu Ile Ile Lys Leu Pro Lys Tyr Ser Leu
    1190                1195                1200

Phe Glu Leu Glu Asn Gly Arg Lys Arg Met Leu Ala Ser Ala Gly
    1205                1210                1215

Glu Leu Gln Lys Gly Asn Glu Leu Ala Leu Pro Ser Lys Tyr Val
    1220                1225                1230

Asn Phe Leu Tyr Leu Ala Ser His Tyr Glu Lys Leu Lys Gly Ser
    1235                1240                1245

Pro Glu Asp Asn Glu Gln Lys Gln Leu Phe Val Glu Gln His Lys
    1250                1255                1260

His Tyr Leu Asp Glu Ile Ile Glu Gln Ile Ser Glu Phe Ser Lys
    1265                1270                1275

Arg Val Ile Leu Ala Asp Ala Asn Leu Asp Lys Val Leu Ser Ala
    1280                1285                1290

Tyr Asn Lys His Arg Asp Lys Pro Ile Arg Glu Gln Ala Glu Asn
    1295                1300                1305

Ile Ile His Leu Phe Thr Leu Thr Asn Leu Gly Ala Pro Ala Ala
    1310                1315                1320

Phe Lys Tyr Phe Asp Thr Thr Ile Asp Arg Lys Arg Tyr Thr Ser
    1325                1330                1335

Thr Lys Glu Val Leu Asp Ala Thr Leu Ile His Gln Ser Ile Thr
    1340                1345                1350

Gly Leu Tyr Glu Thr Arg Ile Asp Leu Ser Gln Leu Gly Gly Asp
    1355                1360                1365

<210> SEQ ID NO 2
<211> LENGTH: 20
<212> TYPE: DNA
<213> ORGANISM: Artificial Sequence
<220> FEATURE:
<223> OTHER INFORMATION: Synthetic

<400> SEQUENCE: 2
ggaaacttgg ccactctatg                                        20

<210> SEQ ID NO 3
<211> LENGTH: 20
```

```
<212> TYPE: DNA
<213> ORGANISM: Artificial Sequence
<220> FEATURE:
<223> OTHER INFORMATION: Synthetic

<400> SEQUENCE: 3
ccactctatg aggatagtca                                         20

<210> SEQ ID NO 4
<211> LENGTH: 20
<212> TYPE: DNA
<213> ORGANISM: Artificial Sequence
<220> FEATURE:
<223> OTHER INFORMATION: Synthetic

<400> SEQUENCE: 4
ctcttctatg tcaactaaac                                         20

<210> SEQ ID NO 5
<211> LENGTH: 20
<212> TYPE: DNA
<213> ORGANISM: Artificial Sequence
<220> FEATURE:
<223> OTHER INFORMATION: Synthetic

<400> SEQUENCE: 5
cagtttagtt gacatagaag                                         20

<210> SEQ ID NO 6
<211> LENGTH: 20
<212> TYPE: DNA
<213> ORGANISM: Artificial Sequence
<220> FEATURE:
<223> OTHER INFORMATION: Synthetic

<400> SEQUENCE: 6
ttgacataga agaggcacaa                                         20

<210> SEQ ID NO 7
<211> LENGTH: 20
<212> TYPE: DNA
<213> ORGANISM: Artificial Sequence
<220> FEATURE:
<223> OTHER INFORMATION: Synthetic

<400> SEQUENCE: 7
ttcgaactcc cgctcgatgg                                         20

<210> SEQ ID NO 8
<211> LENGTH: 20
<212> TYPE: DNA
<213> ORGANISM: Artificial Sequence
<220> FEATURE:
<223> OTHER INFORMATION: Synthetic

<400> SEQUENCE: 8
ctcttcgaac tcccgctcga                                         20

<210> SEQ ID NO 9
<211> LENGTH: 20
<212> TYPE: DNA
<213> ORGANISM: Artificial Sequence
<220> FEATURE:
<223> OTHER INFORMATION: Synthetic
```

```
<400> SEQUENCE: 9
agttggatac tcagcgtcgc                                               20

<210> SEQ ID NO 10
<211> LENGTH: 20
<212> TYPE: DNA
<213> ORGANISM: Artificial Sequence
<220> FEATURE:
<223> OTHER INFORMATION: Synthetic

<400> SEQUENCE: 10
cgagcgggag ttcgaagagt                                               20

<210> SEQ ID NO 11
<211> LENGTH: 20
<212> TYPE: DNA
<213> ORGANISM: Artificial Sequence
<220> FEATURE:
<223> OTHER INFORMATION: Synthetic

<400> SEQUENCE: 11
aactcccgct cgatggtggt                                               20

<210> SEQ ID NO 12
<211> LENGTH: 20
<212> TYPE: DNA
<213> ORGANISM: Artificial Sequence
<220> FEATURE:
<223> OTHER INFORMATION: Synthetic

<400> SEQUENCE: 12
ccgctcgatg gtggtgggca                                               20

<210> SEQ ID NO 13
<211> LENGTH: 20
<212> TYPE: DNA
<213> ORGANISM: Artificial Sequence
<220> FEATURE:
<223> OTHER INFORMATION: Synthetic

<400> SEQUENCE: 13
gaactcccgc tcgatggtgg                                               20

<210> SEQ ID NO 14
<211> LENGTH: 23
<212> TYPE: DNA
<213> ORGANISM: Artificial Sequence
<220> FEATURE:
<223> OTHER INFORMATION: Synthetic

<400> SEQUENCE: 14
ggaaacttgg ccactctatg agg                                           23

<210> SEQ ID NO 15
<211> LENGTH: 23
<212> TYPE: DNA
<213> ORGANISM: Artificial Sequence
<220> FEATURE:
<223> OTHER INFORMATION: Synthetic

<400> SEQUENCE: 15
ccactctatg aggatagtca tgg                                           23

<210> SEQ ID NO 16
```

```
<211> LENGTH: 23
<212> TYPE: DNA
<213> ORGANISM: Artificial Sequence
<220> FEATURE:
<223> OTHER INFORMATION: Synthetic

<400> SEQUENCE: 16
ctcttctatg tcaactaaac tgg                                              23

<210> SEQ ID NO 17
<211> LENGTH: 23
<212> TYPE: DNA
<213> ORGANISM: Artificial Sequence
<220> FEATURE:
<223> OTHER INFORMATION: Synthetic

<400> SEQUENCE: 17
cagtttagtt gacatagaag agg                                              23

<210> SEQ ID NO 18
<211> LENGTH: 23
<212> TYPE: DNA
<213> ORGANISM: Artificial Sequence
<220> FEATURE:
<223> OTHER INFORMATION: Synthetic

<400> SEQUENCE: 18
ttgacataga agaggcacaa agg                                              23

<210> SEQ ID NO 19
<211> LENGTH: 23
<212> TYPE: DNA
<213> ORGANISM: Artificial Sequence
<220> FEATURE:
<223> OTHER INFORMATION: Synthetic

<400> SEQUENCE: 19
ttcgaactcc cgctcgatgg tgg                                              23

<210> SEQ ID NO 20
<211> LENGTH: 23
<212> TYPE: DNA
<213> ORGANISM: Artificial Sequence
<220> FEATURE:
<223> OTHER INFORMATION: Synthetic

<400> SEQUENCE: 20
ctcttcgaac tcccgctcga tgg                                              23

<210> SEQ ID NO 21
<211> LENGTH: 23
<212> TYPE: DNA
<213> ORGANISM: Artificial Sequence
<220> FEATURE:
<223> OTHER INFORMATION: Synthetic

<400> SEQUENCE: 21
agttggatac tcagcgtcgc tgg                                              23

<210> SEQ ID NO 22
<211> LENGTH: 23
<212> TYPE: DNA
<213> ORGANISM: Artificial Sequence
<220> FEATURE:
<223> OTHER INFORMATION: Synthetic
```

-continued

<400> SEQUENCE: 22
cgagcgggag ttcgaagagt tgg                                              23

<210> SEQ ID NO 23
<211> LENGTH: 23
<212> TYPE: DNA
<213> ORGANISM: Artificial Sequence
<220> FEATURE:
<223> OTHER INFORMATION: Synthetic

<400> SEQUENCE: 23
aactcccgct cgatggtggt ggg                                              23

<210> SEQ ID NO 24
<211> LENGTH: 23
<212> TYPE: DNA
<213> ORGANISM: Artificial Sequence
<220> FEATURE:
<223> OTHER INFORMATION: Synthetic

<400> SEQUENCE: 24
ccgctcgatg gtggtgggca tgg                                              23

<210> SEQ ID NO 25
<211> LENGTH: 23
<212> TYPE: DNA
<213> ORGANISM: Artificial Sequence
<220> FEATURE:
<223> OTHER INFORMATION: Synthetic

<400> SEQUENCE: 25
gaactcccgc tcgatggtgg tgg                                              23

<210> SEQ ID NO 26
<211> LENGTH: 100
<212> TYPE: RNA
<213> ORGANISM: Artificial Sequence
<220> FEATURE:
<223> OTHER INFORMATION: Synthetic

<400> SEQUENCE: 26
ggaaacuugg ccacucuaug guuuuagagc uagaaauagc aaguuaaaau aaggcuaguc       60
cguuaucaac uugaaaaagu ggcaccgagu cggugcuuuu                           100

<210> SEQ ID NO 27
<211> LENGTH: 100
<212> TYPE: RNA
<213> ORGANISM: Artificial Sequence
<220> FEATURE:
<223> OTHER INFORMATION: Synthetic
<220> FEATURE:
<221> NAME/KEY: misc_feature
<222> LOCATION: (1)..(4)
<223> OTHER INFORMATION: modified with 2'-O-methyl phosphorothioate
<220> FEATURE:
<221> NAME/KEY: misc_feature
<222> LOCATION: (97)..(100)
<223> OTHER INFORMATION: modified with 2'-O-methyl phosphorothioate

<400> SEQUENCE: 27
ggaaacuugg ccacucuaug guuuuagagc uagaaauagc aaguuaaaau aaggcuaguc       60
cguuaucaac uugaaaaagu ggcaccgagu cggugcuuuu                           100

<210> SEQ ID NO 28

```
<211> LENGTH: 20
<212> TYPE: RNA
<213> ORGANISM: Artificial Sequence
<220> FEATURE:
<223> OTHER INFORMATION: Synthetic

<400> SEQUENCE: 28
ggaaacuugg ccacucuaug                                                     20

<210> SEQ ID NO 29
<211> LENGTH: 20
<212> TYPE: RNA
<213> ORGANISM: Artificial Sequence
<220> FEATURE:
<223> OTHER INFORMATION: Synthetic
<220> FEATURE:
<221> NAME/KEY: misc_feature
<222> LOCATION: (1)..(4)
<223> OTHER INFORMATION: modified with 2'-O-methyl phosphorothioate

<400> SEQUENCE: 29
ggaaacuugg ccacucuaug                                                     20

<210> SEQ ID NO 30
<211> LENGTH: 100
<212> TYPE: RNA
<213> ORGANISM: Artificial Sequence
<220> FEATURE:
<223> OTHER INFORMATION: Synthetic

<400> SEQUENCE: 30
ccacucuaug aggauaguca guuuuagagc uagaaauagc aaguuaaaau aaggcuaguc         60
cguuaucaac uugaaaaagu ggcaccgagu cggugcuuuu                              100

<210> SEQ ID NO 31
<211> LENGTH: 100
<212> TYPE: RNA
<213> ORGANISM: Artificial Sequence
<220> FEATURE:
<223> OTHER INFORMATION: Synthetic
<220> FEATURE:
<221> NAME/KEY: misc_feature
<222> LOCATION: (1)..(4)
<223> OTHER INFORMATION: modified with 2'-O-methyl phosphorothioate
<220> FEATURE:
<221> NAME/KEY: misc_feature
<222> LOCATION: (97)..(100)
<223> OTHER INFORMATION: modified with 2'-O-methyl phosphorothioate

<400> SEQUENCE: 31
ccacucuaug aggauaguca guuuuagagc uagaaauagc aaguuaaaau aaggcuaguc         60
cguuaucaac uugaaaaagu ggcaccgagu cggugcuuuu                              100

<210> SEQ ID NO 32
<211> LENGTH: 20
<212> TYPE: RNA
<213> ORGANISM: Artificial Sequence
<220> FEATURE:
<223> OTHER INFORMATION: Synthetic

<400> SEQUENCE: 32
ccacucuaug aggauaguca                                                     20

<210> SEQ ID NO 33
<211> LENGTH: 20
<212> TYPE: RNA
<213> ORGANISM: Artificial Sequence
```

```
<220> FEATURE:
<223> OTHER INFORMATION: Synthetic
<220> FEATURE:
<221> NAME/KEY: misc_feature
<222> LOCATION: (1)..(4)
<223> OTHER INFORMATION: modified with 2'-O-methyl phosphorothioate

<400> SEQUENCE: 33
ccacucuaug aggauaguca                                                20

<210> SEQ ID NO 34
<211> LENGTH: 100
<212> TYPE: RNA
<213> ORGANISM: Artificial Sequence
<220> FEATURE:
<223> OTHER INFORMATION: Synthetic

<400> SEQUENCE: 34
cucuucuaug ucaacuaaac guuuuagagc uagaaauagc aaguuaaaau aaggcuaguc    60
cguuaucaac uugaaaaagu ggcaccgagu cggugcuuuu                         100

<210> SEQ ID NO 35
<211> LENGTH: 100
<212> TYPE: RNA
<213> ORGANISM: Artificial Sequence
<220> FEATURE:
<223> OTHER INFORMATION: Synthetic
<220> FEATURE:
<221> NAME/KEY: misc_feature
<222> LOCATION: (1)..(4)
<223> OTHER INFORMATION: modified with 2'-O-methyl phosphorothioate
<220> FEATURE:
<221> NAME/KEY: misc_feature
<222> LOCATION: (97)..(100)
<223> OTHER INFORMATION: modified with 2'-O-methyl phosphorothioate

<400> SEQUENCE: 35
cucuucuaug ucaacuaaac guuuuagagc uagaaauagc aaguuaaaau aaggcuaguc    60
cguuaucaac uugaaaaagu ggcaccgagu cggugcuuuu                         100

<210> SEQ ID NO 36
<211> LENGTH: 20
<212> TYPE: RNA
<213> ORGANISM: Artificial Sequence
<220> FEATURE:
<223> OTHER INFORMATION: Synthetic

<400> SEQUENCE: 36
cucuucuaug ucaacuaaac                                                20

<210> SEQ ID NO 37
<211> LENGTH: 20
<212> TYPE: RNA
<213> ORGANISM: Artificial Sequence
<220> FEATURE:
<223> OTHER INFORMATION: Synthetic
<220> FEATURE:
<221> NAME/KEY: misc_feature
<222> LOCATION: (1)..(4)
<223> OTHER INFORMATION: modified with 2'-O-methyl phosphorothioate

<400> SEQUENCE: 37
cucuucuaug ucaacuaaac                                                20

<210> SEQ ID NO 38
<211> LENGTH: 100
<212> TYPE: RNA
```

```
<213> ORGANISM: Artificial Sequence
<220> FEATURE:
<223> OTHER INFORMATION: Synthetic

<400> SEQUENCE: 38
caguuuaguu gacauagaag guuuuagagc uagaaauagc aaguuaaaau aaggcuaguc    60
cguuaucaac uugaaaaagu ggcaccgagu cggugcuuuu                         100

<210> SEQ ID NO 39
<211> LENGTH: 100
<212> TYPE: RNA
<213> ORGANISM: Artificial Sequence
<220> FEATURE:
<223> OTHER INFORMATION: Synthetic
<220> FEATURE:
<221> NAME/KEY: misc_feature
<222> LOCATION: (1)..(4)
<223> OTHER INFORMATION: modified with 2'-O-methyl phosphorothioate
<220> FEATURE:
<221> NAME/KEY: misc_feature
<222> LOCATION: (97)..(100)
<223> OTHER INFORMATION: modified with 2'-O-methyl phosphorothioate

<400> SEQUENCE: 39
caguuuaguu gacauagaag guuuuagagc uagaaauagc aaguuaaaau aaggcuaguc    60
cguuaucaac uugaaaaagu ggcaccgagu cggugcuuuu                         100

<210> SEQ ID NO 40
<211> LENGTH: 20
<212> TYPE: RNA
<213> ORGANISM: Artificial Sequence
<220> FEATURE:
<223> OTHER INFORMATION: Synthetic

<400> SEQUENCE: 40
caguuuaguu gacauagaag                                               20

<210> SEQ ID NO 41
<211> LENGTH: 20
<212> TYPE: RNA
<213> ORGANISM: Artificial Sequence
<220> FEATURE:
<223> OTHER INFORMATION: Synthetic
<220> FEATURE:
<221> NAME/KEY: misc_feature
<222> LOCATION: (1)..(4)
<223> OTHER INFORMATION: modified with 2'-O-methyl phosphorothioate

<400> SEQUENCE: 41
caguuuaguu gacauagaag                                               20

<210> SEQ ID NO 42
<211> LENGTH: 100
<212> TYPE: RNA
<213> ORGANISM: Artificial Sequence
<220> FEATURE:
<223> OTHER INFORMATION: Synthetic

<400> SEQUENCE: 42
uugacauaga agaggcacaa guuuuagagc uagaaauagc aaguuaaaau aaggcuaguc    60
cguuaucaac uugaaaaagu ggcaccgagu cggugcuuuu                         100

<210> SEQ ID NO 43
<211> LENGTH: 100
<212> TYPE: RNA
<213> ORGANISM: Artificial Sequence
```

```
<220> FEATURE:
<223> OTHER INFORMATION: Synthetic
<220> FEATURE:
<221> NAME/KEY: misc_feature
<222> LOCATION: (1)..(4)
<223> OTHER INFORMATION: modified with 2'-O-methyl phosphorothioate
<220> FEATURE:
<221> NAME/KEY: misc_feature
<222> LOCATION: (97)..(100)
<223> OTHER INFORMATION: modified with 2'-O-methyl phosphorothioate

<400> SEQUENCE: 43
uugacauaga agaggcacaa guuuuagagc uagaaauagc aaguuaaaau aaggcuaguc      60
cguuaucaac uugaaaaagu ggcaccgagu cggugcuuuu                          100

<210> SEQ ID NO 44
<211> LENGTH: 20
<212> TYPE: RNA
<213> ORGANISM: Artificial Sequence
<220> FEATURE:
<223> OTHER INFORMATION: Synthetic

<400> SEQUENCE: 44
uugacauaga agaggcacaa                                                 20

<210> SEQ ID NO 45
<211> LENGTH: 20
<212> TYPE: RNA
<213> ORGANISM: Artificial Sequence
<220> FEATURE:
<223> OTHER INFORMATION: Synthetic
<220> FEATURE:
<221> NAME/KEY: misc_feature
<222> LOCATION: (1)..(4)
<223> OTHER INFORMATION: modified with 2'-O-methyl phosphorothioate

<400> SEQUENCE: 45
uugacauaga agaggcacaa                                                 20

<210> SEQ ID NO 46
<211> LENGTH: 100
<212> TYPE: RNA
<213> ORGANISM: Artificial Sequence
<220> FEATURE:
<223> OTHER INFORMATION: Synthetic

<400> SEQUENCE: 46
uucgaacucc cgcucgaugg guuuuagagc uagaaauagc aaguuaaaau aaggcuaguc      60
cguuaucaac uugaaaaagu ggcaccgagu cggugcuuuu                          100

<210> SEQ ID NO 47
<211> LENGTH: 100
<212> TYPE: RNA
<213> ORGANISM: Artificial Sequence
<220> FEATURE:
<223> OTHER INFORMATION: Synthetic
<220> FEATURE:
<221> NAME/KEY: misc_feature
<222> LOCATION: (1)..(4)
<223> OTHER INFORMATION: modified with 2'-O-methyl phosphorothioate
<220> FEATURE:
<221> NAME/KEY: misc_feature
<222> LOCATION: (97)..(100)
<223> OTHER INFORMATION: modified with 2'-O-methyl phosphorothioate
```

<400> SEQUENCE: 47
uucgaacucc cgcucgaugg guuuuagagc uagaaauagc aaguuaaaau aaggcuaguc    60
cguuaucaac uugaaaaagu ggcaccgagu cggugcuuuu                         100

<210> SEQ ID NO 48
<211> LENGTH: 20
<212> TYPE: RNA
<213> ORGANISM: Artificial Sequence
<220> FEATURE:
<223> OTHER INFORMATION: Synthetic

<400> SEQUENCE: 48
uucgaacucc cgcucgaugg                                                20

<210> SEQ ID NO 49
<211> LENGTH: 20
<212> TYPE: RNA
<213> ORGANISM: Artificial Sequence
<220> FEATURE:
<223> OTHER INFORMATION: Synthetic
<220> FEATURE:
<221> NAME/KEY: misc_feature
<222> LOCATION: (1)..(4)
<223> OTHER INFORMATION: modified with 2'-O-methyl phosphorothioate

<400> SEQUENCE: 49
uucgaacucc cgcucgaugg                                                20

<210> SEQ ID NO 50
<211> LENGTH: 100
<212> TYPE: RNA
<213> ORGANISM: Artificial Sequence
<220> FEATURE:
<223> OTHER INFORMATION: Synthetic

<400> SEQUENCE: 50
cucuucgaac ucccgcucga guuuuagagc uagaaauagc aaguuaaaau aaggcuaguc    60
cguuaucaac uugaaaaagu ggcaccgagu cggugcuuuu                         100

<210> SEQ ID NO 51
<211> LENGTH: 100
<212> TYPE: RNA
<213> ORGANISM: Artificial Sequence
<220> FEATURE:
<223> OTHER INFORMATION: Synthetic
<220> FEATURE:
<221> NAME/KEY: misc_feature
<222> LOCATION: (1)..(4)
<223> OTHER INFORMATION: modified with 2'-O-methyl phosphorothioate
<220> FEATURE:
<221> NAME/KEY: misc_feature
<222> LOCATION: (97)..(100)
<223> OTHER INFORMATION: modified with 2'-O-methyl phosphorothioate

<400> SEQUENCE: 51
cucuucgaac ucccgcucga guuuuagagc uagaaauagc aaguuaaaau aaggcuaguc    60
cguuaucaac uugaaaaagu ggcaccgagu cggugcuuuu                         100

<210> SEQ ID NO 52
<211> LENGTH: 20
<212> TYPE: RNA
<213> ORGANISM: Artificial Sequence
<220> FEATURE:
<223> OTHER INFORMATION: Synthetic

```
<400> SEQUENCE: 52
cucuucgaac ucccgcucga                                                    20

<210> SEQ ID NO 53
<211> LENGTH: 20
<212> TYPE: RNA
<213> ORGANISM: Artificial Sequence
<220> FEATURE:
<223> OTHER INFORMATION: Synthetic
<220> FEATURE:
<221> NAME/KEY: misc_feature
<222> LOCATION: (1)..(4)
<223> OTHER INFORMATION: modified with 2'-O-methyl phosphorothioate

<400> SEQUENCE: 53
cucuucgaac ucccgcucga                                                    20

<210> SEQ ID NO 54
<211> LENGTH: 100
<212> TYPE: RNA
<213> ORGANISM: Artificial Sequence
<220> FEATURE:
<223> OTHER INFORMATION: Synthetic

<400> SEQUENCE: 54
aguuggauac ucagcgucgc guuuuagagc uagaaauagc aaguuaaaau aaggcuaguc         60
cguuaucaac uugaaaaagu ggcaccgagu cggugcuuuu                             100

<210> SEQ ID NO 55
<211> LENGTH: 100
<212> TYPE: RNA
<213> ORGANISM: Artificial Sequence
<220> FEATURE:
<223> OTHER INFORMATION: Synthetic
<220> FEATURE:
<221> NAME/KEY: misc_feature
<222> LOCATION: (1)..(4)
<223> OTHER INFORMATION: modified with 2'-O-methyl phosphorothioate
<220> FEATURE:
<221> NAME/KEY: misc_feature
<222> LOCATION: (97)..(100)
<223> OTHER INFORMATION: modified with 2'-O-methyl phosphorothioate

<400> SEQUENCE: 55
aguuggauac ucagcgucgc guuuuagagc uagaaauagc aaguuaaaau aaggcuaguc         60
cguuaucaac uugaaaaagu ggcaccgagu cggugcuuuu                             100

<210> SEQ ID NO 56
<211> LENGTH: 20
<212> TYPE: RNA
<213> ORGANISM: Artificial Sequence
<220> FEATURE:
<223> OTHER INFORMATION: Synthetic

<400> SEQUENCE: 56
aguuggauac ucagcgucgc                                                    20

<210> SEQ ID NO 57
<211> LENGTH: 20
<212> TYPE: RNA
<213> ORGANISM: Artificial Sequence
<220> FEATURE:
<223> OTHER INFORMATION: Synthetic
<220> FEATURE:
<221> NAME/KEY: misc_feature
<222> LOCATION: (1)..(4)
```

<223> OTHER INFORMATION: modified with 2'-O-methyl phosphorothioate

<400> SEQUENCE: 57
aguuggauac ucagcgucgc                                           20

<210> SEQ ID NO 58
<211> LENGTH: 100
<212> TYPE: RNA
<213> ORGANISM: Artificial Sequence
<220> FEATURE:
<223> OTHER INFORMATION: Synthetic

<400> SEQUENCE: 58
cgagcgggag uucgaagagu guuuuagagc uagaaauagc aaguuaaaau aaggcuaguc    60
cguuaucaac uugaaaaagu ggcaccgagu cggugcuuuu                        100

<210> SEQ ID NO 59
<211> LENGTH: 100
<212> TYPE: RNA
<213> ORGANISM: Artificial Sequence
<220> FEATURE:
<223> OTHER INFORMATION: Synthetic
<220> FEATURE:
<221> NAME/KEY: misc_feature
<222> LOCATION: (1)..(4)
<223> OTHER INFORMATION: modified with 2'-O-methyl phosphorothioate
<220> FEATURE:
<221> NAME/KEY: misc_feature
<222> LOCATION: (97)..(100)
<223> OTHER INFORMATION: modified with 2'-O-methyl phosphorothioate

<400> SEQUENCE: 59
cgagcgggag uucgaagagu guuuuagagc uagaaauagc aaguuaaaau aaggcuaguc    60
cguuaucaac uugaaaaagu ggcaccgagu cggugcuuuu                        100

<210> SEQ ID NO 60
<211> LENGTH: 20
<212> TYPE: RNA
<213> ORGANISM: Artificial Sequence
<220> FEATURE:
<223> OTHER INFORMATION: Synthetic

<400> SEQUENCE: 60
cgagcgggag uucgaagagu                                           20

<210> SEQ ID NO 61
<211> LENGTH: 20
<212> TYPE: RNA
<213> ORGANISM: Artificial Sequence
<220> FEATURE:
<223> OTHER INFORMATION: Synthetic
<220> FEATURE:
<221> NAME/KEY: misc_feature
<222> LOCATION: (1)..(4)
<223> OTHER INFORMATION: modified with 2'-O-methyl phosphorothioate

<400> SEQUENCE: 61
cgagcgggag uucgaagagu                                           20

<210> SEQ ID NO 62
<211> LENGTH: 100
<212> TYPE: RNA
<213> ORGANISM: Artificial Sequence
<220> FEATURE:
<223> OTHER INFORMATION: Synthetic -continued

<400> SEQUENCE: 62
aacucccgcu cgaugguggu guuuuagagc uagaaauagc aaguuaaaau aaggcuaguc    60
cguuaucaac uugaaaaagu ggcaccgagu cggugcuuuu    100

<210> SEQ ID NO 63
<211> LENGTH: 100
<212> TYPE: RNA
<213> ORGANISM: Artificial Sequence
<220> FEATURE:
<223> OTHER INFORMATION: Synthetic
<220> FEATURE:
<221> NAME/KEY: misc_feature
<222> LOCATION: (1)..(4)
<223> OTHER INFORMATION: modified with 2'-O-methyl phosphorothioate
<220> FEATURE:
<221> NAME/KEY: misc_feature
<222> LOCATION: (97)..(100)
<223> OTHER INFORMATION: modified with 2'-O-methyl phosphorothioate

<400> SEQUENCE: 63
aacucccgcu cgaugguggu guuuuagagc uagaaauagc aaguuaaaau aaggcuaguc    60
cguuaucaac uugaaaaagu ggcaccgagu cggugcuuuu    100

<210> SEQ ID NO 64
<211> LENGTH: 20
<212> TYPE: RNA
<213> ORGANISM: Artificial Sequence
<220> FEATURE:
<223> OTHER INFORMATION: Synthetic

<400> SEQUENCE: 64
aacucccgcu cgaugguggu    20

<210> SEQ ID NO 65
<211> LENGTH: 20
<212> TYPE: RNA
<213> ORGANISM: Artificial Sequence
<220> FEATURE:
<223> OTHER INFORMATION: Synthetic
<220> FEATURE:
<221> NAME/KEY: misc_feature
<222> LOCATION: (1)..(4)
<223> OTHER INFORMATION: modified with 2'-O-methyl phosphorothioate

<400> SEQUENCE: 65
aacucccgcu cgaugguggu    20

<210> SEQ ID NO 66
<211> LENGTH: 20
<212> TYPE: RNA
<213> ORGANISM: Artificial Sequence
<220> FEATURE:
<223> OTHER INFORMATION: Synthetic

<400> SEQUENCE: 66
ccgcucgaug gugguggca    20

<210> SEQ ID NO 67
<211> LENGTH: 20
<212> TYPE: RNA
<213> ORGANISM: Artificial Sequence
<220> FEATURE:
<223> OTHER INFORMATION: Synthetic
<220> FEATURE:
<221> NAME/KEY: misc_feature
<222> LOCATION: (1)..(4)

<223> OTHER INFORMATION: modified with 2'-O-methyl phosphorothioate

<400> SEQUENCE: 67
ccgcucgaug gugguggca					20

<210> SEQ ID NO 68
<211> LENGTH: 100
<212> TYPE: RNA
<213> ORGANISM: Artificial Sequence
<220> FEATURE:
<223> OTHER INFORMATION: Synthetic

<400> SEQUENCE: 68
gaacucccgc ucgauggugg guuuuagagc uagaaauagc aaguuaaaau aaggcuaguc					60 cguuaucaac uugaaaaagu ggcaccgagu cggugcuuuu					100

<210> SEQ ID NO 69
<211> LENGTH: 100
<212> TYPE: RNA
<213> ORGANISM: Artificial Sequence
<220> FEATURE:
<223> OTHER INFORMATION: Synthetic
<220> FEATURE:
<221> NAME/KEY: misc_feature
<222> LOCATION: (1)..(4)
<223> OTHER INFORMATION: modified with 2'-O-methyl phosphorothioate
<220> FEATURE:
<221> NAME/KEY: misc_feature
<222> LOCATION: (97)..(100)
<223> OTHER INFORMATION: modified with 2'-O-methyl phosphorothioate

<400> SEQUENCE: 69
gaacucccgc ucgauggugg guuuuagagc uagaaauagc aaguuaaaau aaggcuaguc					60 cguuaucaac uugaaaaagu ggcaccgagu cggugcuuuu					100

<210> SEQ ID NO 70
<211> LENGTH: 20
<212> TYPE: RNA
<213> ORGANISM: Artificial Sequence
<220> FEATURE:
<223> OTHER INFORMATION: Synthetic

<400> SEQUENCE: 70
gaacucccgc ucgauggugg					20

<210> SEQ ID NO 71
<211> LENGTH: 20
<212> TYPE: RNA
<213> ORGANISM: Artificial Sequence
<220> FEATURE:
<223> OTHER INFORMATION: Synthetic
<220> FEATURE:
<221> NAME/KEY: misc_feature
<222> LOCATION: (1)..(4)
<223> OTHER INFORMATION: modified with 2'-O-methyl phosphorothioate

<400> SEQUENCE: 71
gaacucccgc ucgauggugg					20

<210> SEQ ID NO 72
<211> LENGTH: 100
<212> TYPE: RNA
<213> ORGANISM: Artificial Sequence
<220> FEATURE:
<223> OTHER INFORMATION: Synthetic
<220> FEATURE:
<221> NAME/KEY: misc_feature

```
<222> LOCATION: (1)..(4)
<223> OTHER INFORMATION: modified with 2'-O-methyl phosphorothioate
<220> FEATURE:
<221> NAME/KEY: misc_feature
<222> LOCATION: (97)..(100)
<223> OTHER INFORMATION: modified with 2'-O-methyl phosphorothioate

<400> SEQUENCE: 72 gcuuggucc cauuggucgc guuuuagagc uagaaauagc aaguuaaaau aaggcuaguc    60
cguuaucaac uugaaaaagu ggcaccgagu cggugcuuuu                       100

<210> SEQ ID NO 73
<211> LENGTH: 100
<212> TYPE: RNA
<213> ORGANISM: Artificial Sequence
<220> FEATURE:
<223> OTHER INFORMATION: Synthetic

<400> SEQUENCE: 73 gcuuggucc cauuggucgc guuuuagagc uagaaauagc aaguuaaaau aaggcuaguc    60
cguuaucaac uugaaaaagu ggcaccgagu cggugcuuuu                       100

<210> SEQ ID NO 74
<211> LENGTH: 20
<212> TYPE: RNA
<213> ORGANISM: Artificial Sequence
<220> FEATURE:
<223> OTHER INFORMATION: Synthetic
<220> FEATURE:
<221> NAME/KEY: misc_feature
<222> LOCATION: (1)..(4)
<223> OTHER INFORMATION: modified with 2'-O-methyl phosphorothioate

<400> SEQUENCE: 74 gcuuggucc cauuggucgc                                               20

<210> SEQ ID NO 75
<211> LENGTH: 20
<212> TYPE: RNA
<213> ORGANISM: Artificial Sequence
<220> FEATURE:
<223> OTHER INFORMATION: Synthetic

<400> SEQUENCE: 75 gcuuggucc cauuggucgc                                               20

<210> SEQ ID NO 76
<211> LENGTH: 100
<212> TYPE: RNA
<213> ORGANISM: Artificial Sequence
<220> FEATURE:
<223> OTHER INFORMATION: Synthetic
<220> FEATURE:
<221> NAME/KEY: misc_feature
<222> LOCATION: (1)..(4)
<223> OTHER INFORMATION: modified with 2'-O-methyl phosphorothioate
<220> FEATURE:
<221> NAME/KEY: misc_feature
<222> LOCATION: (97)..(100)
<223> OTHER INFORMATION: modified with 2'-O-methyl phosphorothioate

<400> SEQUENCE: 76
agagcaacag ugcuguggcc guuuuagagc uagaaauagc aaguuaaaau aaggcuaguc    60
cguuaucaac uugaaaaagu ggcaccgagu cggugcuuuu                        100

<210> SEQ ID NO 77
```

-continued

```
<211> LENGTH: 100
<212> TYPE: RNA
<213> ORGANISM: Artificial Sequence
<220> FEATURE:
<223> OTHER INFORMATION: Synthetic

<400> SEQUENCE: 77
agagcaacag ugcuguggcc guuuuagagc uagaaauagc aaguuaaaau aaggcuaguc    60
cguuaucaac uugaaaaagu ggcaccgagu cggugcuuuu                         100

<210> SEQ ID NO 78
<211> LENGTH: 20
<212> TYPE: RNA
<213> ORGANISM: Artificial Sequence
<220> FEATURE:
<223> OTHER INFORMATION: Synthetic
<220> FEATURE:
<221> NAME/KEY: misc_feature
<222> LOCATION: (1)..(4)
<223> OTHER INFORMATION: modified with 2'-O-methyl phosphorothioate

<400> SEQUENCE: 78
agagcaacag ugcuguggcc                                                20

<210> SEQ ID NO 79
<211> LENGTH: 20
<212> TYPE: RNA
<213> ORGANISM: Artificial Sequence
<220> FEATURE:
<223> OTHER INFORMATION: Synthetic

<400> SEQUENCE: 79
agagcaacag ugcuguggcc                                                20

<210> SEQ ID NO 80
<211> LENGTH: 100
<212> TYPE: RNA
<213> ORGANISM: Artificial Sequence
<220> FEATURE:
<223> OTHER INFORMATION: Synthetic
<220> FEATURE:
<221> NAME/KEY: misc_feature
<222> LOCATION: (1)..(4)
<223> OTHER INFORMATION: modified with 2'-O-methyl phosphorothioate
<220> FEATURE:
<221> NAME/KEY: misc_feature
<222> LOCATION: (97)..(100)
<223> OTHER INFORMATION: modified with 2'-O-methyl phosphorothioate

<400> SEQUENCE: 80
gcuacucucu cuuucuggcc guuuuagagc uagaaauagc aaguuaaaau aaggcuaguc    60
cguuaucaac uugaaaaagu ggcaccgagu cggugcuuuu                         100

<210> SEQ ID NO 81
<211> LENGTH: 100
<212> TYPE: RNA
<213> ORGANISM: Artificial Sequence
<220> FEATURE:
<223> OTHER INFORMATION: Synthetic

<400> SEQUENCE: 81
gcuacucucu cuuucuggcc guuuuagagc uagaaauagc aaguuaaaau aaggcuaguc    60
cguuaucaac uugaaaaagu ggcaccgagu cggugcuuuu                         100

<210> SEQ ID NO 82
<211> LENGTH: 20
```

```
<212> TYPE: RNA
<213> ORGANISM: Artificial Sequence
<220> FEATURE:
<223> OTHER INFORMATION: Synthetic
<220> FEATURE:
<221> NAME/KEY: misc_feature
<222> LOCATION: (1)..(4)
<223> OTHER INFORMATION: modified with 2'-O-methyl phosphorothioate

<400> SEQUENCE: 82
gcuacucucu cuuucuggcc                                              20

<210> SEQ ID NO 83
<211> LENGTH: 20
<212> TYPE: RNA
<213> ORGANISM: Artificial Sequence
<220> FEATURE:
<223> OTHER INFORMATION: Synthetic

<400> SEQUENCE: 83
gcuacucucu cuuucuggcc                                              20

<210> SEQ ID NO 84
<211> LENGTH: 23
<212> TYPE: DNA
<213> ORGANISM: Artificial Sequence
<220> FEATURE:
<223> OTHER INFORMATION: Synthetic

<400> SEQUENCE: 84
gctttggtcc cattggtcgc ggg                                          23

<210> SEQ ID NO 85
<211> LENGTH: 20
<212> TYPE: DNA
<213> ORGANISM: Artificial Sequence
<220> FEATURE:
<223> OTHER INFORMATION: Synthetic

<400> SEQUENCE: 85
gctttggtcc cattggtcgc                                              20

<210> SEQ ID NO 86
<211> LENGTH: 23
<212> TYPE: DNA
<213> ORGANISM: Artificial Sequence
<220> FEATURE:
<223> OTHER INFORMATION: Synthetic

<400> SEQUENCE: 86
agagcaacag tgctgtggcc tgg                                          23

<210> SEQ ID NO 87
<211> LENGTH: 20
<212> TYPE: DNA
<213> ORGANISM: Artificial Sequence
<220> FEATURE:
<223> OTHER INFORMATION: Synthetic

<400> SEQUENCE: 87
agagcaacag tgctgtggcc                                              20

<210> SEQ ID NO 88
<211> LENGTH: 23
<212> TYPE: DNA
<213> ORGANISM: Artificial Sequence
<220> FEATURE:
```

```
<223> OTHER INFORMATION: Synthetic

<400> SEQUENCE: 88
gctactctct ctttctggcc tgg                                            23

<210> SEQ ID NO 89
<211> LENGTH: 20
<212> TYPE: DNA
<213> ORGANISM: Artificial Sequence
<220> FEATURE:
<223> OTHER INFORMATION: Synthetic

<400> SEQUENCE: 89
gctactctct ctttctggcc                                                20

<210> SEQ ID NO 90
<211> LENGTH: 100
<212> TYPE: RNA
<213> ORGANISM: Artificial Sequence
<220> FEATURE:
<223> OTHER INFORMATION: Synthetic
<220> FEATURE:
<221> NAME/KEY: misc_feature
<222> LOCATION: (1)..(20)
<223> OTHER INFORMATION: n is a, c, g, or u

<400> SEQUENCE: 90
nnnnnnnnnn nnnnnnnnnn guuuuagagc uagaaauagc aaguuaaaau aaggcuaguc    60
cguuaucaac uugaaaaagu ggcaccgagu cggugcuuuu                         100

<210> SEQ ID NO 91
<211> LENGTH: 96
<212> TYPE: RNA
<213> ORGANISM: Artificial Sequence
<220> FEATURE:
<223> OTHER INFORMATION: Synthetic
<220> FEATURE:
<221> NAME/KEY: misc_feature
<222> LOCATION: (1)..(20)
<223> OTHER INFORMATION: n is a, c, g, or u

<400> SEQUENCE: 91
nnnnnnnnnn nnnnnnnnnn guuuuagagc uagaaauagc aaguuaaaau aaggcuaguc    60
cguuaucaac uugaaaaagu ggcaccgagu cggugc                              96

<210> SEQ ID NO 92
<211> LENGTH: 114
<212> TYPE: RNA
<213> ORGANISM: Artificial Sequence
<220> FEATURE:
<223> OTHER INFORMATION: Synthetic
<220> FEATURE:
<221> NAME/KEY: misc_feature
<222> LOCATION: (1)..(17)
<223> OTHER INFORMATION: n is a, c, g, or u
<220> FEATURE:
<221> NAME/KEY: misc_feature
<222> LOCATION: (18)..(30)
<223> OTHER INFORMATION: a, g, c, u, or absent
<220> FEATURE:
<221> NAME/KEY: misc_feature
<222> LOCATION: (108)..(114)
<223> OTHER INFORMATION: u or absent

<400> SEQUENCE: 92
nnnnnnnnnn nnnnnnnnn nnnnnnnnnn guuuuagagc uagaaauagc aaguuaaaau    60
aaggcuaguc cguuaucaac uugaaaaagu ggcaccgagu cggugcuuuu uuuu         114
```

```
<210> SEQ ID NO 93
<211> LENGTH: 19
<212> TYPE: DNA
<213> ORGANISM: Artificial Sequence
<220> FEATURE:
<223> OTHER INFORMATION: Synthetic

<400> SEQUENCE: 93
aagagcaaca aatctgact                                                    19

<210> SEQ ID NO 94
<211> LENGTH: 39
<212> TYPE: DNA
<213> ORGANISM: Artificial Sequence
<220> FEATURE:
<223> OTHER INFORMATION: Synthetic

<400> SEQUENCE: 94
aagagcaaca gtgctgtgcc tggagcaaca aatctgact                              39

<210> SEQ ID NO 95
<211> LENGTH: 33
<212> TYPE: DNA
<213> ORGANISM: Artificial Sequence
<220> FEATURE:
<223> OTHER INFORMATION: Synthetic

<400> SEQUENCE: 95
aagagcaaca gtgctggagc aacaaatctg act                                    33

<210> SEQ ID NO 96
<211> LENGTH: 34
<212> TYPE: DNA
<213> ORGANISM: Artificial Sequence
<220> FEATURE:
<223> OTHER INFORMATION: Synthetic

<400> SEQUENCE: 96
aagagcaaca gtgcctggag caacaaatct gact                                   34

<210> SEQ ID NO 97
<211> LENGTH: 19
<212> TYPE: DNA
<213> ORGANISM: Artificial Sequence
<220> FEATURE:
<223> OTHER INFORMATION: Synthetic

<400> SEQUENCE: 97
aagagcaaca gtgctgact                                                    19

<210> SEQ ID NO 98
<211> LENGTH: 41
<212> TYPE: DNA
<213> ORGANISM: Artificial Sequence
<220> FEATURE:
<223> OTHER INFORMATION: Synthetic

<400> SEQUENCE: 98
aagagcaaca gtgctgtggg cctggagcaa caaatctgac t                           41

<210> SEQ ID NO 99
<211> LENGTH: 38
<212> TYPE: DNA
<213> ORGANISM: Artificial Sequence
<220> FEATURE:
```

<223> OTHER INFORMATION: Synthetic

<400> SEQUENCE: 99
aagagcaaca gtgctggcct ggagcaacaa atctgact                          38

<210> SEQ ID NO 100
<211> LENGTH: 41
<212> TYPE: DNA
<213> ORGANISM: Artificial Sequence
<220> FEATURE:
<223> OTHER INFORMATION: Synthetic

<400> SEQUENCE: 100
aagagcaaca gtgctgtgtg cctggagcaa caaatctgac t                     41

<210> SEQ ID NO 101
<211> LENGTH: 79
<212> TYPE: DNA
<213> ORGANISM: Artificial Sequence
<220> FEATURE:
<223> OTHER INFORMATION: Synthetic

<400> SEQUENCE: 101
cgtggcctta gctgtgctcg cgctactctc tctttctgcc tggaggctat ccagcgtgag   60
tctctcctac cctcccgct                                              79

<210> SEQ ID NO 102
<211> LENGTH: 78
<212> TYPE: DNA
<213> ORGANISM: Artificial Sequence
<220> FEATURE:
<223> OTHER INFORMATION: Synthetic

<400> SEQUENCE: 102
cgtggcctta gctgtgctcg cgctactctc tctttcgcct ggaggctatc cagcgtgagt   60
ctctcctacc ctcccgct                                               78

<210> SEQ ID NO 103
<211> LENGTH: 75
<212> TYPE: DNA
<213> ORGANISM: Artificial Sequence
<220> FEATURE:
<223> OTHER INFORMATION: Synthetic

<400> SEQUENCE: 103
cgtggcctta gctgtgctcg cgctactctc tctttctgga ggctatccag cgtgagtctc   60
tcctaccctc ccgct                                                  75

<210> SEQ ID NO 104
<211> LENGTH: 84
<212> TYPE: DNA
<213> ORGANISM: Artificial Sequence
<220> FEATURE:
<223> OTHER INFORMATION: Synthetic

<400> SEQUENCE: 104
cgtggcctta gctgtgctcg cgctactctc tctttctgga tagcctggag gctatccagc   60
gtgagtctct cctaccctcc cgct                                        84

<210> SEQ ID NO 105
<211> LENGTH: 55
<212> TYPE: DNA
<213> ORGANISM: Artificial Sequence
<220> FEATURE:
<223> OTHER INFORMATION: Synthetic

<400> SEQUENCE: 105
cgtggcctta gctgtgctcg cgctatccag cgtgagtctc tcctaccctc ccgct    55

<210> SEQ ID NO 106
<211> LENGTH: 82
<212> TYPE: DNA
<213> ORGANISM: Artificial Sequence
<220> FEATURE:
<223> OTHER INFORMATION: Synthetic

<400> SEQUENCE: 106
cgtggcctta gctgtgctcg cgctactctc tctttctgtg gcctggaggc tatccagcgt    60
gagtctctcc taccctcccg ct    82

<210> SEQ ID NO 107
<211> LENGTH: 58
<212> TYPE: DNA
<213> ORGANISM: Artificial Sequence
<220> FEATURE:
<223> OTHER INFORMATION: Synthetic

<400> SEQUENCE: 107
cacaccacga ggcagatcac caagcccgcg caatgggacc aaagcagccc gcaggacg    58

<210> SEQ ID NO 108
<211> LENGTH: 61
<212> TYPE: DNA
<213> ORGANISM: Artificial Sequence
<220> FEATURE:
<223> OTHER INFORMATION: Synthetic

<400> SEQUENCE: 108
cacaccacga ggcagatcac caagcccgcg aaccaatggg accaaagcag cccgcaggac    60
g    61

<210> SEQ ID NO 109
<211> LENGTH: 48
<212> TYPE: DNA
<213> ORGANISM: Artificial Sequence
<220> FEATURE:
<223> OTHER INFORMATION: Synthetic

<400> SEQUENCE: 109
cacaccacga ggcagatcac caatgggacc aaagcagccc gcaggacg    48

<210> SEQ ID NO 110
<211> LENGTH: 59
<212> TYPE: DNA
<213> ORGANISM: Artificial Sequence
<220> FEATURE:
<223> OTHER INFORMATION: Synthetic

<400> SEQUENCE: 110
cacaccacga ggcagatcac caagcccgcg ccaatgggac caaagcagcc cgcaggacg    59

<210> SEQ ID NO 111
<211> LENGTH: 59
<212> TYPE: DNA
<213> ORGANISM: Artificial Sequence
<220> FEATURE:
<223> OTHER INFORMATION: Synthetic

<400> SEQUENCE: 111
cacaccacga ggcagatcac caagcccgca ccaatgggac caaagcagcc cgcaggacg    59

<210> SEQ ID NO 112
<211> LENGTH: 35
<212> TYPE: DNA
<213> ORGANISM: Artificial Sequence
<220> FEATURE:
<223> OTHER INFORMATION: Synthetic

<400> SEQUENCE: 112
cacaccacga ggcagatcac caagcccgca ggacg    35

<210> SEQ ID NO 113
<211> LENGTH: 22
<212> TYPE: PRT
<213> ORGANISM: Artificial Sequence
<220> FEATURE:
<223> OTHER INFORMATION: Synthetic

<400> SEQUENCE: 113

Met Leu Leu Leu Val Thr Ser Leu Leu Leu Cys Glu Leu Pro His Pro
1               5                   10                  15

Ala Phe Leu Leu Ile Pro
            20

<210> SEQ ID NO 114
<211> LENGTH: 21
<212> TYPE: PRT
<213> ORGANISM: Artificial Sequence
<220> FEATURE:
<223> OTHER INFORMATION: Synthetic

<400> SEQUENCE: 114

Met Ala Leu Pro Val Thr Ala Leu Leu Leu Pro Leu Ala Leu Leu Leu
1               5                   10                  15

His Ala Ala Arg Pro
            20

<210> SEQ ID NO 115
<211> LENGTH: 23
<212> TYPE: PRT
<213> ORGANISM: Artificial Sequence
<220> FEATURE:
<223> OTHER INFORMATION: Synthetic

<400> SEQUENCE: 115

Ile Tyr Ile Trp Ala Pro Leu Ala Gly Thr Cys Gly Val Leu Leu Leu
1               5                   10                  15

Ser Leu Val Ile Thr Leu Tyr
            20

<210> SEQ ID NO 116
<211> LENGTH: 126
<212> TYPE: DNA
<213> ORGANISM: Artificial Sequence
<220> FEATURE:
<223> OTHER INFORMATION: Synthetic

<400> SEQUENCE: 116
aaacggggca gaaagaaact cctgtatata ttcaaacaac catttatgag accagtacaa    60
actactcaag aggaagatgg ctgtagctgc cgatttccag aagaagaaga aggaggatgt   120
gaactg                                                              126

<210> SEQ ID NO 117
<211> LENGTH: 42
<212> TYPE: PRT
<213> ORGANISM: Artificial Sequence
<220> FEATURE:
<223> OTHER INFORMATION: Synthetic

<400> SEQUENCE: 117

Lys Arg Gly Arg Lys Lys Leu Leu Tyr Ile Phe Lys Gln Pro Phe Met
1               5                   10                  15

Arg Pro Val Gln Thr Thr Gln Glu Glu Asp Gly Cys Ser Cys Arg Phe
            20                  25                  30

Pro Glu Glu Glu Glu Gly Gly Cys Glu Leu
        35                  40

<210> SEQ ID NO 118
<211> LENGTH: 120
<212> TYPE: DNA
<213> ORGANISM: Artificial Sequence
<220> FEATURE:
<223> OTHER INFORMATION: Synthetic

<400> SEQUENCE: 118
tcaaagcgga gtaggttgtt gcattccgat tacatgaata tgactcctcg ccggcctggg      60
ccgacaagaa acattacca accctatgcc cccccacgag acttcgctgc gtacaggtcc     120

<210> SEQ ID NO 119
<211> LENGTH: 40
<212> TYPE: PRT
<213> ORGANISM: Artificial Sequence
<220> FEATURE:
<223> OTHER INFORMATION: Synthetic

<400> SEQUENCE: 119

Ser Lys Arg Ser Arg Leu Leu His Ser Asp Tyr Met Asn Met Thr Pro
1               5                   10                  15

Arg Arg Pro Gly Pro Thr Arg Lys His Tyr Gln Pro Tyr Ala Pro Pro
            20                  25                  30

Arg Asp Phe Ala Ala Tyr Arg Ser
        35                  40

<210> SEQ ID NO 120
<211> LENGTH: 336
<212> TYPE: DNA
<213> ORGANISM: Artificial Sequence
<220> FEATURE:
<223> OTHER INFORMATION: Synthetic

<400> SEQUENCE: 120
cgagtgaagt tttcccgaag cgcagacgct ccggcatatc agcaaggaca gaatcagctg      60
tataacgaac tgaatttggg acgccgcgag gagtatgacg tgcttgataa cgccggggg     120 agagacccgg aaatgggggg taaaccccga agaaagaatc cccaagaagg actctacaat    180
gaactccaga aggataagat ggcggaggcc tactcagaaa taggtatgaa gggcgaacga    240
cgacggggaa aaggtcacga tggcctctac aagggttga gtacggcaac caaagatacg    300
tacgatgcac tgcatatgca ggccctgcct cccaga                              336

<210> SEQ ID NO 121
<211> LENGTH: 112
<212> TYPE: PRT

```
<213> ORGANISM: Artificial Sequence
<220> FEATURE:
<223> OTHER INFORMATION: Synthetic

<400> SEQUENCE: 121

Arg Val Lys Phe Ser Arg Ser Ala Asp Ala Pro Ala Tyr Gln Gln Gly
1               5                   10                  15

Gln Asn Gln Leu Tyr Asn Glu Leu Asn Leu Gly Arg Arg Glu Glu Tyr
            20                  25                  30

Asp Val Leu Asp Lys Arg Arg Gly Arg Asp Pro Glu Met Gly Gly Lys
        35                  40                  45

Pro Arg Arg Lys Asn Pro Gln Glu Gly Leu Tyr Asn Glu Leu Gln Lys
50                  55                  60

Asp Lys Met Ala Glu Ala Tyr Ser Glu Ile Gly Met Lys Gly Glu Arg
65                  70                  75                  80

Arg Arg Gly Lys Gly His Asp Gly Leu Tyr Gln Gly Leu Ser Thr Ala
                85                  90                  95

Thr Lys Asp Thr Tyr Asp Ala Leu His Met Gln Ala Leu Pro Pro Arg
            100                 105                 110

<210> SEQ ID NO 122
<211> LENGTH: 11
<212> TYPE: PRT
<213> ORGANISM: Artificial Sequence
<220> FEATURE:
<223> OTHER INFORMATION: Synthetic

<400> SEQUENCE: 122

Arg Ala Ser Gln Asp Ile Ser Lys Tyr Leu Asn
1               5                   10

<210> SEQ ID NO 123
<211> LENGTH: 7
<212> TYPE: PRT
<213> ORGANISM: Artificial Sequence
<220> FEATURE:
<223> OTHER INFORMATION: Synthetic

<400> SEQUENCE: 123

His Thr Ser Arg Leu His Ser
1               5

<210> SEQ ID NO 124
<211> LENGTH: 9
<212> TYPE: PRT
<213> ORGANISM: Artificial Sequence
<220> FEATURE:
<223> OTHER INFORMATION: Synthetic

<400> SEQUENCE: 124

Gln Gln Gly Asn Thr Leu Pro Tyr Thr
1               5

<210> SEQ ID NO 125
<211> LENGTH: 5
<212> TYPE: PRT
<213> ORGANISM: Artificial Sequence
<220> FEATURE:
<223> OTHER INFORMATION: Synthetic

<400> SEQUENCE: 125

Asp Tyr Gly Val Ser
1               5
```

<210> SEQ ID NO 126
<211> LENGTH: 16
<212> TYPE: PRT
<213> ORGANISM: Artificial Sequence
<220> FEATURE:
<223> OTHER INFORMATION: Synthetic

<400> SEQUENCE: 126

Val Ile Trp Gly Ser Glu Thr Thr Tyr Tyr Asn Ser Ala Leu Lys Ser
1               5                   10                  15

<210> SEQ ID NO 127
<211> LENGTH: 12
<212> TYPE: PRT
<213> ORGANISM: Artificial Sequence
<220> FEATURE:
<223> OTHER INFORMATION: Synthetic

<400> SEQUENCE: 127

His Tyr Tyr Tyr Gly Gly Ser Tyr Ala Met Asp Tyr
1               5                   10

<210> SEQ ID NO 128
<211> LENGTH: 11
<212> TYPE: PRT
<213> ORGANISM: Artificial Sequence
<220> FEATURE:
<223> OTHER INFORMATION: Synthetic

<400> SEQUENCE: 128

Arg Ala Ser Gln Asp Ile Ser Lys Tyr Leu Asn
1               5                   10

<210> SEQ ID NO 129
<211> LENGTH: 7
<212> TYPE: PRT
<213> ORGANISM: Artificial Sequence
<220> FEATURE:
<223> OTHER INFORMATION: Synthetic

<400> SEQUENCE: 129

His Thr Ser Arg Leu His Ser
1               5

<210> SEQ ID NO 130
<211> LENGTH: 9
<212> TYPE: PRT
<213> ORGANISM: Artificial Sequence
<220> FEATURE:
<223> OTHER INFORMATION: Synthetic

<400> SEQUENCE: 130

Gln Gln Gly Asn Thr Leu Pro Tyr Thr
1               5

<210> SEQ ID NO 131
<211> LENGTH: 7
<212> TYPE: PRT
<213> ORGANISM: Artificial Sequence
<220> FEATURE:
<223> OTHER INFORMATION: Synthetic

<400> SEQUENCE: 131

Gly Val Ser Leu Pro Asp Tyr
1               5

<210> SEQ ID NO 132
<211> LENGTH: 5
<212> TYPE: PRT
<213> ORGANISM: Artificial Sequence
<220> FEATURE:
<223> OTHER INFORMATION: Synthetic

<400> SEQUENCE: 132

Trp Gly Ser Glu Thr
1               5

<210> SEQ ID NO 133
<211> LENGTH: 12
<212> TYPE: PRT
<213> ORGANISM: Artificial Sequence
<220> FEATURE:
<223> OTHER INFORMATION: Synthetic

<400> SEQUENCE: 133

His Tyr Tyr Tyr Gly Gly Ser Tyr Ala Met Asp Tyr
1               5                   10

<210> SEQ ID NO 134
<211> LENGTH: 1518
<212> TYPE: DNA
<213> ORGANISM: Artificial Sequence
<220> FEATURE:
<223> OTHER INFORMATION: Synthetic

<400> SEQUENCE: 134
atgcttcttt tggttacgtc tctgttgctt tgcgaacttc ctcatccagc gttcttgctg    60
atccccgata ttcagatgac tcagaccacc agtagcttgt ctgcctcact gggagaccga   120
gtaacaatct cctgcagggc aagtcaagac attagcaaat acctcaattg gtaccagcag   180
aagcccgacg gaacggtaaa actcctcatc tatcatacgt caaggttgca ttccggagta   240
ccgtcacgat tttcaggttc tgggagcgga actgactatt ccttgactat ttcaaacctc   300
gagcaggagg acattgcgac atatttttgt caacaaggta ataccctccc ttacactttc   360
ggaggaggaa ccaaactcga aattaccggg tccaccagtg gctctgggaa gcctggcagt   420
ggagaaggtt ccactaaagg cgaggtgaag ctccaggaga gcggcccggg tctcgttgcc   480
cccagtcaaa gcctctctgt aacgtgcaca gtgagtggtg tatcattgcc tgattatggc   540
gtctcctgga taaggcagcc cccgcgaaag ggtcttgaat ggcttggggt aatatggggc   600
tcagagacaa cgtattataa ctccgctctc aaaagtcgct tgacgataat aaaagataac   660
tccaagagtc aagtttttcct taaaatgaac agtttgcaga ctgacgatac cgctatatat   720
tattgtgcta acattatta ctacggcggt agttacgcga tggattattg ggggcagggg   780
acttctgtca cagtcagtag tgctgctgcc tttgtcccgg tatttctccc agccaaaccg   840
accacgactc ccgccccgcg ccctccgaca cccgctccca ccatcgcctc tcaacctctt   900
agtcttcgcc ccgaggcatg ccgacccgcc gccggggtg ctgttcatac gaggggcttg   960
gacttcgctt gtgatattta catttgggct ccgttggcgg gtacgtgcgg cgtccttttg  1020
ttgtcactcg ttattacttt gtattgtaat cacaggaatc gctcaaagcg gagtaggttg  1080
ttgcattccg attacatgaa tatgactcct cgccggcctg ggccgacaag aaaacattac  1140
caaccctatg cccccccacg agacttcgct gcgtacaggt cccgagtgaa gttttcccga  1200
agcgcagacg ctccggcata tcagcaagga cagaatcagc tgtataacga actgaatttg  1260
ggacgccgcg aggagtatga cgtgcttgat aaacgccggg gagagaccc ggaaatgggg  1320

```
ggtaaacccc gaagaaagaa tccccaagaa ggactctaca atgaactcca gaaggataag   1380
atggcggagg cctactcaga aataggtatg aagggcgaac gacgacgggg aaaaggtcac   1440
gatggcctct accaagggtt gagtacggca accaaagata cgtacgatgc actgcatatg   1500
caggccctgc ctcccaga                                                 1518
```

<210> SEQ ID NO 135
<211> LENGTH: 484
<212> TYPE: PRT
<213> ORGANISM: Artificial Sequence
<220> FEATURE:
<223> OTHER INFORMATION: Synthetic

<400> SEQUENCE: 135

```
Asp Ile Gln Met Thr Gln Thr Thr Ser Ser Leu Ser Ala Ser Leu Gly
1               5                   10                  15

Asp Arg Val Thr Ile Ser Cys Arg Ala Ser Gln Asp Ile Ser Lys Tyr
            20                  25                  30

Leu Asn Trp Tyr Gln Gln Lys Pro Asp Gly Thr Val Lys Leu Leu Ile
        35                  40                  45

Tyr His Thr Ser Arg Leu His Ser Gly Val Pro Ser Arg Phe Ser Gly
    50                  55                  60

Ser Gly Ser Gly Thr Asp Tyr Ser Leu Thr Ile Ser Asn Leu Glu Gln
65                  70                  75                  80

Glu Asp Ile Ala Thr Tyr Phe Cys Gln Gln Gly Asn Thr Leu Pro Tyr
                85                  90                  95

Thr Phe Gly Gly Gly Thr Lys Leu Glu Ile Thr Gly Ser Thr Ser Gly
            100                 105                 110

Ser Gly Lys Pro Gly Ser Gly Glu Gly Ser Thr Lys Gly Glu Val Lys
        115                 120                 125

Leu Gln Glu Ser Gly Pro Gly Leu Val Ala Pro Ser Gln Ser Leu Ser
    130                 135                 140

Val Thr Cys Thr Val Ser Gly Val Ser Leu Pro Asp Tyr Gly Val Ser
145                 150                 155                 160

Trp Ile Arg Gln Pro Pro Arg Lys Gly Leu Glu Trp Leu Gly Val Ile
                165                 170                 175

Trp Gly Ser Glu Thr Thr Tyr Tyr Asn Ser Ala Leu Lys Ser Arg Leu
            180                 185                 190

Thr Ile Ile Lys Asp Asn Ser Lys Ser Gln Val Phe Leu Lys Met Asn
        195                 200                 205

Ser Leu Gln Thr Asp Asp Thr Ala Ile Tyr Tyr Cys Ala Lys His Tyr
    210                 215                 220

Tyr Tyr Gly Gly Ser Tyr Ala Met Asp Tyr Trp Gly Gln Gly Thr Ser
225                 230                 235                 240

Val Thr Val Ser Ser Ala Ala Ala Phe Val Pro Val Phe Leu Pro Ala
                245                 250                 255

Lys Pro Thr Thr Thr Pro Ala Pro Arg Pro Pro Thr Pro Ala Pro Thr
            260                 265                 270

Ile Ala Ser Gln Pro Leu Ser Leu Arg Pro Glu Ala Cys Arg Pro Ala
        275                 280                 285

Ala Gly Gly Ala Val His Thr Arg Gly Leu Asp Phe Ala Cys Asp Ile
    290                 295                 300

Tyr Ile Trp Ala Pro Leu Ala Gly Thr Cys Gly Val Leu Leu Leu Ser
305                 310                 315                 320
```

Leu Val Ile Thr Leu Tyr Cys Asn His Arg Asn Arg Ser Lys Arg Ser
            325                 330                 335

Arg Leu Leu His Ser Asp Tyr Met Asn Met Thr Pro Arg Arg Pro Gly
            340                 345                 350

Pro Thr Arg Lys His Tyr Gln Pro Tyr Ala Pro Pro Arg Asp Phe Ala
            355                 360                 365

Ala Tyr Arg Ser Arg Val Lys Phe Ser Arg Ser Ala Asp Ala Pro Ala
        370                 375                 380

Tyr Gln Gln Gly Gln Asn Gln Leu Tyr Asn Glu Leu Asn Leu Gly Arg
385                 390                 395                 400

Arg Glu Glu Tyr Asp Val Leu Asp Lys Arg Arg Gly Arg Asp Pro Glu
                405                 410                 415

Met Gly Gly Lys Pro Arg Arg Lys Asn Pro Gln Glu Gly Leu Tyr Asn
            420                 425                 430

Glu Leu Gln Lys Asp Lys Met Ala Glu Ala Tyr Ser Glu Ile Gly Met
            435                 440                 445

Lys Gly Glu Arg Arg Arg Gly Lys Gly His Asp Gly Leu Tyr Gln Gly
    450                 455                 460

Leu Ser Thr Ala Thr Lys Asp Thr Tyr Asp Ala Leu His Met Gln Ala
465                 470                 475                 480

Leu Pro Pro Arg

<210> SEQ ID NO 136
<211> LENGTH: 735
<212> TYPE: DNA
<213> ORGANISM: Artificial Sequence
<220> FEATURE:
<223> OTHER INFORMATION: Synthetic

<400> SEQUENCE: 136
gatattcaga tgactcagac caccagtagc ttgtctgcct cactgggaga ccgagtaaca      60
atctcctgca gggcaagtca agacattagc aaatacctca attggtacca gcagaagccc     120
gacggaacgg taaaactcct catctatcat acgtcaaggt tgcattccgg agtaccgtca     180
cgattttcag gttctgggag cggaactgac tattccttga ctatttcaaa cctcgagcag     240
gaggacattg cgacatattt ttgtcaacaa ggtaataccc tcccttacac tttcggagga     300
ggaaccaaac tcgaaattac cgggtccacc agtggctctg ggaagcctgg cagtggagaa     360
ggttccacta aggcgaggt gaagctccag gagagcggcc ccgtctcgt tgcccccagt       420 caaagcctct ctgtaacgtg cacagtgagt ggtgtatcat tgcctgatta tggcgtctcc     480
tggataaggc agcccccgcg aaagggtctt gaatggcttg ggtaatatg gggctcagag      540 acaacgtatt ataactccgc tctcaaaagt cgcttgacga taataaaaga taactccaag     600
agtcaagttt tccttaaaat gaacagtttg cagactgacg ataccgctat atattattgt     660
gctaaacatt attactacgg cggtagttac gcgatggatt attgggggca ggggacttct     720
gtcacagtca gtagt                                                     735

<210> SEQ ID NO 137
<211> LENGTH: 245
<212> TYPE: PRT
<213> ORGANISM: Artificial Sequence
<220> FEATURE:
<223> OTHER INFORMATION: Synthetic

<400> SEQUENCE: 137

```
Asp Ile Gln Met Thr Gln Thr Thr Ser Ser Leu Ser Ala Ser Leu Gly
1               5                   10                  15

Asp Arg Val Thr Ile Ser Cys Arg Ala Ser Gln Asp Ile Ser Lys Tyr
            20                  25                  30

Leu Asn Trp Tyr Gln Gln Lys Pro Asp Gly Thr Val Lys Leu Leu Ile
        35                  40                  45

Tyr His Thr Ser Arg Leu His Ser Gly Val Pro Ser Arg Phe Ser Gly
    50                  55                  60

Ser Gly Ser Gly Thr Asp Tyr Ser Leu Thr Ile Ser Asn Leu Glu Gln
65                  70                  75                  80

Glu Asp Ile Ala Thr Tyr Phe Cys Gln Gln Gly Asn Thr Leu Pro Tyr
                85                  90                  95

Thr Phe Gly Gly Gly Thr Lys Leu Glu Ile Thr Gly Ser Thr Ser Gly
            100                 105                 110

Ser Gly Lys Pro Gly Ser Gly Glu Gly Ser Thr Lys Gly Glu Val Lys
        115                 120                 125

Leu Gln Glu Ser Gly Pro Gly Leu Val Ala Pro Ser Gln Ser Leu Ser
130                 135                 140

Val Thr Cys Thr Val Ser Gly Val Ser Leu Pro Asp Tyr Gly Val Ser
145                 150                 155                 160

Trp Ile Arg Gln Pro Pro Arg Lys Gly Leu Glu Trp Leu Gly Val Ile
                165                 170                 175

Trp Gly Ser Glu Thr Thr Tyr Tyr Asn Ser Ala Leu Lys Ser Arg Leu
            180                 185                 190

Thr Ile Ile Lys Asp Asn Ser Lys Ser Gln Val Phe Leu Lys Met Asn
        195                 200                 205

Ser Leu Gln Thr Asp Asp Thr Ala Ile Tyr Tyr Cys Ala Lys His Tyr
    210                 215                 220

Tyr Tyr Gly Gly Ser Tyr Ala Met Asp Tyr Trp Gly Gln Gly Thr Ser
225                 230                 235                 240

Val Thr Val Ser Ser
                245
```

<210> SEQ ID NO 138
<211> LENGTH: 261
<212> TYPE: DNA
<213> ORGANISM: Artificial Sequence
<220> FEATURE:
<223> OTHER INFORMATION: Synthetic

<400> SEQUENCE: 138

```
gctgctgcct tgtcccggt  atttctccca gccaaaccga ccacgactcc cgcccgcgc    60 cctccgacac ccgctcccac catcgcctct caacctctta gtcttcgccc cgaggcatgc  120
cgacccgccg ccgggggtgc tgttcatacg aggggcttgg acttcgcttg tgatatttac  180
atttgggctc cgttggcggg tacgtgcggc gtccttttgt tgtcactcgt tattactttg  240
tattgtaatc acaggaatcg c                                             261
```

<210> SEQ ID NO 139
<211> LENGTH: 252
<212> TYPE: DNA
<213> ORGANISM: Artificial Sequence
<220> FEATURE:
<223> OTHER INFORMATION: Synthetic -continued

<400> SEQUENCE: 139

```
tttgtcccgg tatttctccc agccaaaccg accacgactc ccgccccgcg ccctccgaca    60
cccgctccca ccatcgcctc tcaacctctt agtcttcgcc ccgaggcatg ccgacccgcc   120
gccgggggtg ctgttcatac gaggggcttg gacttcgctt gtgatattta catttgggct   180
ccgttggcgg gtacgtgcgg cgtccttttg ttgtcactcg ttattacttt gtattgtaat   240
cacaggaatc gc                                                      252
```

<210> SEQ ID NO 140
<211> LENGTH: 84
<212> TYPE: PRT
<213> ORGANISM: Artificial Sequence
<220> FEATURE:
<223> OTHER INFORMATION: Synthetic

<400> SEQUENCE: 140

```
Phe Val Pro Val Phe Leu Pro Ala Lys Pro Thr Thr Thr Pro Ala Pro
1               5                   10                  15

Arg Pro Pro Thr Pro Ala Pro Thr Ile Ala Ser Gln Pro Leu Ser Leu
            20                  25                  30

Arg Pro Glu Ala Cys Arg Pro Ala Ala Gly Gly Ala Val His Thr Arg
        35                  40                  45

Gly Leu Asp Phe Ala Cys Asp Ile Tyr Ile Trp Ala Pro Leu Ala Gly
    50                  55                  60

Thr Cys Gly Val Leu Leu Leu Ser Leu Val Ile Thr Leu Tyr Cys Asn
65                  70                  75                  80

His Arg Asn Arg
```

<210> SEQ ID NO 141
<211> LENGTH: 120
<212> TYPE: PRT
<213> ORGANISM: Artificial Sequence
<220> FEATURE:
<223> OTHER INFORMATION: Synthetic

<400> SEQUENCE: 141

```
Glu Val Lys Leu Gln Glu Ser Gly Pro Gly Leu Val Ala Pro Ser Gln
1               5                   10                  15

Ser Leu Ser Val Thr Cys Thr Val Ser Gly Val Ser Leu Pro Asp Tyr
            20                  25                  30

Gly Val Ser Trp Ile Arg Gln Pro Pro Arg Lys Gly Leu Glu Trp Leu
        35                  40                  45

Gly Val Ile Trp Gly Ser Glu Thr Thr Tyr Tyr Asn Ser Ala Leu Lys
    50                  55                  60

Ser Arg Leu Thr Ile Ile Lys Asp Asn Ser Lys Ser Gln Val Phe Leu
65                  70                  75                  80

Lys Met Asn Ser Leu Gln Thr Asp Asp Thr Ala Ile Tyr Tyr Cys Ala
            85                  90                  95

Lys His Tyr Tyr Tyr Gly Gly Ser Tyr Ala Met Asp Tyr Trp Gly Gln
        100                 105                 110

Gly Thr Ser Val Thr Val Ser Ser
    115                 120
```

<210> SEQ ID NO 142
<211> LENGTH: 107
<212> TYPE: PRT
<213> ORGANISM: Artificial Sequence
<220> FEATURE:

<223> OTHER INFORMATION: Synthetic

<400> SEQUENCE: 142

```
Asp Ile Gln Met Thr Gln Thr Thr Ser Ser Leu Ser Ala Ser Leu Gly
1               5                   10                  15

Asp Arg Val Thr Ile Ser Cys Arg Ala Ser Gln Asp Ile Ser Lys Tyr
            20                  25                  30

Leu Asn Trp Tyr Gln Gln Lys Pro Asp Gly Thr Val Lys Leu Leu Ile
        35                  40                  45

Tyr His Thr Ser Arg Leu His Ser Gly Val Pro Ser Arg Phe Ser Gly
    50                  55                  60

Ser Gly Ser Gly Thr Asp Tyr Ser Leu Thr Ile Ser Asn Leu Glu Gln
65                  70                  75                  80

Glu Asp Ile Ala Thr Tyr Phe Cys Gln Gln Gly Asn Thr Leu Pro Tyr
                85                  90                  95

Thr Phe Gly Gly Gly Thr Lys Leu Glu Ile Thr
            100                 105
```

<210> SEQ ID NO 143
<211> LENGTH: 18
<212> TYPE: PRT
<213> ORGANISM: Artificial Sequence
<220> FEATURE:
<223> OTHER INFORMATION: Synthetic

<400> SEQUENCE: 143

```
Gly Ser Thr Ser Gly Ser Gly Lys Pro Gly Ser Gly Glu Gly Ser Thr
1               5                   10                  15

Lys Gly
```

<210> SEQ ID NO 144
<211> LENGTH: 15
<212> TYPE: PRT
<213> ORGANISM: Artificial Sequence
<220> FEATURE:
<223> OTHER INFORMATION: Synthetic

<400> SEQUENCE: 144

```
Arg Ala Ser Lys Ser Val Ser Thr Ser Gly Tyr Ser Phe Met His
1               5                   10                  15
```

<210> SEQ ID NO 145
<211> LENGTH: 11
<212> TYPE: PRT
<213> ORGANISM: Artificial Sequence
<220> FEATURE:
<223> OTHER INFORMATION: Synthetic

<400> SEQUENCE: 145

```
Ser Lys Ser Val Ser Thr Ser Gly Tyr Ser Phe
1               5                   10
```

<210> SEQ ID NO 146
<211> LENGTH: 7
<212> TYPE: PRT
<213> ORGANISM: Artificial Sequence
<220> FEATURE:
<223> OTHER INFORMATION: Synthetic

<400> SEQUENCE: 146

```
Leu Ala Ser Asn Leu Glu Ser
1               5
```

<210> SEQ ID NO 147
<211> LENGTH: 9
<212> TYPE: PRT
<213> ORGANISM: Artificial Sequence
<220> FEATURE:
<223> OTHER INFORMATION: Synthetic

<400> SEQUENCE: 147

Gln His Ser Arg Glu Val Pro Trp Thr
1               5

<210> SEQ ID NO 148
<211> LENGTH: 6
<212> TYPE: PRT
<213> ORGANISM: Artificial Sequence
<220> FEATURE:
<223> OTHER INFORMATION: Synthetic

<400> SEQUENCE: 148

Ser Arg Glu Val Pro Trp
1               5

<210> SEQ ID NO 149
<211> LENGTH: 5
<212> TYPE: PRT
<213> ORGANISM: Artificial Sequence
<220> FEATURE:
<223> OTHER INFORMATION: Synthetic

<400> SEQUENCE: 149

Asn Tyr Gly Met Asn
1               5

<210> SEQ ID NO 150
<211> LENGTH: 10
<212> TYPE: PRT
<213> ORGANISM: Artificial Sequence
<220> FEATURE:
<223> OTHER INFORMATION: Synthetic

<400> SEQUENCE: 150

Gly Tyr Thr Phe Thr Asn Tyr Gly Met Asn
1               5                   10

<210> SEQ ID NO 151
<211> LENGTH: 17
<212> TYPE: PRT
<213> ORGANISM: Artificial Sequence
<220> FEATURE:
<223> OTHER INFORMATION: Synthetic

<400> SEQUENCE: 151

Trp Ile Asn Thr Tyr Thr Gly Glu Pro Thr Tyr Ala Asp Ala Phe Lys
1               5                   10                  15

Gly

<210> SEQ ID NO 152
<211> LENGTH: 6
<212> TYPE: PRT
<213> ORGANISM: Artificial Sequence
<220> FEATURE:
<223> OTHER INFORMATION: Synthetic

<400> SEQUENCE: 152

Asn Thr Tyr Thr Gly Glu
1               5

<210> SEQ ID NO 153
<211> LENGTH: 9
<212> TYPE: PRT
<213> ORGANISM: Artificial Sequence
<220> FEATURE:
<223> OTHER INFORMATION: Synthetic

<400> SEQUENCE: 153

Asp Tyr Gly Asp Tyr Gly Met Asp Tyr
1               5

<210> SEQ ID NO 154
<211> LENGTH: 14
<212> TYPE: PRT
<213> ORGANISM: Artificial Sequence
<220> FEATURE:
<223> OTHER INFORMATION: Synthetic

<400> SEQUENCE: 154

Cys Ala Arg Asp Tyr Gly Asp Tyr Gly Met Asp Tyr Trp Gly
1               5                   10

<210> SEQ ID NO 155
<211> LENGTH: 487
<212> TYPE: PRT
<213> ORGANISM: Artificial Sequence
<220> FEATURE:
<223> OTHER INFORMATION: Synthetic

<400> SEQUENCE: 155

Gln Val Gln Leu Val Gln Ser Gly Ala Glu Val Lys Lys Pro Gly Ala
1               5                   10                  15

Ser Val Lys Val Ser Cys Lys Ala Ser Gly Tyr Thr Phe Thr Asn Tyr
            20                  25                  30

Gly Met Asn Trp Val Arg Gln Ala Pro Gly Gln Gly Leu Lys Trp Met
        35                  40                  45

Gly Trp Ile Asn Thr Tyr Thr Gly Glu Pro Thr Tyr Ala Asp Ala Phe
    50                  55                  60

Lys Gly Arg Val Thr Met Thr Arg Asp Thr Ser Ile Ser Thr Ala Tyr
65                  70                  75                  80

Met Glu Leu Ser Arg Leu Arg Ser Asp Asp Thr Ala Val Tyr Tyr Cys
                85                  90                  95

Ala Arg Asp Tyr Gly Asp Tyr Gly Met Asp Tyr Trp Gly Gln Gly Thr
            100                 105                 110

Thr Val Thr Val Ser Ser Gly Gly Gly Gly Ser Gly Gly Gly Gly Ser
        115                 120                 125

Gly Gly Gly Gly Ser Gly Asp Ile Val Met Thr Gln Ser Pro Asp Ser
    130                 135                 140

Leu Ala Val Ser Leu Gly Glu Arg Ala Thr Ile Asn Cys Arg Ala Ser
145                 150                 155                 160

Lys Ser Val Ser Thr Ser Gly Tyr Ser Phe Met His Trp Tyr Gln Gln
                165                 170                 175

Lys Pro Gly Gln Pro Pro Lys Leu Leu Ile Tyr Leu Ala Ser Asn Leu
            180                 185                 190

Glu Ser Gly Val Pro Asp Arg Phe Ser Gly Ser Gly Ser Gly Thr Asp
        195                 200                 205

Phe Thr Leu Thr Ile Ser Ser Leu Gln Ala Glu Asp Val Ala Val Tyr
    210                 215                 220

```
Tyr Cys Gln His Ser Arg Glu Val Pro Trp Thr Phe Gly Gln Gly Thr
225                 230                 235                 240

Lys Val Glu Ile Lys Ser Ala Ala Ala Phe Val Pro Val Phe Leu Pro
            245                 250                 255

Ala Lys Pro Thr Thr Thr Pro Ala Pro Arg Pro Pro Thr Pro Ala Pro
            260                 265                 270

Thr Ile Ala Ser Gln Pro Leu Ser Leu Arg Pro Glu Ala Cys Arg Pro
            275                 280                 285

Ala Ala Gly Gly Ala Val His Thr Arg Gly Leu Asp Phe Ala Cys Asp
        290                 295                 300

Ile Tyr Ile Trp Ala Pro Leu Ala Gly Thr Cys Gly Val Leu Leu Leu
305                 310                 315                 320

Ser Leu Val Ile Thr Leu Tyr Cys Asn His Arg Asn Arg Lys Arg Gly
                325                 330                 335

Arg Lys Lys Leu Leu Tyr Ile Phe Lys Gln Pro Phe Met Arg Pro Val
            340                 345                 350

Gln Thr Thr Gln Glu Glu Asp Gly Cys Ser Cys Arg Phe Pro Glu Glu
            355                 360                 365

Glu Glu Gly Gly Cys Glu Leu Arg Val Lys Phe Ser Arg Ser Ala Asp
370                 375                 380

Ala Pro Ala Tyr Gln Gln Gly Gln Asn Gln Leu Tyr Asn Glu Leu Asn
385                 390                 395                 400

Leu Gly Arg Arg Glu Glu Tyr Asp Val Leu Asp Lys Arg Arg Gly Arg
                405                 410                 415

Asp Pro Glu Met Gly Gly Lys Pro Arg Arg Lys Asn Pro Gln Glu Gly
            420                 425                 430

Leu Tyr Asn Glu Leu Gln Lys Asp Lys Met Ala Glu Ala Tyr Ser Glu
            435                 440                 445

Ile Gly Met Lys Gly Glu Arg Arg Arg Gly Lys Gly His Asp Gly Leu
            450                 455                 460

Tyr Gln Gly Leu Ser Thr Ala Thr Lys Asp Thr Tyr Asp Ala Leu His
465                 470                 475                 480

Met Gln Ala Leu Pro Pro Arg
                485

<210> SEQ ID NO 156
<211> LENGTH: 735
<212> TYPE: DNA
<213> ORGANISM: Artificial Sequence
<220> FEATURE:
<223> OTHER INFORMATION: Synthetic

<400> SEQUENCE: 156
gatatagtta tgacccaatc acccgatagt cttgcggtaa gcctggggga gcgagcaaca      60
ataaactgtc gggcatcaaa atccgtcagt acaagcgggt attcattcat gcactggtat     120
caacagaaac ccggtcagcc acccaagctc ctgatttatc ttgcgtctaa tcttgagtcc     180
ggcgtcccag accggttttc cggctccggg agcggcacgg attttactct tactatttct     240
agccttcagg ccgaagatgt ggcggtatac tactgccagc attcaaggga agttccttgg     300
acgttcggtc agggcacgaa agtggaaatt aaaggcgggg ggggatccgg cgggggaggg     360
tctggaggag gtggcagtgg tcaggtccaa ctggtgcagt ccggggcaga ggtaaaaaaa     420
cccggcgcgt ctgttaaggt ttcatgcaag gccagtggat atactttcac caattacgga     480
atgaactggg tgaggcaggc ccctggtcaa ggcctgaaat ggatgggatg gataaacacg     540
```

```
tacaccggtg aacctaccta tgccgatgcc tttaagggtc gggttacgat gacgagagac    600
acctccatat caacagccta catggagctc agcagattga ggagtgacga tacggcagtc    660
tattactgtg caagagacta cggcgattat ggcatggatt actggggcca gggcactaca    720
gtaaccgttt ccagc                                                    735
```

<210> SEQ ID NO 157
<211> LENGTH: 245
<212> TYPE: PRT
<213> ORGANISM: Artificial Sequence
<220> FEATURE:
<223> OTHER INFORMATION: Synthetic

<400> SEQUENCE: 157

```
Asp Ile Val Met Thr Gln Ser Pro Asp Ser Leu Ala Val Ser Leu Gly
1               5                   10                  15

Glu Arg Ala Thr Ile Asn Cys Arg Ala Ser Lys Ser Val Ser Thr Ser
            20                  25                  30

Gly Tyr Ser Phe Met His Trp Tyr Gln Gln Lys Pro Gly Gln Pro Pro
        35                  40                  45

Lys Leu Leu Ile Tyr Leu Ala Ser Asn Leu Glu Ser Gly Val Pro Asp
    50                  55                  60

Arg Phe Ser Gly Ser Gly Ser Gly Thr Asp Phe Thr Leu Thr Ile Ser
65                  70                  75                  80

Ser Leu Gln Ala Glu Asp Val Ala Val Tyr Tyr Cys Gln His Ser Arg
                85                  90                  95

Glu Val Pro Trp Thr Phe Gly Gln Gly Thr Lys Val Glu Ile Lys Gly
            100                 105                 110

Gly Gly Gly Ser Gly Gly Gly Gly Ser Gly Gly Gly Gly Ser Gly Gln
        115                 120                 125

Val Gln Leu Val Gln Ser Gly Ala Glu Val Lys Lys Pro Gly Ala Ser
    130                 135                 140

Val Lys Val Ser Cys Lys Ala Ser Gly Tyr Thr Phe Thr Asn Tyr Gly
145                 150                 155                 160

Met Asn Trp Val Arg Gln Ala Pro Gly Gln Gly Leu Lys Trp Met Gly
                165                 170                 175

Trp Ile Asn Thr Tyr Thr Gly Glu Pro Thr Tyr Ala Asp Ala Phe Lys
            180                 185                 190

Gly Arg Val Thr Met Thr Arg Asp Thr Ser Ile Ser Thr Ala Tyr Met
        195                 200                 205

Glu Leu Ser Arg Leu Arg Ser Asp Asp Thr Ala Val Tyr Tyr Cys Ala
    210                 215                 220

Arg Asp Tyr Gly Asp Tyr Gly Met Asp Tyr Trp Gly Gln Gly Thr Thr
225                 230                 235                 240

Val Thr Val Ser Ser
                245
```

<210> SEQ ID NO 158
<211> LENGTH: 735
<212> TYPE: DNA
<213> ORGANISM: Artificial Sequence
<220> FEATURE:
<223> OTHER INFORMATION: Synthetic

<400> SEQUENCE: 158

```
caggtccagt tggtgcaaag cggggcggag gtgaaaaaac ccggcgcttc cgtgaaggtg    60
tcctgtaagg cgtccggtta tacgttcacg aactacggga tgaattgggt tcgccaagcg   120
```

```
ccggggcagg gactgaaatg gatggggtgg ataaatacct acaccggcga acctacatac    180
gccgacgctt ttaaagggcg agtcactatg acgcgcgata ccagcatatc caccgcatac    240
atggagctgt cccgactccg gtcagacgac acggctgtct actattgtgc tcgggactat    300
ggcgattatg gcatggacta ctgggtcag ggtacgactg taacagttag tagtggtgga    360
ggcggcagtg gcgggggggg aagcggagga ggggttctg gtgacatagt tatgacccaa    420
tccccagata gtttggcggt ttctctgggc gagagggcaa cgattaattg tcgcgcatca    480
aagagcgttt caacgagcgg atattctttt atgcattggt accagcaaaa acccggacaa    540
ccgccgaagc tgctgatcta cttggcttca aatcttgagt ctggggtgcc ggaccgattt    600
tctggtagtg gaagcggaac tgactttacg ctcacgatca gttcactgca ggctgaggat    660
gtagcggtct attattgcca gcacagtaga gaagtcccct ggaccttcgg tcaaggcacg    720
aaagtagaaa ttaaa                                                    735
```

<210> SEQ ID NO 159
<211> LENGTH: 245
<212> TYPE: PRT
<213> ORGANISM: Artificial Sequence
<220> FEATURE:
<223> OTHER INFORMATION: Synthetic

<400> SEQUENCE: 159

```
Gln Val Gln Leu Val Gln Ser Gly Ala Glu Val Lys Lys Pro Gly Ala
 1               5                  10                  15

Ser Val Lys Val Ser Cys Lys Ala Ser Gly Tyr Thr Phe Thr Asn Tyr
            20                  25                  30

Gly Met Asn Trp Val Arg Gln Ala Pro Gly Gln Gly Leu Lys Trp Met
        35                  40                  45

Gly Trp Ile Asn Thr Tyr Thr Gly Glu Pro Thr Tyr Ala Asp Ala Phe
    50                  55                  60

Lys Gly Arg Val Thr Met Thr Arg Asp Thr Ser Ile Ser Thr Ala Tyr
65                  70                  75                  80

Met Glu Leu Ser Arg Leu Arg Ser Asp Asp Thr Ala Val Tyr Tyr Cys
                85                  90                  95

Ala Arg Asp Tyr Gly Asp Tyr Gly Met Asp Tyr Trp Gly Gln Gly Thr
            100                 105                 110

Thr Val Thr Val Ser Ser Gly Gly Gly Gly Ser Gly Gly Gly Gly Ser
        115                 120                 125

Gly Gly Gly Gly Ser Gly Asp Ile Val Met Thr Gln Ser Pro Asp Ser
    130                 135                 140

Leu Ala Val Ser Leu Gly Glu Arg Ala Thr Ile Asn Cys Arg Ala Ser
145                 150                 155                 160

Lys Ser Val Ser Thr Ser Gly Tyr Ser Phe Met His Trp Tyr Gln Gln
                165                 170                 175

Lys Pro Gly Gln Pro Pro Lys Leu Leu Ile Tyr Leu Ala Ser Asn Leu
            180                 185                 190

Glu Ser Gly Val Pro Asp Arg Phe Ser Gly Ser Gly Ser Gly Thr Asp
        195                 200                 205

Phe Thr Leu Thr Ile Ser Ser Leu Gln Ala Glu Asp Val Ala Val Tyr
    210                 215                 220
```

```
Tyr Cys Gln His Ser Arg Glu Val Pro Trp Thr Phe Gly Gln Gly Thr
225                 230                 235                 240

Lys Val Glu Ile Lys
            245

<210> SEQ ID NO 160
<211> LENGTH: 118
<212> TYPE: PRT
<213> ORGANISM: Artificial Sequence
<220> FEATURE:
<223> OTHER INFORMATION: Synthetic

<400> SEQUENCE: 160

Gln Val Gln Leu Val Gln Ser Gly Ala Glu Val Lys Lys Pro Gly Ala
1               5                   10                  15

Ser Val Lys Val Ser Cys Lys Ala Ser Gly Tyr Thr Phe Thr Asn Tyr
            20                  25                  30

Gly Met Asn Trp Val Arg Gln Ala Pro Gly Gln Gly Leu Lys Trp Met
        35                  40                  45

Gly Trp Ile Asn Thr Tyr Thr Gly Glu Pro Tyr Tyr Ala Asp Ala Phe
    50                  55                  60

Lys Gly Arg Val Thr Met Thr Arg Asp Thr Ser Ile Ser Thr Ala Tyr
65                  70                  75                  80

Met Glu Leu Ser Arg Leu Arg Ser Asp Asp Thr Ala Val Tyr Tyr Cys
                85                  90                  95

Ala Arg Asp Tyr Gly Asp Tyr Gly Met Asp Tyr Trp Gly Gln Gly Thr
            100                 105                 110

Thr Val Thr Val Ser Ser
        115

<210> SEQ ID NO 161
<211> LENGTH: 111
<212> TYPE: PRT
<213> ORGANISM: Artificial Sequence
<220> FEATURE:
<223> OTHER INFORMATION: Synthetic

<400> SEQUENCE: 161

Asp Ile Val Met Thr Gln Ser Pro Asp Ser Leu Ala Val Ser Leu Gly
1               5                   10                  15

Glu Arg Ala Thr Ile Asn Cys Arg Ala Ser Lys Ser Val Ser Thr Ser
            20                  25                  30

Gly Tyr Ser Phe Met His Trp Tyr Gln Gln Lys Pro Gly Gln Pro Pro
        35                  40                  45

Lys Leu Leu Ile Tyr Leu Ala Ser Asn Leu Glu Ser Gly Val Pro Asp
    50                  55                  60

Arg Phe Ser Gly Ser Gly Ser Gly Thr Asp Phe Thr Leu Thr Ile Ser
65                  70                  75                  80

Ser Leu Gln Ala Glu Asp Val Ala Val Tyr Tyr Cys Gln His Ser Arg
                85                  90                  95

Glu Val Pro Trp Thr Phe Gly Gln Gly Thr Lys Val Glu Ile Lys
            100                 105                 110

<210> SEQ ID NO 162
<211> LENGTH: 1524
<212> TYPE: DNA
<213> ORGANISM: Artificial Sequence
<220> FEATURE:
<223> OTHER INFORMATION: Synthetic
```

<400> SEQUENCE: 162

```
atggcgcttc cggtgacagc actgctcctc cccttggcgc tgttgctcca cgcagcaagg    60
ccgcaggtgc agctggtgca gagcggagcc gagctcaaga agcccggagc ctccgtgaag   120
gtgagctgca aggccagcgg caacaccctg accaactacg tgatccactg ggtgagacaa   180
gcccccggcc aaaggctgga gtggatgggc tacatcctgc cctacaacga cctgaccaag   240
tacagccaga agttccaggg cagggtgacc atcaccaggg ataagagcgc ctccaccgcc   300
tatatggagc tgagcagcct gaggagcgag gacaccgctg tgtactactg tacaaggtgg   360
gactgggacg gcttctttga ccctggggc agggcacaa cagtgaccgt cagcagcggc   420
ggcggaggca gcggcggcgg cggcagcggc ggaggcggaa gcgaaatcgt gatgacccag   480
agccccgcca cactgagcgt gagccctggc gagagggcca gcatctcctg cagggctagc   540
caaagcctgg tgcacagcaa cggcaacacc cacctgcact ggtaccagca gagacccgga   600
caggctccca gcctgctgat ctacagcgtg agcaacaggt tctccgaggt gcctgccagg   660
tttagcggca gcggaagcgg caccgacttt accctgacca tcagcagcgt ggagtccgag   720
gacttcgccg tgtattactg cagccagacc agccacatcc cttacacctt cggcggcggc   780
accaagctgg agatcaaaag tgctgctgcc tttgtcccgg tatttctccc agccaaaccg   840
accacgactc ccgccccgcg ccctccgaca cccgctccca ccatcgcctc tcaacctctt   900
agtcttcgcc ccgaggcatg ccgacccgcc gccggggtg ctgttcatac gagggcttg   960
gacttcgctt gtgatattta catttgggct ccgttggcgg gtacgtgcgg cgtccttttg  1020
ttgtcactcg ttattacttt gtattgtaat cacaggaatc gcaaacgggg cagaaagaaa  1080
ctcctgtata tattcaaaca accatttatg agaccagtac aaactactca agaggaagat  1140
ggctgtagct gccgatttcc agaagaagaa gaaggaggat gtgaactgcg agtgaagttt  1200
tcccgaagcg cagacgctcc ggcatatcag caaggacaga atcagctgta taacgaactg  1260
aatttgggac gccgcgagga gtatgacgtg cttgataaac gccgggggag agacccggaa  1320
atgggggta accccgaag aaagaatccc caagaaggac tctacaatga actccagaag  1380
gataagatgg cggaggccta ctcagaaata ggtatgaagg cgaacgacg acggggaaaa  1440
ggtcacgatg gcctctacca agggttgagt acggcaacca agatacgta cgatgcactg  1500
catatgcagg ccctgcctcc caga                                         1524
```

<210> SEQ ID NO 163
<211> LENGTH: 487
<212> TYPE: PRT
<213> ORGANISM: Artificial Sequence
<220> FEATURE:
<223> OTHER INFORMATION: Synthetic

<400> SEQUENCE: 163

Gln Val Gln Leu Val Gln Ser Gly Ala Glu Leu Lys Lys Pro Gly Ala
1               5                   10                  15

Ser Val Lys Val Ser Cys Lys Ala Ser Gly Asn Thr Leu Thr Asn Tyr
            20                  25                  30

Val Ile His Trp Val Arg Gln Ala Pro Gly Gln Arg Leu Glu Trp Met
        35                  40                  45

Gly Tyr Ile Leu Pro Tyr Asn Asp Leu Thr Lys Tyr Ser Gln Lys Phe
    50                  55                  60

Gln Gly Arg Val Thr Ile Thr Arg Asp Lys Ser Ala Ser Thr Ala Tyr
65                  70                  75                  80

```
Met Glu Leu Ser Ser Leu Arg Ser Glu Asp Thr Ala Val Tyr Tyr Cys
                85                  90                  95

Thr Arg Trp Asp Trp Asp Gly Phe Phe Asp Pro Trp Gly Gln Gly Thr
                100                 105                 110

Thr Val Thr Val Ser Ser Gly Gly Gly Ser Gly Gly Gly Gly Ser
            115                 120                 125

Gly Gly Gly Gly Ser Glu Ile Val Met Thr Gln Ser Pro Ala Thr Leu
        130                 135                 140

Ser Val Ser Pro Gly Glu Arg Ala Ser Ile Ser Cys Arg Ala Ser Gln
145                 150                 155                 160

Ser Leu Val His Ser Asn Gly Asn Thr His Leu His Trp Tyr Gln Gln
                165                 170                 175

Arg Pro Gly Gln Ala Pro Arg Leu Leu Ile Tyr Ser Val Ser Asn Arg
                180                 185                 190

Phe Ser Glu Val Pro Ala Arg Phe Ser Gly Ser Gly Ser Gly Thr Asp
            195                 200                 205

Phe Thr Leu Thr Ile Ser Ser Val Glu Ser Glu Asp Phe Ala Val Tyr
        210                 215                 220

Tyr Cys Ser Gln Thr Ser His Ile Pro Tyr Thr Phe Gly Gly Gly Thr
225                 230                 235                 240

Lys Leu Glu Ile Lys Ser Ala Ala Ala Phe Val Pro Val Phe Leu Pro
                245                 250                 255

Ala Lys Pro Thr Thr Thr Pro Ala Pro Arg Pro Pro Thr Pro Ala Pro
                260                 265                 270

Thr Ile Ala Ser Gln Pro Leu Ser Leu Arg Pro Glu Ala Cys Arg Pro
                275                 280                 285

Ala Ala Gly Gly Ala Val His Thr Arg Gly Leu Asp Phe Ala Cys Asp
            290                 295                 300

Ile Tyr Ile Trp Ala Pro Leu Ala Gly Thr Cys Gly Val Leu Leu Leu
305                 310                 315                 320

Ser Leu Val Ile Thr Leu Tyr Cys Asn His Arg Asn Arg Lys Arg Gly
                325                 330                 335

Arg Lys Lys Leu Leu Tyr Ile Phe Lys Gln Pro Phe Met Arg Pro Val
                340                 345                 350

Gln Thr Thr Gln Glu Glu Asp Gly Cys Ser Cys Arg Phe Pro Glu Glu
                355                 360                 365

Glu Glu Gly Gly Cys Glu Leu Arg Val Lys Phe Ser Arg Ser Ala Asp
            370                 375                 380

Ala Pro Ala Tyr Gln Gln Gly Gln Asn Gln Leu Tyr Asn Glu Leu Asn
385                 390                 395                 400

Leu Gly Arg Arg Glu Glu Tyr Asp Val Leu Asp Lys Arg Arg Gly Arg
                405                 410                 415

Asp Pro Glu Met Gly Gly Lys Pro Arg Arg Lys Asn Pro Gln Glu Gly
                420                 425                 430

Leu Tyr Asn Glu Leu Gln Lys Asp Lys Met Ala Glu Ala Tyr Ser Glu
                435                 440                 445

Ile Gly Met Lys Gly Glu Arg Arg Arg Gly Lys Gly His Asp Gly Leu
                450                 455                 460

Tyr Gln Gly Leu Ser Thr Ala Thr Lys Asp Thr Tyr Asp Ala Leu His
465                 470                 475                 480

Met Gln Ala Leu Pro Pro Arg
                485
```

<210> SEQ ID NO 164
<211> LENGTH: 735
<212> TYPE: DNA
<213> ORGANISM: Artificial Sequence
<220> FEATURE:
<223> OTHER INFORMATION: Synthetic

<400> SEQUENCE: 164

| | | | | |
|---|---|---|---|---|
| caggtgcagc tggtgcagag cggagccgag ctcaagaagc ccggagcctc cgtgaaggtg | | | | 60 |
| agctgcaagg ccagcggcaa caccctgacc aactacgtga tccactgggt gagacaagcc | | | | 120 |
| cccggccaaa ggctggagtg gatgggctac atcctgccct acaacgacct gaccaagtac | | | | 180 |
| agccagaagt tccagggcag ggtgaccatc accagggata gagcgcctc caccgcctat | | | | 240 |
| atggagctga gcagcctgag gagcgaggac accgctgtgt actactgtac aaggtgggac | | | | 300 |
| tgggacggct tctttgaccc ctggggccag ggcacaacag tgaccgtcag cagcggcggc | | | | 360 |
| ggaggcagcg gcggcggcgg cagcggcgga ggcggaagcg aaatcgtgat gacccagagc | | | | 420 |
| cccgccacac tgagcgtgag ccctggcgag agggccagca tctcctgcag ggctagccaa | | | | 480 |
| agcctggtgc acagcaacgg caacacccac ctgcactggt accagcagag acccggacag | | | | 540 |
| gctcccaggc tgctgatcta cagcgtgagc aacaggttct ccgaggtgcc tgccaggttt | | | | 600 |
| agcggcagcg gaagcggcac cgactttacc ctgaccatca gcagcgtgga gtccgaggac | | | | 660 |
| ttcgccgtgt attactgcag ccagaccagc cacatccctt acaccttcgg cggcggcacc | | | | 720 |
| aagctggaga tcaaa | | | | 735 |

<210> SEQ ID NO 165
<211> LENGTH: 245
<212> TYPE: PRT
<213> ORGANISM: Artificial Sequence
<220> FEATURE:
<223> OTHER INFORMATION: Synthetic

<400> SEQUENCE: 165

Gln Val Gln Leu Val Gln Ser Gly Ala Glu Leu Lys Lys Pro Gly Ala
1               5                   10                  15

Ser Val Lys Val Ser Cys Lys Ala Ser Gly Asn Thr Leu Thr Asn Tyr
            20                  25                  30

Val Ile His Trp Val Arg Gln Ala Pro Gly Gln Arg Leu Glu Trp Met
        35                  40                  45

Gly Tyr Ile Leu Pro Tyr Asn Asp Leu Thr Lys Tyr Ser Gln Lys Phe
    50                  55                  60

Gln Gly Arg Val Thr Ile Thr Arg Asp Lys Ser Ala Ser Thr Ala Tyr
65                  70                  75                  80

Met Glu Leu Ser Ser Leu Arg Ser Glu Asp Thr Ala Val Tyr Tyr Cys
                85                  90                  95

Thr Arg Trp Asp Trp Asp Gly Phe Phe Asp Pro Trp Gly Gln Gly Thr
            100                 105                 110

Thr Val Thr Val Ser Ser Gly Gly Gly Ser Gly Gly Gly Gly Ser
        115                 120                 125

Gly Gly Gly Gly Ser Glu Ile Val Met Thr Gln Ser Pro Ala Thr Leu
    130                 135                 140

Ser Val Ser Pro Gly Glu Arg Ala Ser Ile Ser Cys Arg Ala Ser Gln
145                 150                 155                 160

Ser Leu Val His Ser Asn Gly Asn Thr His Leu His Trp Tyr Gln Gln
                165                 170                 175

```
Arg Pro Gly Gln Ala Pro Arg Leu Leu Ile Tyr Ser Val Ser Asn Arg
            180                 185                 190

Phe Ser Glu Val Pro Ala Arg Phe Ser Gly Ser Gly Ser Gly Thr Asp
        195                 200                 205

Phe Thr Leu Thr Ile Ser Ser Val Glu Ser Glu Asp Phe Ala Val Tyr
    210                 215                 220

Tyr Cys Ser Gln Thr Ser His Ile Pro Tyr Thr Phe Gly Gly Gly Thr
225                 230                 235                 240

Lys Leu Glu Ile Lys
                245

<210> SEQ ID NO 166
<211> LENGTH: 118
<212> TYPE: PRT
<213> ORGANISM: Artificial Sequence
<220> FEATURE:
<223> OTHER INFORMATION: Synthetic

<400> SEQUENCE: 166

Gln Val Gln Leu Val Gln Ser Gly Ala Glu Leu Lys Lys Pro Gly Ala
1               5                   10                  15

Ser Val Lys Val Ser Cys Lys Ala Ser Gly Asn Thr Leu Thr Asn Tyr
            20                  25                  30

Val Ile His Trp Val Arg Gln Ala Pro Gly Gln Arg Leu Glu Trp Met
        35                  40                  45

Gly Tyr Ile Leu Pro Tyr Asn Asp Leu Thr Lys Tyr Ser Gln Lys Phe
    50                  55                  60

Gln Gly Arg Val Thr Ile Thr Arg Asp Lys Ser Ala Ser Thr Ala Tyr
65                  70                  75                  80

Met Glu Leu Ser Ser Leu Arg Ser Glu Asp Thr Ala Val Tyr Tyr Cys
                85                  90                  95

Thr Arg Trp Asp Trp Asp Gly Phe Phe Asp Pro Trp Gly Gln Gly Thr
            100                 105                 110

Thr Val Thr Val Ser Ser
        115

<210> SEQ ID NO 167
<211> LENGTH: 112
<212> TYPE: PRT
<213> ORGANISM: Artificial Sequence
<220> FEATURE:
<223> OTHER INFORMATION: Synthetic

<400> SEQUENCE: 167

Glu Ile Val Met Thr Gln Ser Pro Ala Thr Leu Ser Val Ser Pro Gly
1               5                   10                  15

Glu Arg Ala Ser Ile Ser Cys Arg Ala Ser Gln Ser Leu Val His Ser
            20                  25                  30

Asn Gly Asn Thr His Leu His Trp Tyr Gln Gln Arg Pro Gly Gln Ala
        35                  40                  45

Pro Arg Leu Leu Ile Tyr Ser Val Ser Asn Arg Phe Ser Glu Val Pro
    50                  55                  60

Ala Arg Phe Ser Gly Ser Gly Ser Gly Thr Asp Phe Thr Leu Thr Ile
65                  70                  75                  80

Ser Ser Val Glu Ser Glu Asp Phe Ala Val Tyr Tyr Cys Ser Gln Thr
                85                  90                  95

Ser His Ile Pro Tyr Thr Phe Gly Gly Gly Thr Lys Leu Glu Ile Lys
            100                 105                 110
```

-continued

```
<210> SEQ ID NO 168
<211> LENGTH: 16
<212> TYPE: PRT
<213> ORGANISM: Artificial Sequence
<220> FEATURE:
<223> OTHER INFORMATION: Synthetic

<400> SEQUENCE: 168

Arg Ala Ser Gln Ser Leu Val His Ser Asn Gly Asn Thr His Leu His
1               5                   10                  15

<210> SEQ ID NO 169
<211> LENGTH: 7
<212> TYPE: PRT
<213> ORGANISM: Artificial Sequence
<220> FEATURE:
<223> OTHER INFORMATION: Synthetic

<400> SEQUENCE: 169

Ser Val Ser Asn Arg Phe Ser
1               5

<210> SEQ ID NO 170
<211> LENGTH: 9
<212> TYPE: PRT
<213> ORGANISM: Artificial Sequence
<220> FEATURE:
<223> OTHER INFORMATION: Synthetic

<400> SEQUENCE: 170

Ser Gln Thr Ser His Ile Pro Tyr Thr
1               5

<210> SEQ ID NO 171
<211> LENGTH: 9
<212> TYPE: PRT
<213> ORGANISM: Artificial Sequence
<220> FEATURE:
<223> OTHER INFORMATION: Synthetic

<400> SEQUENCE: 171

Ser Gln Thr Ser His Ile Pro Tyr Thr
1               5

<210> SEQ ID NO 172
<211> LENGTH: 5
<212> TYPE: PRT
<213> ORGANISM: Artificial Sequence
<220> FEATURE:
<223> OTHER INFORMATION: Synthetic

<400> SEQUENCE: 172

Asn Tyr Val Ile His
1               5

<210> SEQ ID NO 173
<211> LENGTH: 7
<212> TYPE: PRT
<213> ORGANISM: Artificial Sequence
<220> FEATURE:
<223> OTHER INFORMATION: Synthetic

<400> SEQUENCE: 173

Gly Asn Thr Leu Thr Asn Tyr
1               5
```

<210> SEQ ID NO 174
<211> LENGTH: 17
<212> TYPE: PRT
<213> ORGANISM: Artificial Sequence
<220> FEATURE:
<223> OTHER INFORMATION: Synthetic

<400> SEQUENCE: 174

Tyr Ile Leu Pro Tyr Asn Asp Leu Thr Lys Tyr Ser Gln Lys Phe Gln
1               5                   10                  15

Gly

<210> SEQ ID NO 175
<211> LENGTH: 6
<212> TYPE: PRT
<213> ORGANISM: Artificial Sequence
<220> FEATURE:
<223> OTHER INFORMATION: Synthetic

<400> SEQUENCE: 175

Leu Pro Tyr Asn Asp Leu
1               5

<210> SEQ ID NO 176
<211> LENGTH: 9
<212> TYPE: PRT
<213> ORGANISM: Artificial Sequence
<220> FEATURE:
<223> OTHER INFORMATION: Synthetic

<400> SEQUENCE: 176

Trp Asp Trp Asp Gly Phe Phe Asp Pro
1               5

<210> SEQ ID NO 177
<211> LENGTH: 9
<212> TYPE: PRT
<213> ORGANISM: Artificial Sequence
<220> FEATURE:
<223> OTHER INFORMATION: Synthetic

<400> SEQUENCE: 177

Trp Asp Trp Asp Gly Phe Phe Asp Pro
1               5

<210> SEQ ID NO 178
<211> LENGTH: 145
<212> TYPE: DNA
<213> ORGANISM: Artificial Sequence
<220> FEATURE:
<223> OTHER INFORMATION: Synthetic

<400> SEQUENCE: 178
ttggccactc cctctctgcg cgctcgctcg ctcactgagg ccgggcgacc aaaggtcgcc      60
cgacgcccgg gctttgcccg ggcggcctca gtgagcgagc gagcgcgcag agagggagtg     120
gccaactcca tcactagggg ttcct                                           145

<210> SEQ ID NO 179
<211> LENGTH: 130
<212> TYPE: DNA
<213> ORGANISM: Artificial Sequence
<220> FEATURE:
<223> OTHER INFORMATION: Synthetic

<400> SEQUENCE: 179

```
cctgcaggca gctgcgcgct cgctcgctca ctgaggccgc ccgggcgtcg ggcgaccttt    60
ggtcgcccgg cctcagtgag cgagcgagcg cgcagagagg gagtggccaa ctccatcact   120
aggggttcct                                                          130
```

<210> SEQ ID NO 180
<211> LENGTH: 145
<212> TYPE: DNA
<213> ORGANISM: Artificial Sequence
<220> FEATURE:
<223> OTHER INFORMATION: Synthetic

<400> SEQUENCE: 180

```
aggaacccct agtgatggag ttggccactc cctctctgcg cgctcgctcg ctcactgagg    60
ccgcccgggc aaagcccggg cgtcgggcga cctttggtcg cccggcctca gtgagcgagc   120
gagcgcgcag agggagtg gccaa                                           145
```

<210> SEQ ID NO 181
<211> LENGTH: 141
<212> TYPE: DNA
<213> ORGANISM: Artificial Sequence
<220> FEATURE:
<223> OTHER INFORMATION: Synthetic

<400> SEQUENCE: 181

```
aggaacccct agtgatggag ttggccactc cctctctgcg cgctcgctcg ctcactgagg    60
ccgggcgacc aaaggtcgcc cgacgcccgg gctttgcccg ggcggcctca gtgagcgagc   120
gagcgcgcag ctgcctgcag g                                             141
```

<210> SEQ ID NO 182
<211> LENGTH: 800
<212> TYPE: DNA
<213> ORGANISM: Artificial Sequence
<220> FEATURE:
<223> OTHER INFORMATION: Synthetic

<400> SEQUENCE: 182

```
gagatgtaag gagctgctgt gacttgctca aggccttata tcgagtaaac ggtagtgctg    60
gggcttagac gcaggtgttc tgatttatag ttcaaaacct ctatcaatga gagagcaatc   120
tcctggtaat gtgatagatt tcccaactta atgccaacat accataaacc tcccattctg   180
ctaatgccca gcctaagttg gggagaccac tccagattcc aagatgtaca gtttgctttg   240
ctgggccttt ttcccatgcc tgcctttact ctgccagagt tatattgctg gggttttgaa   300
gaagatccta ttaaataaaa gaataagcag tattattaag tagccctgca tttcaggttt   360
ccttgagtgg caggccaggc ctggccgtga acgttcactg aaatcatggc ctcttggcca   420
agattgatag cttgtgcctg tccctgagtc ccagtccatc acgagcagct ggtttctaag   480
atgctatttc ccgtataaag catgagaccg tgacttgcca gccccacaga gccccgccct   540
tgtccatcac tggcatctgg actccagcct gggttggggc aaagagggaa atgagatcat   600
gtcctaaccc tgatcctctt gtcccacaga tatccgaaac cctgaccctg ccgtgtacca   660
gctgagagac tctaaatcca gtgacaagtc tgtctgccta ttcaccgatt tgattctca    720
aacaaatgtg tcacaaagta aggattctga tgtgtatatc acagacaaaa ctgtgctaga   780
catgaggtct atggacttca                                               800
```

<210> SEQ ID NO 183
<211> LENGTH: 804
<212> TYPE: DNA
<213> ORGANISM: Artificial Sequence
<220> FEATURE:
<223> OTHER INFORMATION: Synthetic

<400> SEQUENCE: 183

```
tggagcaaca aatctgactt tgcatgtgca aacgccttca acaacagcat tattccagaa      60
gacaccttct tccccagccc aggtaagggc agctttggtg ccttcgcagg ctgtttcctt     120
gcttcaggaa tggccaggtt ctgcccagag ctctggtcaa tgatgtctaa aactcctctg     180
attggtggtc tcggccttat ccattgccac caaaaccctc tttttactaa gaaacagtga     240
gccttgttct ggcagtccag agaatgacac gggaaaaaag cagatgaaga aaggtggca     300
ggagagggca cgtggcccag cctcagtctc tccaactgag ttcctgcctg cctgcctttg     360
ctcagactgt ttgcccctta ctgctcttct aggcctcatt ctaagcccct tctccaagtt     420
gcctctcctt atttctccct gtctgccaaa aaatctttcc cagctcacta agtcagtctc     480
acgcagtcac tcattaaccc accaatcact gattgtgccg gcacatgaat gcaccaggtg     540
ttgaagtgga ggaattaaaa agtcagatga ggggtgtgcc cagaggaagc accattctag     600
ttggggagc ccatctgtca gctgggaaaa gtccaaataa cttcagattg aatgtgttt      660
taactcaggg ttgagaaaac agctaccttc aggacaaaag tcaggaagg gctctctgaa      720
gaaatgctac ttgaagatac cagccctacc aagggcaggg agaggaccct atagaggcct     780
gggacaggag ctcaatgaga aagg                                            804
```

<210> SEQ ID NO 184
<211> LENGTH: 1178
<212> TYPE: DNA
<213> ORGANISM: Artificial Sequence
<220> FEATURE:
<223> OTHER INFORMATION: Synthetic

<400> SEQUENCE: 184

```
ggctccggtg cccgtcagtg ggcagagcgc acatcgccca cagtccccga gaagttgggg      60
ggagggggtcg gcaattgaac cggtgcctag agaaggtggc gcggggtaaa ctgggaaagt    120
gatgtcgtgt actggctccg ccttttttccc gagggtgggg gagaaccgta tataagtgca   180
gtagtcgccg tgaacgttct ttttcgcaac gggtttgccg ccagaacaca ggtaagtgcc    240
gtgtgtggtt cccgcgggcc tggcctcttt acgggttatg gcccttgcgt gccttgaatt    300
acttccactg gctgcagtac gtgattcttg atcccgagct tcgggttgga agtgggtggg    360
agagttcgag gccttgcgct taaggagccc cttcgcctcg tgcttgagtt gaggcctggc    420
ctgggcgctg gggccgccgc gtgcgaatct ggtggcacct tcgcgcctgt ctcgctgctt    480
tcgataagtc tctagccatt taaaattttt gatgacctgc tgcgacgctt tttttctggc    540
aagatagtct tgtaaatgcg ggccaagatc tgcacactgg tatttcggtt tttggggccg    600
cgggcggcga cggggcccgt gcgtcccagc gcacatgttc ggcgaggcgg ggcctgcgag    660
cgcggccacc gagaatcgga cggggtagt ctcaagctgg ccggcctgct ctggtgcctg     720
gcctcgcgcc gccgtgtatc gccccgccct gggcggcaag gctggcccgg tcggcaccag    780
ttgcgtgagc ggaaagatgg ccgcttcccg gccctgctgc agggagctca aaatggagga    840
cgcggcgctc gggagagcgg gcgggtgagt cacccacaca aaggaaaagg ccttttccgt    900
cctcagccgt cgcttcatgt gactccacgg agtaccgggc gccgtccagg cacctcgatt    960
```

```
agttctcgag cttttggagt acgtcgtctt taggttgggg ggaggggttt tatgcgatgg    1020
agtttcccca cactgagtgg gtggagactg aagttaggcc agcttggcac ttgatgtaat    1080
tctccttgga atttgccctt tttgagtttg gatcttggtt cattctcaag cctcagacag    1140
tggttcaaag tttttttctt ccatttcagg tgtcgtga                           1178
```

<210> SEQ ID NO 185
<211> LENGTH: 4358
<212> TYPE: DNA
<213> ORGANISM: Artificial Sequence
<220> FEATURE:
<223> OTHER INFORMATION: Synthetic

<400> SEQUENCE: 185

```
gagatgtaag gagctgctgt gacttgctca aggccttata tcgagtaaac ggtagtgctg     60
gggcttagac gcaggtgttc tgatttatag ttcaaaacct ctatcaatga gagagcaatc    120
tcctggtaat gtgatagatt tcccaactta atgccaacat accataaacc tcccattctg    180
ctaatgccca gcctaagttg gggagaccac tccagattcc aagatgtaca gtttgctttg    240
ctgggccttt ttcccatgcc tgcctttact ctgccagagt tatattgctg ggttttgaa     300 gaagatccta ttaaataaaa gaataagcag tattattaag tagccctgca tttcaggttt    360
ccttgagtgg caggccaggc ctggccgtga acgttcactg aaatcatggc tcttggcca     420 agattgatag cttgtgcctg tccctgagtc ccagtccatc acgagcagct ggtttctaag    480
atgctatttc ccgtataaag catgagaccg tgacttgcca gccccacaga gccccgccct    540
tgtccatcac tggcatctgg actccagcct gggttggggc aaagagggaa atgagatcat    600
gtcctaaccc tgatcctctt gtcccacaga tatccagaac cctgaccctg ccgtgtacca    660
gctgagagac tctaaatcca gtgacaagtc tgtctgccta ttcaccgatt ttgattctca    720
aacaaatgtg tcacaaagta aggattctga tgtgtatatc acagacaaaa ctgtgctaga    780
catgaggtct atggacttca ggctccggtg cccgtcagtg ggcagagcgc acatcgccca    840
cagtccccga gaagttgggg ggagggtcg gcaattgaac cggtgcctag agaaggtggc    900
gcggggtaaa ctgggaaagt gatgtcgtgt actggctccg cctttttccc gagggtgggg    960
gagaaccgta tataagtgca gtagtcgccg tgaacgttct ttttcgcaac gggtttgccg    1020
ccagaacaca ggtaagtgcc gtgtgtggtt cccgcgggcc tggcctcttt acgggttatg    1080
gcccttgcgt gccttgaatt acttccactg gctgcagtac gtgattcttg atcccgagct    1140
tcgggttgga agtgggtggg agagttcgag gccttgcgct taaggagccc cttcgcctcg    1200
tgcttgagtt gaggcctggc ctgggcgctg gggccgccgc gtgcgaatct ggtggcacct    1260
tcgcgcctgt ctcgctgctt tcgataagtc tctagccatt taaaatttt gatgacctgc    1320 tgcgacgctt tttttctggc aagatagtct tgtaaatgcg ggccaagatc tgcacactgg    1380
tatttcggtt ttgggccg cgggcggcga cgggcccgt gcgtcccagc gcacatgttc       1440
ggcgaggcgg ggcctgcgag cgcggccacc gagaatcgga cggggagt ctcaagctgg    1500 ccggcctgct ctggtgcctg gcctcgcgcc gccgtgtatc gccccgccct gggcggcaag    1560
gctggcccgg tcggcaccag ttgcgtgagc ggaaagatgg ccgcttcccg gccctgctgc    1620
agggagctca aaatggagga cgcggcgctc gggagagcgg gcgggtgagt cacccacaca    1680
aaggaaaagg gcctttccgt cctcagccgt cgcttcatgt gactccacgg agtaccgggc    1740
gccgtccagg cacctcgatt agttctcgag cttttggagt acgtcgtctt taggttgggg    1800
```

```
ggaggggttt tatgcgatgg agtttcccca cactgagtgg gtggagactg aagttaggcc    1860
agcttggcac ttgatgtaat tctccttgga atttgccctt tttgagtttg gatcttggtt    1920
cattctcaag cctcagacag tggttcaaag ttttttttctt ccatttcagg tgtcgtgacc   1980
accatgcttc ttttggttac gtctctgttg ctttgcgaac ttcctcatcc agcgttcttg    2040
ctgatccccg atattcagat gactcagacc accagtagct tgtctgcctc actgggagac    2100
cgagtaacaa tctcctgcag ggcaagtcaa gacattagca aatacctcaa ttggtaccag    2160
cagaagcccg acggaacggt aaaactcctc atctatcata cgtcaaggtt gcattccgga    2220
gtaccgtcac gattttcagg ttctgggagc ggaactgact attccttgac tatttcaaac    2280
ctcgagcagg aggacattgc gacatatttt tgtcaacaag gtaatacccctcccttacact    2340
ttcggaggag gaaccaaact cgaaattacc gggtccacca gtggctctgg gaagcctggc    2400
agtggagaag gttccactaa aggcgaggtg aagctccagg agagcggccc cggtctcgtt    2460
gcccccagtc aaagcctctc tgtaacgtgc acagtgagtg gtgtatcatt gcctgattat    2520
ggcgtctcct ggataaggca gccccgcgca agggtcttg aatggcttgg ggtaaatatgg    2580
ggctcagaga caacgtatta taactccgct ctcaaaagtc gcttgacgat aataaaagat    2640
aactccaaga gtcaagtttt ccttaaaatg aacagtttgc agactgacga taccgctata    2700
tattattgtg ctaaacatta ttactacggc ggtagttacg cgatggatta ttggggggcag   2760
gggacttctg tcacagtcag tagtgctgct gcctttgtcc cggtatttct cccagccaaa    2820
ccgaccacga ctcccgcccc cgcgcctccg acacccgctc ccaccatcgc ctctcaacct    2880
cttagtcttc gccccgaggc atgccgaccc gccgccgggg tgctgttca tacgagggggc    2940
ttggacttcg cttgtgatat ttacatttgg gctccgttgg cgggtacgtg cggcgtcctt    3000
ttgttgtcac tcgttattac tttgtattgt aatcacagga atcgctcaaa gcggagtagg    3060
ttgttgcatt ccgattacat gaatatgact cctcgccggc ctgggccgac aagaaaacat    3120
taccaacccct atgccccccc acgagacttc gctgcgtaca ggtcccgagt gaagttttcc    3180
cgaagcgcag acgctccggc atatcagcaa ggacagaatc agctgtataa cgaactgaat    3240
ttgggacgcc gcgaggagta tgacgtgctt gataaacgcc gggggagaga cccggaaatg    3300
gggggtaaac cccgaagaaa gaatccccaa gaaggactct acaatgaact ccagaaggat    3360
aagatggcgg aggcctactc agaaataggt atgaagggcg aacgacgacg gggaaaaggt    3420
cacgatggcc tctaccaagg gttgagtacg gcaaccaaag atacgtacga tgcactgcat    3480
atgcaggccc tgcctcccag ataataataa aatcgctatc catcgaagat ggatgtgtgt    3540
tggttttttg tgtgtggagc aacaaatctg actttgcatg tgcaaacgcc ttcaacaaca    3600
gcattattcc agaagacacc ttcttcccca gcccaggtaa gggcagcttt ggtgccttcg    3660
caggctgttt ccttgcttca ggaatggcca ggttctgccc agagctctgg tcaatgatgt    3720
ctaaaactcc tctgattggt ggtctcggcc ttatccattg ccaccaaaac cctctttta    3780
ctaagaaaca gtgagccttg ttctggcagt ccagagaatg cacgggaaa aaagcagatg    3840
aagagaaggt ggcaggagag ggcacgtggc ccagcctcag tctctccaac tgagttcctg    3900
cctgcctgcc tttgctcaga ctgtttgccc cttactgctc ttctaggcct cattctaagc    3960
cccttctcca agttgcctct ccttatttct ccctgtctgc aaaaaatct ttcccagctc     4020
actaagtcag tctcacgcag tcactcatta acccaccaat cactgattgt gccggcacat    4080
gaatgcacca ggtgttgaag tggaggaatt aaaaagtcag atgaggggtg tgcccagagg    4140
aagcaccatt ctagttgggg gagcccatct gtcagctggg aaaagtccaa ataacttcag    4200
```

```
attggaatgt gttttaactc agggttgaga aaacagctac cttcaggaca aaagtcaggg    4260
aagggctctc tgaagaaatg ctacttgaag ataccagccc taccaagggc agggagagga    4320
ccctatagag gcctgggaca ggagctcaat gagaaagg                            4358
```

<210> SEQ ID NO 186
<211> LENGTH: 4364
<212> TYPE: DNA
<213> ORGANISM: Artificial Sequence
<220> FEATURE:
<223> OTHER INFORMATION: Synthetic

<400> SEQUENCE: 186

```
gagatgtaag gagctgctgt gacttgctca aggccttata tcgagtaaac ggtagtgctg      60
gggcttagac gcaggtgttc tgatttatag ttcaaaacct ctatcaatga gagagcaatc     120
tcctggtaat gtgatagatt tcccaactta atgccaacat accataaacc tcccattctg     180
ctaatgccca gcctaagttg gggagaccac tccagattcc aagatgtaca gtttgctttg     240
ctgggccttt ttcccatgcc tgcctttact ctgccagagt tatattgctg ggttttgaa      300 gaagatccta ttaaataaaa gaataagcag tattattaag tagccctgca tttcaggttt     360
ccttgagtgg caggccaggc ctggccgtga acgttcactg aaatcatggc ctcttggcca     420
agattgatag cttgtgcctg tccctgagtc ccagtccatc acgagcagct ggtttctaag     480
atgctatttc ccgtataaag catgagaccg tgacttgcca gccccacaga gccccgccct     540
tgtccatcac tggcatctgg actccagcct gggttgggggc aaagagggaa atgagatcat    600
gtcctaaccc tgatcctctt gtcccacaga tatccagaac cctgaccctg ccgtgtacca    660
gctgagagac tctaaatcca gtgacaagtc tgtctgccta ttcaccgatt ttgattctca    720
aacaaatgtg tcacaaagta aggattctga tgtgtatatc acagacaaaa ctgtgctaga    780
catgaggtct atggacttca ggctccggtg cccgtcagtg ggcagagcgc acatcgccca    840
cagtccccga gaagttgggg ggagggggtcg gcaattgaac cggtgcctag agaaggtggc    900
gcggggtaaa ctgggaaagt gatgtcgtgt actggctccg cctttttccc gagggtgggg    960
gagaaccgta tataagtgca gtagtcgccg tgaacgttct ttttcgcaac gggtttgccg   1020
ccagaacaca ggtaagtgcc gtgtgtggtt cccgcgggcc tggcctcttt acgggttatg   1080
gcccttgcgt gccttgaatt acttccactg gctgcagtac gtgattcttg atcccgagct   1140
tcgggttgga agtgggtggg agagttcgag gccttgcgct taaggagccc cttcgcctcg   1200
tgcttgagtt gaggcctggc ctgggcgctg gggccgccgc gtgcgaatct ggtggcacct   1260
tcgcgcctgt ctcgctgctt tcgataagtc tctagccatt taaaattttt gatgacctgc   1320
tgcgacgctt tttttctggc aagatagtct tgtaaatgcg ggccaagatc tgcacactgg   1380
tatttcggtt tttggggccg cgggcggcga cggggcccgt gcgtcccagc gcacatgttc   1440
ggcgaggcgg ggcctgcgag cgcggccacc gagaatcgga cggggtagt ctcaagctgg    1500 ccggcctgct ctggtgcctg gcctcgcgcc gccgtgtatc gccccgccct gggcggcaag   1560
gctggcccgg tcggcaccag ttgcgtgagc ggaaagatgg ccgcttcccg gccctgctgc   1620
agggagctca aaatgaagga cgcggcgctc gggagagcgg gcgggtgagt cacccacaca   1680
aaggaaaagg gcctttccgt cctcagccgt cgcttcatgt gactccacgg agtaccgggc   1740
gccgtccagg cacctcgatt agttctcgag ctttttggagt acgtcgtctt taggttgggg   1800
ggaggggttt tatgcgatgg agtttcccca cactgagtgg gtggagactg aagttaggcc   1860
```

```
agcttggcac ttgatgtaat tctccttgga atttgcccct tttgagtttg gatcttggtt   1920
cattctcaag cctcagacag tggttcaaag ttttttttctt ccatttcagg tgtcgtgacc   1980
accatggcgc ttccggtgac agcactgctc ctcccccttgg cgctgttgct ccacgcagca   2040
aggccgcagt tccagttggt gcaaagcggg gcggaggtga aaaacccggg cgcttccgtg   2100
aaggtgtcct gtaaggcgtc cggttatacg ttcacgaact acgggatgaa ttgggttcgc   2160
caagcgccgg ggcagggact gaaatggatg ggtggataa ataccctacac cggcgaaccct  2220 acatacgccg acgcttttaa agggcgagtc actatgacgc gcgataccag catatccacc   2280
gcatacatgg agctgtcccg actccggtca gacgacacgg ctgtctacta ttgtgctcgg   2340
gactatggcg attatggcat ggactactgg ggtcagggta cgactgtaac agttagtagt   2400
ggtggaggcg gcagtggcgg ggggggaagc ggaggagggg gttctggtga catagttatg   2460
acccaatccc cagatagttt ggcggtttct ctgggcgaga gggcaacgat taattgtcgc   2520
gcatcaaaga gcgtttcaac gagcggatat tcttttatgc attggtacca gcaaaaaccc   2580
ggacaaccgc cgaagctgct gatctacttg gcttcaaatc ttgagtctgg ggtgccggac   2640
cgattttctg gtagtggaag cggaactgac tttacgctca cgatcagttc actgcaggct   2700
gaggatgtag cggtctatta ttgccagcac agtagagaag tcccctggac cttcggtcaa   2760
ggcacgaaag tagaaattaa aagtgctgct gcctttgtcc cggtatttct cccagccaaa   2820
ccgaccacga ctcccgcccc gcgccctccg acacccgctc ccaccatcgc ctctcaacct   2880
cttagtcttc gccccgaggc atgccgaccc gccgccgggg gtgctgttca tacgaggggc   2940
ttggacttcg cttgtgatat ttacatttgg gctccgttgg cgggtacgtg cggcgtcctt   3000
ttgttgtcac tcgttattac tttgtattgt aatcacagga atcgcaaacg gggcagaaag   3060
aaactcctgt atatattcaa acaaccatttt atgagaccag tacaaactac tcaagaggaa   3120
gatggctgta gctgccgatt tccagaagaa gaagaaggag gatgtgaact gcgagtgaag   3180
ttttcccgaa gcgcagacgc tccggcatat cagcaaggac agaatcagct gtataacgaa   3240
ctgaatttgg gacgccgcga ggagtatgac gtgcttgata acgccggggg gagagacccg   3300
gaaatggggg gtaaaccccg aagaaagaat ccccaagaag gactctacaa tgaactccag   3360
aaggataaga tggcggaggc ctactcagaa ataggtatga agggcgaacg acgacgggga   3420
aaaggtcacg atggcctcta ccaagggttg agtacggcaa ccaaagatac gtacgatgca   3480
ctgcatatgc aggccctgcc tcccagataa taataaaatc gctatccatc gaagatggat   3540
gtgtgttggt ttttgtgtg tggagcaaca aatctgactt tgcatgtgca aacgccttca   3600
acaacagcat tattccagaa gacaccttct tccccagccc aggtaagggc agctttggtg   3660
ccttcgcagg ctgtttcctt gcttcaggaa tggccaggtt ctgcccagag ctctggtcaa   3720
tgatgtctaa aactcctctg attggtggtc tcggccttat ccattgccac caaaaccctc   3780
tttttactaa gaaacagtga gccttgttct ggcagtccag agaatgacac gggaaaaaag   3840
cagatgaaga gaaggtggca ggagagggca cgtggcccag cctcagtctc tccaactgag   3900
ttcctgcctg cctgcctttg ctcagactgt tgccccctta ctgctcttct aggcctcatt   3960
ctaagcccct tctccaagtt gcctctcctt atttctccct gtctgccaaa aaatctttcc   4020
cagctcacta agtcagtctc acgcagtcac tcattaaccc accaatcact gattgtgccg   4080
gcacatgaat gcaccaggtg ttgaagtgga ggaattaaaa agtcgatgga gggtgtgcc    4140 cagaggaagc accattctag ttgggggagc ccatctgtca gctgggaaaa gtccaaataa   4200
cttcagattg gaatgtgttt taactcaggg ttgagaaaac agctaccttc aggacaaaag   4260
```

```
tcagggaagg gctctctgaa gaaatgctac ttgaagatac cagccctacc aagggcaggg      4320
agaggaccct atagaggcct gggacaggag ctcaatgaga aagg                      4364

<210> SEQ ID NO 187
<211> LENGTH: 4364
<212> TYPE: DNA
<213> ORGANISM: Artificial Sequence
<220> FEATURE:
<223> OTHER INFORMATION: Synthetic

<400> SEQUENCE: 187
gagatgtaag gagctgctgt gacttgctca aggccttata tcgagtaaac ggtagtgctg       60
gggcttagac gcaggtgttc tgatttatag ttcaaaacct ctatcaatga gagagcaatc      120
tcctggtaat gtgatagatt tcccaactta atgccaacat accataaacc tcccattctg      180
ctaatgccca gcctaagttg gggagaccac tccagattcc aagatgtaca gtttgctttg      240
ctgggccttt ttcccatgcc tgcctttact ctgccagagt tatattgctg gggttttgaa      300
gaagatccta ttaaataaaa gaataagcag tattattaag tagccctgca tttcaggttt      360
ccttgagtgg caggccaggc ctggccgtga acgttcactg aaatcatggc ctcttggcca      420
agattgatag cttgtgcctg tccctgagtc ccagtccatc acgagcagct ggtttctaag      480
atgctatttc ccgtataaag catgagaccg tgacttgcca gccccacaga gccccgccct      540
tgtccatcac tggcatctgg actccagcct gggttggggc aaagagggaa atgagatcat      600
gtcctaaccc tgatcctctt gtcccacaga tatccagaac cctgaccctg ccgtgtacca      660
gctgagagac tctaaatcca gtgacaagtc tgtctgccta ttcaccgatt ttgattctca      720
aacaaatgtg tcacaaagta aggattctga tgtgtatatc acagacaaaa ctgtgctaga      780
catgaggtct atggacttca ggctccggtg cccgtcagtg ggcagagcgc acatcgccca      840
cagtccccga gaagtggggg gaggggtcg gcaattgaac cggtgcctag agaaggtggc      900
gcggggtaaa ctgggaaagt gatgtcgtgt actggctccg ccttttttccc gagggtgggg      960 gagaaccgta tataagtgca gtagtcgccg tgaacgttct ttttcgcaac gggttttgccg     1020 ccagaacaca ggtaagtgcc gtgtgtggtt cccgcgggcc tggcctctctt acgggttatg     1080 gcccttgcgt gccttgaatt acttccactg gctgcagtac gtgattcttg atcccgagct     1140
tcgggttgga agtgggtggg agagttcgag gccttgcgct taaggagccc cttcgcctcg     1200
tgcttgagtt gaggcctggc ctgggcgctg gggccgccgc gtgcgaatct ggtggcacct     1260
tcgcgcctgt ctcgctgctt tcgataagtc tctagccatt taaaattttt gatgacctgc     1320
tgcgacgctt tttttctggc aagatagtct tgtaaatgcg ggccaagatc tgcacactgg     1380
tatttcggtt tttggggccg cgggcggcga cgggcccgt gcgtcccagc gcacatgttc      1440
ggcgaggcgg ggcctgcgag cgcggccacc gagaatcgga cggggtagt ctcaagctgg      1500 ccggcctgct ctggtgcctg gcctcgcgcc gccgtgtatc gccccgccct gggcggcaag     1560
gctggcccgg tcggcaccag ttgcgtgagc ggaaagatgg ccgcttcccg gccctgctgc     1620
agggagctca aaatggagga cgcggcgctc gggagagcgg gcgggtgagt cacccacaca     1680
aaggaaaagg gcctttccgt cctcagccgt cgcttcatgt gactccacgg agtaccgggc     1740
gccgtccagg cacctcgatt agttctcgag cttttggagt acgtcgtctt taggttgggg     1800
ggaggggttt tatgcgatgg agtttcccca cactgagtgg gtggagactg aagttaggcc     1860
agcttggcac ttgatgtaat tctccttgga atttgccctt tttgagtttg gatcttggtt     1920
```

| | |
|---|---|
| cattctcaag cctcagacag tggttcaaag ttttttttctt ccatttcagg tgtcgtgacc | 1980 |
| accatggcgc ttccggtgac agcactgctc ctccccttgg cgctgttgct ccacgcagca | 2040 |
| aggccgcagg tgcagctggt gcagagcgga gccgagctca agaagcccgg agcctccgtg | 2100 |
| aaggtgagct gcaaggccag cggcaacacc ctgaccaact acgtgatcca ctgggtgaga | 2160 |
| caagccccg gccaaaggct ggagtggatg ggctacatcc tgccctacaa cgacctgacc | 2220 |
| aagtacagcc agaagttcca gggcagggtg accatcacca gggataagag cgcctccacc | 2280 |
| gcctatatgg agctgagcag cctgaggagc gaggacaccg ctgtgtacta ctgtacaagg | 2340 |
| tgggactggg acggcttctt tgaccccctgg gccagggca aacagtgac cgtcagcagc | 2400 |
| ggcggcggag gcagcggcgg cggcggcagc ggcggaggcg gaagcgaaat cgtgatgacc | 2460 |
| cagagccccg ccacactgag cgtgagccct ggcgagaggg ccagcatctc ctgcagggct | 2520 |
| agccaaagcc tggtgcacag caacggcaac acccacctgc actggtacca gcagagaccc | 2580 |
| ggacaggctc ccaggctgct gatctacagc gtgagcaaca ggttctccga ggtgcctgcc | 2640 |
| aggtttagcg gcagcggaag cggcaccgac tttaccctga ccatcagcag cgtggagtcc | 2700 |
| gaggacttcg ccgtgtatta ctgcagccag accagccaca tcccttacac cttcggcggc | 2760 |
| ggcaccaagc tggagatcaa aagtgctgct gcctttgtcc cggtatttct cccagccaaa | 2820 |
| ccgaccacga ctcccgcccc cgcgccctcg acacccgctc ccaccatcgc ctctcaacct | 2880 |
| cttagtcttc gccccgaggc atgccgaccc gccgcgggg gtgctgttca tacgaggggc | 2940 |
| ttggacttcg cttgtgatat ttacatttgg gctccgttgg cgggtacgtg cggcgtcctt | 3000 |
| ttgttgtcac tcgttattac tttgtattgt aatcacagga atcgcaaacg gggcagaaag | 3060 |
| aaactcctgt atatattcaa acaaccattt atgagaccag tacaaactac tcaagaggaa | 3120 |
| gatggctgta gctgccgatt tccagaagaa gaagaaggag gatgtgaact gcgagtgaag | 3180 |
| ttttcccgaa gcgcagacgc tccggcatat cagcaaggac agaatcagct gtataacgaa | 3240 |
| ctgaatttgg gacgccgcga ggagtatgac gtgcttgata acgccgggg gagagacccg | 3300 |
| gaaatgggg gtaaaccccg aagaaagaat ccccaagaag gactctacaa tgaactccag | 3360 |
| aaggataaga tggcggaggc ctactcagaa ataggtatga agggcgaacg acgacgggga | 3420 |
| aaaggtcacg atggcctcta ccaagggttg agtacggcaa ccaaagatac gtacgatgca | 3480 |
| ctgcatatgc aggccctgcc tcccagataa taataaaatc gctatccatc gaagatggat | 3540 |
| gtgtgttggt ttttgtgtg tggagcaaca aatctgactt tgcatgtgca aacgccttca | 3600 |
| acaacagcat tattccagaa gacaccttct tccccagccc aggtaagggc agctttggtg | 3660 |
| ccttcgcagg ctgtttcctt gcttcaggaa tggccaggtt ctgcccagag ctctggtcaa | 3720 |
| tgatgtctaa aactcctctg attggtggtc tcggccttat ccattgccac caaaccctc | 3780 |
| tttttactaa gaaacagtga gccttgttct ggcagtccag agaatgacac gggaaaaaag | 3840 |
| cagatgaaga gaaggtggca ggagagggca cgtggcccag cctcagtctc tccaactgag | 3900 |
| ttcctgcctg cctgcctttg ctcagactgt ttgcccctta ctgctcttct aggcctcatt | 3960 |
| ctaagcccct tctccaagtt gcctctcctt atttctccct gtctgccaaa aaatctttcc | 4020 |
| cagctcacta agtcagtctc acgcagtcac tcattaaccc accaatcact gattgtgccg | 4080 |
| gcacatgaat gcaccaggtg ttgaagtgga ggaattaaaa agtcagatga ggggtgtgcc | 4140 |
| cagaggaagc accattctag ttgggggagc ccatctgtca gctgggaaaa gtccaaataa | 4200 |

-continued

```
cttcagattg gaatgtgttt taactcaggg ttgagaaaac agctaccttc aggacaaaag    4260
tcagggaagg gctctctgaa gaaatgctac ttgaagatac cagccctacc aagggcaggg    4320
agaggaccct atagaggcct gggacaggag ctcaatgaga aagg                     4364
```

<210> SEQ ID NO 188
<211> LENGTH: 506
<212> TYPE: PRT
<213> ORGANISM: Artificial Sequence
<220> FEATURE:
<223> OTHER INFORMATION: Synthetic

<400> SEQUENCE: 188

```
Met Leu Leu Leu Val Thr Ser Leu Leu Cys Glu Leu Pro His Pro
1               5                   10                  15

Ala Phe Leu Leu Ile Pro Asp Ile Gln Met Thr Gln Thr Thr Ser Ser
            20                  25                  30

Leu Ser Ala Ser Leu Gly Asp Arg Val Thr Ile Ser Cys Arg Ala Ser
        35                  40                  45

Gln Asp Ile Ser Lys Tyr Leu Asn Trp Tyr Gln Gln Lys Pro Asp Gly
    50                  55                  60

Thr Val Lys Leu Leu Ile Tyr His Thr Ser Arg Leu His Ser Gly Val
65                  70                  75                  80

Pro Ser Arg Phe Ser Gly Ser Gly Ser Gly Thr Asp Tyr Ser Leu Thr
                85                  90                  95

Ile Ser Asn Leu Glu Gln Glu Asp Ile Ala Thr Tyr Phe Cys Gln Gln
            100                 105                 110

Gly Asn Thr Leu Pro Tyr Thr Phe Gly Gly Gly Thr Lys Leu Glu Ile
        115                 120                 125

Thr Gly Ser Thr Ser Gly Ser Gly Lys Pro Gly Ser Gly Glu Gly Ser
    130                 135                 140

Thr Lys Gly Glu Val Lys Leu Gln Glu Ser Gly Pro Gly Leu Val Ala
145                 150                 155                 160

Pro Ser Gln Ser Leu Ser Val Thr Cys Thr Val Ser Gly Val Ser Leu
                165                 170                 175

Pro Asp Tyr Gly Val Ser Trp Ile Arg Gln Pro Pro Arg Lys Gly Leu
            180                 185                 190

Glu Trp Leu Gly Val Ile Trp Gly Ser Glu Thr Thr Tyr Tyr Asn Ser
        195                 200                 205

Ala Leu Lys Ser Arg Leu Thr Ile Ile Lys Asp Asn Ser Lys Ser Gln
    210                 215                 220

Val Phe Leu Lys Met Asn Ser Leu Gln Thr Asp Asp Thr Ala Ile Tyr
225                 230                 235                 240

Tyr Cys Ala Lys His Tyr Tyr Gly Gly Ser Tyr Ala Met Asp Tyr
                245                 250                 255

Trp Gly Gln Gly Thr Ser Val Thr Val Ser Ser Ala Ala Ala Phe Val
            260                 265                 270

Pro Val Phe Leu Pro Ala Lys Pro Thr Thr Thr Pro Ala Pro Arg Pro
        275                 280                 285

Pro Thr Pro Ala Pro Thr Ile Ala Ser Gln Pro Leu Ser Leu Arg Pro
    290                 295                 300

Glu Ala Cys Arg Pro Ala Ala Gly Gly Ala Val His Thr Arg Gly Leu
305                 310                 315                 320

Asp Phe Ala Cys Asp Ile Tyr Ile Trp Ala Pro Leu Ala Gly Thr Cys
                325                 330                 335
```

-continued

```
Gly Val Leu Leu Leu Ser Leu Val Ile Thr Leu Tyr Cys Asn His Arg
                340                 345                 350

Asn Arg Ser Lys Arg Ser Arg Leu Leu His Ser Asp Tyr Met Asn Met
            355                 360                 365

Thr Pro Arg Arg Pro Gly Pro Thr Arg Lys His Tyr Gln Pro Tyr Ala
        370                 375                 380

Pro Pro Arg Asp Phe Ala Ala Tyr Arg Ser Arg Val Lys Phe Ser Arg
385                 390                 395                 400

Ser Ala Asp Ala Pro Ala Tyr Gln Gln Gly Gln Asn Gln Leu Tyr Asn
                405                 410                 415

Glu Leu Asn Leu Gly Arg Arg Glu Glu Tyr Asp Val Leu Asp Lys Arg
            420                 425                 430

Arg Gly Arg Asp Pro Glu Met Gly Gly Lys Pro Arg Arg Lys Asn Pro
        435                 440                 445

Gln Glu Gly Leu Tyr Asn Glu Leu Gln Lys Asp Lys Met Ala Glu Ala
    450                 455                 460

Tyr Ser Glu Ile Gly Met Lys Gly Glu Arg Arg Arg Gly Lys Gly His
465                 470                 475                 480

Asp Gly Leu Tyr Gln Gly Leu Ser Thr Ala Thr Lys Asp Thr Tyr Asp
                485                 490                 495

Ala Leu His Met Gln Ala Leu Pro Pro Arg
            500                 505

<210> SEQ ID NO 189
<211> LENGTH: 508
<212> TYPE: PRT
<213> ORGANISM: Artificial Sequence
<220> FEATURE:
<223> OTHER INFORMATION: Synthetic

<400> SEQUENCE: 189

Met Ala Leu Pro Val Thr Ala Leu Leu Leu Pro Leu Ala Leu Leu Leu
1               5                   10                  15

His Ala Ala Arg Pro Gln Val Gln Leu Val Gln Ser Gly Ala Glu Val
            20                  25                  30

Lys Lys Pro Gly Ala Ser Val Lys Val Ser Cys Lys Ala Ser Gly Tyr
        35                  40                  45

Thr Phe Thr Asn Tyr Gly Met Asn Trp Val Arg Gln Ala Pro Gly Gln
    50                  55                  60

Gly Leu Lys Trp Met Gly Trp Ile Asn Thr Tyr Thr Gly Glu Pro Thr
65                  70                  75                  80

Tyr Ala Asp Ala Phe Lys Gly Arg Val Thr Met Thr Arg Asp Thr Ser
                85                  90                  95

Ile Ser Thr Ala Tyr Met Glu Leu Ser Arg Leu Arg Ser Asp Asp Thr
            100                 105                 110

Ala Val Tyr Tyr Cys Ala Arg Asp Tyr Gly Asp Tyr Gly Met Asp Tyr
        115                 120                 125

Trp Gly Gln Gly Thr Thr Val Thr Val Ser Ser Gly Gly Gly Gly Ser
    130                 135                 140

Gly Gly Gly Gly Ser Gly Gly Gly Ser Gly Asp Ile Val Met Thr
145                 150                 155                 160

Gln Ser Pro Asp Ser Leu Ala Val Ser Leu Gly Glu Arg Ala Thr Ile
                165                 170                 175

Asn Cys Arg Ala Ser Lys Ser Val Ser Thr Ser Gly Tyr Ser Phe Met
            180                 185                 190
```

```
His Trp Tyr Gln Gln Lys Pro Gly Gln Pro Pro Lys Leu Leu Ile Tyr
            195                 200                 205

Leu Ala Ser Asn Leu Glu Ser Gly Val Pro Asp Arg Phe Ser Gly Ser
        210                 215                 220

Gly Ser Gly Thr Asp Phe Thr Leu Thr Ile Ser Ser Leu Gln Ala Glu
225                 230                 235                 240

Asp Val Ala Val Tyr Tyr Cys Gln His Ser Arg Glu Val Pro Trp Thr
                245                 250                 255

Phe Gly Gln Gly Thr Lys Val Glu Ile Lys Ser Ala Ala Ala Phe Val
                260                 265                 270

Pro Val Phe Leu Pro Ala Lys Pro Thr Thr Thr Pro Ala Pro Arg Pro
            275                 280                 285

Pro Thr Pro Ala Pro Thr Ile Ala Ser Gln Pro Leu Ser Leu Arg Pro
290                 295                 300

Glu Ala Cys Arg Pro Ala Ala Gly Gly Ala Val His Thr Arg Gly Leu
305                 310                 315                 320

Asp Phe Ala Cys Asp Ile Tyr Ile Trp Ala Pro Leu Ala Gly Thr Cys
                325                 330                 335

Gly Val Leu Leu Leu Ser Leu Val Ile Thr Leu Tyr Cys Asn His Arg
            340                 345                 350

Asn Arg Lys Arg Gly Arg Lys Lys Leu Leu Tyr Ile Phe Lys Gln Pro
            355                 360                 365

Phe Met Arg Pro Val Gln Thr Thr Gln Glu Glu Asp Gly Cys Ser Cys
        370                 375                 380

Arg Phe Pro Glu Glu Glu Glu Gly Gly Cys Glu Leu Arg Val Lys Phe
385                 390                 395                 400

Ser Arg Ser Ala Asp Ala Pro Ala Tyr Gln Gln Gly Gln Asn Gln Leu
                405                 410                 415

Tyr Asn Glu Leu Asn Leu Gly Arg Arg Glu Glu Tyr Asp Val Leu Asp
            420                 425                 430

Lys Arg Arg Gly Arg Asp Pro Glu Met Gly Gly Lys Pro Arg Arg Lys
        435                 440                 445

Asn Pro Gln Glu Gly Leu Tyr Asn Glu Leu Gln Lys Asp Lys Met Ala
    450                 455                 460

Glu Ala Tyr Ser Glu Ile Gly Met Lys Gly Glu Arg Arg Arg Gly Lys
465                 470                 475                 480

Gly His Asp Gly Leu Tyr Gln Gly Leu Ser Thr Ala Thr Lys Asp Thr
                485                 490                 495

Tyr Asp Ala Leu His Met Gln Ala Leu Pro Pro Arg
            500                 505

<210> SEQ ID NO 190
<211> LENGTH: 1527
<212> TYPE: DNA
<213> ORGANISM: Artificial Sequence
<220> FEATURE:
<223> OTHER INFORMATION: Synthetic

<400> SEQUENCE: 190
atggcgcttc cggtgacagc actgctcctc cccttggcgc tgttgctcca cgcagcaagg      60
ccgcaggtcc agttggtgca agcgggggcg gaggtgaaaa acccggcgc ttccgtgaag      120 gtgtcctgta aggcgtccgg ttatacgttc acgaactacg ggatgaattg ggttcgccaa    180
gcgccggggc agggactgaa atggatgggg tggataaata cctacaccgg cgaacctaca    240
```

```
tacgccgacg ctttttaaagg gcgagtcact atgacgcgcg ataccagcat atccaccgca    300
tacatggagc tgtcccgact ccggtcagac gacacggctg tctactattg tgctcgggac    360
tatggcgatt atggcatgga ctactggggt cagggtacga ctgtaacagt tagtagtggt    420
ggaggcggca gtggcggggg gggaagcgga ggaggggggtt ctggtgacat agttatgacc    480
caatccccag atagtttggc ggtttctctg ggcgagaggg caacgattaa ttgtcgcgca    540
tcaaagagcg tttcaacgag cggatatttct tttatgcatt ggtaccagca aaaacccgga    600
caaccgccga agctgctgat ctacttggct tcaaatcttg agtctggggt gccggaccga    660
ttttctggta gtggaagcgg aactgacttt acgctcacga tcagttcact gcaggctgag    720
gatgtagcgg tctattattg ccagcacagt agagaagtcc cctggaccttt cggtcaaggc    780 acgaaagtag aaattaaaag tgctgctgcc tttgtcccgg tatttctccc agccaaaccg    840
accacgactc ccgccccgcg ccctccgaca cccgctccca ccatcgcctc tcaacctctt    900
agtcttcgcc ccgaggcatg ccgacccgcc gccgggggtg ctgttcatac gaggggcttg    960
gacttcgctt gtgatattta catttgggct ccgttggcgg gtacgtgcgg cgtcctttttg   1020 ttgtcactcg ttattacttt gtattgtaat cacaggaatc gcaaacgggg cagaaagaaa   1080
ctcctgtata tattcaaaca accatttatg agaccagtac aaaactactca agaggaagat   1140 ggctgtagct gccgattttcc agaagaagaa gaaggaggat gtgaactgcg agtgaagttt   1200
tcccgaagcg cagacgctcc ggcatatcag caaggacaga atcagctgta taacgaactg   1260
aatttgggac gccgcgagga gtatgacgtg cttgataaac gccgggggag agacccggaa   1320
atggggggta aaccccgaag aaagaatccc caagaaggac tctacaatga actccagaag   1380
gataagatgg cggaggccta ctcagaaata ggtatgaagg gcgaacgacg acggggaaaa   1440
ggtcacgatg gcctctacca agggttgagt acggcaacca agatacgta cgatgcactg   1500 catatgcagg ccctgcctcc cagataa                                        1527
```

<210> SEQ ID NO 191
<211> LENGTH: 508
<212> TYPE: PRT
<213> ORGANISM: Artificial Sequence
<220> FEATURE:
<223> OTHER INFORMATION: Synthetic

<400> SEQUENCE: 191

```
Met Ala Leu Pro Val Thr Ala Leu Leu Leu Pro Leu Ala Leu Leu Leu
1               5                   10                  15

His Ala Ala Arg Pro Gln Val Gln Leu Val Gln Ser Gly Ala Glu Leu
            20                  25                  30

Lys Lys Pro Gly Ala Ser Val Lys Val Ser Cys Lys Ala Ser Gly Asn
        35                  40                  45

Thr Leu Thr Asn Tyr Val Ile His Trp Val Arg Gln Ala Pro Gly Gln
    50                  55                  60

Arg Leu Glu Trp Met Gly Tyr Ile Leu Pro Tyr Asn Asp Leu Thr Lys
65                  70                  75                  80

Tyr Ser Gln Lys Phe Gln Gly Arg Val Thr Ile Thr Arg Asp Lys Ser
                85                  90                  95

Ala Ser Thr Ala Tyr Met Glu Leu Ser Ser Leu Arg Ser Glu Asp Thr
            100                 105                 110

Ala Val Tyr Tyr Cys Thr Arg Trp Asp Trp Asp Gly Phe Phe Asp Pro
        115                 120                 125
```

```
Trp Gly Gln Gly Thr Thr Val Thr Val Ser Ser Gly Gly Gly Ser
130                 135                 140

Gly Gly Gly Gly Ser Gly Gly Gly Ser Glu Ile Val Met Thr Gln
145                 150                 155                 160

Ser Pro Ala Thr Leu Ser Val Ser Pro Gly Glu Arg Ala Ser Ile Ser
                165                 170                 175

Cys Arg Ala Ser Gln Ser Leu Val His Ser Asn Gly Asn Thr His Leu
                180                 185                 190

His Trp Tyr Gln Gln Arg Pro Gly Gln Ala Pro Arg Leu Leu Ile Tyr
                195                 200                 205

Ser Val Ser Asn Arg Phe Ser Glu Val Pro Ala Arg Phe Ser Gly Ser
210                 215                 220

Gly Ser Gly Thr Asp Phe Thr Leu Thr Ile Ser Ser Val Glu Ser Glu
225                 230                 235                 240

Asp Phe Ala Val Tyr Tyr Cys Ser Gln Thr Ser His Ile Pro Tyr Thr
                245                 250                 255

Phe Gly Gly Gly Thr Lys Leu Glu Ile Lys Ser Ala Ala Ala Phe Val
                260                 265                 270

Pro Val Phe Leu Pro Ala Lys Pro Thr Thr Thr Pro Ala Pro Arg Pro
                275                 280                 285

Pro Thr Pro Ala Pro Thr Ile Ala Ser Gln Pro Leu Ser Leu Arg Pro
290                 295                 300

Glu Ala Cys Arg Pro Ala Ala Gly Gly Ala Val His Thr Arg Gly Leu
305                 310                 315                 320

Asp Phe Ala Cys Asp Ile Tyr Ile Trp Ala Pro Leu Ala Gly Thr Cys
                325                 330                 335

Gly Val Leu Leu Leu Ser Leu Val Ile Thr Leu Tyr Cys Asn His Arg
                340                 345                 350

Asn Arg Lys Arg Gly Arg Lys Lys Leu Leu Tyr Ile Phe Lys Gln Pro
                355                 360                 365

Phe Met Arg Pro Val Gln Thr Thr Gln Glu Glu Asp Gly Cys Ser Cys
                370                 375                 380

Arg Phe Pro Glu Glu Glu Glu Gly Gly Cys Glu Leu Arg Val Lys Phe
385                 390                 395                 400

Ser Arg Ser Ala Asp Ala Pro Ala Tyr Gln Gln Gly Gln Asn Gln Leu
                405                 410                 415

Tyr Asn Glu Leu Asn Leu Gly Arg Arg Glu Glu Tyr Asp Val Leu Asp
                420                 425                 430

Lys Arg Arg Gly Arg Asp Pro Glu Met Gly Gly Lys Pro Arg Arg Lys
                435                 440                 445

Asn Pro Gln Glu Gly Leu Tyr Asn Glu Leu Gln Lys Asp Lys Met Ala
450                 455                 460

Glu Ala Tyr Ser Glu Ile Gly Met Lys Gly Glu Arg Arg Arg Gly Lys
465                 470                 475                 480

Gly His Asp Gly Leu Tyr Gln Gly Leu Ser Thr Ala Thr Lys Asp Thr
                485                 490                 495

Tyr Asp Ala Leu His Met Gln Ala Leu Pro Pro Arg
                500                 505

<210> SEQ ID NO 192
<211> LENGTH: 100
<212> TYPE: RNA
<213> ORGANISM: Artificial Sequence
<220> FEATURE:
```

```
<223> OTHER INFORMATION: Synthetic

<400> SEQUENCE: 192
ccgcucgaug guggugggca guuuuagagc uagaaauagc aaguuaaaau aaggcuaguc    60
cguuaucaac uugaaaaagu ggcaccgagu cggugcuuuu                         100

<210> SEQ ID NO 193
<211> LENGTH: 100
<212> TYPE: RNA
<213> ORGANISM: Artificial Sequence
<220> FEATURE:
<223> OTHER INFORMATION: Synthetic
<220> FEATURE:
<221> NAME/KEY: misc_feature
<222> LOCATION: (1)..(4)
<223> OTHER INFORMATION: modified with 2'-O-methyl phosphorothioate
<220> FEATURE:
<221> NAME/KEY: misc_feature
<222> LOCATION: (97)..(100)
<223> OTHER INFORMATION: modified with 2'-O-methyl phosphorothioate

<400> SEQUENCE: 193
ccgcucgaug gugugggca guuuuagagc uagaaauagc aaguuaaaau aaggcuaguc     60
cguuaucaac uugaaaaagu ggcaccgagu cggugcuuuu                         100
```

GENETICALLY ENGINEERED T CELLS WITH PTPN2 KNOCKOUT HAVE IMPROVED FUNCTIONALITY AND ANTI-TUMOR ACTIVITY

CROSS REFERENCE TO RELATED APPLICATIONS

This application claims the benefit of the filing dates of U.S. Provisional Application No. 63/158,636, filed Mar. 9, 2021, the entire contents of which is incorporated by reference herein.

SEQUENCE LISTING

The application contains a Sequence Listing that has been filed electronically in the form of a text file, created Mar. 3, 2022, and named "095136-0532-031US1_SEQ.TXT" (128, 215 bytes), the contents of which are incorporated by reference herein in their entirety.

BACKGROUND OF THE INVENTION

Chimeric antigen receptor (CAR) T-cell therapy uses genetically-modified T cells to more specifically and efficiently target and kill cancer cells. After T cells have been collected from the blood, the cells are engineered to include CARs on their surface. The CARs may be introduced into the T cells using CRISPR/Cas9 gene editing technology. When these allogeneic CAR T cells are injected into a patient, the receptors enable the T cells to kill cancer cells.

CAR T therapy has given rise to breakthroughs in treating hematological malignancies. However, their success in treating solid tumors has been limited which has been hypothesized to be due to T cell exhaustion characterized by inability to kill tumor cells, decreased cytokine secretion and proliferation, and over-expression of exhaustion markers such as PD1, LAG3, TIM3 and TIGIT. PTPN2 is a phosphatase that negatively regulates T cell activation. Deletion of PTPN2 in T cells is expected to rescue them from exhaustion, enhance T cell activation, anti-tumor activity and cytokine secretion however this has not been demonstrated in human allogeneic CAR-T cells.

SUMMARY OF THE INVENTION

The present disclosure is based, at least in part, on the development of CAR T cells comprising T cells with CRISPR/Cas9 genetic editing of PTPN2 gene to generate T cells with superior anti-tumor effect in solid tumors. The genetically edited T cells disclosed herein have superior tumor killing, and enhanced secretion of cytokines upon encountering tumor cells both in vitro and in vivo. Moreover, PTPN2 edited CAR T cells show elevated expression of some exhaustion markers suggesting that expression of such markers may be necessary for optimal CAR-T function. Further, CAR T cells having a disrupted PTPN2 gene showed increased CAR copy numbers relative to the PTPN2 wild-type counterpart. In some embodiments, the population of genetically engineered T cells disclosed herein may be further engineered to express a chimeric antigen receptor (CAR).

Accordingly, the present disclosure features, in some aspects, a population of genetically engineered T cells, comprising a disrupted protein tyrosine phosphatase non-receptor type 2 (PTPN2) gene. As compared to non-engineered T cell counterparts (having the same genetic modifications except for disruption of the PTPN2 gene), the population of genetically engineered T cells disclosed herein may have one or more of the following features: (a) improved cytotoxicity; (b) enhanced persistence; (c) increased cytokine production; (d) enhanced expression of LAG3 and/or TIM3; and (e) enhanced survival in the presence of NK cells.

Any of the population of genetically engineered T cells disclosed herein may have a disrupted PTPN2 gene, which is genetically edited in exon 1, exon 2, and/or exon 3. In some embodiments, the disrupted PTPN2 gene is genetically edited by CRISPR/Cas-mediated gene editing. In some examples, the CRISPR/Cas-mediated gene editing comprises a guide RNA (gRNA) targeting a site in the PTPN2 gene that comprises a nucleotide of any one of SEQ ID NOs: 2-13. In one example, the gRNA comprises a nucleotide sequence of any one of SEQ ID NOs: 28, 29, 32, 33, 36, 37, 40, 41, 44, 45, 48, 49, 52, 53, 56, 57, 60, 61, 64-67, 70, and 71. Such a guide RNA may comprise (e.g., consist of) the nucleotide sequence of any one of SEQ ID NOs: 26, 27, 30, 31, 34, 35, 38, 39, 42, 43, 46, 47, 50, 51, 54, 55, 58, 59, 62, 63, 68, 69, 192, and 193.

In some embodiments, the population of genetically engineered T cells disclosed herein may further comprise a disrupted T cell receptor alpha chain constant region (TRAC) gene. In some instances, the disrupted TRAC gene is genetically edited by a CRISPR/Cas-mediated gene editing system. In some examples, the CRISPR/Cas-mediated gene editing system comprises a gRNA comprising the nucleotide sequence of SEQ ID NO: 76 or 77. In specific examples, the disrupted TRAC gene comprises a nucleotide sequence of any one of SEQ ID NOs: 93 to 100. In some instances, the disrupted T cell TRAC gene has a deleted fragment comprising SEQ ID NO: 87.

Alternatively or in addition, the population of genetically engineered T cells may further comprise a disrupted beta-2-microglobulin (β2M) gene. In some instances, the disrupted β2M gene is genetically edited by CRISPR/Cas-mediated gene editing. For example, CRISPR/Cas-mediated gene editing comprises a gRNA comprising the nucleotide sequence of SEQ ID NO: 80 or 81. In specific examples, the disrupted β2M gene may comprise a nucleotide sequence of any one of SEQ ID NOs: 101 to 106.

Alternatively or in addition, the population of the genetically engineered T cells may further comprise a disrupted CD70 gene. In some instances, the disrupted CD70 gene is genetically edited by CRISPR/Cas-mediated gene editing. In some examples, the CRISPR/Cas-mediated gene editing comprises a gRNA comprising the nucleotide sequence of SEQ ID NO: 72 or 73. In some specific examples, the disrupted CD70 gene comprises a nucleotide sequence of any one of SEQ ID NOs: 107 to 112.

In some embodiments, the population of genetically engineered T cells may comprise a nucleic acid encoding the CAR. In some instances, the nucleic acid is inserted in the genome of the T cells. In some examples, the disrupted TRAC gene comprises the nucleic acid encoding the CAR. In specific examples, the nucleic acid encoding the CAR replaces the deleted fragment in the disrupted TRAC gene. Alternatively, the nucleic acid encoding the CAR may be inserted in a different genomic locus, for example, in the disrupted β2M gene or the disrupted CD70 gene.

Any of the genetically engineered T cells disclosed herein may express a CAR, which may comprise an extracellular antigen binding domain specific to a tumor antigen, a co-stimulatory signaling domain of 4-1BB or CD28, and a cytoplasmic signaling domain of CD3ζ.

In some instances, the tumor antigen is CD19. In some examples, the extracellular antigen binding domain of a CAR is a single chain variable fragment (scFv) that binds CD19. Such an scFv may comprise the amino acid sequence of SEQ ID NO: 137. In specific examples, the CAR may comprise the amino acid sequence of SEQ ID NO: 135.

In some instances, the tumor antigen is BCMA. In some examples, the extracellular antigen binding domain of a CAR is a single chain variable fragment (scFv) that binds BCMA. Such an scFv may comprise the amino acid sequence of SEQ ID NO: 165. In specific examples, the CAR may comprise the amino acid sequence of SEQ ID NO: 163.

In some instances, the tumor antigen is CD70. In some examples, the extracellular antigen binding domain of the CAR can be is a single chain variable fragment (scFv) that binds BCMA. Such an scFv may comprise a the amino acid sequence of SEQ ID NO: 157 or 159. In specific examples, the CAR comprises the amino acid sequence of SEQ ID NO: 155.

In some embodiments, the population of genetically engineered T cells disclosed herein may be derived from primary T cells of one or more human donors. In some instances, the population of genetically engineered T cells expressing the CAR has enhanced CAR potency and/or increased CAR copies as compared to non-engineered T cell counterparts.

In another aspect, the present disclosure provides a method for preparing the population of genetically engineered T cells of claim 1, the method comprising: (a) providing a plurality of cells, which are T cells or precursor cells thereof; (b) genetically editing the PTPN2 gene; and (c) producing the population of genetically engineered T cells having disrupted PTPN2 gene. In some instances, the T cells of step (a) are or derived from primary T cells of one or more human donors.

In some embodiments, step (b) can be performed by delivering to the plurality of cells an RNA-guided nuclease and a gRNA targeting the PTPN2 gene. In some examples, the gRNA targeting PTPN2 is specific to an exon of the PTPN2 gene selected from the group consisting of exon 1, exon 2 and exon 3. For example, the gRNA targeting a PTPN2 gene site that comprises a nucleotide of any one of SEQ ID NOs: 2-13. In one example, the gRNA comprises a nucleotide sequence of any one of SEQ ID NOs: 28, 29, 32, 33, 36, 37, 40, 41, 44, 45, 48, 49, 52, 53, 56, 57, 60, 61, 64-67, 70, and 71. Such a guide RNA may comprise (e.g., consist of) the nucleotide sequence of any one of SEQ ID NOs: 26, 27, 30, 31, 34, 35, 38, 39, 42, 43, 46, 47, 50, 51, 54, 55, 58, 59, 62, 63, 68, 69, 192, and 193.

In some embodiments, the plurality of T cells in step (a) comprises one or more of the following genetic modifications: (i) engineered to express a chimeric antigen receptor (CAR); (ii) has a disrupted T cell receptor alpha chain constant region (TRAC) gene; (iii) has a disrupted β2M gene; and (iv) has a disrupted CD70 gene.

In some embodiments, the method may further comprise: (i) delivering to the T cells a nucleic acid encoding a chimeric antigen receptor (CAR); (ii) genetically editing a TRAC gene to disrupt its expression; (iii) genetically editing a β2M gene to disrupt its expression; (iv) genetically editing a CD70 gene to disrupt its expression; or (v) a combination thereof. In some instances, one or more of (i)-(iv) are performed by CRISPR/Cas-mediated gene editing comprising one or more RNA-guided nucleases and one or more gRNAs targeting the TRAC gene, the β2M gene, and/or the CD70 gene. In one example, the gRNA targeting the TRAC gene comprises the nucleotide sequence of SEQ ID NO: 76 or 77. Alternative or in addition, the gRNA targeting the β2M gene comprises the nucleotide sequence of SEQ ID NO: 80 or 81. Alternatively or in addition, the gRNA targeting the CD70 gene comprises the nucleotide sequence of SEQ ID NO: 72 or 73.

In some embodiments, any of the methods disclosed herein may comprise delivering to the T cells one or more ribonucleoprotein particles (RNP), comprising the RNA-guided nuclease, one or more of the gRNAs, and the nucleic acid encoding the CAR. In some instances, the RNA-guided nuclease is a Cas9 nuclease. In one example, the Cas9 nuclease is a *S. pyogenes* Cas9 nuclease.

In some embodiments, the nucleic acid encoding the CAR is in an AAV vector. In some instances, the nucleic acid encoding the CAR comprises a left homology arm and a right homology arm flanking the nucleotide sequence encoding the CAR. In some examples, the left homology arm and the right homology arm are homologous to a genomic locus in the T cells, allowing for insertion of the nucleic acid into the genomic locus. For example, the genomic locus may be a target site of a guide RNA. Insertion of the nucleic acid encoding the CAR at the genomic locus may result in deletion and/or mutation of the target site of the guide RNA.

In some examples, the genomic locus is in the TRAC gene. In some instances, the method may comprise disrupting the TRAC gene by CRISPR/Cas-mediated gene editing comprising a gRNA targeting a TRAC gene site comprising nucleotide sequence of SEQ ID NO: 87 and the nucleic acid encoding the CAR is inserted at the TRAC gene site targeted by the gRNA.

In some examples, the method comprising delivering to the T cells a nucleic acid encoding a CAR, which is specific to CD70, and genetically editing the CD70 gene to disrupt its expression.

A population of genetically engineered T cells provided by any of the methods disclosed herein is also within the scope of the present disclosure.

In addition, the present disclosure also features a method for eliminating undesired cells in a subject, the method comprising administering to a subject in need thereof T cells expressing a disrupted PTPN2 gene and a chimeric antigen receptor targeting the undesired cells. Any of the genetically engineered T cells disclosed herein can be used in this method. In some embodiments, the undesired cells are cancer cells, for example, $CD19^+$, $BCMA^+$, or $CD70^+$ cancer cells. In some embodiments, the T cells are allogenic to the subject.

Moreover, the present disclosure features a guide RNA (gRNA) targeting a PTPN2 gene, comprising a nucleotide sequence specific to a fragment in exon 1, exon 2 or exon 3 of the PTPN2 gene. In some embodiments, the gRNA comprises a spacer, which may comprise any one of SEQ ID NOs: 28, 29, 32, 33, 36, 37, 40, 41, 44, 45, 48, 49, 52, 53, 56, 57, 60, 61, 64-67, 70, and 71. Such a gRNA may further comprise a scaffold sequence. In some examples, the gRNA comprises one or more modified nucleotides. For example, the gRNA comprises one or more 2'-O-methyl phosphorothioate residues at the 5' and/or 3' terminus of the gRNA. In specific examples, the gRNA disclosed herein may comprise the nucleotide sequence of any of SEQ ID NOs: 26, 27, 30, 31, 34, 35, 38, 39, 42, 43, 46, 47, 50, 51, 54, 55, 58, 59, 62, 63, 68, 69, 192, and 193.

Also within the scope of the present disclosure are any of the genetically engineered T cells disclosed herein for use in eliminating undesired cells such as cancer cells and uses of such genetically engineered T cells for manufacturing a medicament for use in eliminating the undesired cells.

The details of one or more embodiments of the invention are set forth in the description below. Other features or advantages of the present invention will be apparent from the following drawings and detailed description of several embodiments, and also from the appended claims.

BRIEF DESCRIPTION OF THE DRAWINGS

FIG. 4A: IL-2. FIG. 4B: IFN-γ. FIG. 4C: TNF-α. FIG. 4D: IL-10. FIG. 4E: Granzyme A. FIG. 4F: Granzyme B. FIG. 4G: Granulysin. FIG. 4H: Perforin.

FIG. 5A: IL-2. FIG. 5B: IFN-γ. FIG. 5C: TNF-α. FIG. 5D: IL-10. FIG. 5E: Granulysin. FIG. 5F: Perforin.

FIGS. 9A-9B include diagrams showing that PTPN2 KO promotes survival of allogeneic anti-CD70 CAR-T cells against NK cell attack. FIG. 9A: Effector NK donor 1. FIG. 9B: Effector NK donor 2.

FIGS. 10A-10B include diagrams showing that PTPN2 KO enhances in vivo anti-tumor killing function of anti-BCMA CAR-T cells (FIG. 10A) and in-vivo expansion of anti-BCMA CAR-T cells (FIG. 10B).

FIGS. 11A-11B include diagrams showing that PTPN2 KO enhances in vivo anti-tumor killing function of anti-CD19 CAR-T cells (FIG. 11A) and prolongs survival of NALM6 tumor bearing mice (FIG. 11B).

DETAILED DESCRIPTION OF THE INVENTION

Figure 1:
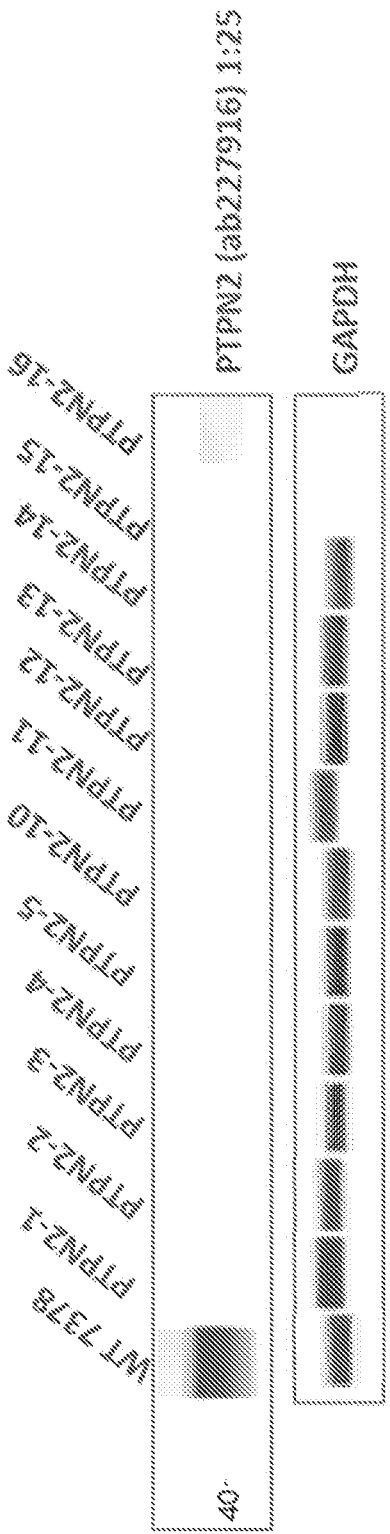
FIG. 1 is a photo showing expression of PTPN2 protein in T cells edited by the indicated various guide RNAs targeting PTPN2 using Simple Wes protein analysis.

The present disclosure aims at establishing genetically engineered T cells having improved growth activity, cytotoxicity, or both, particularly in the presence of TGFβ and/or cells capable of secreting such (e.g., fibroblasts). Such a T cell may use bona fide T cells as the starting material, for example, non-transformed T cells, terminally differentiated T cells, T cells having stable genome, and/or T cells that depend on cytokines and growth factors for proliferation and expansion. Alternatively, such a T cell may use T cells generated from precursor cells such as hematopoietic stem cells (e.g., iPSCs), e.g., in vitro culture. The T cells disclosed herein may confer one or more benefits in CAR-T cell clinical applications.

The genetically engineered T cells having a disrupted PTPN2 gene, and optionally one or more additional genetic edits, for example, a disrupted TRAC gene, a disrupted β2M gene, a disrupted CD70 gene, an inserted nucleic acid coding for a chimeric antigen receptor (CAR), or a combination thereof. Unexpectedly, T cells having a disrupted PTPN2 gene showed advantageous features disclosed herein. Given such advantageous features, the genetically engineered T cells (e.g., CAR-T cells) disclosed herein, having a disrupted PTPN2 gene and optionally other genetic edits as disclosed herein, would be expected to exhibit superior therapeutic effects, for example, superior anti-tumor effects.

Accordingly, provided herein are genetically engineered T cells (e.g., CAR-T cells) having a disrupted PTPN2 gene and optionally one or more additional genetic edits, e.g., a disrupted TRAC gene, a disrupted β2M gene, a disrupted CD70 gene, or a combination thereof; compositions comprising such; and therapeutic uses of such genetically engineered T cells, for example, in tumor treatment. Components and processes (e.g., the CRISPR approach for gene editing and components used therein) for making the T cells disclosed herein are also within the scope of the present disclosure.

I. Genetically Engineered T Cells

In some aspects, provided herein are genetically engineered T cells having a disrupted PTPN2 gene, and optionally one or more additional genetic edits as disclosed herein. As shown by the studies disclosed herein, such genetically engineered T cells show improved cytotoxicity; enhanced persistence; increased cytokine production; enhanced expression of LAG5 and/or TIM3; enhanced survival in the presence of NK cells, or a combination thereof. When the engineered T cells are CAR-T cells expressing a chimeric antigen receptor (CAR), disruption of the PTPN2 gene led to enhanced CAR potency, increased in vivo CAR expansion, enhanced CAR-T cell activation, or a combination thereof.

The genetically engineered T cells may be derived from parent T cells (e.g., non-edited wild-type T cells) obtained from a suitable source, for example, one or more mammal donors. In some examples, the parent T cells are primary T cells (e.g., non-transformed and terminally differentiated T cells) obtained from one or more human donors (e.g., healthy donors). Alternatively, the parent T cells may be differentiated from precursor T cells obtained from one or more suitable donor or stem cells such as hematopoietic stem cells or inducible pluripotent stem cells (iPSC), which may be cultured in vitro. In other examples, T cells from a T cell bank can be used as the starting material for preparing the genetically engineered T cells disclosed herein.

In some embodiments, the genetically engineered T cells carry a disrupted PTPN2 gene, and optionally, one or more disrupted genes involved in cell exhaustion (e.g., CD70). Such genetically engineered T cells may further comprise one or more disrupted genes, for example, TRAC and/or β2M. Any of the genetically engineered T cells may be generated via gene editing (including genomic editing), a type of genetic engineering, in which nucleotide(s)/nucleic acid(s) is/are inserted, deleted, and/or substituted in a DNA sequence, such as in the genome of a targeted cell. Targeted gene editing enables insertion, deletion, and/or substitution at pre-selected sites in the genome of a targeted cell (e.g., in a targeted gene or targeted DNA sequence). When a sequence of an endogenous gene is edited, for example by deletion, insertion or substitution of nucleotide(s)/nucleic acid(s), the endogenous gene comprising the affected sequence may be knocked-out due to the sequence alteration. Therefore, targeted editing may be used to disrupt endogenous gene expression. "Targeted integration" refers to a process involving insertion of one or more exogenous sequences, with or without deletion of an endogenous sequence at the insertion site. Targeted integration can result from targeted gene editing when a donor template containing an exogenous sequence is present.

(a) Genetically Edited Genes

In some aspects, the present disclosure provides genetically engineered T cells (e.g., CAR-T cells) that comprise a disrupted PTPN2 gene. In some instances, the genetically engineered T cells disclosed herein may further comprise a disrupted CD70 gene, a disrupted β2M gene, a disrupted TRAC gene, or a combination thereof.

As used herein, a "disrupted gene" refers to a gene comprising an insertion, deletion or substitution relative to an endogenous gene such that expression of a functional protein from the endogenous gene is reduced or inhibited. As used herein, "disrupting a gene" refers to a method of inserting, deleting or substituting at least one nucleotide/ nucleic acid in an endogenous gene such that expression of a functional protein from the endogenous gene is reduced or inhibited. Methods of disrupting a gene are known to those of skill in the art and described herein.

In some embodiments, a cell that comprises a disrupted gene does not express (e.g., at the cell surface) a detectable level (e.g., in an immune assay using an antibody binding to the encoded protein or by flow cytometry) of the protein encoded by the gene. A cell that does not express a detectable level of the protein may be referred to as a knockout cell.

PTPN2 Gene Editing

In some embodiments, the genetically engineered T cells may comprise a disrupted PTPN2 gene, which encodes protein tyrosine phosphatase non-receptor type 2 (PTPN2). PTPN2 is a member of the protein tyrosine phosphatase (PTP) family, members of which share a highly conserved catalytic domain. PTPN2 is a signaling molecule that regulates various cellular processes, including cell growth, differentiation, mitotic cycle, and oncogenic transformation. PTPN2 can dephosphorylate several tyrosine kinases, including receptor protein tyrosine kinases such as INSR, EGFR, CSF1R, PDGFR and non-receptor protein tyrosine kinases such as JAK1, JAK2, JAK3, Src family kinases, STAT1, STAT3 and STAT6, either in the nucleus or the cytoplasm. Some of the tyrosine kinases play roles in cancer-related signaling pathways. As such, PTPN2 is deemed as a tumor suppressor. Veenstra et al., *J. Cancer Res. Clin. Oncol.* 145(7): 1845-1856 (2019).

Structures of PTPN2 genes are known in the art. For example, human PTPN2 gene is located on chromosome 18p11.21. The gene contains 10 exons. Additional information can be found in GenBank under ENSG00000175354.

In some examples, the genetically engineered T cells may comprise a disrupted PTPN2 gene such that the expression of PTPN2 in the T cells is substantially reduced or eliminated completely. The disrupted PTPN2 gene may comprise one or more genetic edits at one or more suitable target sites (e.g., in coding regions or in non-coding regulatory regions such as promoter regions) that disrupt expression of the PTPN2 gene. Such target sites may be identified based on the gene editing approach for use in making the genetically engineered T cells. Exemplary target sites for the genetic edits may include exon 1, exon 2, exon 3, or a combination thereof. In some examples, one or more genetic editing may occur in exon 1. In some examples, one or more genetic editing may occur in exon 2. Such genetic editing may be induced by a gene editing technology, (e.g., the CRISPR/Cas technology) using a suitable guide RNA, for example, those targeting the PTPN2 sites listed in Table 3. Exemplary PTPN2-targeting guide RNAs are provided in Table 4, which are also within the scope of the present disclosure.

CD70 Gene Editing

T cell exhaustion is a process of stepwise and progressive loss of T cell functions, which may be induced by prolonged antigen stimulation or other factors. Genes involved in T cell exhaustion refer to those that either positively regulate or negatively regulate this biological process. The genetically engineered T cells disclosed herein may comprise genetic editing of a gene that positively regulates T cell exhaustion to disrupt its expression. Alternatively or in addition, the genetically engineered T cells may comprise genetic editing of a gene that negatively regulates T cell exhaustion to enhance its expression and/or biologic activity of the gene product.

In some embodiments, the genetically engineered T cells may comprise an edited gene involved in T cell exhaustion, e.g., disruption of a gene that positively regulates T cell exhaustion. Such a gene may be a Cluster of Differentiation 70 (CD70) gene. CD70 is a member of the tumor necrosis factor superfamily and its expression is restricted to activated T and B lymphocytes and mature dendritic cells. CD70 is implicated in tumor cell and regulatory T cell survival through interaction with its ligand, CD27. CD70 and its receptor CD27 have multiple roles in immune function in multiple cell types including T cells (activated and $T_{reg}$ cells), and B cells. In some embodiments, an edited CD70 gene may comprise a nucleotide sequence selected from the following sequences in Table 8. In other embodiments, an edited CD70 gene may have a nucleic acid encoding a CAR (e.g., those disclosed herein) inserted, leading to disruption of the CD70 gene expression.

It was also found that disrupting the CD70 gene in immune cells engineered to express an antigen targeting moiety enhanced anti-tumor efficacy against large tumors and induced a durable anti-cancer memory response. Specifically, the anti-cancer memory response prevented tumor growth upon re-challenge. Further, it has been demonstrated disrupting the CD70 gene results in enhanced cytotoxicity of immune cells engineered to express an antigen targeting moiety at lower ratios of engineered immune cells to target cells, indicating the potential efficacy of low doses of engineered immune cells. See, e.g., WO2019/215500, the relevant disclosures of which are incorporated by reference for the purpose and subject matter referenced herein.

Structures of CD70 genes are known in the art. For example, human CD70 gene is located on chromosome 19p13.3. The gene contains four protein encoding exons. Additional information can be found in GenBank under Gene ID: 970.

In some examples, the genetically engineered T cells may comprise a disrupted CD70 gene such that the expression of CD70 in the T cells is substantially reduced or eliminated completely. The disrupted CD70 gene may comprise one or more genetic edits at one or more suitable target sites (e.g., in coding regions or in non-coding regulatory regions such as promoter regions) that disrupt expression of the CD70 gene. Such target sites may be identified based on the gene editing approach for use in making the genetically engineered T cells. Exemplary target sites for the genetic edits may include exon 1, exon 2, exon 3, exon 4, or a combination thereof. See also WO2019/215500, the relevant disclosures of which are incorporated by reference for the purpose and subject matter referenced herein.

β2M Gene Edit

In some embodiments, the genetically engineered T cells disclosed herein may further comprise a disrupted β2M gene. P2M is a common (invariant) component of MHC I complexes. Disrupting its expression by gene editing will prevent host versus therapeutic allogeneic T cells responses leading to increased allogeneic T cell persistence. In some embodiments, expression of the endogenous β2M gene is eliminated to prevent a host-versus-graft response.

In some embodiments, an edited β2M gene may comprise a nucleotide sequence selected from the sequences in Table 7. It is known to those skilled in the art that different nucleotide sequences in an edited gene such as an edited β2M gene (e.g., those in Table 7) may be generated by a single gRNA. See also WO2019097305, the relevant disclosures of which are incorporated by reference for the subject matter and purpose referenced herein. In other embodiments, an edited β2M gene may have a nucleic acid encoding a CAR (e.g., those disclosed herein) inserted, leading to disruption of the β2M gene expression.

TRAC Gene Edit

In some embodiments, the genetically engineered T cells as disclosed herein may further comprise a disrupted TRAC gene. This disruption leads to loss of function of the TCR and renders the engineered T cell non-alloreactive and suitable for allogeneic transplantation, minimizing the risk of graft versus host disease. In some embodiments, expression of the endogenous TRAC gene is eliminated to prevent a graft-versus-host response. See also WO2019097305, the relevant disclosures of which are incorporated by reference herein for the purpose and subject matter referenced herein. In some embodiments, an edited TRAC gene may comprise a nucleotide sequence selected from the following sequences in Table 6. In other embodiments, an edited TRAC gene may have a nucleic acid encoding a CAR (e.g., those disclosed herein) inserted, leading to disruption of the TRAC gene expression.

It should be understood that more than one suitable target site/gRNA can be used for each target gene disclosed herein, for example, those known in the art or disclosed herein. Additional examples can be found in, e.g., WO2019097305, the relevant disclosures of which are incorporated by reference herein for the purpose and subject matter referenced herein.

The genetically engineered T cells disclosed herein may further comprise one or more additional gene edits (e.g., gene knock-in or knock-out) to improve T cell function. Examples include knock-in or knock-out genes to improve target cell lysis, knock-in or knock-out genes to enhance performance of therapeutic T cells such as CAR-T cells prepared from the genetically engineered T cells.

(b) Exemplary Improved Features of Genetically Engineered T Cells Disclosed Herein Any of the genetically engineered T cell having a disrupted PTPN2 gene, and optionally one or more additional genetic edits, for example, a disrupted CD70 gene, a disrupted TRAC gene, a disrupted β2M gene, a CAR-coding nucleic acid insertion, or a combination thereof, may have improved growth and expansion activities, both in vitro and in vivo, as compared with the non-engineered counterpart, which refers to T cells having the same genetic background except for an undisrupted PTPN2 gene. Further, such genetically engineered T cells (e.g., CAR-T cells) may exhibit enhanced cytotoxicity activity, for example, against undesired cells (e.g., tumor cells) expressing an antigen targeted by the CAR expressed in the CAR-T cells, as compared with the non-engineered counterpart.

In some embodiments, the genetically engineered T cells may further comprise one or more disrupted genes (e.g., CD70) to improve T cell persistency. "T cell persistence" as used herein refers to the tendency of T cells to continue to grow, proliferate, self-renew, expand, and maintain healthy activity in culture. In some instances, T cell persistence can be represented by the longevity that T cells can grow and expand in vitro, which can be measured by conventional methods and/or assays described herein. In other instances, T cell persistence can be represented by the reduction of cell death (e.g., apoptosis) or reduction in cell states characterized by exhaustion or replicative senescence. In yet other instances, T cell persistence can be presented by the maintenance of T cell activation capacity in culture.

In some examples, the genetically engineered T cells having a disrupted PTPN2 gene, and optionally one or more additional genetic edits as disclosed herein exhibit one or more of the following features: improved cytotoxicity, enhanced persistence; increased cytokine production; enhanced expression of LAGS and/or TIM3; enhanced survival in the presence of NK cells, or a combination thereof. When the engineered T cells are CAR-T cells expressing a chimeric antigen receptor (CAR), disruption of the PTPN2 gene led to enhanced CAR potency, increased CA copy numbers, or a combination thereof. See also Examples below.

(c) Methods of Making Genetically Engineered T Cells

The genetically engineered T cells disclosed herein can be prepared by genetic editing of parent T cells or precursor cells thereof via a conventional gene editing method or those described herein.

(i) T Cells

In some embodiments, T cells for generating the genetically engineered T cells disclosed herein can be derived from one or more suitable mammals, for example, one or more human donors. T cells can be obtained from a number of sources, including, but not limited to, peripheral blood mononuclear cells, bone marrow, lymph nodes tissue, cord blood, thymus issue, tissue from a site of infection, ascites, pleural effusion, spleen tissue, and tumors. In certain embodiments, T cells can be obtained from a unit of blood collected from a subject using any number of techniques known to the skilled person, such as sedimentation, e.g., FICOLL™ separation. In some instances, the T cell population comprises primary T cells isolated from one or more human donors. Such T cells are terminally differentiated, not transformed, depend on cytokines and/or growth factors for growth, and/or have stable genomes.

In some examples, T cells can be isolated from a mixture of immune cells (e.g., those described herein) to produce an isolated T cell population. For example, after isolation of peripheral blood mononuclear cells (PBMC), both cytotoxic and helper T lymphocytes can be sorted into naive, memory, and effector T cell subpopulations either before or after activation, expansion, and/or genetic modification.

A specific subpopulation of T cells, expressing one or more of the following cell surface markers: TCRαβ, CD3, CD4, CD8, CD27 CD28, CD38 CD45RA, CD45RO, CD62L, CD127, CD122, CD95, CD197, CCR7, KLRG1, MCH-I proteins and/or MCH-II proteins, can be further isolated by positive or negative selection techniques. In some embodiments, a specific subpopulation of T cells, expressing one or more of the markers selected from the group consisting of TCRαβ, CD4 and/or CD8, is further isolated by positive or negative selection techniques. In some embodiments, subpopulations of T cells may be isolated by positive or negative selection prior to genetic engineering and/or post genetic engineering.

An isolated population of T cells may express one or more of the T cell markers, including, but not limited to a CD3+, CD4+, CD8+, or a combination thereof. In some embodiments, the T cells are isolated from a donor, or subject, and first activated and stimulated to proliferate in vitro prior to undergoing gene editing.

In other embodiments, the T cells for use in generating the genetically engineered T cells disclosed herein may be derived from a T cell bank. A T cell bank may comprise T cells with genetic editing of certain genes (e.g., genes involved in cell self renewal, apoptosis, and/or T cell exhaustion or replicative senescence) to improve T cell persistence in cell culture. A T cell bank may be produced from bona fide T cells, for example, non-transformed T cells, terminally differentiated T cells, T cells having stable genome, and/or T cells that depend on cytokines and growth factors for proliferation and expansion. Alternatively, such a T cell bank may be produced from precursor cells such as hematopoietic stem cells (e.g., iPSCs), e.g., in vitro culture. In some examples, the T cells in the T cell bank may comprise genetic editing of one or more genes involved in cell self-renewal, one or more genes involved in apoptosis, and/or one or more genes involved in T cell exhaustion, so as to disrupt or reduce expression of such genes, leading to improved persistence in culture. Examples of the edited genes in a T cell bank include, but are not limited to, Tet2, Fas, CD70, Reg1, or a combination thereof. Compared with the non-edited T counterpart, T cells in a T cell bank may have enhanced expansion capacity in culture, enhanced proliferation capacity, greater T cell activation, and/or reduced apoptosis levels. Additional information of T cell bank may be found in International Application No. PCT/IB2020/058280, the relevant disclosures of which are incorporated by reference for the subject matter and purpose referenced herein.

In yet other embodiments, the T cells for generating the genetically engineered T cells disclosed herein may be derived from stem cells (e.g., HSCs or iPSCs) via in vitro differentiation.

T cells from any suitable source (e.g., those disclosed herein) can be subjected to one or more rounds of stimulation, activation and/or expansion. T cells can be activated and expanded generally using methods as described, for example, in U.S. Pat. Nos. 6,352,694; 6,534,055; 6,905,680; 6,692,964; 5,858,358; 6,887,466; 6,905,681; 7,144,575; 7,067,318; 7,172,869; 7,232,566; 7,175,843; 5,883,223; 6,905,874; 6,797,514; and 6,867,041. In some embodiments, T cells can be activated and expanded for about 1 day to about 4 days, about 1 day to about 3 days, about 1 day to about 2 days, about 2 days to about 3 days, about 2 days to about 4 days, about 3 days to about 4 days, or about 1 day, about 2 days, about 3 days, or about 4 days prior to introduction of the genome editing compositions into the T cells.

In some embodiments, T cells can be activated and expanded for about 4 hours, about 6 hours, about 12 hours, about 18 hours, about 24 hours, about 36 hours, about 48 hours, about 60 hours, or about 72 hours prior to introduction of the gene editing compositions into the T cells. In some embodiments, T cells are activated at the same time that genome editing compositions are introduced into the T cells. In some instances, the T cell population can be expanded and/or activated after the genetic editing as disclosed herein. T cell populations or isolated T cells generated by any of the gene editing methods described herein are also within the scope of the present disclosure.

(ii) Gene Editing Methods

Any of the genetically engineered T cells can be prepared using conventional gene editing methods or those described herein to edit one or more of the target genes disclosed herein (targeted editing). Targeted editing can be achieved either through a nuclease-independent approach, or through a nuclease-dependent approach. In the nuclease-independent targeted editing approach, homologous recombination is guided by homologous sequences flanking an exogenous polynucleotide to be introduced into an endogenous sequence through the enzymatic machinery of the host cell. The exogenous polynucleotide may introduce deletions, insertions or replacement of nucleotides in the endogenous sequence.

Alternatively, the nuclease-dependent approach can achieve targeted editing with higher frequency through the specific introduction of double strand breaks (DSBs) by specific rare-cutting nucleases (e.g., endonucleases). Such nuclease-dependent targeted editing also utilizes DNA repair mechanisms, for example, non-homologous end joining (NHEJ), which occurs in response to DSBs. DNA repair by NHEJ often leads to random insertions or deletions (indels) of a small number of endogenous nucleotides. In contrast to NHEJ mediated repair, repair can also occur by a homology directed repair (HDR). When a donor template containing exogenous genetic material flanked by a pair of homology arms is present, the exogenous genetic material can be introduced into the genome by HDR, which results in targeted integration of the exogenous genetic material.

In some embodiments, gene disruption may occur by deletion of a genomic sequence using two guide RNAs. Methods of using CRISPR-Cas gene editing technology to create a genomic deletion in a cell (e.g., to knock out a gene in a cell) are known (Bauer D E et al. Vis. Exp. 2015; 95:e52118).

Available endonucleases capable of introducing specific and targeted DSBs include, but not limited to, zinc-finger nucleases (ZFN), transcription activator-like effector nucleases (TALEN), and RNA-guided CRISPR-Cas9 nuclease (CRISPR/Cas9; Clustered Regular Interspaced Short Palindromic Repeats Associated 9). Additionally, DICE (dual integrase cassette exchange) system utilizing phiC31 and Bxb1 integrases may also be used for targeted integration. Some exemplary approaches are disclosed in detail below.

CRISPR-Cas9 Gene Editing System

The CRISPR-Cas9 system is a naturally-occurring defense mechanism in prokaryotes that has been repurposed as an RNA-guided DNA-targeting platform used for gene editing. It relies on the DNA nuclease Cas9, and two noncoding RNAs, crisprRNA (crRNA) and trans-activating RNA (tracrRNA), to target the cleavage of DNA. CRISPR is an abbreviation for Clustered Regularly Interspaced Short Palindromic Repeats, a family of DNA sequences found in the genomes of bacteria and archaea that contain fragments of DNA (spacer DNA) with similarity to foreign DNA previously exposed to the cell, for example, by viruses that have infected or attacked the prokaryote. These fragments of DNA are used by the prokaryote to detect and destroy similar foreign DNA upon re-introduction, for example, from similar viruses during subsequent attacks. Transcription of the CRISPR locus results in the formation of an RNA molecule comprising the spacer sequence, which associates with and targets Cas (CRISPR-associated) proteins able to recognize and cut the foreign, exogenous DNA. Numerous types and classes of CRISPR/Cas systems have been described (see, e.g., Koonin et al., (2017) Curr Opin Microbiol 37:67-78).

crRNA drives sequence recognition and specificity of the CRISPR-Cas9 complex through Watson-Crick base pairing typically with a 20 nucleotide (nt) sequence in the target DNA. Changing the sequence of the 5' 20 nt in the crRNA allows targeting of the CRISPR-Cas9 complex to specific loci. The CRISPR-Cas9 complex only binds DNA sequences that contain a sequence match to the first 20 nt of the crRNA, if the target sequence is followed by a specific short DNA motif (with the sequence NGG) referred to as a protospacer adjacent motif (PAM). tracrRNA hybridizes with the 3' end of crRNA to form an RNA-duplex structure that is bound by the Cas9 endonuclease to form the catalytically active CRISPR-Cas9 complex, which can then cleave the target DNA.

Once the CRISPR-Cas9 complex is bound to DNA at a target site, two independent nuclease domains within the Cas9 enzyme each cleave one of the DNA strands upstream of the PAM site, leaving a double-strand break (DSB), where both strands of the DNA terminate in a base pair (a blunt end). After binding of CRISPR-Cas9 complex to DNA at a specific target site and formation of the site-specific DSB, the next key step is repair of the DSB. Cells use two main DNA repair pathways to repair the DSB: non-homologous end joining (NHEJ) and homology-directed repair (HDR).

NHEJ is a robust repair mechanism that appears highly active in the majority of cell types, including non-dividing cells. NHEJ is error-prone and can often result in the removal or addition of between one and several hundred nucleotides at the site of the DSB, though such modifications are typically <20 nt. The resulting insertions and deletions (indels) can disrupt coding or noncoding regions of genes. Alternatively, HDR uses a long stretch of homologous donor DNA, provided endogenously or exogenously, to repair the DSB with high fidelity. HDR is active only in dividing cells and occurs at a relatively low frequency in most cell types. In many embodiments of the present disclosure, NHEJ is utilized as the repair operant.

Endonuclease for Use in CRISPR

In some embodiments, the Cas9 (CRISPR associated protein 9) endonuclease is used in a CRISPR method for making the genetically engineered T cells as disclosed herein. The Cas9 enzyme may be one from *Streptococcus pyogenes*, although other Cas9 homologs may also be used. It should be understood, that wild-type Cas9 may be used or modified versions of Cas9 may be used (e.g., evolved versions of Cas9, or Cas9 orthologues or variants), as provided herein. In some embodiments, Cas9 may be substituted with another RNA-guided endonuclease, such as Cpf1 (of a class II CRISPR/Cas system).

In some embodiments, the CRISPR/Cas system comprises components derived from a Type-I, Type-II, or Type-III system. Updated classification schemes for CRISPR/Cas loci define Class 1 and Class 2 CRISPR/Cas systems, having Types I to V or VI (Makarova et al., (2015) Nat Rev Microbiol, 13(11):722-36; Shmakov et al., (2015) Mol Cell, 60:385-397). Class 2 CRISPR/Cas systems have single protein effectors. Cas proteins of Types II, V, and VI are single-protein, RNA-guided endonucleases, herein called "Class 2 Cas nucleases." Class 2 Cas nucleases include, for example, Cas9, Cpf1, C2c1, C2c2, and C2c3 proteins. The Cpf1 nuclease (Zetsche et al., (2015) Cell 163:1-13) is homologous to Cas9 and contains a RuvC-like nuclease domain.

In some embodiments, the Cas nuclease is from a Type-II CRISPR/Cas system (e.g., a Cas9 protein from a CRISPR/Cas9 system). In some embodiments, the Cas nuclease is from a Class 2 CRISPR/Cas system (a single-protein Cas nuclease such as a Cas9 protein or a Cpf1 protein). The Cas9 and Cpf1 family of proteins are enzymes with DNA endonuclease activity, and they can be directed to cleave a desired nucleic acid target by designing an appropriate guide RNA, as described further herein.

In some embodiments, a Cas nuclease may comprise more than one nuclease domain. For example, a Cas9 nuclease may comprise at least one RuvC-like nuclease domain (e.g., Cpf1) and at least one HNH-like nuclease domain (e.g., Cas9). In some embodiments, the Cas9 nuclease introduces a DSB in the target sequence. In some embodiments, the Cas9 nuclease is modified to contain only one functional nuclease domain. For example, the Cas9 nuclease is modified such that one of the nuclease domains is mutated or fully or partially deleted to reduce its nucleic acid cleavage activity. In some embodiments, the Cas9 nuclease is modified to contain no functional RuvC-like nuclease domain. In other embodiments, the Cas9 nuclease is modified to contain no functional HNH-like nuclease domain. In some embodiments in which only one of the nuclease domains is functional, the Cas9 nuclease is a nickase that is capable of introducing a single-stranded break (a "nick") into the target sequence. In some embodiments, a conserved amino acid within a Cas9 nuclease domain is substituted to reduce or alter a nuclease activity. In some embodiments, the Cas nuclease nickase comprises an amino acid substitution in the RuvC-like nuclease domain. Exemplary amino acid substitutions in the RuvC-like nuclease domain include D10A (based on the *S. pyogenes* Cas9 nuclease). In some embodiments, the nickase comprises an amino acid substitution in the HNH-like nuclease domain. Exemplary amino acid substitutions in the HNH-like nuclease domain include E762A, H840A, N863A, H983A, and D986A (based on the *S. pyogenes* Cas9 nuclease).

```
Amino acid sequence of Cas9
nuclease (SEQ ID NO: 1):
MDKKYSIGLDIGTNSVGWAVITDEYKVPSKKFKVLG

NTDRHSIKKNLIGALLFDSGETAEATRLKRTARRR

YTRRKNRICYLQEIFSNEMAKVDDSFFHRLEESFL
```

-continued

```
VEEDKKHERHPIFGNIVDEVAYHEKYPTIYHLRKK

LVDSTDKADLRLIYLALAHMIKFRGHFLIEGDLNP

DNSDVDKLFIQLVQTYNQLFEENPINASGVDAKAI

LSARLSKSRRLENLIAQLPGEKKNGLFGNLIALSL

GLTPNFKSNFDLAEDAKLQLSKDTYDDDLDNLLAQ

IGDQYADLFLAAKNLSDAILLSDILRVNTEITKAP

LSASMIKRYDEHHQDLTLLKALVRQQLPEKYKEIF

FDQSKNGYAGYIDGGASQEEFYKFIKPILEKMDGT

EELLVKLNREDLLRKQRTFDNGSIPHQIHLGELHA

ILRRQEDFYPFLKDNREKIEKILTFRIPYYVGPLA

RGNSRFAWMTRKSEETITPWNFEEVVDKGASAQSF

IERMTNFDKNLPNEKVLPKHSLLYEYFTVYNELTK

VKYVTEGMRKPAFLSGEQKKAIVDLLFKTNRKVTV

KQLKEDYFKKIECFDSVEISGVEDRFNASLGTYHD

LLKIIKDKDFLDNEENEDILEDIVLTLTLFEDREM

IEERLKTYAHLFDDKVMKQLKRRRYTGWGRLSRKL

INGIRDKQSGKTILDFLKSDGFANRNFMQLIHDDS

LTFKEDIQKAQVSGQGDSLHEHIANLAGSPAIKKG

ILQTVKVVDELVKVMGRHKPENIVIEMARENQTTQ

KGQKNSRERMKRIEEGIKELGSQILKEHPVENTQL

QNEKLYLYYLQNGRDMYVDQELDINRLSDYDVDHI

VPQSFLKDDSIDNKVLTRSDKNRGKSDNVPSEEVV

KKMKNYWRQLLNAKLITQRKFDNLTKAERGGLSEL

DKAGFIKRQLVETRQITKHVAQILDSRMNTKYDEN

DKLIREVKVITLKSKLVSDFRKDFQFYKVREINNY

HHAHDAYLNAVVGTALIKKYPKLESEFVYGDYKVY

DVRKMIAKSEQEIGKATAKYFFYSNIMNFFKTEIT

LANGEIRKRPLIETNGETGEIVWDKGRDFATVRKV

LSMPQVNIVKKTEVQTGGFSKESILPKRNSDKLIA

RKKDWDPKKYGGFDSPTVAYSVLVVAKVEKGKSKK

LKSVKELLGITIMERSSFEKNPIDFLEAKGYKEVK

KDLIIKLPKYSLFELENGRKRMLASAGELQKGNEL

ALPSKYVNFLYLASHYEKLKGSPEDNEQKQLFVEQ

HKHYLDEIIEQISEFSKRVILADANLDKVLSAYNK

HRDKPIREQAENIIHLFTLTNLGAPAAFKYFDTTI

DRKRYTSTKEVLDATLIHQSITGLYETRIDLSQLG

GD
```

In some embodiments, the Cas nuclease is from a Type-I CRISPR/Cas system. In some embodiments, the Cas nuclease is a component of the Cascade complex of a Type-I CRISPR/Cas system. For example, the Cas nuclease is a Cas3 nuclease. In some embodiments, the Cas nuclease is derived from a Type-III CRISPR/Cas system. In some embodiments, the Cas nuclease is derived from Type-IV CRISPR/Cas system. In some embodiments, the Cas nuclease is derived from a Type-V CRISPR/Cas system. In some embodiments, the Cas nuclease is derived from a Type-VI CRISPR/Cas system.

Guide RNAs (gRNAs)

The CRISPR technology involves the use of a genome-targeting nucleic acid that can direct the endonuclease to a specific target sequence within a target gene for gene editing at the specific target sequence. The genome-targeting nucleic acid can be a RNA. A genome-targeting RNA is referred to as a "guide RNA" or "gRNA" herein. A guide RNA comprises at least a spacer sequence that hybridizes to a target nucleic acid sequence within a target gene for editing, and a CRISPR repeat sequence.

In Type II systems, the gRNA also comprises a second RNA called the tracrRNA sequence. In the Type II gRNA, the CRISPR repeat sequence and tracrRNA sequence hybridize to each other to form a duplex. In the Type V gRNA, the crRNA forms a duplex. In both systems, the duplex binds a site-directed polypeptide, such that the guide RNA and site-direct polypeptide form a complex. In some embodiments, the genome-targeting nucleic acid provides target specificity to the complex by virtue of its association with the site-directed polypeptide. The genome-targeting nucleic acid thus directs the activity of the site-directed polypeptide.

As is understood by the person of ordinary skill in the art, each guide RNA is designed to include a spacer sequence complementary to its genomic target sequence. See Jinek et al., Science, 337, 816-821 (2012) and Deltcheva et al., Nature, 471, 602-607 (2011).

In some embodiments, the genome-targeting nucleic acid (e.g., gRNA) is a double-molecule guide RNA. A double-molecule guide RNA comprises two strands of RNA molecules. The first strand comprises in the 5' to 3' direction, an optional spacer extension sequence, a spacer sequence and a minimum CRISPR repeat sequence. The second strand comprises a minimum tracrRNA sequence (complementary to the minimum CRISPR repeat sequence), a 3' tracrRNA sequence and an optional tracrRNA extension sequence.

In some embodiments, the genome-targeting nucleic acid (e.g., gRNA) is a single-molecule guide RNA. A single-molecule guide RNA (referred to as a "sgRNA") in a Type II system comprises, in the 5' to 3' direction, an optional spacer extension sequence, a spacer sequence, a minimum CRISPR repeat sequence, a single-molecule guide linker, a minimum tracrRNA sequence, a 3' tracrRNA sequence and an optional tracrRNA extension sequence. The optional tracrRNA extension may comprise elements that contribute additional functionality (e.g., stability) to the guide RNA. The single-molecule guide linker links the minimum CRISPR repeat and the minimum tracrRNA sequence to form a hairpin structure. The optional tracrRNA extension comprises one or more hairpins. A single-molecule guide RNA in a Type V system comprises, in the 5' to 3' direction, a minimum CRISPR repeat sequence and a spacer sequence.

A spacer sequence in a gRNA is a sequence (e.g., a 20 nucleotide sequence) that defines the target sequence (e.g., a DNA target sequences, such as a genomic target sequence) of a target gene of interest. In some embodiments, the spacer sequence range from 15 to 30 nucleotides. For example, the spacer sequence may contain 15, 16, 17, 18, 19, 29, 21, 22, 23, 24, 25, 26, 27, 28, 29, or 30 nucleotides. In some embodiments, a spacer sequence contains 20 nucleotides.

The "target sequence" is in a target gene that is adjacent to a PAM sequence and is the sequence to be modified by an RNA-guided nuclease (e.g., Cas9). The "target sequence" is on the so-called PAM-strand in a "target nucleic acid," which is a double-stranded molecule containing the PAM-strand and a complementary non-PAM strand. One of skill in the art recognizes that the gRNA spacer sequence hybridizes to the complementary sequence located in the non-PAM strand of the target nucleic acid of interest. Thus, the gRNA spacer sequence is the RNA equivalent of the target sequence. For example, if the target sequence is 5'-AGAGCAACAGTGCTGTGGCC-3' (SEQ ID NO: 87), then the gRNA spacer sequence is 5'-AGAGCAACAGUGCUGUGGCC-3' (SEQ ID NO: 79). The spacer of a gRNA interacts with a target nucleic acid of interest in a sequence-specific manner via hybridization (i.e., base pairing). The nucleotide sequence of the spacer thus varies depending on the target sequence of the target nucleic acid of interest.

In a CRISPR/Cas system herein, the spacer sequence is designed to hybridize to a region of the target nucleic acid that is located 5' of a PAM recognizable by a Cas9 enzyme used in the system. The spacer may perfectly match the target sequence or may have mismatches. Each Cas9 enzyme has a particular PAM sequence that it recognizes in a target DNA. For example, *S. pyogenes* recognizes in a target nucleic acid a PAM that comprises the sequence 5'-NRG-3', where R comprises either A or G, where N is any nucleotide and N is immediately 3' of the target nucleic acid sequence targeted by the spacer sequence.

In some embodiments, the target nucleic acid sequence has 20 nucleotides in length. In some embodiments, the target nucleic acid has less than 20 nucleotides in length. In some embodiments, the target nucleic acid has more than 20 nucleotides in length. In some embodiments, the target nucleic acid has at least: 5, 10, 15, 16, 17, 18, 19, 20, 21, 22, 23, 24, 25, 30 or more nucleotides in length. In some embodiments, the target nucleic acid has at most: 5, 10, 15, 16, 17, 18, 19, 20, 21, 22, 23, 24, 25, 30 or more nucleotides in length. In some embodiments, the target nucleic acid sequence has 20 bases immediately 5' of the first nucleotide of the PAM. For example, in a sequence comprising 5'-NNNNNNNNNNNNNNNNNNNNNRG-3', the target nucleic acid can be the sequence that corresponds to the Ns, wherein N can be any nucleotide, and the underlined NRG sequence is the *S. pyogenes* PAM.

The guide RNA disclosed herein may target any sequence of interest via the spacer sequence in the crRNA. In some embodiments, the degree of complementarity between the spacer sequence of the guide RNA and the target sequence in the target gene can be about 60%, 65%, 70%, 75%, 80%, 85%, 90%, 95%, 97%, 98%, 99%, or 100%. In some embodiments, the spacer sequence of the guide RNA and the target sequence in the target gene is 100% complementary. In other embodiments, the spacer sequence of the guide RNA and the target sequence in the target gene may contain up to 10 mismatches, e.g., up to 9, up to 8, up to 7, up to 6, up to 5, up to 4, up to 3, up to 2, or up to 1 mismatch.

For any of the gRNA sequences provided herein, those that do not explicitly indicate modifications are meant to encompass both unmodified sequences and sequences having any suitable modifications.

The length of the spacer sequence in any of the gRNAs disclosed herein may depend on the CRISPR/Cas9 system and components used for editing any of the target genes also disclosed herein. For example, different Cas9 proteins from different bacterial species have varying optimal spacer sequence lengths. Accordingly, the spacer sequence may have 5, 6, 7, 8, 9, 10, 11, 12, 13, 14, 15, 16, 17, 18, 19, 20, 21, 22, 23, 24, 25, 26, 27, 28, 29, 30, 35, 40, 45, 50, or more than 50 nucleotides in length. In some embodiments, the spacer sequence may have 18-24 nucleotides in length. In some embodiments, the targeting sequence may have 19-21 nucleotides in length. In some embodiments, the spacer sequence may comprise 20 nucleotides in length.

In some embodiments, the gRNA can be an sgRNA, which may comprise a 20 nucleotide spacer sequence at the 5' end of the sgRNA sequence. In some embodiments, the sgRNA may comprise a less than 20 nucleotide spacer sequence at the 5' end of the sgRNA sequence. In some embodiments, the sgRNA may comprise a more than 20 nucleotide spacer sequence at the 5' end of the sgRNA sequence. In some embodiments, the sgRNA comprises a variable length spacer sequence with 17-30 nucleotides at the 5' end of the sgRNA sequence. Examples are provided in Table 5 below. In these exemplary sequences, the fragment of "n" refers to the spacer sequence at the 5' end.

In some embodiments, the sgRNA comprises comprise no uracil at the 3' end of the sgRNA sequence. In other embodiments, the sgRNA may comprise one or more uracil at the 3' end of the sgRNA sequence. For example, the sgRNA can comprise 1-8 uracil residues, at the 3' end of the sgRNA sequence, e.g., 1, 2, 3, 4, 5, 6, 7, or 8 uracil residues at the 3' end of the sgRNA sequence.

Any of the gRNAs disclosed herein, including any of the sgRNAs, may be unmodified. Alternatively, it may contain one or more modified nucleotides and/or modified backbones. For example, a modified gRNA such as an sgRNA can comprise one or more 2'-O-methyl phosphorothioate nucleotides, which may be located at either the 5' end, the 3' end, or both.

In certain embodiments, more than one guide RNAs can be used with a CRISPR/Cas nuclease system. Each guide RNA may contain a different targeting sequence, such that the CRISPR/Cas system cleaves more than one target nucleic acid. In some embodiments, one or more guide RNAs may have the same or differing properties such as activity or stability within the Cas9 RNP complex. Where more than one guide RNA is used, each guide RNA can be encoded on the same or on different vectors. The promoters used to drive expression of the more than one guide RNA is the same or different.

In some embodiments, the gRNAs disclosed herein target a PTPN2 gene, for example, target a site within any one of exons 1-10, for example, exon 1, exon 2, or exon 3 of the PTPN2 gene. Such a gRNA may comprise a spacer sequence complementary (complete or partially) to the target sequences in exon 2 of a PTPN2 gene, or a fragment thereof. Exemplary target sequences of PTPN2 and exemplary gRNA sequences are provided in Table 3 and Table 4 below:

In some embodiments, the gRNAs disclosed herein target a CD70 gene, for example, target a site within exon 1 or exon 3 of a CD70 gene. Such a gRNA may comprise a spacer sequence complementary (complete or partially) to the target sequences in exon 1 or exon 3 of a CD70 gene, or a fragment thereof. Exemplary target sequences in a CD70 gene and exemplary gRNAs specific to the CD70 gene are provided in Table 5 below. See also WO2019/215500, the relevant disclosures of which are incorporated by reference for the purpose and subject matter referenced herein.

In some embodiments, the gRNAs disclosed herein target a β2M gene, for example, target a suitable site within a β2M gene. See also WO2019097305, the relevant disclosure s of which are incorporated by reference herein for the purpose and subject matter referenced herein. Other gRNA sequences may be designed using the β2M gene sequence located on Chromosome 15 (GRCh38 coordinates: Chromosome 15: 44,711,477-44,718,877; Ensembl: ENSG00000166710). In some embodiments, gRNAs targeting the β2M genomic region and RNA-guided nuclease create breaks in the β2M genomic region resulting in Indels in the β2M gene disrupting expression of the mRNA or protein. Exemplary spacer sequences and gRNAs targeting a β2M gene are provided in Table 5 below.

In some embodiments, the gRNAs disclosed herein target a TRAC gene. See also WO2019097305, the relevant disclosures of which are incorporated by reference herein for the subject matter and purpose referenced herein. Other gRNA sequences may be designed using the TRAC gene sequence located on chromosome 14 (GRCh38: chromosome 14: 22,547,506-22,552,154; Ensembl; ENSG00000277734). In some embodiments, gRNAs targeting the TRAC genomic region and RNA-guided nuclease create breaks in the TRAC genomic region resulting Indels in the TRAC gene disrupting expression of the mRNA or protein. Exemplary spacer sequences and gRNAs targeting a TRAC gene are provided in Table 5 below.

By way of illustration, guide RNAs used in the CRISPR/Cas/Cpf1 system, or other smaller RNAs can be readily synthesized by chemical means, as illustrated below and described in the art. While chemical synthetic procedures are continually expanding, purifications of such RNAs by procedures such as high performance liquid chromatography (HPLC, which avoids the use of gels such as PAGE) tends to become more challenging as polynucleotide lengths increase significantly beyond a hundred or so nucleotides. One approach used for generating RNAs of greater length is to produce two or more molecules that are ligated together. Much longer RNAs, such as those encoding a Cas9 or Cpf1 endonuclease, are more readily generated enzymatically. Various types of RNA modifications can be introduced during or after chemical synthesis and/or enzymatic generation of RNAs, e.g., modifications that enhance stability, reduce the likelihood or degree of innate immune response, and/or enhance other attributes, as described in the art.

In some examples, the gRNAs of the present disclosure can be are produced in vitro transcription (IVT), synthetic and/or chemical synthesis methods, or a combination thereof. Enzymatic (IVT), solid-phase, liquid-phase, combined synthetic methods, small region synthesis, and ligation methods are utilized. In one embodiment, the gRNAs are made using IVT enzymatic synthesis methods. Methods of making polynucleotides by IVT are known in the art and are described in WO2013/151666. Accordingly, the present disclosure also includes polynucleotides, e.g., DNA, constructs and vectors are used to in vitro transcribe a gRNA described herein.

Various types of RNA modifications can be introduced during or after chemical synthesis and/or enzymatic generation of RNAs, e.g., modifications that enhance stability, reduce the likelihood or degree of innate immune response, and/or enhance other attributes, as described in the art. In some embodiments, non-natural modified nucleobases can be introduced into any of the gRNAs disclosed herein during synthesis or post-synthesis. In certain embodiments, modifications are on internucleoside linkages, purine or pyrimidine bases, or sugar. In some embodiments, a modification is introduced at the terminal of a gRNA with chemical synthesis or with a polymerase enzyme. Examples of modified nucleic acids and their synthesis are disclosed in WO2013/052523. Synthesis of modified polynucleotides is also described in Verma and Eckstein, Annual Review of Biochemistry, vol. 76, 99-134 (1998).

In some embodiments, enzymatic or chemical ligation methods can be used to conjugate polynucleotides or their regions with different functional moieties, such as targeting or delivery agents, fluorescent labels, liquids, nanoparticles, etc. Conjugates of polynucleotides and modified polynucleotides are reviewed in Goodchild, Bioconjugate Chemistry, vol. 1(3), 165-187 (1990).

In some embodiments of the present disclosure, a CRISPR/Cas nuclease system for use in genetically editing any of the target genes disclosed here may include at least one guide RNA. In some examples, the CRISPR/Cas nuclease system may contain multiple gRNAs, for example, 2, 3, or 4 gRNAs. Such multiple gRNAs may target different sites in a same target gene. Alternatively, the multiple gRNAs may target different genes. In some embodiments, the guide RNA(s) and the Cas protein may form a ribonucleoprotein (RNP), e.g., a CRISPR/Cas complex. The guide RNA(s) may guide the Cas protein to a target sequence(s) on one or more target genes as those disclosed herein, where the Cas protein cleaves the target gene at the target site. In some embodiments, the CRISPR/Cas complex is a Cpf1/guide RNA complex. In some embodiments, the CRISPR complex is a Type-II CRISPR/Cas9 complex. In some embodiments, the Cas protein is a Cas9 protein. In some embodiments, the CRISPR/Cas9 complex is a Cas9/guide RNA complex.

In some embodiments, the indel frequency (editing frequency) of a particular CRISPR/Cas nuclease system, comprising one or more specific gRNAs, may be determined using a TIDE analysis, which can be used to identify highly efficient gRNA molecules for editing a target gene. In some embodiments, a highly efficient gRNA yields a gene editing frequency of higher than 80%. For example, a gRNA is considered to be highly efficient if it yields a gene editing frequency of at least 80%, at least 85%, at least 90%, at least 95%, or 100%.

Delivery of Guide RNAs and Nucleases to T Cells

The CRISPR/Cas nuclease system disclosed herein, comprising one or more gRNAs and at least one RNA-guided nuclease, optionally a donor template as disclosed below, can be delivered to a target cell (e.g., a T cell) for genetic editing of a target gene, via a conventional method. In some embodiments, components of a CRISPR/Cas nuclease system as disclosed herein may be delivered to a target cell separately, either simultaneously or sequentially. In other embodiments, the components of the CRISPR/Cas nuclease system may be delivered into a target together, for example, as a complex. In some instances, gRNA and a RNA-guided nuclease can be pre-complexed together to form a ribonucleoprotein (RNP), which can be delivered into a target cell.

RNPs are useful for gene editing, at least because they minimize the risk of promiscuous interactions in a nucleic acid-rich cellular environment and protect the RNA from degradation. Methods for forming RNPs are known in the art. In some embodiments, an RNP containing an RNA-guided nuclease (e.g., a Cas nuclease, such as a Cas9 nuclease) and one or more gRNAs targeting one or more genes of interest can be delivered a cell (e.g., a T cell). In some embodiments, an RNP can be delivered to a T cell by electroporation.

In some embodiments, an RNA-guided nuclease can be delivered to a cell in a DNA vector that expresses the RNA-guided nuclease in the cell. In other examples, an RNA-guided nuclease can be delivered to a cell in an RNA that encodes the RNA-guided nuclease and expresses the nuclease in the cell. Alternatively or in addition, a gRNA targeting a gene can be delivered to a cell as a RNA, or a DNA vector that expresses the gRNA in the cell.

Delivery of an RNA-guided nuclease, gRNA, and/or an RNP may be through direct injection or cell transfection using known methods, for example, electroporation or chemical transfection. Other cell transfection methods may be used.

Other Gene Editing Methods

Besides the CRISPR method disclosed herein, additional gene editing methods as known in the art can also be used in making the genetically engineered T cells disclosed herein. Some examples include gene editing approaching involve zinc finger nuclease (ZFN), transcription activator-like effector nucleases (TALEN), restriction endonucleases, meganucleases homing endonucleases, and the like.

ZFNs are targeted nucleases comprising a nuclease fused to a zinc finger DNA binding domain (ZFBD), which is a polypeptide domain that binds DNA in a sequence-specific manner through one or more zinc fingers. A zinc finger is a domain of about 30 amino acids within the zinc finger binding domain whose structure is stabilized through coordination of a zinc ion. Examples of zinc fingers include, but not limited to, C2H2 zinc fingers, C3H zinc fingers, and C4 zinc fingers. A designed zinc finger domain is a domain not occurring in nature whose design/composition results principally from rational criteria, e.g., application of substitution rules and computerized algorithms for processing information in a database storing information of existing ZFP designs and binding data. See, for example, U.S. Pat. Nos. 6,140,081; 6,453,242; and 6,534,261; see also WO 98/53058; WO 98/53059; WO 98/53060; WO 02/016536 and WO 03/016496. A selected zinc finger domain is a domain not found in nature whose production results primarily from an empirical process such as phage display, interaction trap or hybrid selection. ZFNs are described in greater detail in U.S. Pat. Nos. 7,888,121 and 7,972,854. The most recognized example of a ZFN is a fusion of the FokI nuclease with a zinc finger DNA binding domain.

A TALEN is a targeted nuclease comprising a nuclease fused to a TAL effector DNA binding domain. A "transcription activator-like effector DNA binding domain", "TAL effector DNA binding domain", or "TALE DNA binding domain" is a polypeptide domain of TAL effector proteins that is responsible for binding of the TAL effector protein to DNA. TAL effector proteins are secreted by plant pathogens of the genus *Xanthomonas* during infection. These proteins enter the nucleus of the plant cell, bind effector-specific DNA sequences via their DNA binding domain, and activate gene transcription at these sequences via their transactivation domains. TAL effector DNA binding domain specificity depends on an effector-variable number of imperfect 34 amino acid repeats, which comprise polymorphisms at select repeat positions called repeat variable-diresidues (RVD). TALENs are described in greater detail in US Patent Application No. 2011/0145940. The most recognized example of a TALEN in the art is a fusion polypeptide of the FokI nuclease to a TAL effector DNA binding domain.

Additional examples of targeted nucleases suitable for use as provided herein include, but are not limited to, Bxb1, phiC31, R4, PhiBT1, and WWSPBc/TP901-1, whether used individually or in combination.

Any of the nucleases disclosed herein may be delivered using a vector system, including, but not limited to, plasmid vectors, DNA minicircles, retroviral vectors, lentiviral vectors, adenovirus vectors, poxvirus vectors; herpesvirus vectors and adeno-associated virus vectors, and combinations thereof.

Conventional viral and non-viral based gene transfer methods can be used to introduce nucleic acids encoding nucleases and donor templates in cells (e.g., T cells). Non-viral vector delivery systems include DNA plasmids, DNA minicircles, naked nucleic acid, and nucleic acid complexed with a delivery vehicle such as a liposome or poloxamer. Viral vector delivery systems include DNA and RNA viruses, which have either episomal or integrated genomes after delivery to the cell.

Methods of non-viral delivery of nucleic acids include electroporation, lipofection, microinjection, biolistics, virosomes, liposomes, immunoliposomes, polycation or lipid: nucleic acid conjugates, naked DNA, naked RNA, capped RNA, artificial virions, and agent-enhanced uptake of DNA. Sonoporation using, e.g., the Sonitron 2000 system (RichMar) can also be used for delivery of nucleic acids. Some specific examples are provided below.

II. Genetically Engineered T Cells Expressing a Chimeric Antigen Receptor (CAR)

The genetically engineered T cells having a disrupted PTPN2 gene and optionally one or more of additional disrupted genes, e.g., β2M, TRAC, CD70, or a combination thereof as disclosed herein, may further express a chimeric antigen receptor (CAR) targeting an antigen of interest or cells expressing such an antigen.

(a) Chimeric Antigen Receptor (CAR)

A chimeric antigen receptor (CAR) refers to an artificial immune cell receptor that is engineered to recognize and bind to an antigen expressed by undesired cells, for example, disease cells such as cancer cells. A T cell that expresses a CAR polypeptide is referred to as a CAR T cell. CARs have the ability to redirect T-cell specificity and reactivity toward a selected target in a non-MHC-restricted manner. The non-MHC-restricted antigen recognition gives CAR-T cells the ability to recognize an antigen independent of antigen processing, thus bypassing a major mechanism of tumor escape. Moreover, when expressed on T-cells, CARs advantageously do not dimerize with endogenous T-cell receptor (TCR) alpha and beta chains. There are various generations of CARs, each of which contains different components.

First generation CARs join an antibody-derived scFv to the CD3zeta or z) intracellular signaling domain of the T-cell receptor through hinge and transmembrane domains. Second generation CARs incorporate an additional co-stimulatory domain, e.g., CD28, 4-1BB (41BB), or ICOS, to supply a costimulatory signal. Third-generation CARs contain two costimulatory domains (e.g., a combination of CD27, CD28, 4-1BB, ICOS, or OX40) fused with the TCR CD3ζ chain. Maude et al., Blood. 2015; 125(26):4017-4023; Kakarla and Gottschalk, *Cancer J.* 2014; 20(2):151-155). Any of the various generations of CAR constructs is within the scope of the present disclosure.

Generally, a CAR is a fusion polypeptide comprising an extracellular domain that recognizes a target antigen (e.g., a single chain fragment (scFv) of an antibody or other antibody fragment) and an intracellular domain comprising a signaling domain of the T-cell receptor (TCR) complex (e.g., CD3ζ) and, in most cases, a co-stimulatory domain. (Enblad et al., Human Gene Therapy. 2015; 26(8):498-505). A CAR construct may further comprise a hinge and transmembrane domain between the extracellular domain and the intracellular domain, as well as a signal peptide at the N-terminus for surface expression. Examples of signal peptides include SEQ ID NO: 113 and SEQ ID NO: 114 as provided in Table 9 below. Other signal peptides may be used.

(i) Antigen Binding Extracellular Domain

The antigen-binding extracellular domain is the region of a CAR polypeptide that is exposed to the extracellular fluid when the CAR is expressed on cell surface. In some instances, a signal peptide may be located at the N-terminus to facilitate cell surface expression. In some embodiments, the antigen binding domain can be a single-chain variable fragment (scFv, which may include an antibody heavy chain variable region ($V_H$) and an antibody light chain variable region ($V_L$) (in either orientation). In some instances, the $V_H$ and $V_L$ fragment may be linked via a peptide linker. The linker, in some embodiments, includes hydrophilic residues with stretches of glycine and serine for flexibility as well as stretches of glutamate and lysine for added solubility. The scFv fragment retains the antigen-binding specificity of the parent antibody, from which the scFv fragment is derived. In some embodiments, the scFv may comprise humanized $V_H$ and/or $V_L$ domains. In other embodiments, the $V_H$ and/or $V_L$ domains of the scFv are fully human.

The antigen-binding extracellular domain may be specific to a target antigen of interest, for example, a pathologic antigen such as a tumor antigen (e.g., a solid tumor antigen). In some embodiments, a tumor antigen is a "tumor associated antigen," referring to an immunogenic molecule, such as a protein, that is generally expressed at a higher level in tumor cells than in non-tumor cells, in which it may not be expressed at all, or only at low levels. In some embodiments, tumor-associated structures, which are recognized by the immune system of the tumor-harboring host, are referred to as tumor-associated antigens. In some embodiments, a tumor-associated antigen is a universal tumor antigen, if it is broadly expressed by most types of tumors. In some embodiments, tumor-associated antigens are differentiation antigens, mutational antigens, overexpressed cellular antigens or viral antigens. In some embodiments, a tumor antigen is a "tumor specific antigen" or "TSA," referring to an immunogenic molecule, such as a protein, that is unique to a tumor cell. Tumor specific antigens are exclusively expressed in tumor cells, for example, in a specific type of tumor cells.

Exemplary tumor antigens include, but are not limited to, CD19, BCMA, and CD70. Any known antibodies specific to such tumor antigens, for example, those approved for marketing and those in clinical trials, can be used for making the CAR constructs disclosed herein. Non-limiting examples of CAR constructs are provided in WO2019097305 and WO2019215500, and WO2020/095107, the relevant disclosures of which are herein incorporated by reference for the purposes and subject matter referenced herein.

(ii) Transmembrane Domain

The CAR polypeptide disclosed herein may contain a transmembrane domain, which can be a hydrophobic alpha helix that spans the membrane. As used herein, a "transmembrane domain" refers to any protein structure that is thermodynamically stable in a cell membrane, preferably a eukaryotic cell membrane. The transmembrane domain can provide stability of the CAR containing such.

In some embodiments, the transmembrane domain of a CAR as provided herein can be a CD8 transmembrane domain. In other embodiments, the transmembrane domain can be a CD28 transmembrane domain. In yet other embodiments, the transmembrane domain is a chimera of a CD8 and CD28 transmembrane domain. Other transmembrane domains may be used as provided herein. In some embodiments, the transmembrane domain is a CD8a transmembrane domain containing the sequence of SEQ ID NO: 115 as provided below in Table 9. Other transmembrane domains may be used.

(iii) Hinge Domain

In some embodiments, a hinge domain may be located between an extracellular domain (comprising the antigen binding domain) and a transmembrane domain of a CAR, or between a cytoplasmic domain and a transmembrane domain of the CAR. A hinge domain can be any oligopeptide or polypeptide that functions to link the transmembrane domain to the extracellular domain and/or the cytoplasmic domain in the polypeptide chain. A hinge domain may function to provide flexibility to the CAR, or domains thereof, or to prevent steric hindrance of the CAR, or domains thereof.

In some embodiments, a hinge domain may comprise up to 300 amino acids (e.g., 10 to 100 amino acids, or 5 to 20 amino acids). In some embodiments, one or more hinge domain(s) may be included in other regions of a CAR. In some embodiments, the hinge domain may be a CD8 hinge domain. Other hinge domains may be used.

(iv) Intracellular Signaling Domains

Any of the CAR constructs contain one or more intracellular signaling domains (e.g., CD3ζ, and optionally one or more co-stimulatory domains), which are the functional end of the receptor. Following antigen recognition, receptors cluster and a signal is transmitted to the cell.

CD3ζ is the cytoplasmic signaling domain of the T cell receptor complex. CD3ζ contains three (3) immunoreceptor tyrosine-based activation motif (ITAM)s, which transmit an activation signal to the T cell after the T cell is engaged with a cognate antigen. In many cases, CD3ζ provides a primary T cell activation signal but not a fully competent activation signal, which requires a co-stimulatory signaling.

In some embodiments, the CAR polypeptides disclosed herein may further comprise one or more co-stimulatory signaling domains. For example, the co-stimulatory domains of CD28 and/or 4-1BB may be used to transmit a full proliferative/survival signal, together with the primary signaling mediated by CD3ζ. In some examples, the CAR disclosed herein comprises a CD28 co-stimulatory molecule. In other examples, the CAR disclosed herein comprises a 4-1BB co-stimulatory molecule. In some embodiments, a CAR includes a CD3ζ signaling domain and a CD28 co-stimulatory domain. In other embodiments, a CAR includes a CD3ζ signaling domain and 4-1BB co-stimulatory domain. In still other embodiments, a CAR includes a CD3ζ signaling domain, a CD28 co-stimulatory domain, and a 4-1BB co-stimulatory domain.

Table 9 provides examples of signaling domains derived from 4-1BB, CD28 and CD3-zeta that may be used herein.

In specific examples, the anti-CD19 CAR disclosed herein may comprise the amino acid sequence of SEQ ID NO: 135, which may be encoded by the nucleotide sequence of SEQ ID NO: 134. In other examples, the anti-BCMA CAR disclosed herein may comprise the amino acid sequence of SEQ ID NO: 163, which may be encoded by the nucleotide sequence of SEQ ID NO: 162. In other examples, the anti-CD70 CAR disclosed herein may comprise the amino acid sequence of SEQ ID NO: 155, which may be encoded by the nucleotide sequence of SEQ ID NO: 190. See sequence Table 9 provided below.

(b) Delivery of CAR Construct to T Cells

In some embodiments, a nucleic acid encoding a CAR can be introduced into any of the genetically engineered T cells disclosed herein by methods known to those of skill in the art. For example, a coding sequence of the CAR may be cloned into a vector, which may be introduced into the genetically engineered T cells for expression of the CAR. A variety of different methods known in the art can be used to introduce any of the nucleic acids or expression vectors disclosed herein into an immune effector cell. Non-limiting examples of methods for introducing nucleic acid into a cell include: lipofection, transfection (e.g., calcium phosphate transfection, transfection using highly branched organic compounds, transfection using cationic polymers, dendrimer-based transfection, optical transfection, particle-based transfection (e.g., nanoparticle transfection), or transfection using liposomes (e.g., cationic liposomes)), microinjection, electroporation, cell squeezing, sonoporation, protoplast fusion, impalefection, hydrodynamic delivery, gene gun, magnetofection, viral transfection, and nucleofection.

In specific examples, a nucleic acid encoding a CAR construct can be delivered to a cell using an adeno-associated virus (AAV). AAVs are small viruses which integrate site-specifically into the host genome and can therefore deliver a transgene, such as CAR. Inverted terminal repeats (ITRs) are present flanking the AAV genome and/or the transgene of interest and serve as origins of replication. Also present in the AAV genome are rep and cap proteins which, when transcribed, form capsids which encapsulate the AAV genome for delivery into target cells. Surface receptors on these capsids which confer AAV serotype, which determines which target organs the capsids will primarily bind and thus what cells the AAV will most efficiently infect. There are twelve currently known human AAV serotypes. In some embodiments, the AAV for use in delivering the CAR-coding nucleic acid is AAV serotype 6 (AAV6).

Adeno-associated viruses are among the most frequently used viruses for gene therapy for several reasons. First, AAVs do not provoke an immune response upon administration to mammals, including humans. Second, AAVs are effectively delivered to target cells, particularly when consideration is given to selecting the appropriate AAV serotype. Finally, AAVs have the ability to infect both dividing and non-dividing cells because the genome can persist in the host cell without integration. This trait makes them an ideal candidate for gene therapy.

A nucleic acid encoding a CAR can be designed to insert into a genomic site of interest in the host T cells. In some embodiments, the target genomic site can be in a safe harbor locus.

In some embodiments, a nucleic acid encoding a CAR (e.g., via a donor template, which can be carried by a viral vector such as an adeno-associated viral (AAV) vector) can be designed such that it can insert into a genomic site of interest. In some instances, the nucleic acid may comprise a left homologous arm and a right homologous arm flanking the nucleotide sequence encoding the CAR. The left and right homologous arms are homologous to the upstream and downstream sequences of the genomic site where the CAR-coding sequence is to be inserted. In some examples, the genomic site where the CAR-coding sequence is to be inserted is also the target site of a guide RNA such that the CAR-coding nucleic acid can be inserted at the guide RNA targeting site. In some examples, the left homologous arm and the right homologous arm may be homologous to the sequences immediately flank the guide RNA targeting site. In some instances, the guide RNA targeting site can be deleted and replaced by the CAR-encoding nucleic acid after gene editing.

In some embodiments, a nucleic acid encoding a CAR (e.g., via a donor template, which can be carried by a viral vector such as an adeno-associated viral (AAV) vector) can be designed such that it can insert into a location within a TRAC gene to disrupt the TRAC gene in the genetically engineered T cells and express the CAR polypeptide. Disruption of TRAC leads to loss of function of the endogenous TCR. For example, a disruption in the TRAC gene can be created with an endonuclease such as those described herein and one or more gRNAs targeting one or more TRAC genomic regions. Any of the gRNAs specific to a TRAC gene and the target regions disclosed herein can be used for this purpose.

In some examples, a genomic deletion in the TRAC gene and replacement by a CAR coding segment can be created by homology directed repair or HDR (e.g., using a donor template, which may be part of a viral vector such as an adeno-associated viral (AAV) vector). In some embodiments, a disruption in the TRAC gene can be created with an endonuclease as those disclosed herein and one or more gRNAs targeting one or more TRAC genomic regions and inserting a CAR coding segment into the TRAC gene.

A donor template as disclosed herein can contain a coding sequence for a CAR. In some examples, the CAR-coding sequence may be flanked by two regions of homology to allow for efficient HDR at a genomic location of interest, for example, at a TRAC gene using a gene editing method known in the art. In some examples, a CRISPR-based method can be used. In this case, both strands of the DNA at the target locus can be cut by a CRISPR Cas9 enzyme guided by gRNAs specific to the target locus. HDR then occurs to repair the double-strand break (DSB) and insert the donor DNA coding for the CAR. For this to occur correctly, the donor sequence is designed with flanking residues which are complementary to the sequence surrounding the DSB site in the target gene (hereinafter "homology arms"), such as the TRAC gene. These homology arms serve as the template for DSB repair and allow HDR to be an essentially error-free mechanism. The rate of homology directed repair (HDR) is a function of the distance between the mutation and the cut site so choosing overlapping or nearby target sites is important. Templates can include extra sequences flanked by the homologous regions or can contain a sequence that differs from the genomic sequence, thus allowing sequence editing.

In other embodiments, the nucleic acid encoding the CAR may be inserted at a different genomic site, for example, at the disrupted CD70 locus or the disrupted β2M locus via the same CRISPR/Cas9-mediated gene editing and homologous recombination approach disclosed above.

Alternatively, a donor template may have no regions of homology to the targeted location in the DNA and may be integrated by NHEJ-dependent end joining following cleavage at the target site.

A donor template can be DNA or RNA, single-stranded and/or double-stranded, and can be introduced into a cell in linear or circular form. If introduced in linear form, the ends of the donor sequence can be protected (e.g., from exonucleolytic degradation) by methods known to those of skill in the art. For example, one or more dideoxynucleotide residues are added to the 3' terminus of a linear molecule and/or self-complementary oligonucleotides are ligated to one or both ends. See, for example, Chang et al., (1987) Proc. Natl. Acad. Sci. USA 84:4959-4963; Nehls et al., (1996) Science 272:886-889. Additional methods for protecting exogenous polynucleotides from degradation include, but are not limited to, addition of terminal amino group(s) and the use of modified internucleotide linkages such as, for example, phosphorothioates, phosphoramidates, and O-methyl ribose or deoxyribose residues.

A donor template can be introduced into a cell as part of a vector molecule having additional sequences such as, for example, replication origins, promoters and genes encoding antibiotic resistance. Moreover, a donor template can be introduced into a cell as naked nucleic acid, as nucleic acid complexed with an agent such as a liposome or poloxamer, or can be delivered by viruses (e.g., adenovirus, AAV, herpesvirus, retrovirus, lentivirus and integrase defective lentivirus (IDLV)).

A donor template, in some embodiments, can be inserted at a site nearby an endogenous prompter (e.g., downstream or upstream) so that its expression can be driven by the endogenous promoter. In other embodiments, the donor template may comprise an exogenous promoter and/or enhancer, for example, a constitutive promoter, an inducible promoter, or tissue-specific promoter to control the expression of the CAR gene. In some embodiments, the exogenous promoter is an EF1α promoter, see, e.g., SEQ ID NO: 184 provided in Table 10 below. Other promoters may be used.

Furthermore, exogenous sequences may also include transcriptional or translational regulatory sequences, for example, promoters, enhancers, insulators, internal ribosome entry sites, sequences encoding 2A peptides and/or polyadenylation signals.

When needed, additional gene editing (e.g., gene knock-in or knock-out) can be introduced into therapeutic T cells as disclosed herein to improve T cell function and therapeutic efficacy. For example, if β2M knockout can be performed to reduce the risk of or prevent a host-versus-graft response. Other examples include knock-in or knock-out genes to improve target cell lysis, knock-in or knock-out genes to enhance performance of therapeutic T cells such as CAR-T cells.

In some embodiments, a donor template for delivering an anti-CD19 CAR may be an AAV vector inserted with a nucleic acid fragment comprising the coding sequence of the anti-CD19 CAR, and optionally regulatory sequences for expression of the anti-CD19 CAR (e.g., a promoter such as the EF1a promoter provided in the sequence Table), which can be flanked by homologous arms for inserting the coding sequence and the regulatory sequences into a genomic locus of interest. In some examples, the nucleic acid fragment is inserted in the endogenous TRAC gene locus, thereby disrupting expression of the TRAC gene. In specific examples, the nucleic acid may replace a fragment in the TRAC gene, for example, a fragment comprising the nucleotide sequence of AGAGCAACAGTGCTGTGGCC (SEQ ID NO: 87). In some specific examples, the donor template for delivering the anti-CD19 CAR may comprise a nucleotide sequence of SEQ ID NO: 185, which can be inserted into a disrupted TRAC gene, for example, replacing the fragment of SEQ ID NO: 87.

In some embodiments, a donor template for delivering an anti-BCMA CAR may be an AAV vector inserted with a nucleic acid fragment comprising the coding sequence of the anti-BCMA CAR, and optionally regulatory sequences for expression of the anti-BCMA CAR (e.g., a promoter such as the EF1a promoter provided in the sequence Table), which can be flanked by homologous arms for inserting the coding sequence and the regulatory sequences into a genomic locus of interest. In some examples, the nucleic acid fragment is inserted in the endogenous TRAC gene locus, thereby disrupting expression of the TRAC gene. In specific examples, the nucleic acid may replace a fragment in the TRAC gene, for example, a fragment comprising the nucleotide sequence of SEQ ID NO: 87. In some specific examples, the donor template for delivering the anti-BCMA CAR may comprise a nucleotide sequence of SEQ ID NO: 187, which can be inserted into a disrupted TRAC gene, for example, replacing the fragment of SEQ ID NO: 87.

In some embodiments, a donor template for delivering an anti-CD70 CAR may be an AAV vector inserted with a nucleic acid fragment comprising the coding sequence of the anti-CD70 CAR, and optionally regulatory sequences for expression of the anti-CD70 CAR (e.g., a promoter such as the EF1a promoter provided in the sequence Table), which can be flanked by homologous arms for inserting the coding sequence and the regulatory sequences into a genomic locus of interest. In some examples, the nucleic acid fragment is inserted in the endogenous TRAC gene locus, thereby disrupting expression of the TRAC gene. In specific examples, the nucleic acid may replace a fragment in the TRAC gene, for example, a fragment comprising the nucleotide sequence of SEQ ID NO: 87. In some specific examples, the donor template for delivering the anti-CD70 CAR may comprise a nucleotide sequence of SEQ ID NO: 186, which can be inserted into a disrupted TRAC gene, for example, replacing the fragment of SEQ ID NO: 87.

The genetically engineered T cells having a disrupted PTPN2 gene, one or more additional disrupted genes, e.g., β2M, TRAC, and/or CD70, and further expressing a chimeric antigen receptor (CAR) can be produced by sequential targeting of the genes of interest. For example, in some embodiments, the PTPN2 gene may be disrupted first, followed by disruption of TRAC, and/or β2M genes and CAR insertion. In other embodiments, TRAC and β2M genes may be disrupted first, followed by CAR insertion and disruption of the PTPN2 gene. In other embodiments, CD70 may be disrupted first, followed by TRAC and β2M genes disruption and CAR insertion, as well as disruptions of the PTPN2 gene. Accordingly, in some embodiments, the genetically engineered T cells disclosed herein may be produced by multiple, sequential electroporation events with multiple RNPs targeting the genes of interest, e.g., PTPN2, β2M, TRAC, and CD70 etc.

In other embodiments, the genetically engineered CAR T cells disclosed herein may be produced by a single electroporation event with an RNP complex comprising an RNA-guided nuclease and multiple gRNAs targeting the genes of interest, e.g., PTPN2, β2M, TRAC, and CD70.

(c) Exemplary Genetically Engineered T Cells Expressing a Chimeric Antigen Receptor It should be understood that gene disruption encompasses gene modification through gene editing (e.g., using CRISPR/Cas gene editing to insert or delete one or more nucleotides). A disrupted gene may contain one or more mutations (e.g., insertion, deletion, or nucleotide substitution, etc.) relative to the wild-type counterpart so as to substantially reduce or completely eliminate the activity of the encoded gene product. The one or more mutations may be located in a non-coding region, for example, a promoter region, a regulatory region that regulates transcription or translation; or an intron region. Alternatively, the one or more mutations may be located in a coding region (e.g., in an exon). In some instances, the disrupted gene does not express or expresses a substantially reduced level of the encoded protein. In other instances, the disrupted gene expresses the encoded protein in a mutated form, which is either not functional or has substantially reduced activity. In some embodiments, a disrupted gene is a gene that does not encode functional protein. In some embodiments, a cell that comprises a disrupted gene does not express (e.g., at the cell surface) a detectable level (e.g. by antibody, e.g., by flow cytometry) of the protein encoded by the gene. A cell that does not express a detectable level of the protein may be referred to as a knockout cell. For example, a cell having a β2M gene edit may be considered a β2M knockout cell if β2M protein cannot be detected at the cell surface using an antibody that specifically binds β2M protein.

In some embodiments, the genetically engineered immune cells (e.g., T cells such as human T cells) may comprise a disrupted PTPN2 gene, a disrupted TRAC gene, a disrupted β2M gene, and express an anti-CD19 CAR, e.g., those disclosed herein (anti-CD19 CAR-T cells). In some examples, the population of anti-CD19 CAR T cells may comprise a disrupted TRAC gene via the CRISPR/Cas technology using the TA-1 TRAC gRNA. In some examples, the anti-CD19 CAR T cells may comprise a deletion in the TRAC gene relative to unmodified T cells. For example, the anti-CD19 CAR T cells may comprise a deletion of the fragment AGAGCAACAGTGCTGTGGCC (SEQ ID NO: 87) in the TRAC gene. This fragment can be replaced by the nucleic acid encoding the anti-CD19 CAR (e.g., SEQ ID NO: 185). Alternatively or in addition, the population of anti-CD19 CAR T cells may comprise a disrupted β2M gene via CRISPR/Cas9 technology using the gRNA of β2M-1. Table 5. Such anti-CD19 CAR T cells may comprise Indels in the β2M gene, which comprise one or more of the nucleotide sequences of SEQ ID NOs: 101-106. See Table 7. See also WO 2019/097305A2, and WO2019215500, the relevant disclosures of each of which are incorporated by reference for the subject matter and purpose referenced herein.

In some embodiments, the genetically engineered immune cells (e.g., T cells such as human T cells) may comprise a disrupted PTPN2 gene, a disrupted TRAC gene, a disrupted β2M gene, and express an anti-BCMA CAR, e.g., those disclosed herein (anti-BCMA CAR-T cells). In some examples, the population of anti-BCMA CAR T cells may comprise a disrupted TRAC gene via the CRISPR/Cas technology using the TA-1 TRAC gRNA. In some examples, the anti-BCMA CAR T cells may comprise a deletion in the TRAC gene relative to unmodified T cells. For example, the anti-BCMA CAR T cells may comprise a deletion of the fragment AGAGCAACAGTGCTGTGGCC (SEQ ID NO: 87) in the TRAC gene. This fragment can be replaced by the nucleic acid encoding the anti-BCMA CAR (e.g., SEQ ID NO: 187). Alternatively or in addition, the population of anti-BCMA CAR T cells may comprise a disrupted β2M gene via CRISPR/Cas9 technology using the gRNA of β2M-1. Table 5. Such anti-BCMA CAR T cells may comprise Indels in the β2M gene, which comprise one or more of the nucleotide sequences of SEQ ID NOs: 101-106. See Table 7. See also WO 2019/097305A2, and WO2019215500, the relevant disclosures of each of which are incorporated by reference for the subject matter and purpose referenced herein.

In some embodiments, the genetically engineered immune cells (e.g., T cells such as human T cells) may comprise a disrupted PTPN2 gene, a disrupted TRAC gene, a disrupted β2M gene, a disrupted CD70 gene, and express an anti-CD70 CAR, e.g., those disclosed herein (anti-CD70 CAR-T cells). In some examples, the population of anti-CD70 CAR T cells may comprise a disrupted TRAC gene via the CRISPR/Cas technology using the TA-1 TRAC gRNA. In some examples, the anti-BCMA CAR T cells may comprise a deletion in the TRAC gene relative to unmodified T cells. For example, the anti-CD70 CAR T cells may comprise a deletion of the fragment AGAGCAACAGTGCTGTGGCC (SEQ ID NO: 87) in the TRAC gene. This fragment can be replaced by the nucleic acid encoding the anti-CD70 CAR (e.g., SEQ ID NO: 186). Alternatively or in addition, the population of anti-CD70 CAR T cells may comprise a disrupted β2M gene via CRISPR/Cas9 technology using the gRNA of β2M-1. Such anti-CD70 CAR T cells may comprise Indels in the β2M gene, which comprise one or more of the nucleotide sequences of SEQ ID NOs: 101-106. See Table 7. See also WO 2019/097305A2, and WO2019215500, the relevant disclosures of each of which are incorporated by reference for the subject matter and purpose referenced herein. Further, the population of anti-CD70 CAR T cells may comprise a disrupted CD70 gene via CRISPR/Cas9 technology using a gRNA targeting the CD70 locus, for example, CD70-7. See Table 5. Such anti-CD70 CAR T cells may comprise Indels in the CD70 gene, which comprise one or more of the nucleotide sequences of SEQ ID NOs: 107-112. See Table 8. See also WO2019215500, the relevant disclosures of each of which are incorporated by reference for the subject matter and purpose referenced herein.

III. Therapeutic Applications

The therapeutic T cells disclosed herein can be administered to a subject for therapeutic purposes, for example, treatment of a tumor such as a solid tumor targeted by the CAR construct expressed by the therapeutic CAR-T cells. As reported herein, disruption of the PTPN2 gene led to improved T cell persistence, increased cytokine secretion, enhanced CAR potency and/or CAR copy numbers, etc., leading to improved anti-tumor efficacy as observed in animal models.

The step of administering may include the placement (e.g., transplantation) of the therapeutic T cells into a subject by a method or route that results in at least partial localization of the therapeutic T cells at a desired site, such as a tumor site, such that a desired effect(s) can be produced. Therapeutic T cells can be administered by any appropriate route that results in delivery to a desired location in the subject where at least a portion of the implanted cells or components of the cells remain viable. The period of viability of the cells after administration to a subject can be as short as a few hours, e.g., twenty-four hours, to a few days, to as long as several years, or even the lifetime of the subject, i.e., long-term engraftment. For example, in some aspects described herein, an effective amount of the therapeutic T cells can be administered via a systemic route of administration, such as an intraperitoneal or intravenous route.

In some embodiments, the therapeutic T cells are administered systemically, which refers to the administration of a population of cells other than directly into a target site, tissue, or organ, such that it enters, instead, the subject's circulatory system and, thus, is subject to metabolism and other like processes. Suitable modes of administration include injection, infusion, instillation, or ingestion. Injection includes, without limitation, intravenous, intramuscular, intra-arterial, intrathecal, intraventricular, intracapsular, intraorbital, intracardiac, intradermal, intraperitoneal, transtracheal, subcutaneous, subcuticular, intraarticular, sub capsular, subarachnoid, intraspinal, intracerebro spinal, and intrasternal injection and infusion. In some embodiments, the route is intravenous.

A subject may be any subject for whom diagnosis, treatment, or therapy is desired. In some embodiments, the subject is a mammal. In some embodiments, the subject is a human. In some instances, the human patient has a cancer involving CD19$^+$ cancer cells (e.g., B cell malignancy such as B-cell leukemia, non-Hodgkin lymphoma, e.g., diffuse large B cell lymphoma (DLBCL), B cell lymphoma, or transformed follicular lymphoma, or T cell malignancy). CAR-T cells expressing an anti-CD19 CAR (e.g., disclosed herein) may be used to treat such a patient. In some instances, the human patient has a cancer involving BCMA⁺ cancer cells (e.g., multiple myeloma). CAR-T cells expressing an anti-BCMA CAR (e.g., disclosed herein) may be used to treat such a patient. In some instances, the human patient has a CD70⁺ hematological tumor (e.g., cutaneous T cell lymphoma, peripheral T-cell lymphoma, or T cell leukemia) or a solid tumor (e.g., renal cell carcinoma). CAR-T cells expressing an anti-CD70 CAR (e.g., disclosed herein) may be used to treat such a patient.

In some instances, the therapeutic T cells may be autologous ("self") to the subject, i.e., the cells are from the same subject. Alternatively, the therapeutic T cells can be non-autologous ("non-self," e.g., allogeneic, syngeneic or xenogeneic) to the subject. "Allogeneic" means that the therapeutic T cells are not derived from the subject who receives the treatment but from different individuals (donors) of the same species as the subject. A donor is an individual who is not the subject being treated. A donor is an individual who is not the patient. In some embodiments, a donor is an individual who does not have or is not suspected of having the cancer being treated. In some embodiments, multiple donors, e.g., two or more donors, are used.

In some embodiments, an engineered T cell population being administered according to the methods described herein comprises allogeneic T cells obtained from one or more donors. Allogeneic refers to a cell, cell population, or biological samples comprising cells, obtained from one or more different donors of the same species, where the genes at one or more loci are not identical to the recipient (e.g., subject). For example, an engineered T cell population, being administered to a subject can be derived from one or more unrelated donors, or from one or more non-identical siblings. In some embodiments, syngeneic cell populations may be used, such as those obtained from genetically identical donors, (e.g., identical twins). In some embodiments, the cells are autologous cells; that is, the engineered T cells are obtained or isolated from a subject and administered to the same subject, i.e., the donor and recipient are the same.

An effective amount refers to the amount of a population of engineered T cells needed to prevent or alleviate at least one or more signs or symptoms of a medical condition (e.g., cancer), and relates to a sufficient amount of a composition to provide the desired effect, e.g., to treat a subject having a medical condition. An effective amount also includes an amount sufficient to prevent or delay the development of a symptom of the disease, alter the course of a symptom of the disease (for example but not limited to, slow the progression of a symptom of the disease), or reverse a symptom of the disease. It is understood that for any given case, an appropriate effective amount can be determined by one of ordinary skill in the art using routine experimentation.

The efficacy of a treatment using the therapeutic T cells disclosed herein can be determined by the skilled clinician. A treatment is considered "effective", if any one or all of the signs or symptoms of, as but one example, levels of functional target are altered in a beneficial manner (e.g., increased by at least 10%), or other clinically accepted symptoms or markers of disease (e.g., cancer) are improved or ameliorated. Efficacy can also be measured by failure of a subject to worsen as assessed by hospitalization or need for medical interventions (e.g., progression of the disease is halted or at least slowed). Methods of measuring these indicators are known to those of skill in the art and/or described herein. Treatment includes any treatment of a disease in subject and includes: (1) inhibiting the disease, e.g., arresting, or slowing the progression of symptoms; or (2) relieving the disease, e.g., causing regression of symptoms; and (3) preventing or reducing the likelihood of the development of symptoms.

Combination therapies are also encompassed by the present disclosure. For example, the therapeutic T cells disclosed herein may be co-used with other therapeutic agents, for treating the same indication, or for enhancing efficacy of the therapeutic T cells and/or reducing side effects of the therapeutic T cells.

IV. Kits

The present disclosure also provides kits for use in producing the genetically engineered T cells, the therapeutic T cells, and for therapeutic uses, In some embodiments, a kit provided herein may comprise components for performing genetic edit of a PTPN2 gene, and optionally components for editing one or more additional genes, including TRAC gene, β2M gene, and/or CD70 gene. The kit may also comprise a population of immune cells to which the genetic editing will be performed (e.g., a leukopak or a T cell bank). A leukopak sample may be an enriched leukapheresis product collected from peripheral blood. It typically contains a variety of blood cells including monocytes, lymphocytes, platelets, plasma, and red cells. The components for genetically editing one or more of the target genes may comprise a suitable endonuclease such as an RNA-guided endonuclease and one or more nucleic acid guides, which direct cleavage of one or more suitable genomic sites by the endonuclease. For example, the kit may comprise a Cas enzyme such as Cas 9 and one or more gRNAs targeting PTPN2, and optionally gRNAs targeting TRAC, β2M, and/or a CD70. Any of the gRNAs specific to these target genes can be included in the kit.

In some embodiments, a kit provided herein may comprise a population of genetically engineered T cells as disclosed herein, and one or more components for producing the therapeutic T cells as also disclosed herein. Such components may comprise an endonuclease suitable for gene editing and a nucleic acid coding for a CAR construct of interest. The CAR-coding nucleic acid may be part of a donor template as disclosed herein, which may contain homologous arms flanking the CAR-coding sequence. In some instances, the donor template may be carried by a viral vector such as an AAV vector. The kit may further comprise gRNAs specific to a TRAC gene for inserting the CAR-coding sequence into the TRAC gene.

In yet other embodiments, the kit disclosed herein may comprise a population of therapeutic T cells as disclosed for the intended therapeutic purposes.

Any of the kit disclosed herein may further comprise instructions for making the therapeutic T cells, or therapeutic applications of the therapeutic T cells. In some examples, the included instructions may comprise a description of using the gene editing components to genetically engineer one or more of the target genes (e.g., TRAC, β2M, CD70, or a combination thereof). In other examples, the included instructions may comprise a description of how to introduce a nucleic acid encoding a CAR construction into the T cells for making therapeutic T cells.

In some embodiments, a kit as disclosed herein may comprise a population of genetically engineered T cells (e.g., CAR-T cells) for use to eliminate undesired cells targeted by the CAR construct (e.g., for treatment of cancer such as a solid tumor). Such a kit may comprise one or more containers in which the genetically engineered T cells can be placed. The kit may further comprise instructions for administration of the therapeutic T cells as disclosed herein to achieve the intended activity, e.g., eliminating disease cells targeted by the CAR expressed on the therapeutic T cells. Alternatively or in addition, the kit may further comprise a description of selecting a subject suitable for treatment based on identifying whether the subject is in need of the treatment. The instructions relating to the use of the therapeutic T cells described herein generally include information as to dosage, dosing schedule, and route of administration for the intended treatment. The containers may be unit doses, bulk packages (e.g., multi-dose packages) or sub-unit doses. Instructions supplied in the kits of the disclosure are typically written instructions on a label or package insert. The label or package insert indicates that the therapeutic T cells are used for treating, delaying the onset, and/or alleviating a disease or disorder in a subject.

The kits provided herein are in suitable packaging. Suitable packaging includes, but is not limited to, vials, bottles, jars, flexible packaging, and the like. Also contemplated are packages for use in combination with a specific device, such as an infusion device for administration of the therapeutic T cells. A kit may have a sterile access port (for example, the container may be an intravenous solution bag or a vial having a stopper pierceable by a hypodermic injection needle). The container may also have a sterile access port. Kits optionally may provide additional components such as buffers and interpretive information. Normally, the kit comprises a container and a label or package insert(s) on or associated with the container. In some embodiment, the disclosure provides articles of manufacture comprising contents of the kits described above.

General Techniques

The practice of the present disclosure will employ, unless otherwise indicated, conventional techniques of molecular biology (including recombinant techniques), microbiology, cell biology, biochemistry, and immunology, which are within the skill of the art. Such techniques are explained fully in the literature, such as *Molecular Cloning: A Laboratory Manual*, second edition (Sambrook, et al., 1989) Cold Spring Harbor Press; *Oligonucleotide Synthesis* (M. J. Gait, ed. 1984); *Methods in Molecular Biology*, Humana Press; *Cell Biology: A Laboratory Notebook* (J. E. Cellis, ed., 1989) Academic Press; Animal Cell Culture (R. I. Freshney, ed. 1987); Introduction to Cell and Tissue Culture (J. P. Mather and P. E. Roberts, 1998) Plenum Press; Cell and Tissue Culture: Laboratory Procedures (A. Doyle, J. B. Griffiths, and D. G. Newell, eds. 1993-8) J. Wiley and Sons; Methods in Enzymology (Academic Press, Inc.); Handbook of Experimental Immunology (D. M. Weir and C. C. Blackwell, eds.): Gene Transfer Vectors for Mammalian Cells (J. M. Miller and M. P. Calos, eds., 1987); Current Protocols in Molecular Biology (F. M. Ausubel, et al. eds. 1987); PCR: The Polymerase Chain Reaction, (Mullis, et al., eds. 1994); Current Protocols in Immunology (J. E. Coligan et al., eds., 1991); Short Protocols in Molecular Biology (Wiley and Sons, 1999); Immunobiology (C. A. Janeway and P. Travers, 1997); Antibodies (P. Finch, 1997); Antibodies: a practice approach (D. Catty., ed., IRL Press, 1988-1989); Monoclonal antibodies: a practical approach (P. Shepherd and C. Dean, eds., Oxford University Press, 2000); Using antibodies: a laboratory manual (E. Harlow and D. Lane (Cold Spring Harbor Laboratory Press, 1999); The Antibodies (M. Zanetti and J. D. Capra, eds. Harwood Academic Publishers, 1995); *DNA Cloning: A practical Approach*, Volumes I and II (D. N. Glover ed. 1985); *Nucleic Acid Hybridization* (B. D. Hames & S. J. Higgins eds. (1985»; *Transcription and Translation* (B. D. Hames & S. J. Higgins, eds. (1984»; *Animal Cell Culture* (R. I. Freshney, ed. (1986»; *Immobilized Cells and Enzymes* (IRL Press, (1986»; and B. Perbal, *A practical Guide To Molecular Cloning* (1984); F. M. Ausubel et al. (eds.).

Without further elaboration, it is believed that one skilled in the art can, based on the above description, utilize the present invention to its fullest extent. The following specific embodiments are, therefore, to be construed as merely illustrative, and not limitative of the remainder of the disclosure in any way whatsoever. All publications cited herein are incorporated by reference for the purposes or subject matter referenced herein.

EXAMPLES

Example 1. Screening of PTPN2 Targeting Site for CRISPR/Cas-Mediated Gene Editing This example discloses screening of exemplary guide RNAs for knocking out PTPN2 by CRISPR/Cas-mediated gene editing.

(A) Efficient Knockout of PTPN2 by Cas9:sgRNA RNPs in T Cells

The PTPN2 gene was efficiently edited in primary human T cells ex vivo using CRISPR/Cas9 gene editing. Genomic segments of the PTPN2 gene containing the six (6) protein coding exons were used as input in gRNA design software. Desired gRNAs were those that would lead to insertions or deletions in the coding sequence, disrupting the amino acid sequence of PTPN2, leading to out-of-frame/loss-of-function allele(s) (referred to as "PTPN2 knockout (KO)" alleles). All twelve (12) in silico-identified gRNA spacer sequences targeting the PTPN2 gene (targeting sites provided in Table 3) were synthesized, and the gRNAs were specifically modified, as indicated in Table 4. While the gRNAs in Table 4 were modified with 2'-O-methyl phosphorothioate modifications, unmodified gRNAs, or gRNAs with other modifications, may be used (see also Table 4).

Primary human T cells were transfected (electroporated) with a ribonucleoprotein particle (RNP) containing Cas9 nuclease and a synthetic modified sgRNA targeting the PTPN2 gene (sequences in Table 4) or controls (no Cas9, no gRNA). Five (5) days post transfection, cells were subjected to a TIDE analysis to assess indel frequency. Knockout of PTPN2 was also confirmed by Western blot protein analysis. All twelve guides significantly inhibited PTPN2 protein expression compared to the control, wild type T cells without the knockout (FIG. 1).

(B) On-Target and Off-Target Editing of PTPN2 Guide RNAs

On-target and off-target editing efficiencies of various PTPN2-targeting gRNAs noted above were examined following the method disclosed herein. Briefly, activated T cells were transfected (electroporated) with a ribonucleoprotein particle (RNP) containing Cas9 nuclease and a synthetic modified sgRNA targeting the PTPN2 gene (target sequences in Table 4) or controls (no Cas9, no gRNA).

For genomic on- and off-target assessment, these electroporation methods were used to generate two cell populations of edited cells from two different donor T cells. Cells were gene edited with each of the twelve guides noted above, and then harvested ten (10) days post transfection. These samples were analyzed with hybrid capture, a homology-dependent method to enrich on- and off-target sites, combined with next-generation sequencing. Briefly, on- and off-target sites with homology to each gRNA target site were identified computationally, single-stranded RNA probes were used to enrich these sites from bulk genomic DNA, these enriched sites were sequenced with next-generation sequencing, and the data were analyzed for insertions and deletions (indels) indicating repair following CRISPR editing. Three (3) gRNAs showed no off-target effect with an on-target editing rate greater than 96%, which includes PTPN2-10, PTPN2-11 and PTPN2-13 as shown in Table 1 below.

TABLE 1

Off-target analysis of gRNAs that target PTPN-2

| Name | Number of predicted off target sites tested | On-target mean editing hyb cap [a] | Detected off-targets |
|---|---|---|---|
| PTPN2-1 | 102 | 98.9% | Two 1-10% off-targets |
| PTPN2-2 | 129 | 97.2% | One >40% off-target |
| PTPN2-3 | 339 | 96.4% | Two <1% off-targets |
| PTPN2-4 | 234 | 97.0% | Two >50% off-targets |
| PTPN2-5 | 346 | 97.6% | One 1-10% off-target; five <1% off-targets |
| PTPN2-10 | 7 | 98.4% | None |
| PTPN2-11 | 8 | 98.3% | None |
| PTPN2-12 | 17 | 94.6% | Two <1% off-target |
| PTPN2-13 | 17 | 96.9% | None |
| PTPN2-14 | 33 | 98.8% | Two >10% off-targets |
| PTPN2-15 | 70 | 98.9% | One >10% off-target; one <1% off-target |
| PTPN2-16 | 31 | 96.9% | Two 1-10% off-targets; one <1% off-target |

[a] Average across donors 1 and 2.

Example 2: Cell Killing Function of Anti-CD70 CAR T Cells with PTPN2 Knock-Out

Allogeneic human T cells that lack expression of the TRAC gene, β2M gene and CD70 gene, and express a chimeric antigen receptor (CAR) targeting CD70 were generated. The edited CAR T cells further comprised knock out of PTPN2 gene. As in the examples above, activated human T cells were electroporated with a recombinant adeno-associated adenoviral vectors, serotype 6 (AAV6) (MOI 50,000), and Cas9:sgRNA RNPs (1 μM Cas9, 5 μM gRNA).

Recombinant AAV comprised the nucleotide sequence of SEQ ID NO: 190 (encoding anti-CD70 CAR comprising the amino acid sequence of SEQ ID NO: 155). The following sgRNAs were used: TRAC (SEQ ID NO: 76), β2M (SEQ ID NO: 80), CD70 (SEQ ID NO:72).

Figure 2:
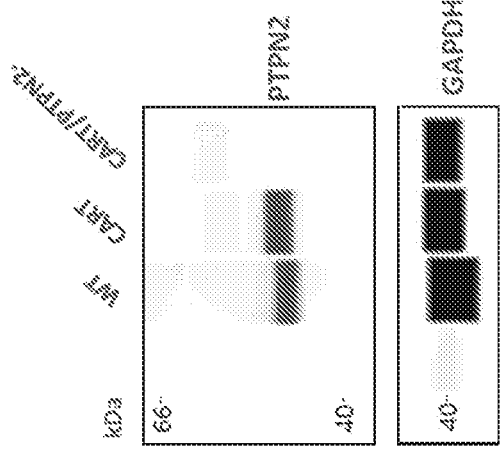
FIG. 2 is a photo showing PTPN2 KO in anti-CD70 CAR T cells as determined by Simple Wes Western Blot protein analysis. (WT: unedited cells; CART: anti-CD70 CAR T with unedited PTPN2; CART/PTPN2–: anti-CD70 CAR T with PTPN2 KO)

One week post-electroporation, T cells were analyzed for CAR expression by flow cytometry and PTPN2 protein expression by western blot protein analysis (Figure. 2). Both anti-CD70 CAR T cells with unedited PTPN2 and anti-CD70 CAR T cells that lack PTPN2 (using PTPN2-1 gRNA targeting: GGAAACTTGGCCACTCTATG; SEQ ID NO: 2) expressed the anti-CD70 CAR on their surface at day 7 post HDR at 69.6% and 62.9%, respectively, as determined by FACS.

In Vitro Cell Killing Function of Anti-CD70 CAR T Cells with PTPN2 Knock-Out

A cell killing assay was used to assess the ability of the TRAC−/β2M−/CD70−/PTPN2−/anti-CD70 CAR+ cells to kill CD70+ adherent renal cell carcinoma (RCC)-derived cell lines (e.g.: Caki-1, or A498 cell lines). Adherent cells were seeded in 96-well plates at 50,000 cells per well and incubated overnight at 37° C. in cytokine-free medium. The next day edited anti-CD70 CAR T cells (cultured until day 12 post HDR or day 27 post HDR) were added to the wells containing target cells at 0.25:1, 1:1 or 4:1 CAR T: Target cell ratios. After 24 hours co-culture, CAR T cells were removed from the culture by aspiration and 100 μL Cell titer-Glo (Promega) was added to each well of the plate to assess the number of remaining viable target cells. The amount of light emitted per well was then quantified using a plate reader.

Figure 3A:
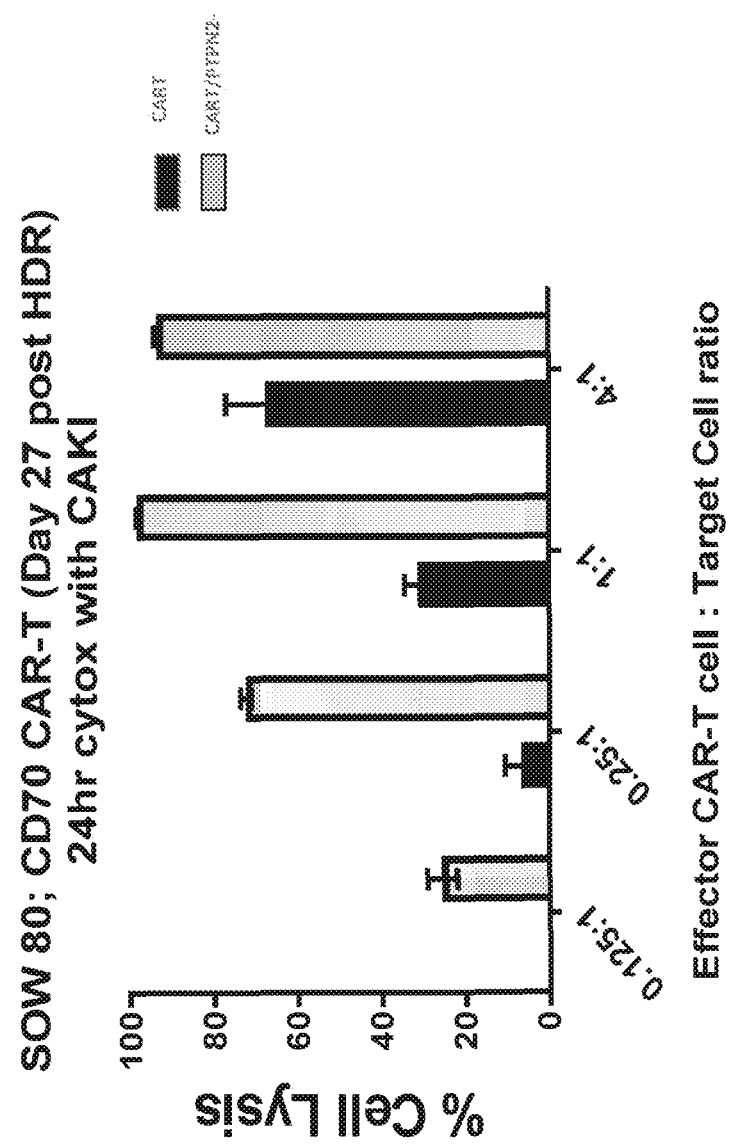
FIGS. 3A-3B include diagrams showing the in vitro effect of PTPN2 editing on anti-CD70 CAR T cell killing ability against CAKI-1 (FIG. 3A) and A498 (FIG. 3B) tumor cells at various E:T ratios as indicated. PTPN2 KO improves cytotoxicity of CAR-T cells.
Figure 3B:
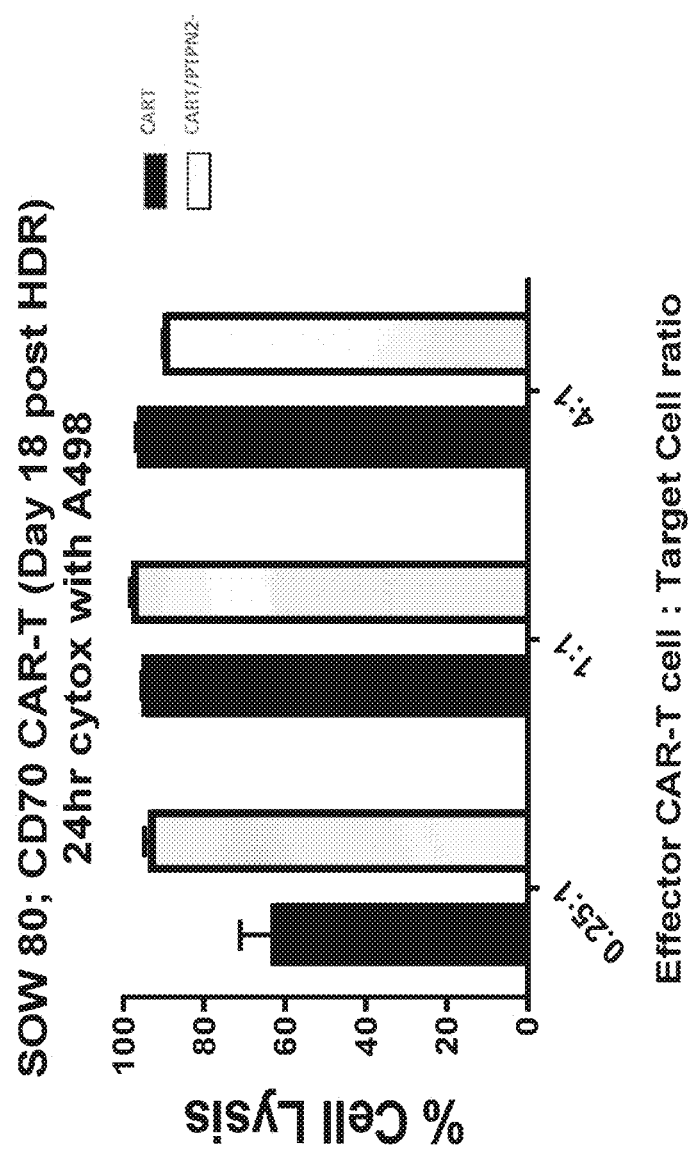
Figure 4A:
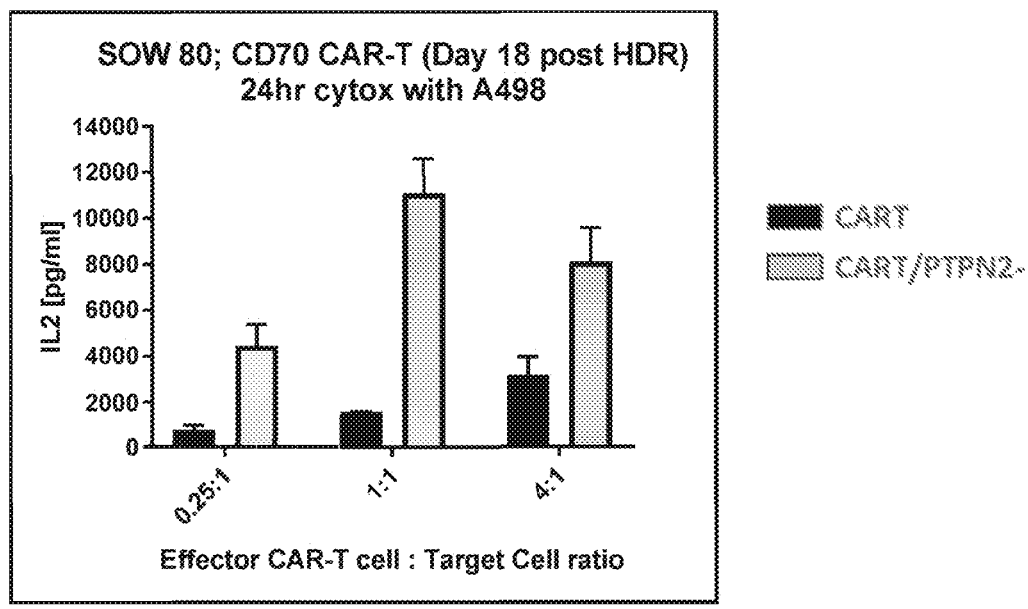
FIGS. 4A-4H include diagrams showing the effect of PTPN2 editing on cytokine secretion of CAR T cells in the presence of A498 tumor cells. The anti-tumor cytokine secretion of anti-CD70 CAR T cells was compared to anti-CD70 CAR T cells with PTPN2 KO.
Figure 4B:
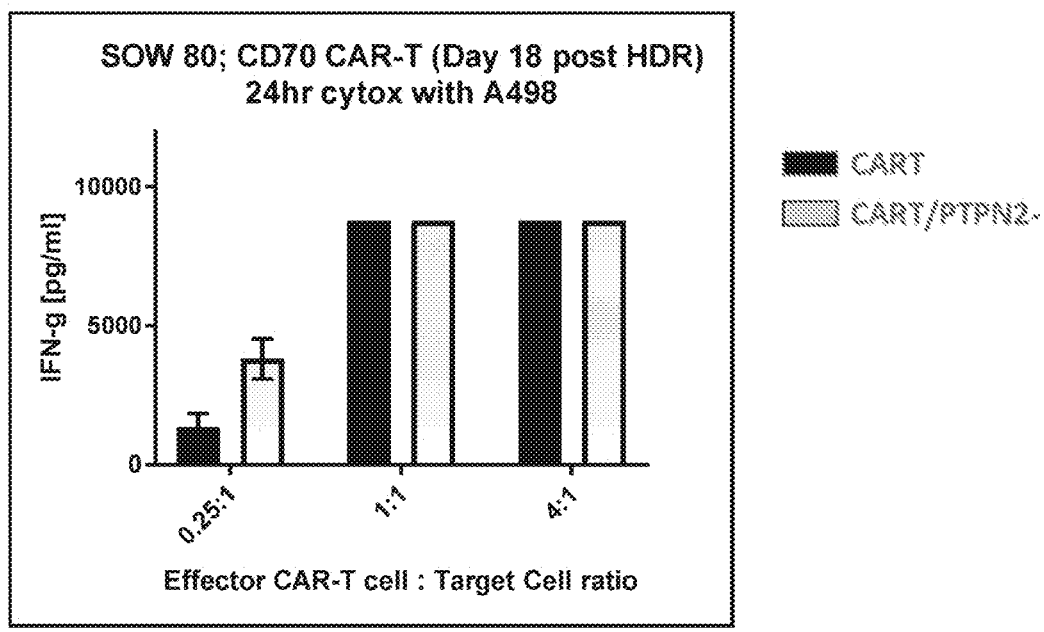
Figure 4C:
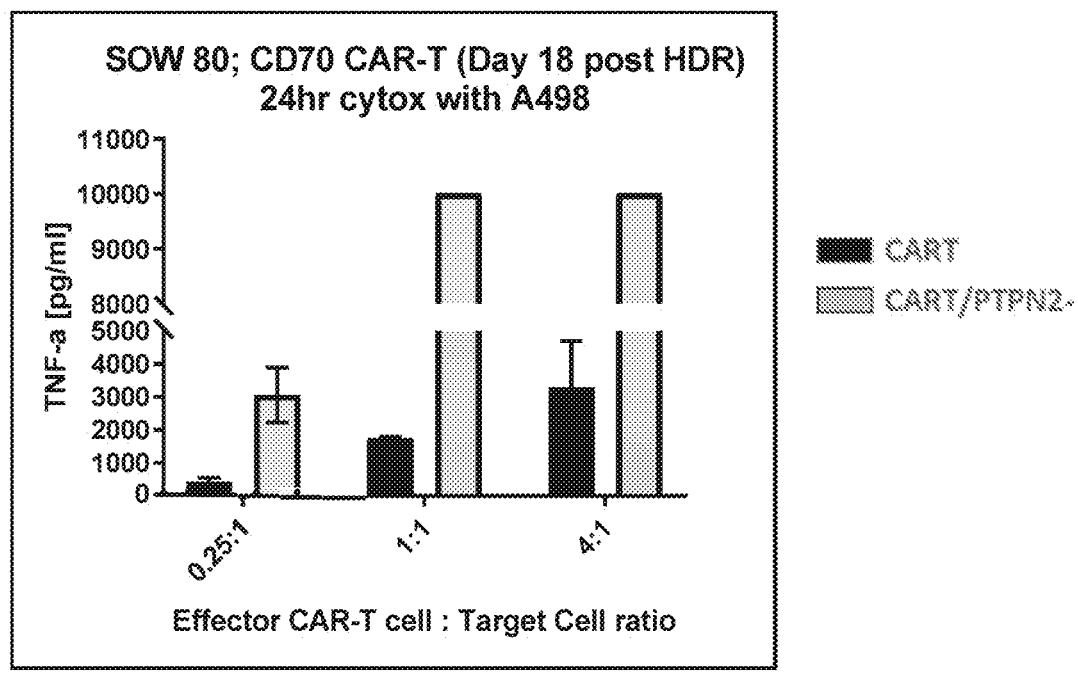
Figure 4D:
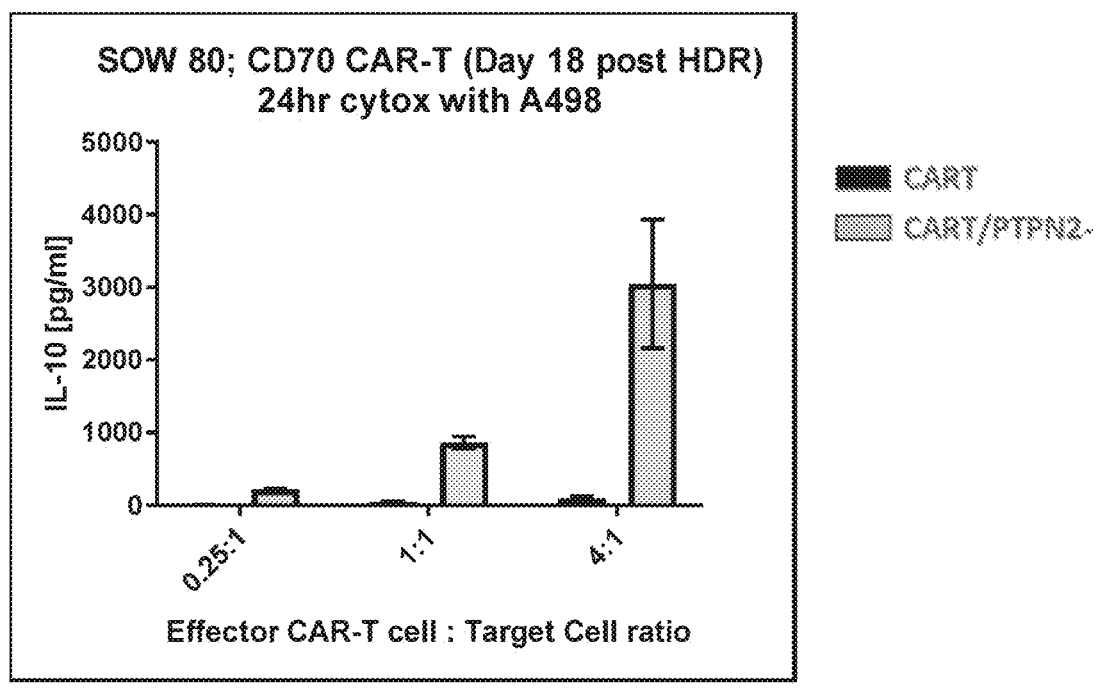
Figure 4E:
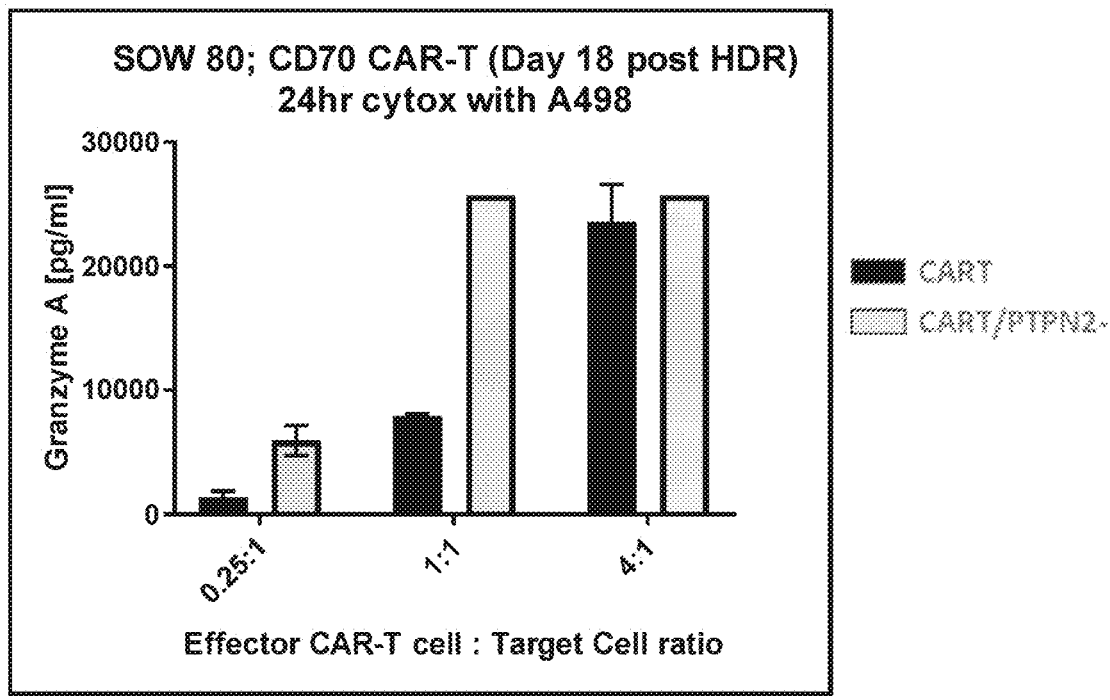
Figure 4F:
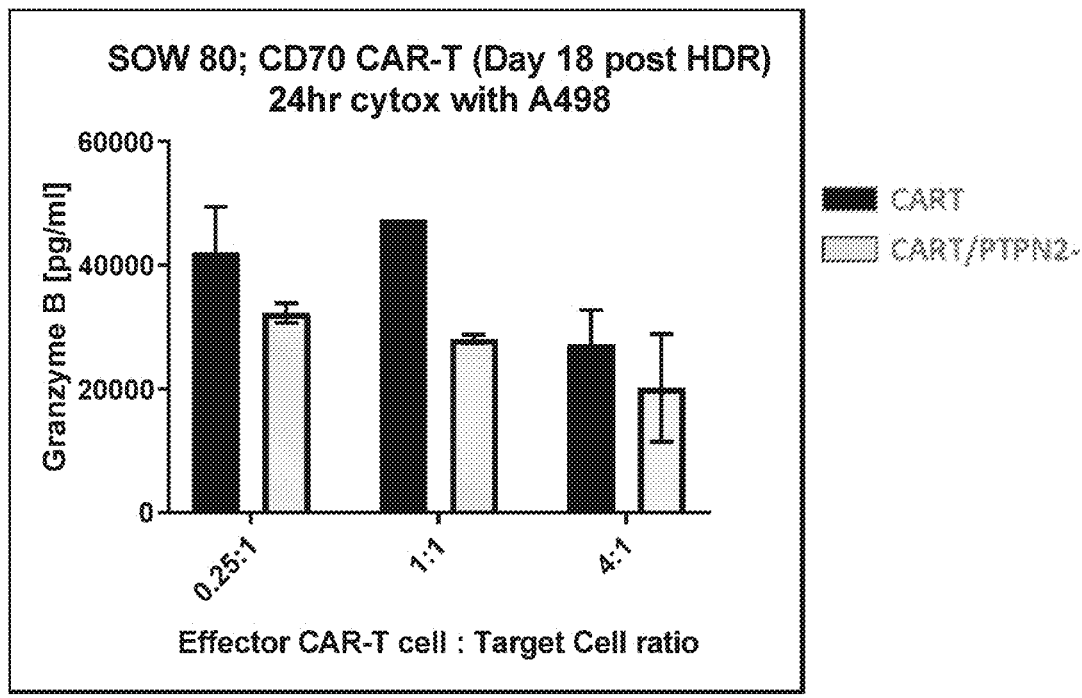
Figure 4G:
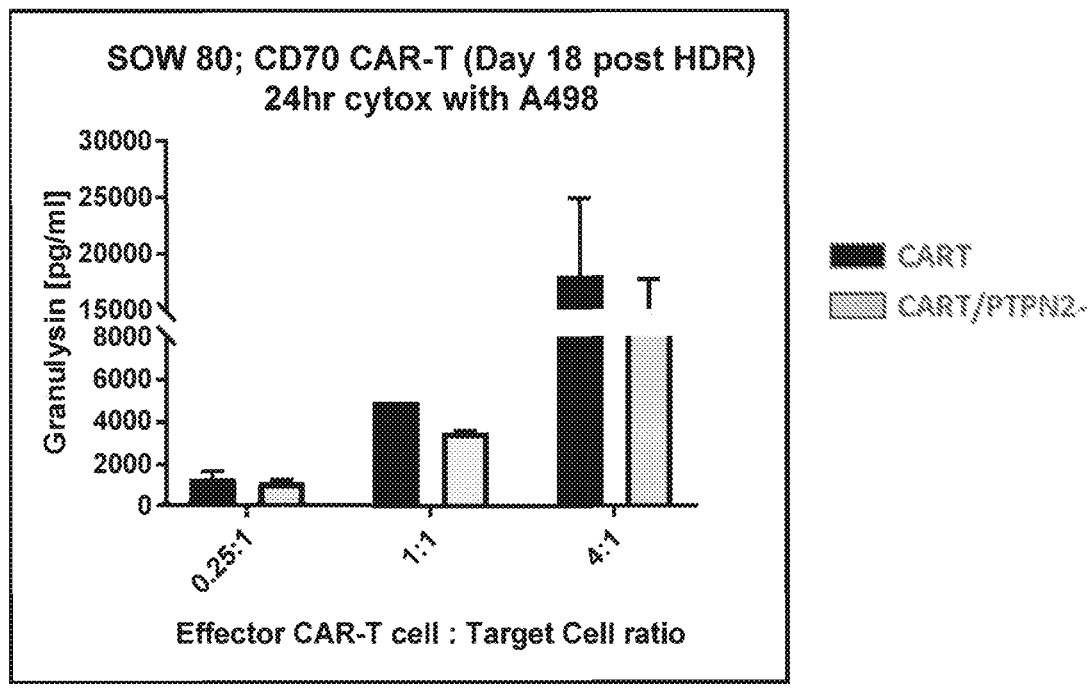
Figure 4H:
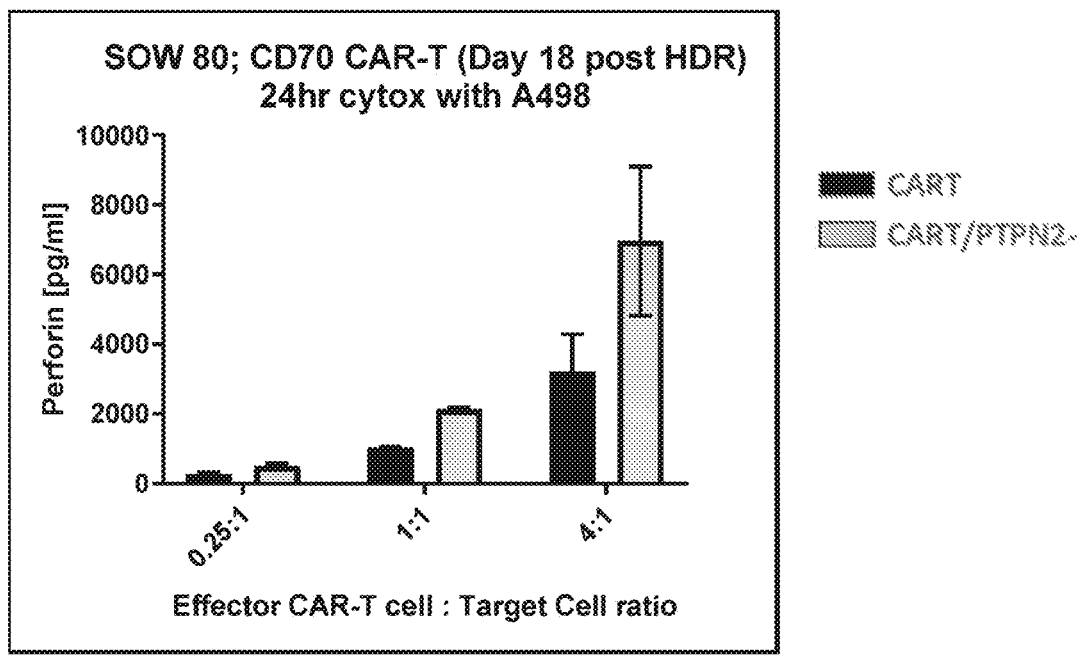
Figure 5A:
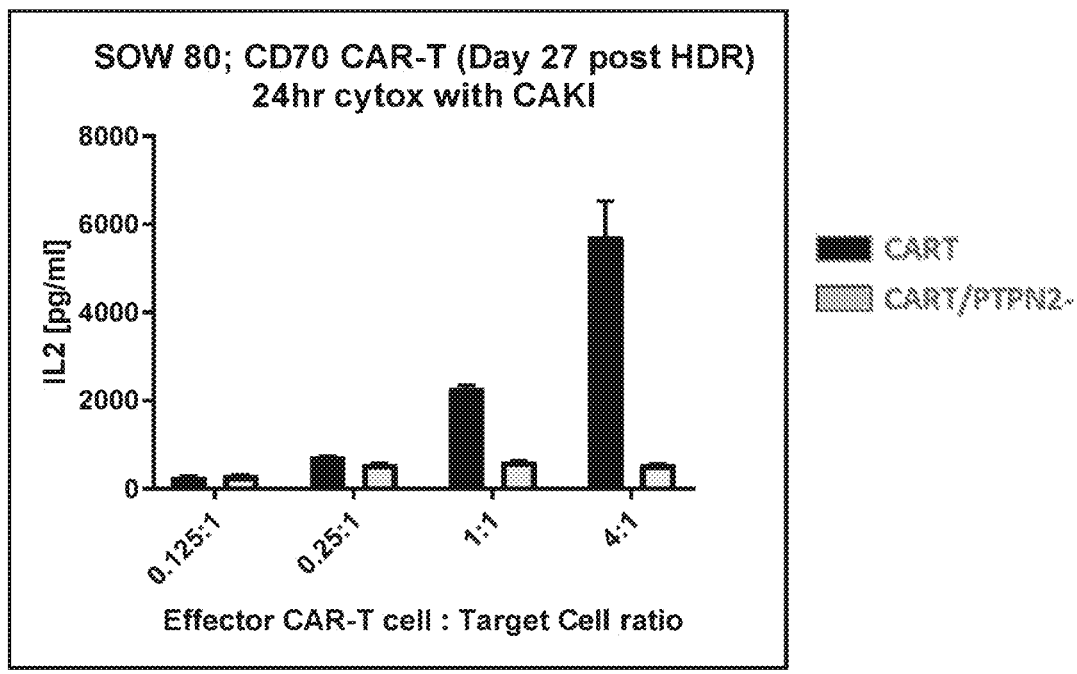
FIGS. 5A-5F include diagrams showing the effect of PTPN2 editing on cytokine secretion of CAR T cells in the presence of CAKI-1 tumor cells. The anti-tumor cytokine secretion of anti-CD70 CAR T cells was compared to anti-CD70 CAR T cells with PTPN2 KO.
Figure 5B:
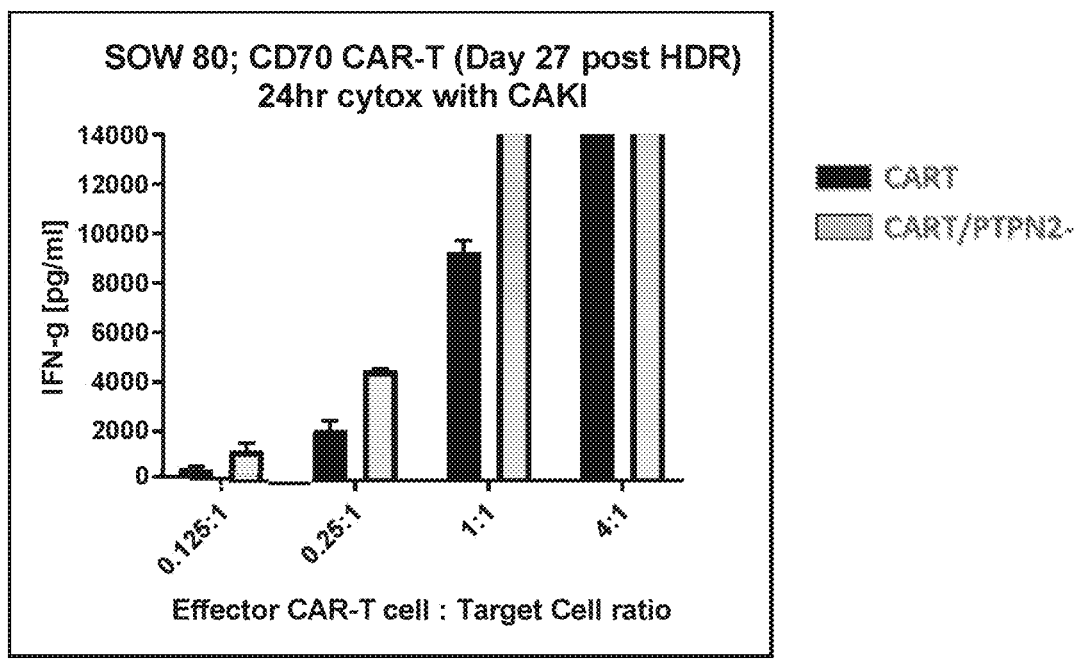
Figure 5C:
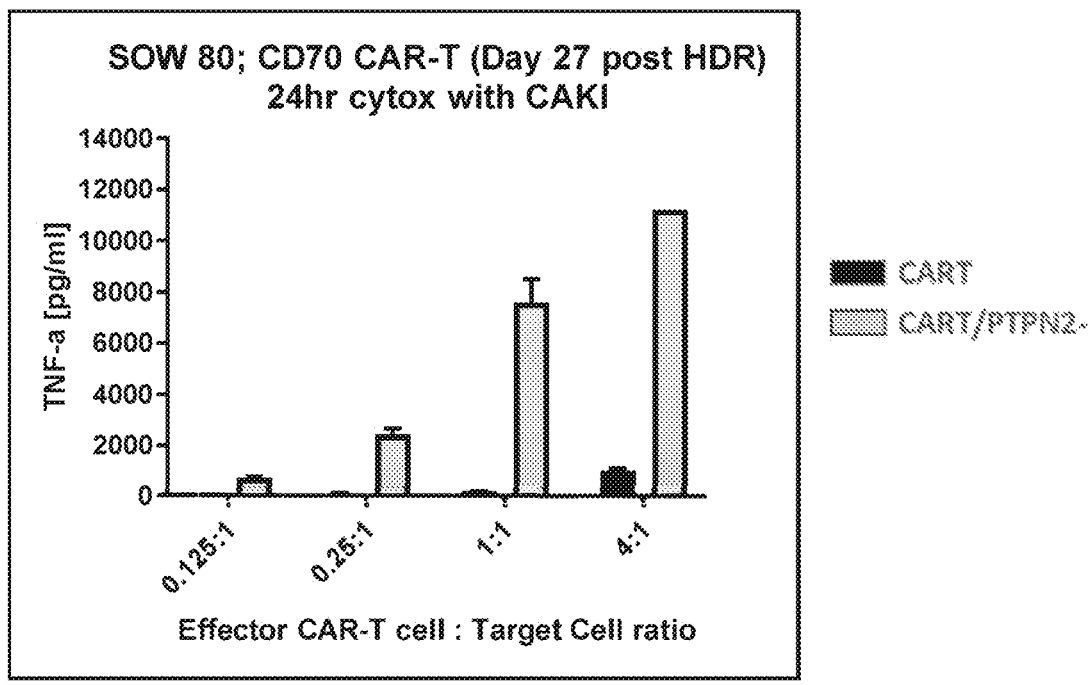
Figure 5D:
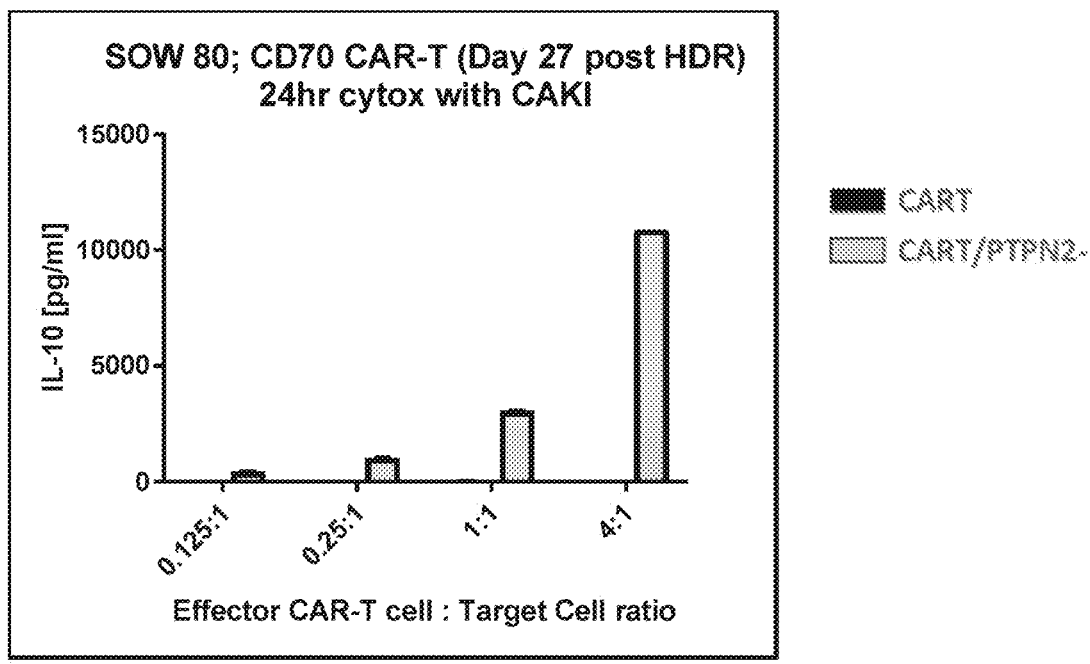
Figure 5E:
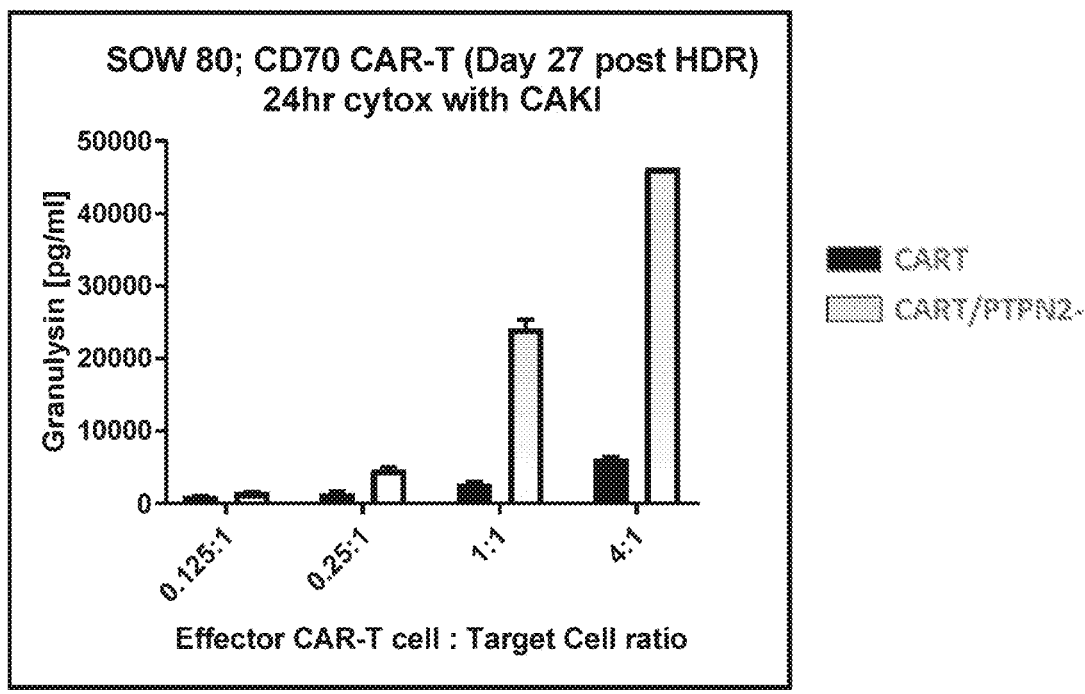
Figure 5F:
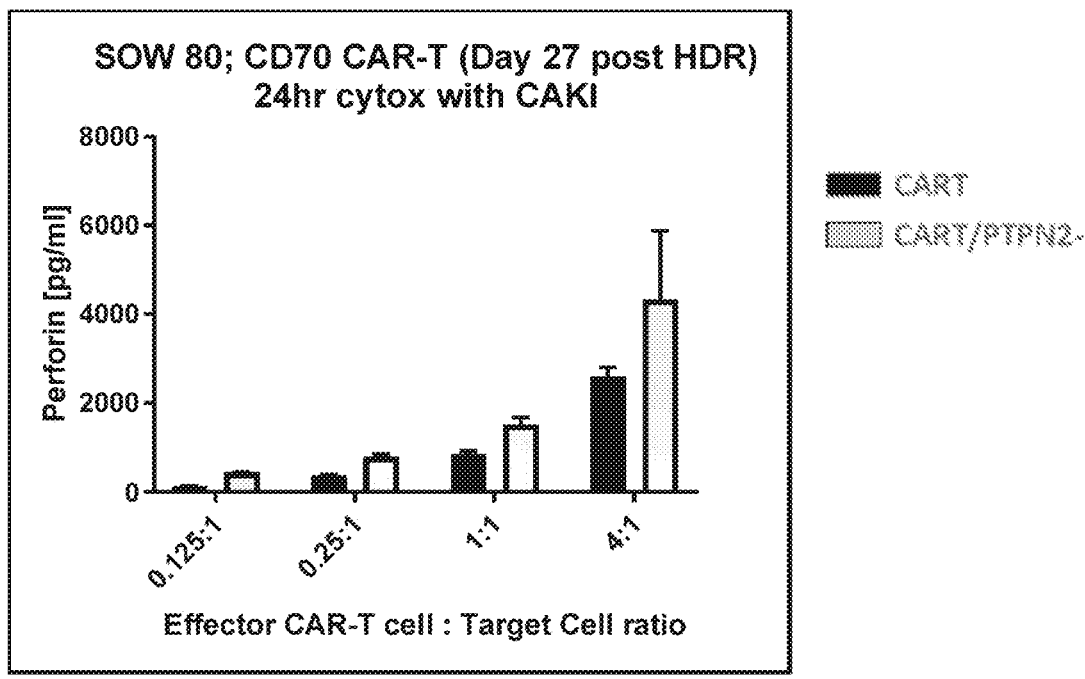

Anti-CD70 CAR-T cells with PTPN2 knock out exhibited a more potent cell killing of RCC-derived cell lines, CAKI-1 and A498, following 24-hour co-incubation (FIGS. 3A-3B). This suggests that knocking-out the PTPN2 gene gives a maintained/persistent higher cell kill potency compared to anti-CD70 CAR+ T cells with an intact PTPN2 gene over time post HDR.

Example 3. PTPN2 Knockout and CAR-T Cytokine Secretion

To determine the effect of knocking out PTPN2 on cytokine secretion by anti-CD70 CAR-T cells when engaged with tumor cells, cell culture supernatants from the co-culture experiment described in Example 2 were harvested and analyzed for secreted cytokines using the BIOLEGEND Legendplex system. CAR-T cells with PTPN2 KO secreted higher levels of cytokines such as IFN-g, TNF-α, IL-10, Granzyme A and Perforin. This was observed against both A498 cells (FIGS. 4A-4H) and CAKI-1 cells (FIGS. 5A-5F).

Example 4. Effect of PTPN2 Knockout on Exhaustion Marker Expression

Figure 6A:
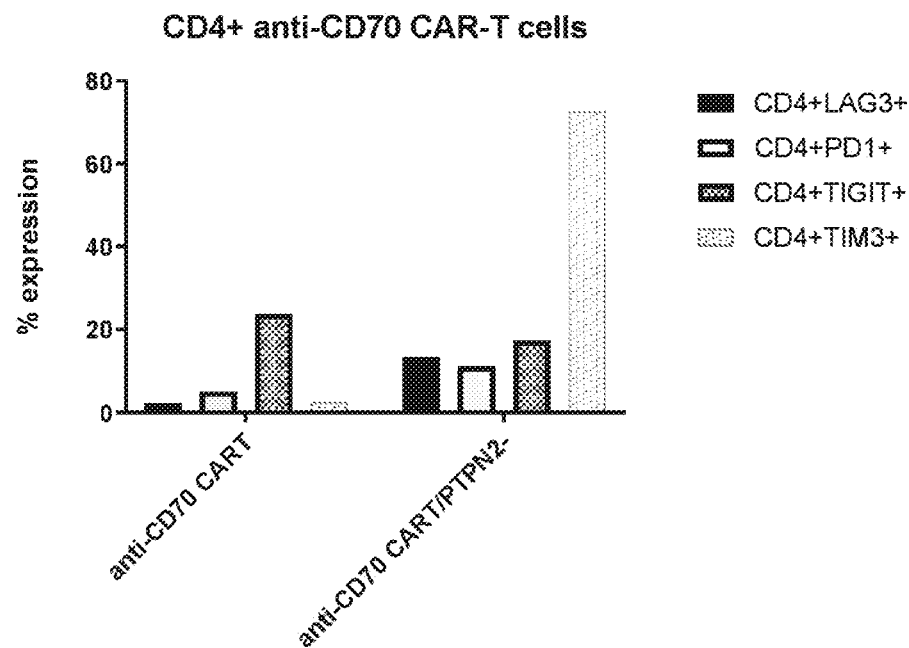
FIGS. 6A-6B include diagrams showing analysis of exhaustion markers in CAR T cells with PTPN2 KO. Fluorescent cytometry analysis of exhaustion markers, PD1, LAG3, TIGIT and TIM3 in CD4+(FIG. 6A) and CD8+(FIG. 6B) CAR-T cells are shown. PTPN2 KO CAR T cells show higher expression of TIM3, and LAG3 in both CD4+ and CD8+ populations compared to anti-CD70 CAR-Ts without the knockout.
Figure 6B:
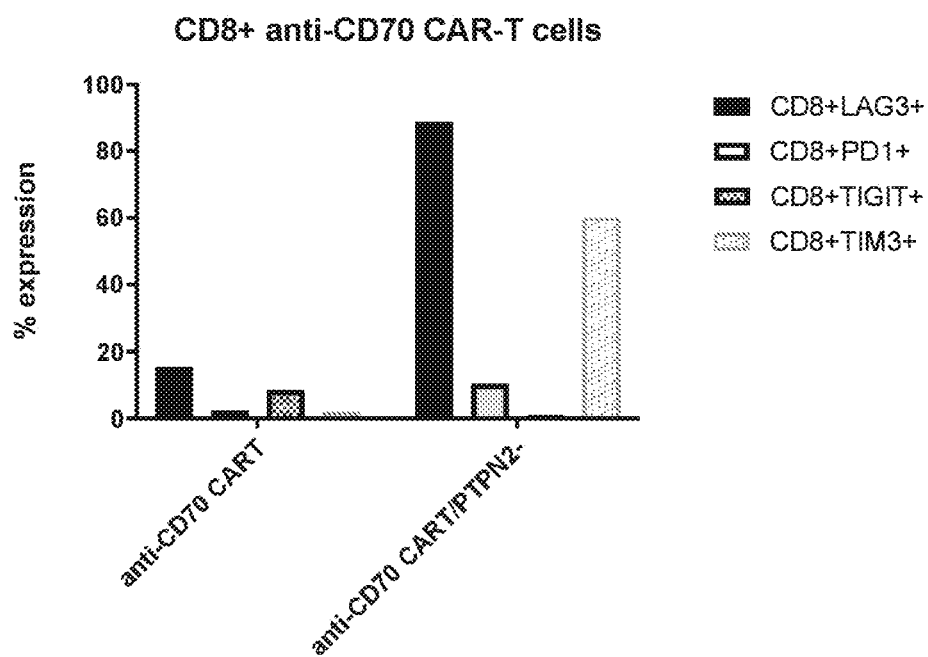

The levels of the T cell exhaustion markers, PD1, LAG3, TIGIT and TIM3 were also assessed on TRAC−/β2M−/CD70−/anti-CD70 CAR+ and TRAC−VM−/CD70−/PTPN2−/anti-CD70 CAR+ cells. Both CD4+ and CD8+ T cells were assessed by flow cytometry at Day 36 post HDR (FIGS. 6A and 6B).

PTPN2 KO did not significantly alter expression of PD1 and TIGIT in CD4 T cells. However, PTPN2 KO elevated expression of LAG3 and TIM3 in both CD4+ and CD8+ CAR-T cells. This suggests that enhanced potency of the CAR T cells is not via reducing expression of exhaustion markers, PD1, LAG3 and TIM3. In fact, enhanced TIM3 expression via knocking out PTPN2 may contribute to potency enhancement of the anti-CD70 CAR-T cells.

Example 5. Effect of PTPN2 KO on Phosphorylation of Downstream Targets

Figure 7:
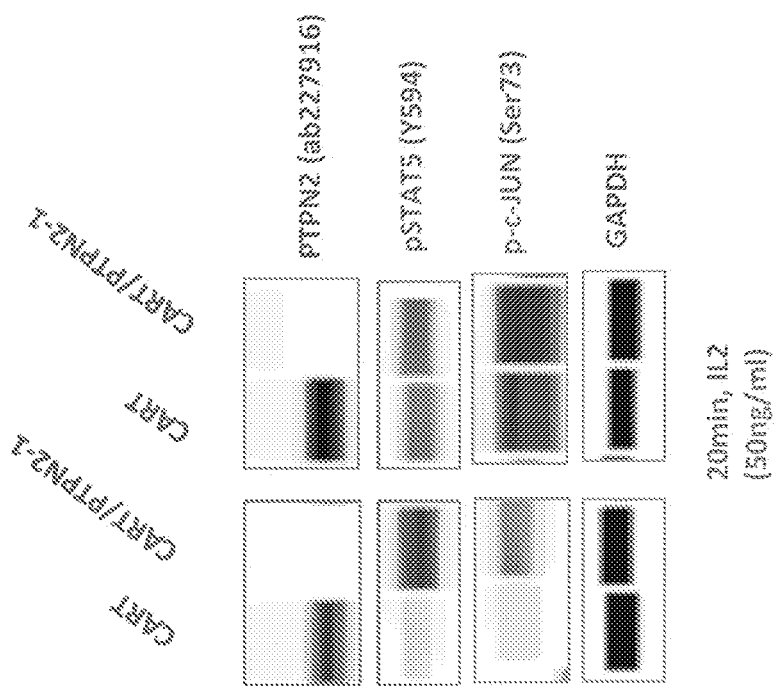
FIG. 7 includes a photo showing knockout of PTPN2 in anti-CD70 CAR-T cells leads to higher phosphorylation levels of STAT5 and c-JUN. Diagram shows elevated phosphorylation levels of STAT5 in PTPN2 KO suggesting superior cytokine secretion. Phospho-JUN levels are elevated in PTPN2 KO CAR-T cells, which is more pronounced when the CAR-T cells are stimulated with IL-2. All samples were serum/cytokine starved for 24 hours.

As a phosphatase, PTPN2 dephosphorylates target proteins such as LCK, FYN, STAT5, JAK and c-JUN, to modulate T cell activation and function. For example, phosphorylation of STAT5 and JAK induces cytokine secretion in activated T cells. To assess whether knockout of PTPN2 enhances phosphorylation of some of its target proteins, anti-CD70 CAR-T cells with and without PTPN2 KO were cultured in serum- and cytokine-free medium for 24 hours. Cells were then processed immediately or stimulated for 20 minutes at 37 degrees Celsius with 50 ng/ml concentration of IL-2, followed by protein isolation with RIPA buffer containing protease and phosphatase inhibitors. Protein analysis was conducted by western blot assay using antibodies specific for the phosphorylated forms of STAT5 and JUN proteins. As a control, GAPDH protein was also assessed to ensure equal amount of protein in samples with and without PTPN2 KO to avoid erroneous comparison of protein levels. Results showed that PTPN-2 KO CAR-T cells have elevated phospho-STAT5 and phospho-JUN expression compared to unstimulated samples; however, this difference was not detected in IL-2-stimulated samples. FIG. 7. These results suggest that knocking out PTPN2 interferes with its dephosphorylation function leading to increased phosphorylation of target proteins such as STAT5 and JUN which may promote optimal T cell activation, cytokine secretion and anti-tumor activity.

Example 6: In Vivo Effect of PTPN2 KO on Allogeneic Anti-CD70 CAR-T Cells in the CAKI-1 Human Renal Cell Carcinoma Tumor Xenograft Model in NSG Mice A xenograft mouse model was utilized to further assess the in vivo efficacy of allogeneic CART cells lacking (32M and TRAC, as well as PTPN2. The CAKI-1 human renal cell carcinoma tumor xenograft in NSG mice was used to demonstrate the efficacy of TRAC−/β2M−/anti-CD70 CAR+ T cells (anti-CD70 CAR T cells) with or without editing of the PTPN2 locus. The PTPN2 gene was edited via CRISPR/Cas-mediated gene editing using PTPN2-1 (comprising the spacer of GGAAACUUGGCCACUCUAUG; SEQ ID NO: 28) guide RNA.

Efficacy of the anti-CD70 CAR T cells was evaluated in the xenograft model using methods employed by Translations Drug Development, LLC (Scottsdale, AZ) and described herein. In brief, 5-8 week old female NSG mice were individually housed in ventilated microisolator cages, maintained under pathogen-free conditions, 5-7 days prior to the start of the study. At the start of the study, the mice were divided into 3 treatment groups of 5 mice each, as shown in Table 2. The mice were inoculated with $5 \times 10^6$ CAKI-1 cells and monitored until tumor sizes of 150 mm$^3$ were achieved. Thereafter, mice in Groups 2 and 3 received an intravenous injection of CAR T cells ($10 \times 10^6$ CAR+ cells/mouse), as indicated in Table 2.

TABLE 2

Treatment groups for intravenous tumor xenograft study

| Group | CAKI-1 tumor cells ($0.5 \times 10^6$ cells/mouse) | CAR T cells (i.v.) ($10 \times 10^6$ cells/mouse) | N |
|---|---|---|---|
| 1 | X | NA | 5 |
| 2 | X | anti-CD70 CAR/TRAC−/β2M− (8e6 CAR+) | 5 |
| 3 | X | anti-CD70 CAR/TRAC−/β2M−/PTPN2−(8e6 CAR+) | 5 |

During the course of the study, the mice were monitored daily and body weight was measured two times weekly. Tumor volumes were measured twice weekly beginning on Day 5 of the study. A significant endpoint between the time to peri-morbidity and the effect of T-cell engraftment was also assessed. The percentage of animal mortality and time to death were recorded for every group in the study. Mice were euthanized prior to reaching a moribund state. Mice may be defined as moribund and sacrificed if one or more of the following criteria were met:
  Loss of body weight of 20% or greater sustained for a period of greater than 1 week;
  Tumors that inhibit normal physiological function such as eating, drinking, mobility and ability to urinate and or defecate;
  Prolonged, excessive diarrhea leading to excessive weight loss (>20%); or
  Persistent wheezing and respiratory distress.

Animals were also considered moribund if there was prolonged or excessive pain or distress, as defined by clinical observations such as: prostration, hunched posture, paralysis/paresis, distended abdomen, ulcerations, abscesses, seizures and/or hemorrhages.

Tumor Growth

Figure 8A:
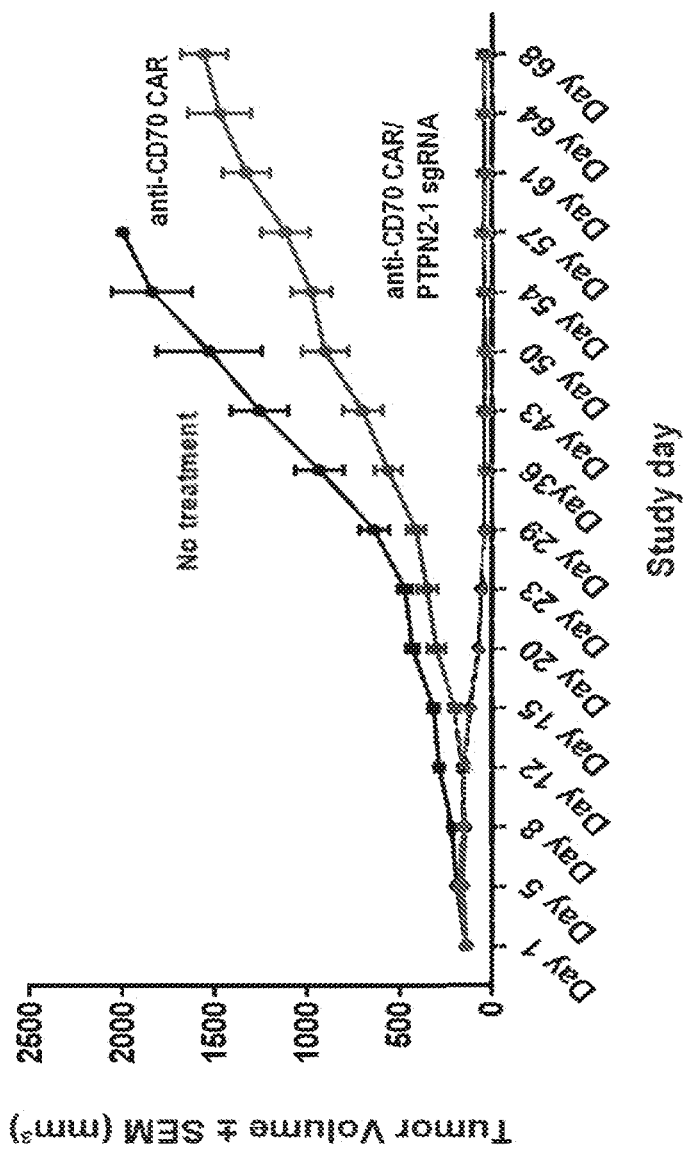
FIGS. 8A-8B include diagrams showing PTPN2 KO enhances in vivo anti-tumor killing function of anti-CD70 CAR T cells against CAKI-1 tumors (FIG. 8A) and prolongs survival of tumor bearing mice (FIG. 8B).

Tumor-bearing mice receiving a dose of TRAC−/β2M−/PTPN2−/anti-CD70 CAR+ T cells completely abrogated tumor growth 20 days after injection of CAR-T cells, which was sustained beyond 68 days post-injection (FIG. 8A).

In Vivo Survival Rate

Figure 8B:
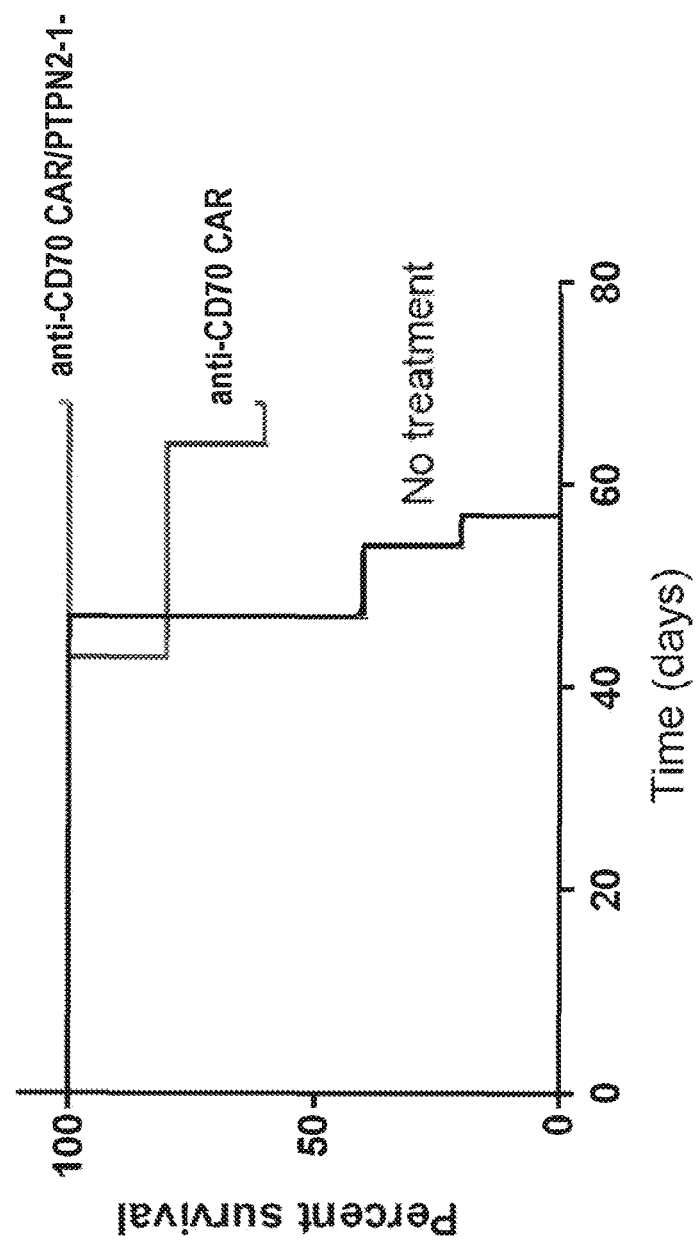

Mice in groups receiving TRAC−/β2M/anti-CD70 CAR+ T cells with or without an additional PTPN2 knockout exhibited an increase in survival relative to mice in the untreated group (Group 1). Mice receiving a dose of TRAC−/β2M−/PTPN2−/anti-CD70 CAR+ T cells exhibited increased survival in comparison to TRAC−/β2M/anti-CD70 CAR+ T cells (FIG. 8B).

These data demonstrate that the PTPN2 knockout in CAR T cells increases efficacy of these CAR T cells in vivo, decreasing tumor burden and increasing survival.

Example 7: In Vitro Effect of PTPN2 KO on Allogeneic CD70 CAR-T Cells Against NK Lysis Allogeneic CAR T cells lacking β2M and TRAC may be susceptible to cell mediated killing by donor NK cells. To test whether PTPN2 KO affects this susceptibility in CAR-T cells, anti-CD70 CAR/CD70−/TRAC−/132M− CAR T cells and anti-CD70 CAR/CD70−/TRAC−/β2M−/PTPN2− cells (both generated from two different PBMC donors) were co-cultured with NK cells from a different donor, in the presence of IL-2 stimulation. After 24 hours, cell death of CAR-T cells was quantified by FACs analysis. Interestingly, NK-mediated killing of allogeneic CAR-T cells was reduced by 30% to 50% in CAR-T cells lacking PTPN2 (FIGS. 9A and 9B). This suggests that knocking out PTPN2 enhances survival of CAR-T cells in the presence of NK cells and may protect donor allogeneic CAR-T cells from encountering recipient NK cell attack.

Example 8: In Vivo Effect of PTPN2 KO on Allogeneic Anti-BCMA CAR-T Cells in Xenograft Mouse Tumor Model Allogenic CAR-T cells directed against BCMA were produced by knocking out TRAC & B2M loci, and HDR mediated insertion of a BCMA CAR sequence to the TRAC locus. To evaluate the effect of PTPN2 knockout on these cells, anti-BCMA CAR-T cells were produced with or without targeting the PTPN2 locus, using the PTPN2-1 sgRNA (e.g.: TRAC−/B2M−/PTPN2−/anti-BCMA CAR+ T cells).

Figure 10A:
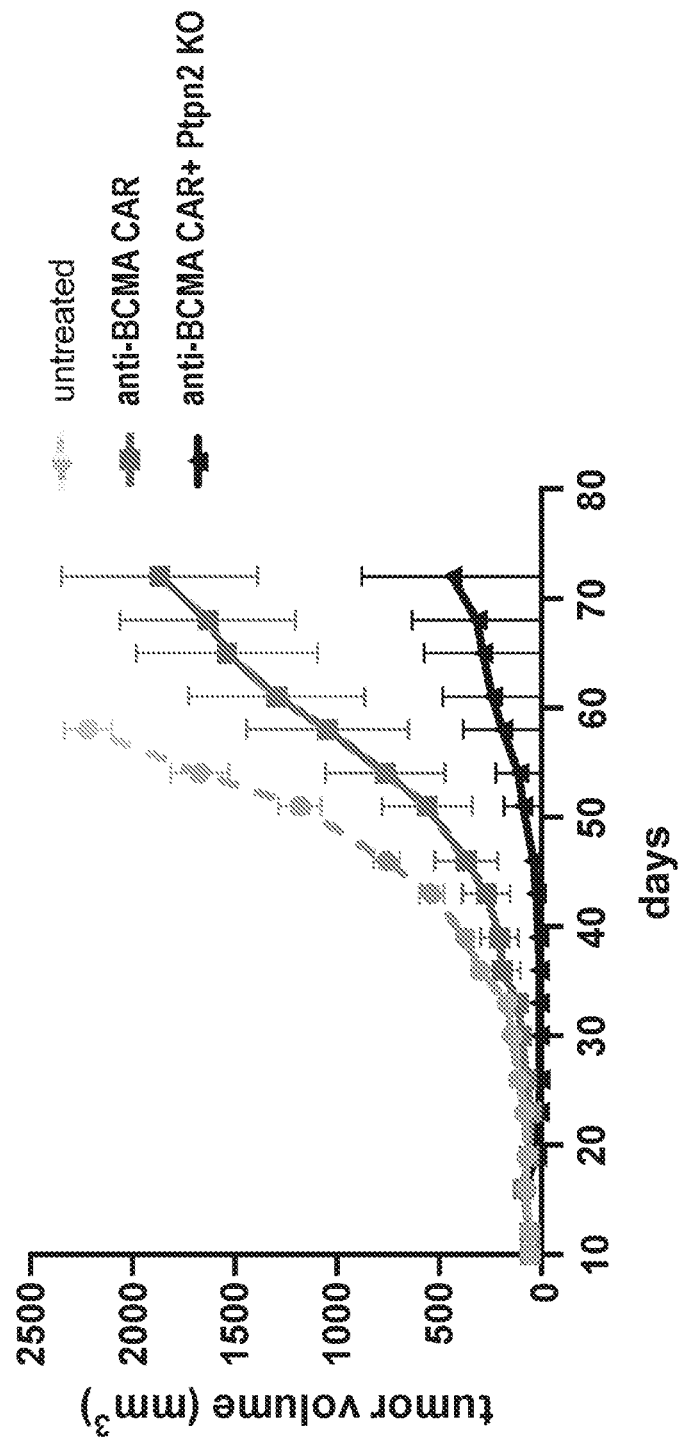

The ability of the CAR-T cells to inhibit the growth of BCMA+ RPMI-8226 (multiple myeloma) tumor model was examined in NOG mice. Compared to allogenic CAR-T cells with a functional PTPN2 gene (TRAC−/B2M−/anti-BCMA CAR+ T cells), allogenic CAR-T cells with PTPN2 KO (TRAC−/B2M−/PTPN2−/anti-BCMA CAR+ T cells) showed an improved ability to inhibit tumor progression (FIG. 10A). The enhanced CAR-T cell potency was accompanied by increased ability of the anti-BCMA CAR T cells to expand in-vivo in peripheral blood (FIG. 10B).

Example 9: In Vivo Effect of PTPN2 KO on Allogeneic Anti-CD19 CAR-T Cells in Xenograft Mouse Tumor Model This Example describes evaluation of anti-CD19 CAR T cells with and without a PTPN2 knockout in the intravenously disseminated Nalm-Fluc-GFP acute lymphoblastic leukemia tumor xenograft model.

Allogenic CAR-T cells directed against CD19 were produced by knocking out TRAC & B2M loci, and HDR mediated insertion of a CD19 CAR sequence to the TRAC locus. To evaluate the effect of PTPN2 knockout on these cells, anti-CD19 CAR-T cells were produced with or without targeting the PTPN2 locus (e.g.: TRAC–/B2M–/PTPN2–/anti-CD19 CAR+ T cells), using the PTPN2-13 sgRNA (spacer sequence SEQ ID NO: 60).

Figure 11A:
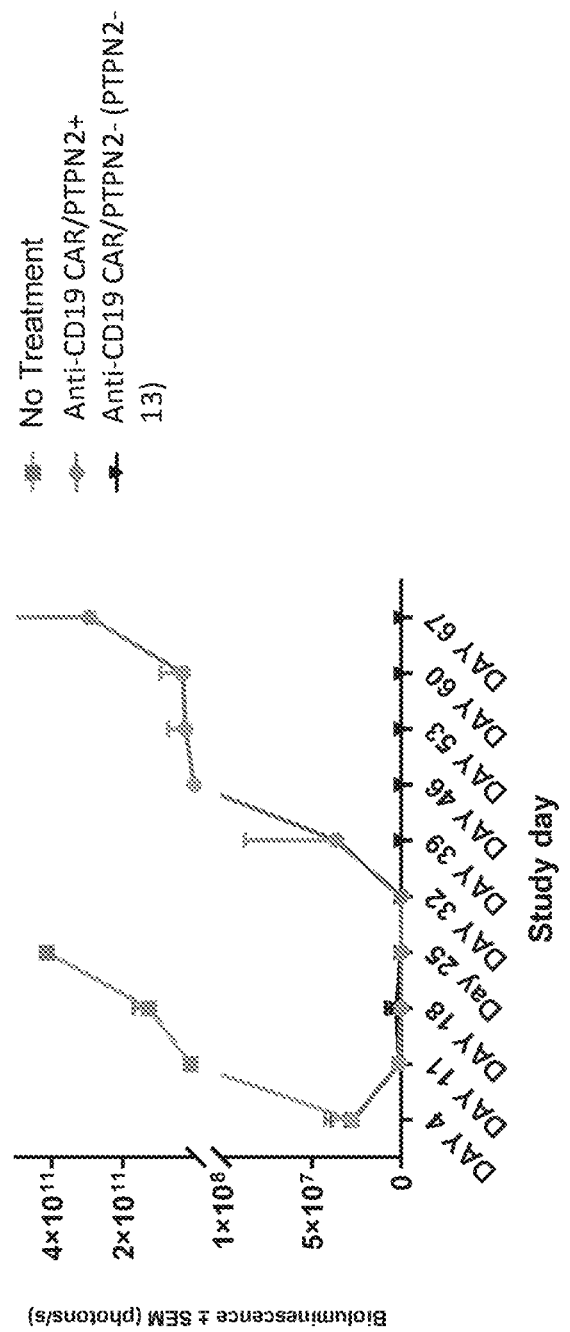

The ability of the CAR-T cells ($4 \times 10^6$ cells injected) to inhibit the growth of the Nalm6 tumor model was examined in NOG mice by measuring the bioluminescence emitted by the tumor cells. Compared to allogenic CAR-T cells with a functional PTPN2 gene (TRAC–/B2M–/anti-CD19 CAR+ T cells), allogeneic CAR-T cells with PTPN2 KO (TRAC–/B2M–/PTPN2–/anti-CD19 CAR+ T cells) showed complete remission of the tumor until at least day 67 (FIG. 11A).

Mice receiving a dose of TRAC–/β2M–/PTPN2–/anti-CD19 CAR+ T cells exhibited increased survival in comparison to TRAC–/β2M–/anti-CD19 CAR+ T cells (FIG. 11B).

These data demonstrate that the PTPN2 knockout in CAR T cells increases efficacy of these CAR T cells in vivo, decreasing tumor burden and increasing survival.

Sequence Tables

The following tables provide details for the various nucleotide and amino acid sequences disclosed herein.

TABLE 3

PTPN-2 gRNA Target Sequences

| Name | sgRNA target sequence (PAM) | SEQ ID NO (no PAM) | SEQ ID NO (with PAM) |
|---|---|---|---|
| PTPN2-1 | GGAAACTTGGCCACTCTATG (AGG) | 2 | 14 |
| PTPN2-2 | CCACTCTATGAGGATAGTCA (TGG) | 3 | 15 |
| PTPN2-3 | CTCTTCTATGTCAACTAAAC (TGG) | 4 | 16 |
| PTPN2-4 | CAGTTTAGTTGACATAGAAG (AGG) | 5 | 17 |
| PTPN2-5 | TTGACATAGAAGAGGCACAA (AGG) | 6 | 18 |
| PTPN2-10 | TTCGAACTCCCGCTCGATGG (TGG) | 7 | 19 |
| PTPN2-11 | CTCTTCGAACTCCCGCTCGA (TGG) | 8 | 20 |
| PTPN2-12 | AGTTGGATACTCAGCGTCGC (TGG) | 9 | 21 |
| PTPN2-13 | CGAGCGGGAGTTCGAAGAGT (TGG) | 10 | 22 |
| PTPN2-14 | AACTCCCGCTCGATGGTGGT (GGG) | 11 | 23 |
| PTPN2-15 | CCGCTCGATGGTGGTGGGCA (TGG) | 12 | 24 |
| PTPN2-16 | GAACTCCCGCTCGATGGTGG (TGG) | 13 | 25 |

TABLE 4 sgRNA Sequences for PTPN2

| Name | Unmodified Sequence | Modified Sequence |
|---|---|---|
| PTPN2-1 | GGAAACUUGGCCACUCUAUGguuuuagagc uagaaauagcaaguuaaaauaaggcuaguc cguuaucaacuugaaaaaguggcaccgagu cggugcUUUU (SEQ ID NO: 26) | G*G*A*AACUUGGCCACUCUAUGguuuuaga gcuagaaauagcaaguuaaaauaaggcuagu ccguuaucaacuugaaaaaguggcaccgagu cggugcU*U*U*U (SEQ ID NO: 27) |
| PTPN2-1 (spacer) | GGAAACUUGGCCACUCUAUG (SEQ ID NO: 28) | G*G*A*AACUUGGCCACUCUAUG (SEQ ID NO: 29) |
| PTPN2-2 | CCACUCUAUGAGGAUAGUCAguuuuagagc uagaaauagcaaguuaaaauaaggcuaguc cguuaucaacuugaaaaaguggcaccgagu cggugcUUUU (SEQ ID NO: 30) | C*C*A*CUCUAUGAGGAUAGUCAguuuuaga gcuagaaauagcaaguuaaaauaaggcuagu ccguuaucaacuugaaaaaguggcaccgagu cggugcU*U*U*U (SEQ ID NO: 31) |
| PTPN2-2 (spacer) | CCACUCUAUGAGGAUAGUCA (SEQ ID NO: 32) | C*C*A*CUCUAUGAGGAUAGUCA (SEQ ID NO: 33) |
| PTPN2-3 | CUCUUCUAUGUCAACUAAACguuuuagagc uagaaauagcaaguuaaaauaaggcuaguc cguuaucaacuugaaaaaguggcaccgagu cggugcUUUU (SEQ ID NO: 34) | C*U*C*UUCUAUGUCAACUAAACguuuuaga gcuagaaauagcaaguuaaaauaaggcuagu ccguuaucaacuugaaaaaguggcaccgagu cggugcU*U*U*U (SEQ ID NO: 35) |
| PTPN2-3 (spacer) | CUCUUCUAUGUCAACUAAAC (SEQ ID NO: 36) | C*U*C*UUCUAUGUCAACUAAAC (SEQ ID NO: 37) |
| PTPN2-4 | CAGUUUAGUUGACAUAGAAGguuuuagagc uagaaauagcaaguuaaaauaaggcuaguc cguuaucaacuugaaaaaguggcaccgagu cggugcUUUU (SEQ ID NO: 38) | C*A*G*UUUAGUUGACAUAGAAGguuuuaga gcuagaaauagcaaguuaaaauaaggcuagu ccguuaucaacuugaaaaaguggcaccgagu cggugcU*U*U*U (SEQ ID NO: 39) |
| PTPN2-4 (spacer) | CAGUUUAGUUGACAUAGAAG (SEQ ID NO: 40) | C*A*G*UUUAGUUGACAUAGAAG (SEQ ID NO: 41) |

TABLE 4-continued sgRNA Sequences for PTPN2

| Name | Unmodified Sequence | Modified Sequence |
|---|---|---|
| PTPN2-5 | UUGACAUAGAAGAGGCACAAguuuuagagc uagaaauagcaaguuaaaauaaggcuaguc cguuaucaacuugaaaaaguggcaccgagu cggugcUUUU (SEQ ID NO: 42) | U*U*G*ACAUAGAAGAGGCACAAguuuuaga gcuagaaauagcaaguuaaaauaaggcuagu ccguuaucaacuugaaaaaguggcaccgagu cggugcU*U*U*U (SEQ ID NO: 43) |
| PTPN2-5 (spacer) | UUGACAUAGAAGAGGCACAA (SEQ ID NO: 44) | U*U*G*ACAUAGAAGAGGCACAA (SEQ ID NO: 45) |
| PTPN2-10 | UUCGAACUCCCGCUCGAUGGguuuuagagc uagaaauagcaaguuaaaauaaggcuaguc cguuaucaacuugaaaaaguggcaccgagu cggugcUUUU (SEQ ID NO: 46) | U*U*C*GAACUCCCGCUCGAUGGguuuuaga gcuagaaauagcaaguuaaaauaaggcuagu ccguuaucaacuugaaaaaguggcaccgagu cggugcU*U*U*U (SEQ ID NO: 47) |
| PTPN2-10 (spacer) | UUCGAACUCCCGCUCGAUGG (SEQ ID NO: 48) | U*U*C*GAACUCCCGCUCGAUGG (SEQ ID NO: 49) |
| PTPN2-11 | CUCUUCGAACUCCCGCUCGAguuuuagagc uagaaauagcaaguuaaaauaaggcuaguc cguuaucaacuugaaaaaguggcaccgagu cggugcUUUU (SEQ ID NO: 50) | C*U*C*UUCGAACUCCCGCUCGAguuuuaga gcuagaaauagcaaguuaaaauaaggcuagu ccguuaucaacuugaaaaaguggcaccgagu cggugcU*U*U*U (SEQ ID NO: 51) |
| PTPN2-11 (spacer) | CUCUUCGAACUCCCGCUCGA (SEQ ID NO: 52) | C*U*C*UUCGAACUCCCGCUCGA (SEQ ID NO: 53) |
| PTPN2-12 | AGUUGGAUACUCAGCGUCGCguuuuagagc uagaaauagcaaguuaaaauaaggcuaguc cguuaucaacuugaaaaaguggcaccgagu cggugcUUUU (SEQ ID NO: 54) | A*G*U*UGGAUACUCAGCGUCGCguuuuaga gcuagaaauagcaaguuaaaauaaggcuagu ccguuaucaacuugaaaaaguggcaccgagu cggugcU*U*U*U (SEQ ID NO: 55) |
| PTPN2-12 (spacer) | AGUUGGAUACUCAGCGUCGC (SEQ ID NO: 56) | A*G*U*UGGAUACUCAGCGUCGC (SEQ ID NO: 57) |
| PTPN2-13 | CGAGCGGGAGUUCGAAGAGUguuuuagagc uagaaauagcaaguuaaaauaaggcuaguc cguuaucaacuugaaaaaguggcaccgagu cggugcUUUU (SEQ ID NO: 58) | C*G*A*GCGGGAGUUCGAAGAGUguuuuaga gcuagaaauagcaaguuaaaauaaggcuagu ccguuaucaacuugaaaaaguggcaccgagu cggugcU*U*U*U (SEQ ID NO: 59) |
| PTPN2-13 (spacer) | CGAGCGGGAGUUCGAAGAGU (SEQ ID NO: 60) | C*G*A*GCGGGAGUUCGAAGAGU (SEQ ID NO: 61) |
| PTPN2-14 | AACUCCCGCUCGAUGGUGGUguuuuagagc uagaaauagcaaguuaaaauaaggcuaguc cguuaucaacuugaaaaaguggcaccgagu cggugcUUUU (SEQ ID NO: 62) | A*A*C*UCCCGCUCGAUGGUGGUguuuuaga gcuagaaauagcaaguuaaaauaaggcuagu ccguuaucaacuugaaaaaguggcaccgagu cggugcU*U*U*U (SEQ ID NO: 63) |
| PTPN2-14 (spacer) | AACUCCCGCUCGAUGGUGGU (SEQ ID NO: 64) | A*A*C*UCCCGCUCGAUGGUGGU (SEQ ID NO:65) |
| PTPN2-15 | CCGCUCGAUGGUGGUGGGCAguuuuagagc uagaaauagcaaguuaaaauaaggcuaguc cguuaucaacuugaaaaaguggcaccgagu cggugcUUUU (SEQ ID NO: 192) | C*C*G*CUCGAUGGUGGUGGGCAguuuuaga gcuagaaauagcaaguuaaaauaaggcuagu ccguuaucaacuugaaaaaguggcaccgagu cggugcU*U*U*U (SEQ ID NO: 193) |
| PTPN2-15 (spacer) | CCGCUCGAUGGUGGUGGGCA (SEQ ID NO: 66) | C*C*G*CUCGAUGGUGGUGGGCA (SEQ ID NO: 67) |
| PTPN2-16 | GAACUCCCGCUCGAUGGUGGguuuuagagc uagaaauagcaaguuaaaauaaggcuaguc cguuaucaacuugaaaaaguggcaccgagu cggugcUUUU (SEQ ID NO: 68) | G*A*A*CUCCCGCUCGAUGGUGGguuuuaga gcuagaaauagcaaguuaaaauaaggcuagu ccguuaucaacuugaaaaaguggcaccgagu cggugcU*U*U*U (SEQ ID NO: 69) |
| PTPN2-16 (spacer) | GAACUCCCGCUCGAUGGUGG (SEQ ID NO: 70) | G*A*A*CUCCCGCUCGAUGGUGG (SEQ ID NO: 71) |

TABLE 5 sgRNA Sequences and Target Gene Sequences for TRAC, β2M, and CD70

| | | | SEQ ID NO: |
|---|---|---|---|
| sgRNA Sequences | | | |
| CD70 sgRNA (CD70-7) | Modified | G*C*U*UUGGUCCCAUUGGUCGCguuuuagagcuagaaau agcaaguuaaaauaaggcuaguccguuaucaacuugaaaa aguggcaccgagucggugcU*U*CJ*U | 72 |
| | Unmodified | GCUUUGGUCCCAUUGGUCGCguuuuagagcuagaaauagc aaguuaaaauaaggcuaguccguuaucaacuugaaaaagu ggcaccgagucggugcUUUU | 73 |
| CD70 sgRNA spacer | Modified | G*C*U*UUGGUCCCAUUGGUCGC | 74 |
| | Unmodified | GCUUUGGUCCCAUUGGUCGC | 75 |
| TRAC sgRNA (TA-1) | Modified | A*G*A*GCAACAGUGCUGUGGCCguuuuagagcuagaaau agcaaguuaaaauaaggcuaguccguuaucaacuugaaaa aguggcaccgagucggugcU*U*U*U | 76 |
| | Unmodified | AGAGCAACAGUGCUGUGGCCguuuuagagcuagaaauagc aaguuaaaauaaggcuaguccguuaucaacuugaaaaagu ggcaccgagucggugcUUUU | 77 |
| TRAC sgRNA spacer | Modified | A*G*A*GCAACAGUGCUGUGGCC | 78 |
| | Unmodified | AGAGCAACAGUGCUGUGGCC | 79 |
| β2M sgRNA (β2M-1) | Modified | G*C*U*ACUCUCUCUUUCUGGCCguuuuagagcuagaaau agcaaguuaaaauaaggcuaguccguuaucaacuugaaaa aguggcaccgagucggugcU*U*U*U | 80 |
| | Unmodified | GCUACUCUCUCUUUCUGGCCguuuuagagcuagaaauagc aaguuaaaauaaggcuaguccguuaucaacuugaaaaagu ggcaccgagucggugcUUUU | 81 |
| β2M sgRNA spacer | Modified | G*C*U*ACUCUCUCUUUCUGGCC | 82 |
| | Unmodified | GCUACUCUCUCUUUCUGGCC | 83 |
| Target Sequences (PAM) | | | |
| CD70 target sequence with (PAM) | | GCTTTGGTCCCATTGGTCGC (GGG) | 84 |
| CD70 target sequence | | GCTTTGGTCCCATTGGTCGC | 85 |
| TRAC target sequence with (PAM) | | AGAGCAACAGTGCTGTGGCC (TGG) | 86 |
| TRAC target sequence | | AGAGCAACAGTGCTGTGGCC | 87 |
| β2M target sequence with (PAM) | | GCTACTCTCTCTTTCTGGCC (TGG) | 88 |
| β2M target sequence | | GCTACTCTCTCTTTCTGGCC | 89 |
| Exemplary sgRNA Formulas | | | |
| sgRNA sequence | | nnnnnnnnnnnnnnnnnnnnguuuuagagcuagaaauagcaaguuaaaauaag gcuaguccguuaucaacuugaaaaaguggcaccgagucggugcuuuu | 90 |
| sgRNA sequence | | nnnnnnnnnnnnnnnnnnnnguuuuagagcuagaaauagcaaguuaaaauaag gcuaguccguuaucaacuugaaaaaguggcaccgagucggugc | 91 |

TABLE 5-continued sgRNA Sequences and Target Gene Sequences for TRAC, β2M, and CD70

| | | SEQ ID NO: |
|---|---|---|
| sgRNA sequence | n(17-30)guuuuagagcuagaaauagcaaguuaaaauaaggcuaguccguua ucaacuugaaaaaguggcaccgagucggugcu(1-8) | 92 |

*indicates a nucleotide with a 2'-O-methyl phosphorothioate modification,
"n" refers to the spacer sequence at the 5' end.

TABLE 6

Edited TRAC Gene Sequence.

| Description | Sequence (Deletions indicated by dashes (-); insertions indicated by bold) | SEQ ID NO: |
|---|---|---|
| TRAC gene edit | AA------------------- --GAGCAACAAATCTGACT | 93 |
| TRAC gene edit | AAGAGCAACAGTGCTGT-GCC TGGAGCAACAAATCTGACT | 94 |
| TRAC gene edit | AAGAGCAACAGTG-------C TGGAGCAACAAATCTGACT | 95 |
| TRAC gene edit | AAGAGCAACAGT------GCC TGGAGCAACAAATCTGACT | 96 |
| TRAC gene edit | AAGAGCAACAGTG-------- ---------------CTGACT | 97 |
| TRAC gene edit | AAGAGCAACAGTGCTGTGGG CCTGGAGCAACAAATCTGACT | 98 |
| TRAC gene edit | AAGAGCAACAGTGC--TGGC CTGGAGCAACAAATCTGACT | 99 |
| TRAC gene edit | AAGAGCAACAGTGCTGTGTG CCTGGAGCAACAAATCTGACT | 100 |

These sequences are not present in the disrupted TRAC gene if a CAR-coding sequence is inserted at the TRAC targeting site.

TABLE 7

Edited β2M Gene Sequence.

| Description | Sequence (Deletions indicated by dashes (-); insertions indicated by bold) | SEQ ID NO: |
|---|---|---|
| β2M gene-edit | CGTGGCCTTAGCTGTGCTCGCGCTACTCT CTCTTTCT-GCCTGGAGGCTATCCAGCGT GAGTCTCTCCTACCCTCCCGCT | 101 |
| β2M gene-edit | CGTGGCCTTAGCTGTGCTCGCGCTACTCT CTCTTTC--GCCTGGAGGCTATCCAGCGT GAGTCTCTCCTACCCTCCCGCT | 102 |
| β2M gene-edit | CGTGGCCTTAGCTGTGCTCGCGCTACTCT CTCTTT-----CTGGAGGCTATCCAGCGT GAGTCTCTCCTACCCTCCCGCT | 103 |
| β2M gene-edit | CGTGGCCTTAGCTGTGCTCGCGCTACTCT CTCTTTCTGATAGCCTGGAGGCTATCCA GCGTGAGTCTCTCCTACCCTCCCGCT | 104 |
| β2M gene-edit | CGTGGCCTTAGCTGTGCTCGC-------- -----------------GCTATCCAGCG TGAGTCTCTCCTACCCTCCCGCT | 105 |
| β2M gene-edit | CGTGGCCTTAGCTGTGCTCGCGCTACTC TCTCTTTCTGTTGGCCTGGAGGCTACCA GCGTGAGTCTCTCCTACCCTCCCGCT | 106 |

TABLE 8

Edited CD70 Gene Sequence.

| Description | Sequence (Deletions indicated by dashes (-); insertions indicated by bold) | SEQ ID NO: |
|---|---|---|
| CD70 gene-edit | CACACCACGAGGCAGATCACCAAGCCCGCG-- CAATGGGACCAAAGCAGCCCGCAGGACG | 107 |
| CD70 gene-edit | CACACCACGAGGCAGATCACCAAGCCCGCGA ACCAATGGGACCAAAGCAGCCCGCAGGACG | 108 |
| CD70 gene-edit | CACACCACGAGGCAGATC------------ ACCAATGGGACCAAAGCAGCCCGCAGGACG | 109 |
| CD70 gene-edit | CACACCACGAGGCAGATCACCAAGCCCGCG- CCAATGGGACCAAAGCAGCCCGCAGGACG | 110 |
| CD70 gene-edit | CACACCACGAGGCAGATCACCAAGCCCGC- ACCAATGGGACCAAAGCAGCCCGCAGGACG | 111 |
| CD70 gene-edit | CACACCACGAGGCAGATCACCA--------- ----------------AGCCCGCAGGACG | 112 |

TABLE 9

Chimeric Antigen Receptor Sequences

| SEQ ID NO | Description | Sequence |
|---|---|---|
| 113 | signal peptide | MLLLVTSLLLCELPHPAFLLIP |
| 114 | signal peptide | MALPVTALLLPLALLLHAARP |
| 115 | CD8a transmembrane domain | IYIWAPLAGTCGVLLLSLVITLY |
| 116 | 4-1BB nucleotide sequence | AAACGGGGCAGAAAGAAACTCCTGTATATATTCAAACAACCATTTAT GAGACCAGTACAAACTACTCAAGAGGAAGATGGCTGTAGCTGCCGAT TTCCAGAAGAAGAAGAAGGAGGATGTGAACTG |
| 117 | 4-1BB amino acid sequence | KRGRKKLLYIFKQPFMRPVQTTQEEDGCSCRFPEEEEGGCEL |
| 118 | CD28 nucleotide sequence | TCAAAGCGGAGTAGGTTGTTGCATTCCGATTACATGAATATGACTCC TCGCCGGCCTGGGCCGACAAGAAAACATTACCAACCCTATGCCCCCC CACGAGACTTCGCTGCGTACAGGTCC |
| 119 | CD28 amino acid sequence | SKRSRLLHSDYMNMTPRRPGPTRKHYQPYAPPRDFAAYRS |
| 120 | CD3-zeta Nucleotide sequence | CGAGTGAAGTTTTCCCGAAGCGCAGACGCTCCGGCATATCAGCAAGG ACAGAATCAGCTGTATAACGAACTGAATTTGGGACGCCGCGAGGAGT ATGACGTGCTTGATAAAGCCGGGGGAGAGACCCGGAAATGGGGGGT AAACCCCGAAGAAGAATCCCCAAGAAGGACTCTACAATGAACTCCA GAAGGATAAGATGGCGGAGGCCTACTCAGAAATAGGTATGAAGGGCG AACGACGACGGGGAAAAGGTCACGATGGCCTCTACCAAGGGTTGAGT ACGGCAACCAAAGATACGTACGATGCACTGCATATGCAGGCCCTGCC TCCCAGA |
| 121 | CD3-zeta amino acid sequence | RVKFSRSADAPAYQQGQNQLYNELNLGRREEYDVLDKRRGRDPEMGG KPRRKNPQEGLYNELQKDKMAEAYSEIGMKGERRRGKGHDGLYQGLS TATKDTYDALHMQALPPR |
| 122 | anti-CD19 VL CDR1 (Kabat) | RASQDISKYLN |
| 123 | anti-CD19 VL CDR2 (Kabat) | HTSRLHS |
| 124 | anti-CD19 VL CDR3 (Kabat) | QQGNTLPYT |
| 125 | anti-CD19 VH CDR1 (Kabat) | DYGVS |
| 126 | anti-CD19 VH CDR2 (Kabat) | VIWGSETTYYNSALKS |
| 127 | anti-CD19 VH CDR3 (Kabat) | HYYYGGSYAMDY |
| 128 | anti-CD19 VL CDR1 (Chothia) | RASQDISKYLN |
| 129 | anti-CD19 VL CDR2 (Chothia) | HTSRLHS |
| 130 | anti-CD19 VL CDR3 (Chothia) | QQGNTLPYT |
| 131 | anti-CD19 VH CDR1 (Chothia) | GVSLPDY |
| 132 | anti-CD19 VH CDR2 (Chothia) | WGSET |
| 133 | anti-CD19 VH CDR3 (Chothia) | HYYYGGSYAMDY |
| 134 | Anti-CD19 CAR FMC63-28Z | ATGCTTCTTTTGGTTACGTCTCTGTTGCTTTGCGAACTTCCTCATCC AGCGTTCTTGCTGATCCCCGATATTCAGATGACTCAGACCACCAGTA |

TABLE 9-continued

Chimeric Antigen Receptor Sequences

| SEQ ID NO | Description | Sequence |
|---|---|---|
| | (FMC63-CD8[tm]-CD28[co-stimulatory domain]-CD3z) | GCTTGTCTGCCTCACTGGGAGACCGAGTAACAATCTCCTGCAGGGCA<br>AGTCAAGACATTAGCAAATACCTCAATTGGTACCAGCAGAAGCCCGA<br>CGGAACGGTAAAACTCCTCATCTATCATACGTCAAGGTTGCATTCCG<br>GAGTACCGTCACGATTTTCAGGTTCTGGGAGCGGAACTGACTATTCC<br>TTGACTATTTCAAACCTCGAGCAGGAGGACATTGCGACATATTTTG<br>TCAACAAGGTAATACCCTCCCTTACACTTTCGGAGGAGGAACCAAAC<br>TCGAAATTACCGGGTCCACCAGTGGCTCTGGGAAGCCTGGCAGTGGA<br>GAAGGTTCCACTAAAGGCGAGGTGAAGCTCCAGGAGAGCGGCCCCGG<br>TCTCGTTGCCCCCAGTCAAAGCCTCTCTGTAACGTGCACAGTGAGTG<br>GTGTATCATTGCCTGATTATGGCGTCTCCTGGATAAGGCAGCCCCCG<br>CGAAAGGGTCTTGAATGGCTTGGGGTAATATGGGGCTCAGAGACAAC<br>GTATTATAACTCCGCTCTCAAAAGTCGCTTGACGATAATAAAAGATA<br>ACTCCAAGAGTCAAGTTTTCCTTAAAATGAACAGTTTGCAGACTGAC<br>GATACCGCTATATATTATTGTGCTAAACATTATTACTACGGCGGTAG<br>TTACGCGATGGATTATTGGGGGCAGGGGACTTCTGTCACAGTCAGTA<br>GTGCTGCTGCCTTTGTCCCGGTATTTCTCCCAGCCAAACCGACCACG<br>ACTCCCGCCCCGCGCCCTCCGACACCCGCTCCCACCATCGCCTCTCA<br>ACCTCTTAGTCTTCGCCCCGAGGCATGCCGACCCGCCGCCGGGGGTG<br>CTGTTCATACGAGGGGCTTGGACTTCGCTTGTGATATTTACATTTGG<br>GCTCCGTTGGCGGGTACGTGCGGCGTCCTTTTGTTGTCACTCGTTAT<br>TACTTTGTATTGTAATCACAGGAATCGCTCAAAGCGGAGTAGGTTGT<br>TGCATTCCGATTACATGAATATGACTCCTCGCCGGCCTGGGCCGACA<br>AGAAAACATTACCAACCCTATGCCCCCCCACGAGACTTCGCTGCGTA<br>CAGGTCCCGAGTGAAGTTTTCCCGAAGCGCAGACGCTCCGGCATATC<br>AGCAAGGACAGAATCAGCTGTATAACGAACTGAATTTGGGACGCCGC<br>GAGGAGTATGACGTGCTTGATAAACGCCGGGGAGAGACCCGGAAAT<br>GGGGGGTAAACCCCGAAGAAAGAATCCCCAAGAAGGACTCTACAATG<br>AACTCCAGAAGGATAAGATGGCGGAGGCCTACTCAGAAATAGGTATG<br>AAGGGCAACGACGACGGGGAAAAGGTCACGATGGCCTCTACCAAGG<br>GTTGAGTACGGCAACCAAAGATACGTACGATGCACTGCATATGCAGG<br>CCCTGCCTCCCAGA |
| 135 (with no signal peptide) 188 (with signal peptide) | Anti-CD19 CAR FMC63-28Z (FMC63-CD8[tm]-CD28[co-stimulatory domain]-CD3z) Amino Acid | MLLLVTSLLLCELPHPAFLLIPDIQMTQTTSSLSASLGDRVHSCRA<br>SQDISKYLNWYQQKPDGTVKLLIYHTSRLHSGVPSRFSGSGSGTDYS<br>LTISNLEQEDIATYFCQQGNTLPYTFGGGTKLEITGSTSGSGKPGSG<br>EGSTKGEVKLQESGPGLVAPSQSLSVTCTVSGVSLPDYGVSWIRQPP<br>RKGLEWLGVIWGSETTYYNSALKSRLTIIKDNSKSQVFLKMNSLQTD<br>DTAIYYCAKHYYYGGSYAMDYWGQGTSVTVSSAAAFVPVFLPAKPTT<br>TPAPRPPTPAPTIASQPLSLRPEACRPAAGGAVHTRGLDFACDIYIW<br>APLAGTCGVLLLSLVITLYCNHRNRSKRSRLLHSDYMNMTPRRPGPT<br>RKHYQPYAPPRDFAAYRSRVKFSRSADAPAYQQGQNQLYNELNLGRR<br>EEYDVLDKRRGRDPEMGGKPRRKNPQEGLYNELQKDKMAEAYSEIGM<br>KGERRRGKGHDGLYQGLSTATKDTYDALHMQALPPR |
| 136 | Anti-CD19 scFv coding sequence | GATATTCAGATGACTCAGACCACCAGTAGCTTGTCTGCCTCACTGGG<br>AGACCGAGTAACAATCTCCTGCAGGGCAAGTCAAGACATTAGCAAAT<br>ACCTCAATTGGTACCAGCAGAAGCCCGACGGAACGGTAAAACTCCTC<br>ATCTATCATACGTCAAGGTTGCATTCCGGAGTACCGTCACGATTTTC<br>AGGTTCTGGGAGCGGAACTGACTATTCCTTGACTATTTCAAACCTCG<br>AGCAGGAGGACATTGCGACATATTTTTGTCAACAAGGTAATACCCTC<br>CCTTACACTTTCGGAGGAGGAACCAAACTCGAAATTACCGGGTCCAC<br>CAGTGGCTCTGGGAAGCCTGGCAGTGGAGAAGGTTCCACTAAAGGCG<br>AGGTGAAGCTCCAGGAGAGCGGCCCCGGTCTCGTTGCCCCCAGTCAA<br>AGCCTCTCTGTAACGTGCACAGTGAGTGGTGTATCATTGCCTGATTA<br>TGGCGTCTCCTGGATAAGGCAGCCCCCGCGAAAGGGTCTTGAATGGC<br>TTGGGGTAATATGGGGCTCAGAGACAACGTATTATAACTCCGCTCTC<br>AAAAGTCGCTTGACGATAATAAAAGATAACTCCAAGAGTCAAGTTTT<br>CCTTAAAATGAACAGTTTGCAGACTGACGATACCGCTATATATTATT<br>GTGCTAAACATTATTACTACGGCGGTAGTTACGCGATGGATTATTGG<br>GGGCAGGGGACTTCTGTCACAGTCAGTAGT |
| 137 | CD19 scFv amino acid sequence Linker underlined | DIQMTQTTSSLSASLGDRVTISCRASQDISKYLNWYQQKPDGTVKLL<br>IYHTSRLHSGVPSRFSGSGSGTDYSLTISNLEQEDIATYFCQQGNTL<br>PYTFGGGTKLEIT<u>GSTSGSGKPGSGEGSTKG</u>EVKLQESGPGLVAPSQ<br>SLSVTCTVSGVSLPDYGVSWIRQPPRKGLEWLGVIWGSETTYYNSAL<br>KSRLTIIKDNSKSQVFLKMNSLQTDDTAIYYCAKHYYYGGSYAMDYW<br>GQGTSVTVSS |
| 138 | CD8a extracellular + CD8a transmembrane + 5' Linker (underlined) | GCTGCTGCCTTTGTCCCGGTATTTCTCCCAGCCAAACCGACCACGAC<br><u>TCCCGCCCCGCGCCCTCCGACACCCGCTCCCACCATCGCCTCTCAAC</u><br>CTCTTAGTCTTCGCCCCGAGGCATGCCGACCCGCCGCCGGGGGTGCT<br>GTTCATACGAGGGGCTTGGACTTCGCTTGTGATATTTACATTTGGGC<br>TCCGTTGGCGGGTACGTGCGGCGTCCTTTTGTTGTCACTCGTTATTA<br>CTTTGTATTGTAATCACAGGAATCGC |

TABLE 9-continued

Chimeric Antigen Receptor Sequences

| SEQ ID NO | Description | Sequence |
|---|---|---|
| 139 | CD8a extracellular + CD8a transmembrane (without linker) | TTTGTCCCGGTATTTCTCCCAGCCAAACCGACCACGACTCCCGCCCC GCGCCCTCCGACACCCGCTCCCACCATCGCCTCTCAACCTCTTAGTC TTCGCCCCGAGGCATGCCGACCCGCCGCCGGGGGTGCTGTTCATACG AGGGGCTTGGACTTCGCTTGTGATATTTACATTTGGGCTCCGTTGGC GGGTACGTGCGGCGTCCTTTTGTTGTCACTCGTTATTACTTTGTATT GTAATCACAGGAATCGC |
| 140 | CD8a extracellular + CD8a transmembrane | FVPVFLPAKPTTTPAPRPPTPAPTIASQPLSLRPEACRPAAGGAVHT RGLDFACDIYIWAPLAGTCGVLLLSLVITLYCNHRNR |
| 141 | CD19 VH | EVKLQESGPGLVAPSQSLSVTCTVSGVSLPDYGVSWIRQPPRKGLEW LGVIWGSETTYYNSALKSRLTIIKDNSKSQVFLKMNSLQTDDTAIYY CAKHYYYGGSYAMDYWGQGTSVTVSS |
| 142 | CD19 VL | DIQMTQTTSSLSASLGDRVTISCRASQDISKYLNWYQQKPDGTVKLL IYHTSRLHSGVPSRFSGSGSGTDYSLTISNLEQEDIATYFCQQGNTL PYTFGGGTKLEIT |
| 143 | CD19 linker | GSTSGSGKPGSGEGSTKG |
| 144 | CD70 VL CDR1 (Kabat) | RASKSVSTSGYSFMH |
| 145 | CD70 VL CDR1 (Chothia) | SKSVSTSGYSF |
| 146 | CD70 VL CDR2 (Kabat) | LASNLES |
| N/A | CD70 VL CDR2 (Chothia) | LAS |
| 147 | CD70 VL CDR3 (Kabat) | QHSREVPWT |
| 148 | CD70 VL CDR3 (Chothia) | SREVPW |
| 149 | CD70 VH CDR1 (Kabat) | NYGMN |
| 150 | CD70VHCDR1 (Chothia) | GYTFTNYGMN |
| 151 | CD70 VH CDR2 (Kabat) | WINTYTGEPTYADAFKG |
| 152 | CD70 VH CDR2 (Chothia) | NTYTGE |
| 153 | CD70 VH CDR3 (Kabat) | DYGDYGMDY |
| 154 | CD70 VH CDR3 (Chothia) | CARDYGDYGMDYWG |
| 155 (with no signal peptide) 189 (with signal peptide) | CD70 CAR amino acid sequence (CD70B scFv with 41BB) | *MALPVTALLLPLALLLHAARP*QVQLVQSGAEVKKPGASVKVSCKASG YTFTNYGMNWVRQAPGQGLKWMGWINTYTGEPTYADAFKGRVTMTRD TSISTAYMELSRLRSDDTAVYYCARDYGDYGMDYWGQGTTVTVSSGG GGSGGGGSGGGGSGDIVMTQSPDSLAVSLGERATINCRASKSVSTSG YSFMHWYQQKPGQPPKLLIYLASNLESGVPDRFSGSGSGTDFTLTIS SLQAEDVAVYYCQHSREVPWTFGQGTKVEIKSAAAFVPVFLPAKPTT TPAPRPPTPAPTIASQPLSLRPEACRPAAGGAVHTRGLDFACDIYIW APLAGTCGVLLLSLVITLYCNHRNRKRGRKKLLYIFKQPFMRPVQTT QEEDGCSCRFPEEEEGGCELRVKFSRSADAPAYQQGQNQLYNELNLG RREEYDVLDKRRGRDPEMGGKPRRKNPQEGLYNELQKDKMAEAYSEI GMKGERRRGKGHDGLYQGLSTATKDTYDALHMQALPPR |
| 190 | CD70 CAR nucleotide sequence (CD70B scFv with 41BB) | ATGGCGCTTCCGGTGACAGCACTGCTCCTCCCCTTGGCGCTGTTGCT CCACGCAGCAAGGCCGCAGGTCCAGTTGGTGCAAAGCGGGGCGGAGG TGAAAAAACCCGGCGCTTCCGTGAAGGTGTCCTGTAAGGCGTCCGGT TATACGTTCACGAACTACGGGATGAATTGGGTTCGCCAAGCGCCGGG GCAGGGACTGAAATGGATGGGGTGGATAAATACCTACACCGGCGAAC |

TABLE 9-continued

Chimeric Antigen Receptor Sequences

| SEQ ID NO | Description | Sequence |
|---|---|---|
| | | CTACATACGCCGACGCTTTTAAAGGGCGAGTCACTATGACGCGCGAT<br>ACCAGCATATCCACCGCATACATGGAGCTGTCCCGACTCCGGTCAGA<br>CGACACGGCTGTCTACTATTGTGCTCGGGACTATGGCGATTATGGCA<br>TGGACTACTGGGGTCAGGGTACGACTGTAACAGTTAGTAGTGGTGGA<br>GGCGGCAGTGGCGGGGGGGAAGCGGAGGAGGGGGTTCTGGTGACAT<br>AGTTATGACCCAATCCCCAGATAGTTTGGCGGTTTCTCTGGGCGAGA<br>GGGCAACGATTAATTGTCGCGCATCAAAGAGCGTTTCAACGAGCGGA<br>TATTCTTTTATGCATTGGTACCAGCAAAAACCCGGACAACCGCCGAA<br>GCTGCTGATCTACTTGGCTTCAAATCTTGAGTCTGGGGTGCCGGACC<br>GATTTTCTGGTAGTGGAAGCGGAACTGACTTTACGCTCACGATCAGT<br>TCACTGCAGGCTGAGGATGTAGCGGTCTATTATTGCCAGCACAGTAG<br>AGAAGTCCCCTGGACCTTCGGTCAAGGCACGAAAGTAGAAATTAAAA<br>GTGCTGCTGCCTTTGTCCCGGTATTTCTCCCAGCCAAACCGACCACG<br>ACTCCCGCCCCGCGCCCTCCGACACCCGCTCCCACCATCGCCTCTCA<br>ACCTCTTAGTCTTCGCCCCGAGGCATGCCGACCCGCCGCCGGGGGTG<br>CTGTTCATACGAGGGGCTTGGACTTCGCTTGTGATATTTACATTTGG<br>GCTCCGTTGGCGGGTACGTGCGGCGTCCTTTTGTTGTCACTCGTTAT<br>TACTTTGTATTGTAATCACAGGAATCGCAAACGGGGCAGAAAGAAAC<br>TCCTGTATATATTCAAACAACCATTTATGAGACCAGTACAAACTACT<br>CAAGAGGAAGATGGCTGTAGCTGCCGATTTCCAGAAGAAGAAGAAGG<br>AGGATGTGAACTGCGAGTGAAGTTTTCCCGAAGCGCAGACGCTCCGG<br>CATATCAGCAAGGACAGAATCAGCTGTATAACGAACTGAATTTGGGA<br>CGCCGCGAGGAGTATGACGTGCTTGATAAACGCCGGGGGAGAGACCC<br>GGAAATGGGGGGTAAACCCCGAAGAAAGAATCCCCAAGAAGGACTCT<br>ACAATGAACTCCAGAAGGATAAGATGGCGGAGGCCTACTCAGAAATA<br>GGTATGAAGGCGAACGACGACGGGAAAAAGGTCACGATGGCCTCTA<br>CCAAGGGGTTGAGTACGGCAACCAAAGATACGTACGATGCACTGCATA<br>TGCAGGCCCTGCCTCCCAGATAA |
| 156 | CD70A scFv nucleotide sequence | GATATAGTTATGACCCAATCACCCGATAGTCTTGCGGTAAGCCTGGG<br>GGAGCGAGCAACAATAAACTGTCGGGCATCAAAATCCGTCAGTACAA<br>GCGGGTATTCATTCATGCACTGGTATCAACAGAAACCCGGCAGCCA<br>CCCAAGCTCCTGATTTATCTTGCGTCTAATCTTGAGTCCGGCGTCCC<br>AGACCGGTTTTCCGGCTCCGGGAGCGGCACGGATTTTACTCTTACTA<br>TTTCTAGCCTTCAGGCCGAAGATGTGGCGGTATACTACTGCCAGCAT<br>TCAAGGGAAGTTCCTTGGACGTTCGGTCAGGGCACGAAAGTGGAAAT<br>TAAAGGCGGGGGGGGATCCGGCGGGGAGGGTCTGGAGGAGGTGGCA<br>GTGGTCAGGTCCAACTGGTGCAGTCCGGGGCAGAGGTAAAAAACCC<br>GGCGCGTCTGTTAAGGTTTCATGCAAGGCCAGTGGATATACTTTCAC<br>CAATTACGGAATGAACTGGGTGAGGCAGGCCCCTGGTCAAGGCCTGA<br>AATGGATGGGATGGATAAACACGTACACCGGTGAACCTACCTATGCC<br>GATGCCTTTAAGGGTCGGGTTACGATGACGAGAGACACCTCCATATC<br>AACAGCCTACATGGAGCTCAGCAGATTGAGGAGTGACGATACGGCAG<br>TCTATTACTGTGCAAGAGACTACCGGCGATTATGGCATGGATTACTGG<br>GGCCAGGGCACTACAGTAACCGTTTCCAGC |
| 157 | CD70A scFv amino acid sequence (linker underlined) | DIVMTQSPDSLAVSLGERATINCRASKSVSTSGYSFMHWYQQKPGQP<br>PKLLIYLASNLESGVPDRFSGSGSGTDFTLTISSLQAEDVAVYYCQH<br>SREVPWTFGQGTKVEIK<u>GGGGSGGGGSGGGGS</u>GQVQLVQSGAEVKKP<br>GASVKVSCKASGYTFTNYGMNWVRQAPGQGLKWMGWINTYTGEPTYA<br>DAFKGRVTMTRDTSISTAYMELSRLRSDDTAVYYCARDYGDYGMDYW<br>GQGTTVTVSS |
| 158 | CD70B scFv nucleotide sequence | CAGGTCCAGTTGGTGCAAAGCGGGGCGGAGGTGAAAAAACCCGGCGC<br>TTCCGTGAAGGTGTCCTGTAAGGCGTCCGGTTATACGTTCACGAACT<br>ACGGGATGAATTGGGTCGCCAAGCGCCGGGGCAGGGACTGAAATGG<br>ATGGGGTGGATAAATACCTACACCGGCGAACCTACATACGCCGACGC<br>TTTTAAAGGGCGAGTCACTATGACGCGCGATACCAGCATATCCACCG<br>CATACATGGAGCTGTCCCGACTCCGGTCAGACGACACGGCTGTCTAC<br>TATTGTGCTCGGGACTATGGCGATTATGGCATGGACTACTGGGGTCA<br>GGGTACGACTGTAACAGTTAGTAGTGGTGGAGGCGGCAGTGGCGGGG<br>GGGGAAGCGGAGGAGGGGGTTCTGGTGACATAGTTATGACCCAATCC<br>CCAGATAGTTTGGCGGTTTCTCTGGGCGAGAGGGCAACGATTAATTG<br>TCGCGCATCAAAGAGCGTTTCAACGAGCGGATATTCTTTTATGCATT<br>GGTACCAGCAAAAACCCGGACAACCGCCGAAGCTGCTGATCTACTTG<br>GCTTCAAATCTTGAGTCTGGGGTGCCGGACCGATTTTCTGGTAGTGG<br>AAGCGGAACTGACTTTACGCTCACGATCAGTTCACTGCAGGCTGAGG<br>ATGTAGCGGTCTATTATTGCCAGCACAGTAGAGAAGTCCCCTGGACC<br>TTCGGTCAAGGCACGAAAGTAGAAATTAAA |
| 159 | CD70B scFv amino acid sequence (linker underlined) | QVQLVQSGAEVKKPGASVKVSCKASGYTFTNYGMNWVRQAPGQGLKW<br>MGWINTYTGEPTYADAFKGRVTMTRDTSISTAYMELSRLRSDDTAVY<br>YCARDYGDYGMDYWGQGTTVTVSS<u>GGGGSGGGGSGGGGS</u>GDIVMTQS<br>PDSLAVSLGERATINCRASKSVSTSGYSFMHWYQQKPGQPPKLLIYL |

TABLE 9-continued

Chimeric Antigen Receptor Sequences

| SEQ ID NO | Description | Sequence |
|---|---|---|
|  |  | ASNLESGVPDRFSGSGSGTDFTLTISSLQAEDVAVYYCQHSREVPWT FGQGTKVEIK |
| 160 | CD70 VH | QVQLVQSGAEVKKPGASVKVSCKASGYTFTNYGMNWVRQAPGQGLKW MGWINTYTGEPTYADAFKGRVTMTRDTSISTAYMELSRLRSDDTAVY YCARDYGDYGMDYWGQGTTVTVSS |
| 161 | CD70 VL | DIVMTQSPDSLAVSLGERATINCRASKSVSTSGYSFMHWYQQKPGQP PKLLIYLASNLESGVPDRFSGSGSGTDFTLTISSLQAEDVAVYYCQH SREVPWTFGQGTKVEIK |
| 162 | BCMA CAR nucleotide sequence | ATGGCGCTTCCGGTGACAGCACTGCTCCTCCCCTTGGCGCTGTTGCT CCACGCAGCAAGGCCGCAGGTGCAGCTGGTGCAGAGCGGAGCCGAGC TCAAGAAGCCCGGAGCCTCCGTGAAGGTGAGCTGCAAGGCCAGCGGC AACACCCTGACCAACTACGTGATCCACTGGGTGAGACAAGCCCCCGG CCAAAGGCTGGAGTGGATGGGCTACATCCTGCCCTACAACGACCTGA CCAAGTACAGCCAGAAGTTCCAGGGCAGGGTGACCATCACCAGGGAT AAGAGCGCCTCCACCGCCTATATGGAGCTGAGCAGCCTGAGGAGCGA GGACACCGCTGTGTACTACTGTACAAGGTGGGACTGGGACGGCTTCT TTGACCCCTGGGGCCAGGGCACAACAGTGACCGTCAGCAGCGGCGGC GGAGGCAGCGGCGGCGGCGGCAGCGGCGGAGGCGGAAGCGAAATCGT GATGACCCAGAGCCCCGCCACACTGAGCGTGAGCCCTGGCGAGAGGG CCAGCATCTCCTGCAGGGCTAGCCAAAGCCTGGTGCACAGCAACGGC AACACCCACCTGCACTGGTACCAGCAGAGACCCGGACAGGCTCCCAG GCTGCTGATCTACAGCGTGAGCAACAGGTTCTCCGAGGTGCCTGCCA GGTTTAGCGGCAGCGGAAGCGGCACCGACTTTACCCTGACCATCAGC AGCGTGGAGTCCGAGGACTTCGCCGTGTATTACTGCAGCCAGACCAG CCACATCCCTTACACCTTCGGCGGCGGCACCAAGCTGGAGATCAAAA GTGCTGCTGCCTTTGTCCCGGTATTCTCCCAGCCAAACCGACCACG ACTCCCGCCCCGCGCCCTCCGACACCCGCTCCCACCATCGCCTCTCA ACCTCTTAGTCTTCGCCCCGAGGCATGCCGACCCGCCGCCGGGGGTG CTGTTCATACGAGGGGCTTGGACTTCGCTTGTGATATTTACATTTGG GCTCCGTTGGCGGGTACGTGCGGCGTCCTTTTGTTGTCACTCGTTAT TACTTTGTATTGTAATCACAGGAATCGCAAACGGGGCAGAAAGAAAC TCCTGTATATATTCAAACAACCATTTATGAGACCAGTACAAACTACT CAAGAGGAAGATGGCTGTAGCTGCCGATTTCCAGAAGAAGAAGAAGG AGGATGTGAACTGCGAGTGAAGTTTTCCCGAAGCGCAGACGCTCCGG CATATCAGCAAGGACAGAATCAGCTGTATAACGAACTGAATTTGGGA CGCCGCGAGGAGTATGACGTGCTTGATAAAGCCGGGGGAGAGACCC GGAAATGGGGGGTAAACCCCGAAGAAAGAATCCCCAAGAAGGACTCT ACAATGAACTCCAGAAGGATAAGATGGCGGAGGCCTACTCAGAAATA GGTATGAAGGGCGAACGACGACGGGGAAAAGGTCACGATGGCCTCTA CCAAGGGGTTGAGTACGGCAACCAAAGATACGTACGATGCACTGCATA TGCAGGCCCTGCCTCCCAGA |
| 163 (with no signal peptide) 191 (with signal peptide) | BCMA CAR amino acid sequence | *MALPVTALLLPLALLLHAARP*QVQLVQSGAELKKPGASVKVSCKASG NTLTNYVIHWVRQAPGQRLEWMGYILPYNDLTKYSQKFQGRVTITRD KSASTAYMELSSLRSEDTAVYYCTRWDWDGFFDPWGQGTTVTVSSGG GGSGGGGSGGGGSEIVMTQSPATLSVSPGERASISCRASQSLVHSNG NTHLHWYQQRPGQAPRLLIYSVSNRFSEVPARFSGSGSGTDFTLTIS SVESEDFAVYYCSQTSHIPYTFGGGTKLEIKSAAAFVPVFLPAKPTT TPAPRPPTPAPTIASQPLSLRPEACRPAAGGAVHTRGLDFACDIYIW APLAGTCGVLLLSLVITLYCNHRNRKRGRKKLLYIFKQPFMRPVQTT QEEDGCSCRFPEEEEGGCELRVKFSRSADAPAYQQGQNQLYNELNLG RREEYDVLDKRRGRDPEMGGKPRRKNPQEGLYNELQKDKMAEAYSEI GMKGERRRGKGHDGLYQGLSTATKDTYDALHMQALPPR |
| 164 | BCMA scFv nucleotide sequence | CAGGTGCAGCTGGTGCAGAGCGGAGCCGAGCTCAAGAAGCCCGGAGC CTCCGTGAAGGTGAGCTGCAAGGCCAGCGGCAACACCCTGACCAACT ACGTGATCCACTGGGTGAGACAAGCCCCCGGCCAAAGGCTGGAGTGG ATGGGCTACATCCTGCCCTACAACGACCTGACCAAGTACAGCCAGAA GTTCCAGGGCAGGGTGACCATCACCAGGGATAAGAGCGCCTCCACCG CCTATATGGAGCTGAGCAGCCTGAGGAGCGAGGACACCGCTGTGTAC TACTGTACAAGGTGGGACTGGGACGGCTTCTTTGACCCCTGGGGCCA GGGCACAACAGTGACCGTCAGCAGCGGCGGCGGAGGCAGCGGCGGCG GCGGCAGCGGCGGAGGCGGAAGCGAAATCGTGATGACCCAGAGCCCC GCCACACTGAGCGTGAGCCCTGGCGAGAGGGCCAGCATCTCCTGCAG GGCTAGCCAAAGCCTGGTGCACAGCAACGGCAACACCCACCTGCACT GGTACCAGCAGAGACCCGGACAGGCTCCCAGGCTGCTGATCTACAGC GTGAGCAACAGGTTCTCCGAGGTGCCTGCCAGGTTTAGCGGCAGCGG AAGCGGCACCGACTTTACCCTGACCATCAGCAGCGTGGAGTCCGAGG ACTTCGCCGTGTATTACTGCAGCCAGACCAGCCACATCCCTTACACC TTCGGCGGCGGCACCAAGCTGGAGATCAAA |

TABLE 9-continued

Chimeric Antigen Receptor Sequences

| SEQ ID NO | Description | Sequence |
|---|---|---|
| 165 | BCMA scFv amino acid sequence (linker underlined) | QVQLVQSGAELKKPGASVKVSCKASGNTLTNYVIHWVRQAPGQRLEW MGYILPYNDLTKYSQKFQGRVTITRDKSASTAYMELSSLRSEDTAVY YCTRWDWDGFFDPWGQGTTVTVSSGGGGSGGGGSGGGGSEIVMTQSP ATLSVSPGERASISCRASQSLVHSNGNTHLHWYQQRPGQAPRLLIYS VSNRFSEVPARFSGSGSGTDFTLTISSVESEDFAVYYCSQTSHIPYT FGGGTKLEIK |
| 166 | BCMA VH | QVQLVQSGAELKKPGASVKVSCKASGNTLTNYVIHWVRQAPGQRLEW MGYILPYNDLTKYSQKFQGRVTITRDKSASTAYMELSSLRSEDTAVY YCTRWDWDGFFDPWGQGTTVTVSS |
| 167 | BCMA VL | EIVMTQSPATLSVSPGERASISCRASQSLVHSNGNTHLHWYQQRPGQ APRLLIYSVSNRFSEVPARFSGSGSGTDFTLTISSVESEDFAVYYCS QTSHIPYTFGGGTKLEIK |
| 168 | BCMA VL CDR1 (Kabat & Chothia) | RASQSLVHSNGNTHLH |
| 169 | BCMA VL CDR2 (Kabat & Chothia) | SVSNRFS |
| 170 | BCMA VL CDR3 (Kabat) | SQTSHIPYT |
| 171 | BCMA VL CDR3 (Chothia) | SQTSHIPYT |
| 172 | BCMA VH CDR1 (Kabat) | NYVIH |
| 173 | BCMA VH CDR1 (Chothia) | GNTLTNY |
| 174 | BCMA VH CDR2 (Kabat) | YILPYNDLTKYSQKFQG |
| 175 | BCMA VH CDR2 (Chothia) | LPYNDL |
| 176 | BCMA VH CDR3 (Kabat) | WDWDGFFDP |
| 177 | BCMA VH CDR3 (Chothia) | WDWDGFFDP |

TABLE 10

AAV Donor Template Sequences

| 178 | Left ITR (5' ITR) | TTGGCCACTCCCTCTCTGCGCGCTCGCTCGCTCACTGAGGCCGGGCGAC CAAAGGTCGCCCGACGCCCGGGCTTTGCCCGGGCGGCCTCAGTGAGCGA GCGAGCGCGCAGAGAGGGAGTGGCCAACTCCATCACTAGGGGTTCCT |
|---|---|---|
| 179 | Left ITR (5' ITR) (alternate) | CCTGCAGGCAGCTGCGCGCTCGCTCGCTCACTGAGGCCGCCCGGGCGTC GGGCGACCTTTGGTCGCCCGGCCTCAGTGAGCGAGCGAGCGCGCAGAGA GGGAGTGGCCAACTCCATCACTAGGGGTTCCT |
| 180 | Right ITR (3' ITR) | AGGAACCCCTAGTGATGGAGTTGGCCACTCCCTCTCTGCGCGCTCGCTC GCTCACTGAGGCCGCCCGGGCAAAGCCCGGGCGTCGGGCGACCTTTGGT CGCCCGGCCTCAGTGAGCGAGCGAGCGCGCAGAGAGGGAGTGGCCAA |
| 181 | Right ITR (3' ITR) (alternate) | AGGAACCCCTAGTGATGGAGTTGGCCACTCCCTCTCTGCGCGCTCGCTC GCTCACTGAGGCCGGGCGACCAAAGGTCGCCCGACGCCCGGGCTTTGCC CGGGCGGCCTCAGTGAGCGAGCGAGCGCGCAGCTGCCTGCAGG |
| 182 | TRAC-LHA (800 bp) | GAGATGTAAGGAGCTGCTGTGACTTGCTCAAGGCCTTATATCGAGTAAA CGGTAGTGCTGGGGCTTAGACGCAGGTGTTCTGATTTATAGTTCAAAAC CTCTATCAATGAGAGAGCAATCCTTGGTAATGTGATAGATTTCCCAAC TTAATGCCAACATACCATAAACCTCCCATTCTGCTAATGCCCAGCCTAA GTTGGGGAGACCACTCCAGATTCCAAGATGTACAGTTTGCTTTGCTGGG CCTTTTTCCCATGCCTGCCTTTACTCTGCCAGAGTTATATTGCTGGGGT TTTGAAGAAGATCCTATTAAATAAAAGAATAAGCAGTATTATTAAGTAG |

TABLE 10-continued

AAV Donor Template Sequences

| | | |
|---|---|---|
| | | CCCTGCATTTCAGGTTTCCTTGAGTGGCAGGCCAGGCCTGGCCGTGAAC<br>GTTCACTGAAATCATGGCCTCTTGGCCAAGATTGATAGCTTGTGCCTGT<br>CCCTGAGTCCCAGTCCATCACGAGCAGCTGGTTTCTAAGATGCTATTTC<br>CCGTATAAAGCATGAGACCGTGACTTGCCAGCCCCACAGAGCCCCGCCC<br>TTGTCCATCACTGGCATCTGGACTCCAGCCTGGGTTGGGGCAAAGAGGG<br>AAATGAGATCATGTCCTAACCCTGATCCTCTTGTCCCACAGATATCCAG<br>AACCCTGACCCTGCCGTGTACCAGCTGAGAGACTCTAAATCCAGTGACA<br>AGTCTGTCTGCCTATTCACCGATTTTGATTCTCAAACAAATGTGTCACA<br>AAGTAAGGATTCTGATGTGTATATCACAGACAAAACTGTGCTAGACATG<br>AGGTCTATGGACTTCA |
| 183 | TRAC-RHA<br>(800 bp) | TGGAGCAACAAATCTGACTTTGCATGTGCAAACGCCTTCAACAACAGCA<br>TTATTCCAGAAGACACCTTCTTCCCCAGCCCAGGTAAGGGCAGCTTTGG<br>TGCCTTCGCAGGCTGTTTCCTTGCTTCAGGAATGGCCAGGTTCTGCCCA<br>GAGCTCTGGTCAATGATGTCTAAAACTCCTCTGATTGGTGGTCTCGGCC<br>TTATCCATTGCCACCAAAACCCTCTTTTTACTAAGAAACAGTGAGCCTT<br>GTTCTGGCAGTCCAGAGAATGACACGGGAAAAAAGCAGATGAAGAGAAG<br>GTGGCAGGAGAGGGCACGTGGCCCAGCCTCAGTCTCTCCAACTGAGTTC<br>CTGCCTGCCTGCCTTTGCTCAGACTGTTTGCCCCTTACTGCTCTTCTAG<br>GCCTCATTCTAAGCCCCTTCTCCAAGTTGCCTCTCCTTATTTCTCCCTG<br>TCTGCCAAAAAATCTTTCCCAGCTCACTAAGTCAGTCTCACGCAGTCAC<br>TCATTAACCCACCAATCACTGATTGTGCCGGCACATGAATGCACCAGGT<br>GTTGAAGTGGAGGAATTAAAAAGTCAGATGAGGGGTGTGCCCAGAGGAA<br>GCACCATTCTAGTTGGGGGAGCCCATCTGTCAGCTGGGAAAAGTCCAAA<br>TAACTTCAGATTGGAATGTGTTTTAACTCAGGGTTGAGAAAACAGCTAC<br>CTTCAGGACAAAAGTCAGGGAAGGGCTCTCTGAAGAAATGCTACTTGAA<br>GATACCAGCCCTACCAAGGGCAGGGAGAGGACCCTATAGAGGCCTGGGA<br>CAGGAGCTCAATGAGAAAGG |
| 184 | EF1a | GGCTCCGGTGCCCGTCAGTGGGCAGAGCGCACATCGCCCACAGTCCCCG<br>AGAAGTTGGGGGGAGGGGTCGGCAATTGAACCGGTGCCTAGAGAAGGTG<br>GCGCGGGGTAAACTGGGAAAGTGATGTCGTGTACTGGCTCCGCCTTTTT<br>CCCGAGGGTGGGGGAGAACCGTATATAAGTGCAGTAGTCGCCGTGAACG<br>TTCTTTTTCGCAACGGGTTTGCCGCCAGAACACAGGTAAGTGCCGTGTG<br>TGGTTCCCGCGGGCCTGGCCTCTTTACGGGTTATGGCCCTTGCGTGCCT<br>TGAATTACTTCCACTGGCTGCAGTACGTGATTCTTGATCCCGAGCTTCG<br>GGTTGGAAGTGGGTGGGAGAGTTCGAGGCCTTGCGCTTAAGGAGCCCCT<br>TCGCCTCGTGCTTGAGTTGAGGCCTGGCCTGGGCGCTGGGGCCGCCGCG<br>TGCGAATCTGGTGGCACCTTCGCGCCTGTCTCGCTGCTTTCGATAAGTC<br>TCTAGCCATTTAAAATTTTTGATGACCTGCTGCGACGCTTTTTTTCTGG<br>CAAGATAGTCTTGTAAATGCGGGCCAAGATCTGCACACTGGTATTTCGG<br>TTTTTGGGGCCGCGGGCGGCGACGGGGCCCGTGCGTCCCAGCGCACATG<br>TTCGGCGAGGCGGGGCCTGCGAGCGCGGCCACCGAGAATCGGACGGGGG<br>TAGTCTCAAGCTGGCCGGCCTGCTCTGGTGCCTGGCCTCGCGCCGCCGT<br>GTATCGCCCCGCCCTGGGCGGCAAGGCTGGCCCGGTCGGCACCAGTTGC<br>GTGAGCGGAAAGATGGCCGCTTCCCGGCCCTGCTGCAGGGAGCTCAAAA<br>TGGAGGACGCGGCGCTCGGGAGAGCGGGCGGGTGAGTCACCCACACAAA<br>GGAAAAGGGCCTTTCCGTCCTCAGCCGTCGCTTCATGTGACTCCACGGA<br>GTACCGGGCGCCGTCCAGGCACCTCGATTAGTTCTCGAGCTTTTGGAGT<br>ACGTCGTCTTTAGGTTGGGGGAGGGGTTTTATGCGATGGAGTTTCCCC<br>ACACTGAGTGGGTGGAGACTGAAGTTAGGCCAGCTTGGCACTTGATGTA<br>ATTCTCCTTGGAATTTGCCCTTTTTGAGTTTGGATCTTGGTTCATTCTC<br>AAGCCTCAGACAGTGGTTCAAAGTTTTTTTCTTCCATTTCAGGTGTCGT<br>GA |
| 185 | CD19<br>LHA to RHA | GAGATGTAAGGAGCTGCTGTGACTTGCTCAAGGCCTTATATCGAGTAAA<br>CGGTAGTGCTGGGGCTTAGACGCAGGTGTTCTGATTTATAGTTCAAAAC<br>CTCTATCAATGAGAGAGCAATCTCCTGGTAATGTGATAGATTTCCCAAC<br>TTAATGCCAACATACCATAAACCTCCCATTCTGCTAATGCCCAGCCTAA<br>GTTGGGGAGACCACTCCAGATTCCAAGATGTACAGTTTGCTTTGCTGGG<br>CCTTTTTCCCATGCCTGCCTTTACTCTGCCAGAGTTATATTGCTGGGGT<br>TTTGAAGAAGATCCTATTAAATAAAAGAATAAGCAGTATTATTAAGTAG<br>CCCTGCATTTCAGGTTTCCTTGAGTGGCAGGCCAGGCCTGGCCGTGAAC<br>GTTCACTGAAATCATGGCCTCTTGGCCAAGATTGATAGCTTGTGCCTGT<br>CCCTGAGTCCCAGTCCATCACGAGCAGCTGGTTTCTAAGATGCTATTTC<br>CCGTATAAAGCATGAGACCGTGACTTGCCAGCCCCACAGAGCCCCGCCC<br>TTGTCCATCACTGGCATCTGGACTCCAGCCTGGGTTGGGGCAAAGAGGG<br>AAATGAGATCATGTCCTAACCCTGATCCTCTTGTCCCACAGATATCCAG<br>AACCCTGACCCTGCCGTGTACCAGCTGAGAGACTCTAAATCCAGTGACA<br>AGTCTGTCTGCCTATTCACCGATTTTGATTCTCAAACAAATGTGTCACA<br>AAGTAAGGATTCTGATGTGTATATCACAGACAAAACTGTGCTAGACATG<br>AGGTCTATGGACTTCAGGCTCCGGTGCCCGTCAGTGGGCAGAGCGCACA<br>TCGCCCACAGTCCCCGAGAAGTTGGGGGGAGGGGTCGGCAATTGAACCG<br>GTGCCTAGAGAAGGTGGCGCGGGGTAAACTGGGAAAGTGATGTCGTGTA<br>CTGGCTCCGCCTTTTTCCCGAGGGTGGGGGAGAACCGTATATAAGTGCA<br>GTAGTCGCCGTGAACGTTCTTTTTCGCAACGGGTTTGCCGCCAGAACAC<br>AGGTAAGTGCCGTGTGTGGTTCCCGCGGGCCTGGCCTCTTTACGGGTTA<br>TGGCCCTTGCGTGCCTTGAATTACTTCCACTGGCTGCAGTACGTGATTC |

TABLE 10-continued

AAV Donor Template Sequences

|  |  |  |
| --- | --- | --- |
|  |  | TTGATCCCGAGCTTCGGGTTGGAAGTGGGTGGGAGAGTTCGAGGCCTTG<br>CGCTTAAGGAGCCCCTTCGCCTCGTGCTTGAGTTGAGGCCTGGCCTGGG<br>CGCTGGGGCCGCCGCGTGCGAATCTGGTGGCACCTTCGCGCCTGTCTCG<br>CTGCTTTCGATAAGTCTCTAGCCATTTAAAATTTTTGATGACCTGCTGC<br>GACGCTTTTTTTCTGGCAAGATAGTCTTGTAAATGCGGGCCAAGATCTG<br>CACACTGGTATTTCGGTTTTTGGGGCCGCGGGCGGCGACGGGGCCCGTG<br>CGTCCCAGCGCACATGTTCGGCGAGGCGGGGCCTGCGAGCGCGGCCACC<br>GAGAATCGGACGGGGGTAGTCTCAAGCTGGCCGGCCTGCTCTGGTGCCT<br>GGCCTCGCGCCGCCGTGTATCGCCCCGCCCTGGGCGGCAAGGCTGGCCC<br>GGTCGGCACCAGTTGCGTGAGCGGAAAGATGGCCGCTTCCCGGCCCTGC<br>TGCAGGGAGCTCAAAATGGAGGACGCGGCGCTCGGGAGAGCGGGCGGGT<br>GAGTCACCCACACAAAGGAAAAGGGCCTTTCCGTCCTCAGCCGTCGCTT<br>CATGTGACTCCACGGAGTACCGGGCGCCGTCCAGGCACCTCGATTAGTT<br>CTCGAGCTTTTGGAGTACGTCGTCTTTAGGTTGGGGGGAGGGGTTTTAT<br>GCGATGGAGTTTCCCCACACTGAGTGGGTGGAGACTGAAGTTAGGCCAG<br>CTTGGCACTTGATGTAATTCTCCTTGGAATTTGCCCTTTTTGAGTTTGG<br>ATCTTGGTTCATTCTCAAGCCTCAGACAGTGGTTCAAAGTTTTTTTCTT<br>CCATTTCAGGTGTCGTGACCACCATGCTTCTTTTGGTTACGTCTCTGTT<br>GCTTTGCGAACTTCCTCATCCAGCGTTCTTGCTGATCCCCGATATTCAG<br>ATGACTCAGACCACCAGTAGCTTGTCTGCCTCACTGGGAGACCGAGTAA<br>CAATCCTGCAGGGCAAGTCAAGACATTAGCAAATACCTCAATTGGTA<br>CCAGCAGAAGCCCGACGGAACGGTAAAACTCCTCATCTATCATACGTCA<br>AGGTTGCATTCCGGAGTACCGTCACGATTTTCAGGTTCTGGGAGCGGAA<br>CTGACTATTCCTTGACTATTTCAAACCTCGAGCAGGAGGACATTGCGAC<br>ATATTTTTGTCAACAAGGTAATACCCTCCCTTACACTTTCGGAGGAGGA<br>ACCAAACTCGAAATTACCGGGTCCACCAGTGGCTCTGGGAAGCCTGGCA<br>GTGGAGAAGGTTCCACTAAAGGCGAGGTGAAGCTCCAGGAGAGCGGCCC<br>CGGTCTCGTTGCCCCCAGTCAAAGCCTCTCTGTAACGTGCACAGTGAGT<br>GGTGTATCATTGCCTGATTATGGCGTCTCCTGGATAAGGCAGCCCCCGC<br>GAAAGGGTCTTGAATGGCTTGGGGTAATATGGGGCTCAGAGACAACGTA<br>TTATAACTCCGCTCTCAAAAGTCGCTTGACGATAATAAAAGATAACTCC<br>AAGAGTCAAGTTTTCCTTAAAATGAACAGTTTGCAGACTGACGATACCG<br>CTATATATTATTGTGCTAAACATTATTACTACGGCGGTAGTTACGCGAT<br>GGATTATTGGGGCAGGGGACTTCTGTCACAGTCAGTAGTGCTGCTGCC<br>TTTGTCCCGGTATTTCTCCCAGCCAAACCGACCACGACTCCCGCCCCGC<br>GCCCTCCGACACCCGCTCCCACCATCGCCTCTCAACCTCTTAGTCTTCG<br>CCCCGAGGCATGCCGACCCGCCGCCGGGGGTGCTGTTCATACGAGGGGC<br>TTGGACTTCGCTTGTGATATTTACATTTGGGCTCCGTTGGCGGGTACGT<br>GCGGCGTCCTTTTGTTGTCACTCGTTATTACTTTGTATTGTAATCACAG<br>GAATCGCTCAAAGCGGAGTAGGTTGTTGCATTCCGATTACATGAATATG<br>ACTCCTCGCCGGCCTGGGCCGACAAGAAAACATTACCAACCCTATGCCC<br>CCCCACGAGACTTCGCTGCGTACAGGTCCCGAGTGAAGTTTTCCCGAAG<br>CGCAGACGCTCCGGCATATCAGCAAGGACAGAATCAGCTGTATAACGAA<br>CTGAATTTGGGACGCCGCGAGGAGTATGACGTGCTTGATAAACGCCGGG<br>GGAGAGACCCGGAAATGGGGGGTAAACCCCGAAGAAAGAATCCCCAAGA<br>AGGACTCTACAATGAACTCCAGAAGGATAAGATGGCGGAGGCCTACTCA<br>GAAATAGGTATGAAGGGCGAACGACGACGGGGAAAAGGTCACGATGGCC<br>TCTACCAAGGGTTGAGTACGGCAACCAAAGATACGTACGATGCACTGCA<br>TATGCAGGCCCTGCCTCCCAGATAATAATAAAAATCGCTATCCATCGAAG<br>ATGGATGTGTGTTGGTTTTTTGTGTGTGGAGCAACAAATCTGACTTTGC<br>ATGTGCAAACGCCTTCAACAACAGCATTATTCCAGAAGACACCTTCTTC<br>CCCAGCCCAGGTAAGGGCAGCTTTGGTGCCTTCGCAGGCTGTTTCCTTG<br>CTTCAGGAATGGCCAGGTTCTGCCCAGAGCTCTGGTCAATGATGTCTAA<br>AACTCCTCTGATTGGTGGTCTCGGCCTTATCCATTGCCACCAAAACCCT<br>CTTTTTACTAAGAAACAGTGAGCCTTGTTCTGGCAGTCCAGAGAATGAC<br>ACGGGAAAAAAGCAGATGAAGAGAAGGTGGCAGGAGAGGGCACGTGGCC<br>CAGCCTCAGTCTCTCCAACTGAGTTCCTGCCTGCCTGCCTTTGCTCAGA<br>CTGTTTGCCCCTTACTGCTCTTCTAGGCCTCATTCTAAGCCCCTTCTCC<br>AAGTTGCCTCTCCTTATTTCTCCCTGTCTGCCAAAAAATCTTTCCCAGC<br>TCACTAAGTCAGTCTCACGCAGTCACTCATTAACCCACCAATCACTGAT<br>TGTGCCGGCACATGAATGCACCAGGTGTTGAAGTGGAGGAATTAAAAAG<br>TCAGATGAGGGTGTGCCCAGAGGAAGCACCATTCTAGTTGGGGGAGCC<br>CATCTGTCAGCTGGGAAAAGTCCAAATAACTTCAGATTGGAATGTGTTT<br>TAACTCAGGGTTGAGAAAACAGCTACCTTCAGGACAAAAGTCAGGGAAG<br>GGCTCTCTGAAGAAATGCTACTTGAAGATACCAGCCCTACCAAGGGCAG<br>GGAGAGGACCCTATAGAGGCCTGGGACAGGAGCTCAATGAGAAAGG |
| 186 | CD70<br>LHA to RHA<br>(CD70B<br>scFV with<br>41BB) | GAGATGTAAGGAGCTGCTGTGACTTGCTCAAGGCCTTATATCGAGTAAA<br>CGGTAGTGCTGGGGCTTAGACGCAGGTGTTCTGATTTATAGTTCAAAAC<br>CTCTATCAATGAGAGAGCAATCTCCTGGTAATGTGATAGATTTCCCAAC<br>TTAATGCCAACATACCATAAACCTCCCATTCTGCTAATGCCCAGCCTAA<br>GTTGGGGAGACCACTCCAGATTCCAAGATGTACAGTTTGCTTTGCTGGG<br>CCTTTTTCCCATGCCTGCCTTTACTCTGCCAGAGTTATATTGCTGGGGT<br>TTTGAAGAAGATCCTATTAAATAAAAGAATAAGCAGTATTATTAAGTAG<br>CCCTGCATTTCAGGTTTCCTTGAGTGGCAGGCCAGGCCTGGCCGTGAAC<br>GTTCACTGAAATCATGGCCTCTTGGCCAAGATTGATAGCTTGTGCCTGT |

TABLE 10-continued

AAV Donor Template Sequences

```
CCCTGAGTCCCAGTCCATCACGAGCAGCTGGTTTCTAAGATGCTATTTC
CCGTATAAAGCATGAGACCGTGACTTGCCAGCCCCACAGAGCCCCGCCC
TTGTCCATCACTGGCATCTGGACTCCAGCCTGGGTTGGGGCAAAGAGGG
AAATGAGATCATGTCCTAACCCTGATCCTCTTGTCCCACAGATATCCAG
AACCCTGACCCTGCCGTGTACCAGCTGAGAGACTCTAAATCCAGTGACA
AGTCTGTCTGCCTATTCACCGATTTTGATTCTCAAACAAATGTGTCACA
AAGTAAGGATTCTGATGTGTATATCACAGACAAAACTGTGCTAGACATG
AGGTCTATGGACTTCAGGCTCCGGTGCCCGTCAGTGGGCAGAGCGCACA
TCGCCCACAGTCCCCGAGAAGTTGGGGGGAGGGGTCGGCAATTGAACCG
GTGCCTAGAGAAGGTGGCGCGGGGTAAACTGGGAAAGTGATGTCGTGTA
CTGGCTCCGCCTTTTTCCCGAGGGTGGGGGAGAACCGTATATAAGTGCA
GTAGTCGCCGTGAACGTTCTTTTTCGCAACGGGTTTGCCGCCAGAACAC
AGGTAAGTGCCGTGTGTGGTTCCCGCGGGCCTGGCCTCTTTACGGGTTA
TGGCCCTTGCGTGCCTTGAATTACTTCCACTGGCTGCAGTACGTGATTC
TTGATCCCGAGCTTCGGGTTGGAAGTGGGTGGGAGAGTTCGAGGCCTTG
CGCTTAAGGAGCCCCTTCGCCTCGTGCTTGAGTTGAGGCCTGGCCTGGG
CGCTGGGGCCGCCGCGTGCGAATCTGGTGGCACCTTCGCGCCTGTCTCG
CTGCTTTCGATAAGTCTCTAGCCATTTAAAATTTTTGATGACCTGCTGC
GACGCTTTTTTTCTGGCAAGATAGTCTTGTAAATGCGGGCCAAGATCTG
CACACTGGTATTTCGGTTTTTGGGGCCGCGGGCGGCGACGGGGCCCGTG
CGTCCCAGCGCACATGTTCGGCGAGGCGGGGCCTGCGAGCGCGGCCACC
GAGAATCGGACGGGGGTAGTCTCAAGCTGGCCGGCCTGCTCTGGTGCCT
GGCCTCGCCGCCGTGTATCGCCCCGCCCTGGGCGGCAAGGCTGGCCC
GGTCGGCACCAGTTGCGTGAGCGGAAAGATGGCCGCTTCCCGGCCCTGC
TGCAGGGAGCTCAAAATGGAGGACGCGGCGCTCGGGAGAGCGGGCGGGT
GAGTCACCCACACAAAGGAAAAGGGCCTTTCCGTCCTCAGCCGTCGCTT
CATGTGACTCCACGGAGTACCGGGCGCCGTCCAGGCACCTCGATTAGTT
CTCGAGCTTTTGGAGTACGTCGTCTTTAGGTTGGGGGGAGGGGTTTTAT
GCGATGGAGTTTCCCCACACTGAGTGGGTGGAGACTGAAGTTAGGCCAG
CTTGGCACTTGATGTAATTCTCCTTGGAATTTGCCCTTTTTGAGTTTGG
ATCTTGGTTCATTCTCAAGCCTCAGACAGTGGTTCAAAGTTTTTTCTT
CCATTTCAGGTGTCGTGACCACCATGGCGCTTCCGGTGACAGCACTGCT
CCTCCCCTTGGCGCTGTTGCTCCACGCAGCAAGGCCGCAGGTCCAGTTG
GTGCAAAGCGGGGCGGAGGTGAAAAAACCCGGCGCTTCCGTGAAGGTGT
CCTGTAAGGCGTCCGGTTATACGTTCACGAACTACGGGATGAATTGGGT
TCGCCAAGCGCCGGGGCAGGGACTGAAATGGATGGGGTGGATAAATACC
TACACCGGCGAACCTACATACGCCGACGCTTTTAAAGGGCGAGTCACTA
TGACGCGCGATACCAGCATATCCACCGCATACATGGAGCTGTCCCGACT
CCGGTCAGACGACACGGCTGTCTACTATTGTGCTCGGGACTATGGCGAT
TATGGCATGGACTACTGGGGTCAGGGTACGACTGTAACAGTTAGTAGTG
GTGGAGGCGGCAGTGGCGGGGGGGAAGCGGAGGAGGGGGTTCTGGTGA
CATAGTTATGACCCAATCCCCAGATAGTTTGGCGGTTTCTCTGGGCGAG
AGGGCAACGATTAATTGTCGCGCATCAAAGAGCGTTTCAACGAGCGGAT
ATTCTTTTATGCATTGGTACCAGCAAAAACCCGGACAACCGCCGAAGCT
GCTGATCTACTTGGCTTCAAATCTTGAGTCTGGGGTGCCGGACCGATTT
TCTGGTAGTGGAAGCGGAACTGACTTTACGCTCACGATCAGTTCACTGC
AGGCTGAGGATGTAGCGGTCTATTATTGCCAGCACAGTAGAGAAGTCCC
CTGGACCTTCGGTCAAGGCACGAAAGTAGAAATTAAAAGTGCTGCTGCC
TTTGTCCCGGTATTTCTCCCAGCCAAACCGACCACGACTCCCGCCCCGC
GCCCTCCGACACCCGCTCCCACCATCGCCTCTCAACCTCTTAGTCTTCG
CCCCGAGGCATGCCGACCCGCCGCCGGGGGTGCTGTTCATACGAGGGGC
TTGGACTTCGCTTGTGATATTTACATTTGGGCTCCGTTGGCGGGTACGT
GCGGCGTCCTTTTGTTGTCACTCGTTATTACTTTGTATTGTAATCACAG
GAATCGCAAACGGGGCAGAAAGAAACTCCTGTATATATTCAAACAACCA
TTTATGAGACCAGTACAAACTACTCAAGAGGAAGATGGCTGTAGCTGCC
GATTTCCAGAAGAAGAAGAAGGAGGATGTGAACTGCGAGTGAAGTTTTC
CCGAAGCGCAGACGCTCCGGCATATCAGCAAGGACAGAATCAGCTGTAT
AACGAACTGAATTTGGGACGCCGCGAGGAGTATGACGTGCTTGATAAAC
GCCGGGGAGAGACCCGGAAATGGGGGTAAACCCCGAAGAAAGAATCC
CCAAGAAGGACTCTACAATGAACTCCAGAAGGATAAGATGGCGGAGGCC
TACTCAGAAATAGGTATGAAGGGCGAACGACGACGGGGAAAAGGTCACG
ATGGCCTCTACCAAGGGTTGAGTACGGCAACCAAAGATACGTACGATGC
ACTGCATATGCAGGCCCTGCCTCCCAGATAATAATAAAATCGCTATCCA
TCGAAGATGGATGTGTGTTGGTTTTTGTGTGTGGAGCAACAAATCTGA
CTTTGCATGTGCAAACGCCTTCAACAACAGCATTATTCCAGAAGACACC
TTCTTCCCCAGCCCAGGTAAGGGCAGCTTTGGTGCCTTCGCAGGCTGTT
TCCTTGCTTCAGGAATGGCCAGGTTCTGCCCAGAGCTCTGGTCAATGAT
GTCTAAAACTCCTCTGATTGGTGGTCTCGGCCTTATCCATTGCCACCAA
AACCCTCTTTTTACTAAGAAACAGTGAGCCTTGTTCTGGCAGTCCAGAG
AATGACACGGGAAAAAAGCAGATGAAGAGAAGGTGGCAGGAGAGGGCAC
GTGGCCCAGCCTCAGTCTCTCCAACTGAGTTCCTGCCTGCCTGCCTTTG
CTCAGACTGTTTGCCCCTTACTGCTCTTCTAGGCCTCATTCTAAGCCCC
TTCTCCAAGTTGCCTCTCCTTATTTCTCCCTGTCTGCCAAAAAATCTTT
CCCAGCTCACTAAGTCAGTCTCACGCAGTCACTCATTAACCCACCAATC
ACTGATTGTGCCGGCACATGAATGCACCAGGTGTTGAAGTGGAGGAATT
AAAAAGTCAGATGAGGGGTGTGCCCAGAGGAAGCACCATTCTAGTTGGG
GGAGCCCATCTGTCAGCTGGGAAAAGTCCAAATAACTTCAGATTGGAAT
GTGTTTTAACTCAGGGTTGAGAAAACAGCTACCTTCAGGACAAAAGTCA
```

TABLE 10-continued

AAV Donor Template Sequences

GGGAAGGGCTCTCTGAAGAAATGCTACTTGAAGATACCAGCCCTACCAA
GGGCAGGGAGAGGACCCTATAGAGGCCTGGGACAGGAGCTCAATGAGAA
AGG

| 187 | BCMA RHA to LHA | GAGATGTAAGGAGCTGCTGTGACTTGCTCAAGGCCTTATATCGAGTAAA
CGGTAGTGCTGGGGCTTAGACGCAGGTGTTCTGATTTATAGTTCAAAAC
CTCTATCAATGAGAGAGCAATCTCCTGGTAATGTGATAGATTTCCCAAC
TTAATGCCAACATACCATAAACCTCCCATTCTGCTAATGCCCAGCCTAA
GTTGGGGAGACCACTCCAGATTCCAAGATGTACAGTTTGCTTTGCTGGG
CCTTTTTCCCATGCCTGCCTTTACTCTGCCAGAGTTATATTGCTGGGGT
TTTGAAGAAGATCCTATTAAATAAAAGAATAAGCAGTATTATTAAGTAG
CCCTGCATTTCAGGTTTCCTTGAGTGGCAGGCCAGGCCTGGCCGTGAAC
GTTCACTGAAATCATGGCCTCTTGGCCAAGATTGATAGCTTGTGCCTGT
CCCTGAGTCCCAGTCCATCACGAGCAGCTGGTTTCTAAGATGCTATTTC
CGTATAAAGCATGAGACCGTGACTTGCCAGCCCCACAGAGCCCCGCCC
TTGTCCATCACTGGCATCTGGACTCCAGCCTGGGTTGGGGCAAAGAGGG
AAATGAGATCATGTCCTAACCCTGATCCTCTTGTCCCACAGATATCCAG
AACCCTGACCCTGCCGTGTACCAGCTGAGAGACTCTAAATCCAGTGACA
AGTCTGTCTGCCTATTCACCGATTTTGATTCTCAAACAAATGTGTCACA
AAGTAAGGATTCTGATGTGTATATCACAGACAAAACTGTGCTAGACATG
AGGTCTATGGACTTCAGGCTCCGGTGCCCGTCAGTGGGCAGAGCGCACA
TCGCCCACAGTCCCCGAGAAGTTGGGGGGAGGGGTCGGCAATTGAACCG
GTGCCTAGAGAAGGTGGCGCGGGGTAAACTGGGAAAGTGATGTCGTGTA
CTGGCTCCGCCTTTTTCCCGAGGGTGGGGGAGAACCGTATATAAGTGCA
GTAGTCGCCGTGAACGTTCTTTTTCGCAACGGGTTTGCCGCCAGAACAC
AGGTAAGTGCCGTGTGTGGTTCCCGCGGGCCTGGCCTCTTTACGGGTTA
TGGCCCTTGCGTGCCTTGAATTACTTCCACTGGCTGCAGTACGTGATTC
TTGATCCCGAGCTTCGGGTTGGAAGTGGGTGGGAGAGTTCGAGGCCTTG
CGCTTAAGGAGCCCCTTCGCCTCGTGCTTGAGTTGAGGCCTGGCCTGGG
CGCTGGGGCCGCCGCGTGCGAATCTGGTGGCACCTTCGCGCCTGTCTCG
CTGCTTTCGATAAGTCTCTAGCCATTTAAAATTTTTGATGACCTGCTGC
GACGCTTTTTTTCTGGCAAGATAGTCTTGTAAATGCGGGCCAAGATCTG
CACACTGGTATTTCGGTTTTTGGGGCCGCGGGCGGCGACGGGGCCCGTG
CGTCCCAGCGCACATGTTCGGCGAGGCGGGGCCTGCGAGCGCGGCCACC
GAGAATCGGACGGGGGTAGTCTCAAGCTGGCCGGCCTGCTCTGGTGCCT
GGCCTCGCGCCGCCGTGTATCGCCCCGCCCTGGGCGGCAAGGCTGGCCC
GGTCGGCACCAGTTGCGTGAGCGGAAAGATGGCCGCTTCCCGGCCCTGC
TGCAGGGAGCTCAAAATGGAGGACGCGGCGCTCGGGAGAGCGGGCGGGT
GAGTCACCCCACACAAAGGAAAAGGGCCTTTCCGTCCTCAGCCGTCGCTT
CATGTGACTCCACGAGTACCGGGCGCCGTCCAGGCACCTCGATTAGTT
CTCGAGCTTTTGGAGTACGTCGTCTTTAGGTTGGGGGGAGGGGTTTTAT
GCGATGGAGTTTCCCCACACTGAGTGGGTGGAGACTGAAGTTAGGCCAG
CTTGGCACTTGATGTAATTCTCCTTGGAATTTGCCCTTTTTGAGTTTGG
ATCTTGGTTCATTCTCAAGCCTCAGACAGTTGGTTCAAAGTTTTTTCTT
CCATTTCAGGTGTCGTGACCACCATGGCGCTTCCGGTGACAGCACTGCT
CCTCCCCTTGGCGCTGTTGCTCCACGCAGCAAGGCCGCAGGTGCAGCTG
GTGCAGAGCGGAGCCGAGCTCAAGAAGCCCGGAGCCTCCGTGAAGGTGA
GCTGCAAGGCCAGCGGCAACACCCTGACCAACTACGTGATCCACTGGGT
GAGACAAGCCCCCGGCCAAAGGCTGGAGTGGATGGGCTACATCCTGCCC
TACAACGACCTGACCAAGTACAGCCAGAAGTTCAGGGCAGGGTGACCA
TCACCAGGGATAAGAGCGCCTCCACCGCCTATATGGAGCTGAGCAGCCT
GAGGAGCGAGGACACCGCTGTGTACTACTGTACAAGGTGGGACTGGGAC
GGCTTCTTTGACCCCTGGGGCCAGGGCACAACAGTGACCGTCAGCAGCG
GCGGCGGAGGCAGCGGCGGCGGCGGCAGCGGCGGAGGCGGAAGCGAAAT
CGTGATGACCCAGAGCCCCGCCACACTGAGCGTGAGCCCTGGCGAGAGG
GCCAGCATCTCCTGCAGGGCTAGCCAAAGCCTGGTGCACAGCAACGGCA
ACACCCACCTGCACTGGTACCAGCAGAGACCCGGACAGGCTCCCAGGCT
GCTGATCTACAGCGTGAGCAACAGGTTCTCCGAGGTGCCTGCCAGGTTT
AGCGGCAGCGGAAGCGGCACCGACTTTACCCTGACCATCAGCAGCGTGG
AGTCCGAGGACTTCGCCGTGTATTACTGCAGCCAGACCAGCCACATCCC
TTACACCTTCGGCGGCGGCACCAAGCTGGAGATCAAAAGTGCTGCTGCC
TTTGTCCCGGTATTTCTCCCAGCCAAACGACCACGACTCCCGCCCCGC
GCCCTCCGACACCCGCTCCCACCATCGCCTCTCAACCTCTTAGTCTTCG
CCCCGAGGCATGCCGACCCGCCGCCGGGGTGCTGTTCATACGAGGGGC
TTGGACTTCGCTTGTGATATTTACATTTGGGCTCCGTTGGCGGGTACGT
GCGGCGTCCTTTTGTTGTCACTCGTTATTACTTTGTATTGTAATCACAG
GAATCGCAAACGGGCAGAAAGAAACTCCTGTATATATTCAAACAACCA
TTTATGAGACCAGTACAAACTACTCAAGAGGAAGATGGCTGTAGCTGCC
GATTTCCAGAAGAAGAAGAAGGAGGATGTGAACTGCGAGTGAAGTTTTC
CCGAAGCGCAGACGCTCCGGCATATCAGCAAGGACAGAATCAGCTGTAT
AACGAACTGAATTTGGGACGCCGCGAGGAGTATGACGTGCTTGATAAAC
GCCGGGGAGAGACCCGGAAATGGGGGTAAACCCCGAAGAAAGAATCC
CCAAGAAGGACTCTACAATGAACTCCAGAAGGATAAGATGGCGGAGGCC
TACTCAGAAATAGGTATGAAGGGCAACGACGACGGGAAAAGGTCACG
ATGGCCTCTACCAAGGGTTGAGTACGGCAACCAAAGATACGTACGATGC
ACTGCATATGCAGGCCCTGCCTCCCAGATAATAATAAAATCGCTATCCA
TCGAAGATGGATGTGTGTTGGTTTTTTGTGTGTGGAGCAACAAATCTGA
CTTTGCATGTGCAAACGCCTTCAACAACAGCATTATTCCAGAAGACACC |

TABLE 10-continued

AAV Donor Template Sequences

```
TTCTTCCCCAGCCCAGGTAAGGGCAGCTTTGGTGCCTTCGCAGGCTGTT
TCCTTGCTTCAGGAATGGCCAGGTTCTGCCCAGAGCTCTGGTCAATGAT
GTCTAAAACTCCTCTGATTGGTGGTCTCGGCCTTATCCATTGCCACCAA
AACCCTCTTTTTACTAAGAAACAGTGAGCCTTGTTCTGGCAGTCCAGAG
AATGACACGGGAAAAAAGCAGATGAAGAGAAGGTGGCAGGAGAGGGCAC
GTGGCCCAGCCTCAGTCTCTCCAACTGAGTTCCTGCCTGCCTGCCTTTG
CTCAGACTGTTTGCCCCTTACTGCTCTTCTAGGCCTCATTCTAAGCCCC
TTCTCCAAGTTGCCTCTCCTTATTTCTCCCTGTCTGCCAAAAAATCTTT
CCCAGCTCACTAAGTCAGTCTCACGCAGTCACTCATTAACCCACCAATC
ACTGATTGTGCCGGCACATGAATGCACCAGGTGTTGAAGTGGAGGAATT
AAAAAGTCAGATGAGGGGTGTGCCCAGAGGAAGCACCATTCTAGTTGGG
GGAGCCCATCTGTCAGCTGGGAAAAGTCCAAATAACTTCAGATTGGAAT
GTGTTTTAACTCAGGGTTGAGAAAACAGCTACCTTCAGGACAAAAGTCA
GGGAAGGGCTCTCTGAAGAAATGCTACTTGAAGATACCAGCCCTACCAA
GGGCAGGGAGAGGACCCTATAGAGGCCTGGGACAGGAGCTCAATGAGAA
AGG
```

Other Embodiments

All of the features disclosed in this specification may be combined in any combination. Each feature disclosed in this specification may be replaced by an alternative feature serving the same, equivalent, or similar purpose. Thus, unless expressly stated otherwise, each feature disclosed is only an example of a generic series of equivalent or similar features.

From the above description, one skilled in the art can easily ascertain the essential characteristics of the present invention, and without departing from the spirit and scope thereof, can make various changes and modifications of the invention to adapt it to various usages and conditions. Thus, other embodiments are also within the claims.

EQUIVALENTS

While several inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize or be able to ascertain using no more than routine experimentation, many equivalents to the specific inventive embodiments described herein. It is, therefore, to be understood that the foregoing embodiments are presented by way of example only and that, within the scope of the appended claims and equivalents thereto, inventive embodiments may be practiced otherwise than as specifically described and claimed. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

All definitions, as defined and used herein, should be understood to control over dictionary definitions, definitions in documents incorporated by reference, and/or ordinary meanings of the defined terms.

All references, patents and patent applications disclosed herein are incorporated by reference with respect to the subject matter for which each is cited, which in some cases may encompass the entirety of the document.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of." "Consisting essentially of," when used in the claims, shall have its ordinary meaning as used in the field of patent law.

The term "about" as used herein means within an acceptable error range for the particular value as determined by one of ordinary skill in the art, which will depend in part on how the value is measured or determined, i.e., the limitations of the measurement system. For example, "about" can mean within an acceptable standard deviation, per the practice in the art. Alternatively, "about" can mean a range of up to ±20%, preferably up to ±10%, more preferably up to ±5%, and more preferably still up to ±1% of a given value. Where particular values are described in the application and claims, unless otherwise stated, the term "about" is implicit and in this context means within an acceptable error range for the particular value.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

It should also be understood that, unless clearly indicated to the contrary, in any methods claimed herein that include more than one step or act, the order of the steps or acts of the method is not necessarily limited to the order in which the steps or acts of the method are recited.

What is claimed is:

1. A population of genetically engineered T cells, comprising:
   a nucleic acid encoding a chimeric antigen receptor (CAR);
   a disrupted protein tyrosine phosphatase non-receptor type 2 (PTPN2) gene;
   a disrupted T cell receptor alpha chain constant region (TRAC) gene; and
   a disrupted beta-2-microglobulin (β2M) gene, wherein the cells exhibit enhanced survival in the presence of natural killer (NK) cells.

2. The population of genetically engineered T cells of claim 1, wherein the disrupted PTPN2 gene is genetically edited in exon 1, exon 2, and/or exon 3.

3. The population of genetically engineered T cells of claim 1, wherein the disrupted PTPN2 gene is genetically edited by CRISPR/Cas-mediated gene editing.

4. The population of genetically engineered T cells of claim 3, wherein the CRISPR/Cas-mediated gene editing comprises a guide RNA (gRNA) targeting a site in the PTPN2 gene that comprises a nucleotide sequence selected from the group consisting of SEQ ID NOs: 2-13.

5. The population of genetically engineered T cells of claim 4, wherein the gRNA comprises a nucleotide sequence selected from the group consisting of SEQ ID NOs: 28, 29, 32, 33, 36, 37, 40, 41, 44, 45, 48, 49, 52, 53, 56, 57, 60, 61, 64-67, 70, and 71.

6. The population of genetically engineered T cells of claim 5, wherein the gRNA comprises a nucleotide sequence selected from the group consisting of SEQ ID NOs: 26, 27, 30, 31, 34, 38, 39, 42, 43, 46, 47, 50, 51, 54, 55, 58, 59, 32, 63, 68, 69, 192, 193.

7. The population of genetically engineered T cells of claim 1, wherein the disrupted TRAC gene is genetically edited by a CRISPR/Cas-mediated gene editing system.

8. The population of genetically engineered T cells of claim 7, wherein the CRISPR/Cas-mediated gene editing system comprises a gRNA comprising the nucleotide sequence of SEQ ID NO: 76 or 77.

9. The population of genetically engineered T cells of claim 8, wherein the disrupted TRAC gene comprises a nucleotide sequence selected from the group consisting of SEQ ID NOs: 93 to 100.

10. The population of genetically engineered T cells of claim 1, wherein the disrupted T cell TRAC gene has a deleted fragment comprising SEQ ID NO: 87.

11. The population of genetically engineered T cells of claim 1, wherein the nucleic acid is inserted in the genome of the T cells.

12. The population of genetically engineered T cells of claim 11, wherein the disrupted TRAC gene comprises the nucleic acid encoding the CAR.

13. The population of genetically engineered T cells of claim 12, wherein the nucleic acid encoding the CAR replaces the deleted fragment in the disrupted TRAC gene.

14. The population of genetically engineered T cells of claim 1, wherein the disrupted β2M gene is genetically edited by CRISPR/Cas-mediated gene editing.

15. The population of genetically engineered T cells of claim 14, wherein the CRISPR/Cas-mediated gene editing comprises a gRNA comprising the nucleotide sequence of SEQ ID NO: 80 or 81.

16. The population of genetically engineered T cells of claim 15, wherein the disrupted β2M gene comprises a nucleotide sequence selected from the group consisting of SEQ ID NOs: 101 to 106.

17. The population of genetically engineered T cells of claim 1, wherein the T cells further comprise a disrupted CD70 gene.

18. The population of genetically engineered T cells of claim 17, wherein the disrupted CD70 gene is genetically edited by CRISPR/Cas-mediated gene editing.

19. The population of genetically engineered T cells of claim 18, wherein the CRISPR/Cas-mediated gene editing comprises a gRNA comprising the nucleotide sequence of SEQ ID NO: 72 or 73.

20. The population of genetically engineered T cells of claim 19, wherein the disrupted CD70 gene comprises a nucleotide sequence selected from the group consisting of SEQ ID NOs: 107 to 112.

21. The population of genetically engineered T cells of claim 1, wherein the CAR comprises an extracellular antigen binding domain specific to a tumor antigen, a co-stimulatory signaling domain of 4-1BB or CD28, and a cytoplasmic signaling domain of CD3ζ.

22. The population of genetically engineered T cells of claim 21, wherein the tumor antigen is CD19, BCMA, or CD70.

23. The population of genetically engineered T cells of claim 22, wherein the extracellular antigen binding domain is a single chain variable fragment (scFv) that binds CD19, and wherein the scFv comprises the amino acid sequence of SEQ ID NO: 137.

24. The population of genetically engineered T cells of claim 23, wherein the CAR comprises the amino acid sequence of SEQ ID NO: 135.

25. The population of genetically engineered T cells of claim 22, wherein the extracellular antigen binding domain is a single chain variable fragment (scFv) that binds CD70, and wherein the scFv comprises the amino acid sequence of SEQ ID NO: 157 or 159.

26. The population of genetically engineered T cells of claim 25, wherein the CAR comprises the amino acid sequence of SEQ ID NO: 155.

27. The population of genetically engineered T cells of claim 22, wherein the extracellular antigen binding domain is a single chain variable fragment (scFv) that binds BCMA, and wherein the scFv comprises the amino acid sequence of SEQ ID NO: 165.

28. The population of genetically engineered T cells of claim 27, wherein the CAR comprises the amino acid sequence of SEQ ID NO: 163.

29. The population of genetically engineered T cells of claim 1, wherein the genetically engineered T cells are derived from primary T cells of one or more human donors.

30. The population of genetically engineered T cells of claim 1, wherein the population of genetically engineered T cells expressing the CAR has enhanced CAR potency and/or increased CAR copies as compared to non-engineered T cell counterparts.

31. A method for preparing the population of genetically engineered T cells of claim 1, the method comprising:
 (a) providing a plurality of cells, which are T cells or precursor cells thereof;
  genetically editing the PTPN2, TRAC and β2M genes; and
 (b) producing the population of genetically engineered T cells having disrupted PTPN2, TRAC and β2M genes.

* * * * *